US006566707B1

(12) United States Patent
Sudo et al.

(10) Patent No.: US 6,566,707 B1
(45) Date of Patent: May 20, 2003

(54) TRANSISTOR, SEMICONDUCTOR MEMORY AND METHOD OF FABRICATING THE SAME

(75) Inventors: Shoji Sudo, Gifu (JP); Mamoru Arimoto, Ogaki (JP); Takayuki Kaida, Gifu (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/223,965

(22) Filed: Dec. 31, 1998

(30) Foreign Application Priority Data

| Jan. 8, 1998 | (JP) | ................................. | 10-002616 |
| Apr. 28, 1998 | (JP) | ................................. | 10-119624 |
| Sep. 25, 1998 | (JP) | ................................. | 10-271976 |
| Dec. 4, 1998 | (JP) | ................................. | 10-346240 |

(51) Int. Cl.⁷ ........................................... H01L 29/788
(52) U.S. Cl. .................... 257/316; 257/327; 257/762
(58) Field of Search ................... 257/315, 316, 257/327, 752

(56) References Cited

U.S. PATENT DOCUMENTS

| 4,639,893 A | * | 1/1987 | Eitan ........................... 365/185 |
| 4,990,979 A | * | 2/1991 | Otto ............................. 257/316 |
| 5,021,999 A | * | 6/1991 | Kohda et al. ................ 257/316 |
| 5,095,344 A | * | 3/1992 | Harari .......................... 257/327 |
| 5,723,888 A | * | 3/1998 | Yu ................................ 257/316 |
| 5,812,449 A | * | 9/1998 | Song ........................ 365/185.03 |
| 5,851,881 A | * | 12/1998 | Lin et al. ..................... 438/261 |
| 6,190,968 B1 | * | 2/2001 | Kalnitsky et al. ............ 438/259 |

\* cited by examiner

Primary Examiner—Sara Crane
(74) Attorney, Agent, or Firm—Armstrong, Westerman & Hattori, LLP

(57) ABSTRACT

A plurality of source/drain regions are formed on a surface of a silicon substrate at a prescribed space. Floating gate electrodes are formed on sides of a channel region closer to the source/drain regions respectively through a first insulator film. Projections are formed on peripheral edge portions of the floating gate electrodes respectively. A control gate electrode is formed over the channel region and the floating gate electrodes through a second insulator film. The control gate electrode is opposed to the floating gate electrodes at one surface through the second insulator film.

18 Claims, 77 Drawing Sheets

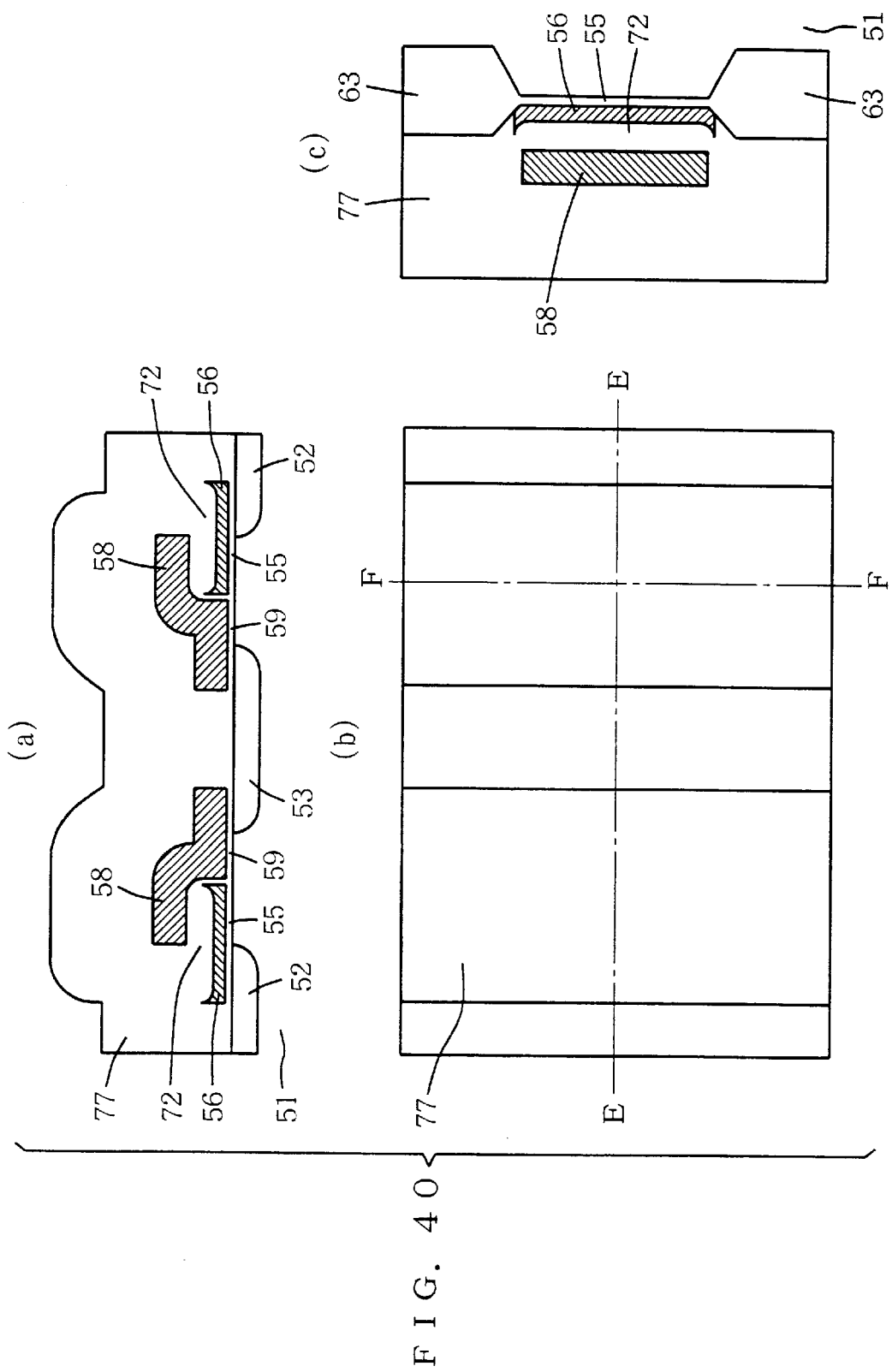
F I G. 4 0

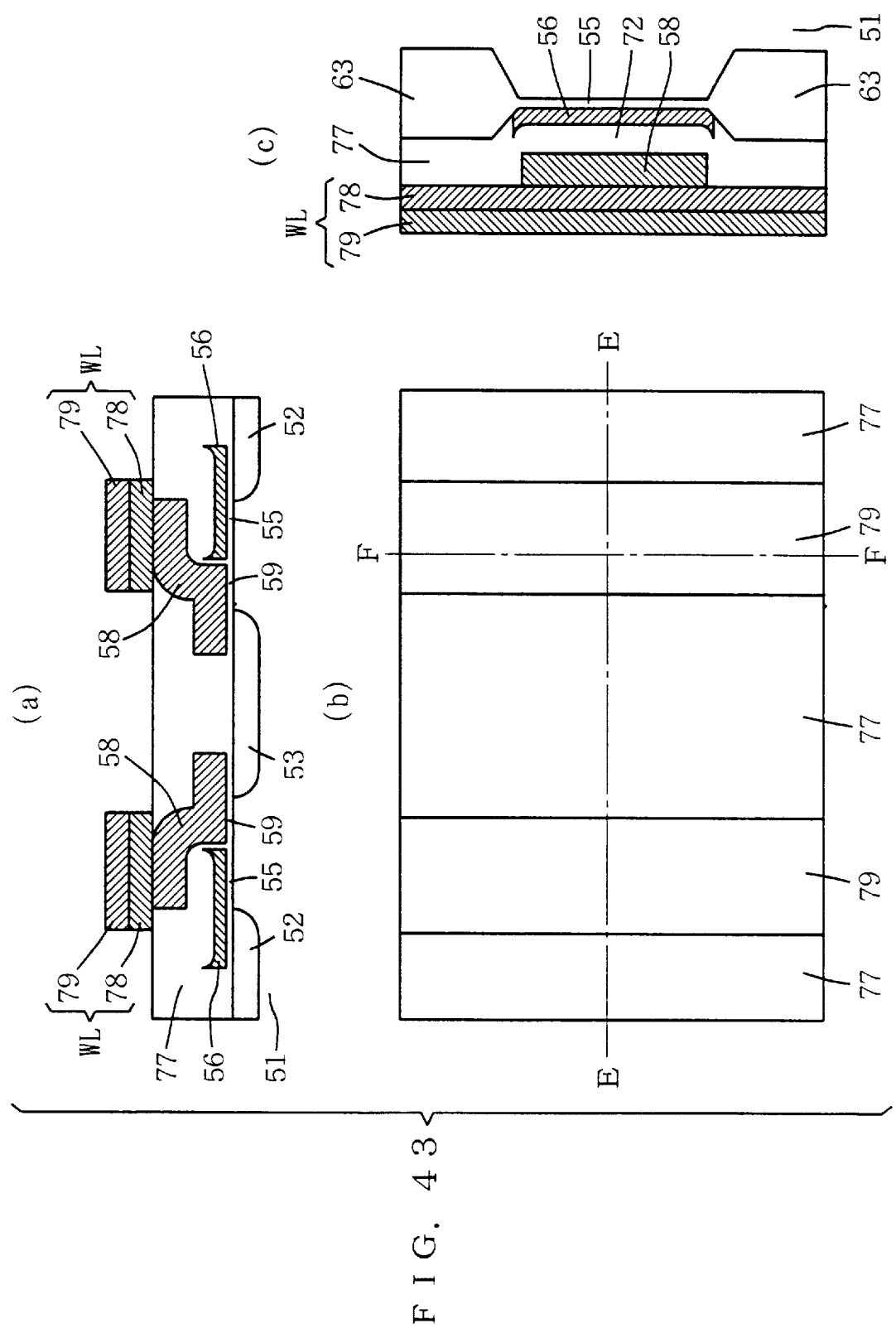
F I G. 43

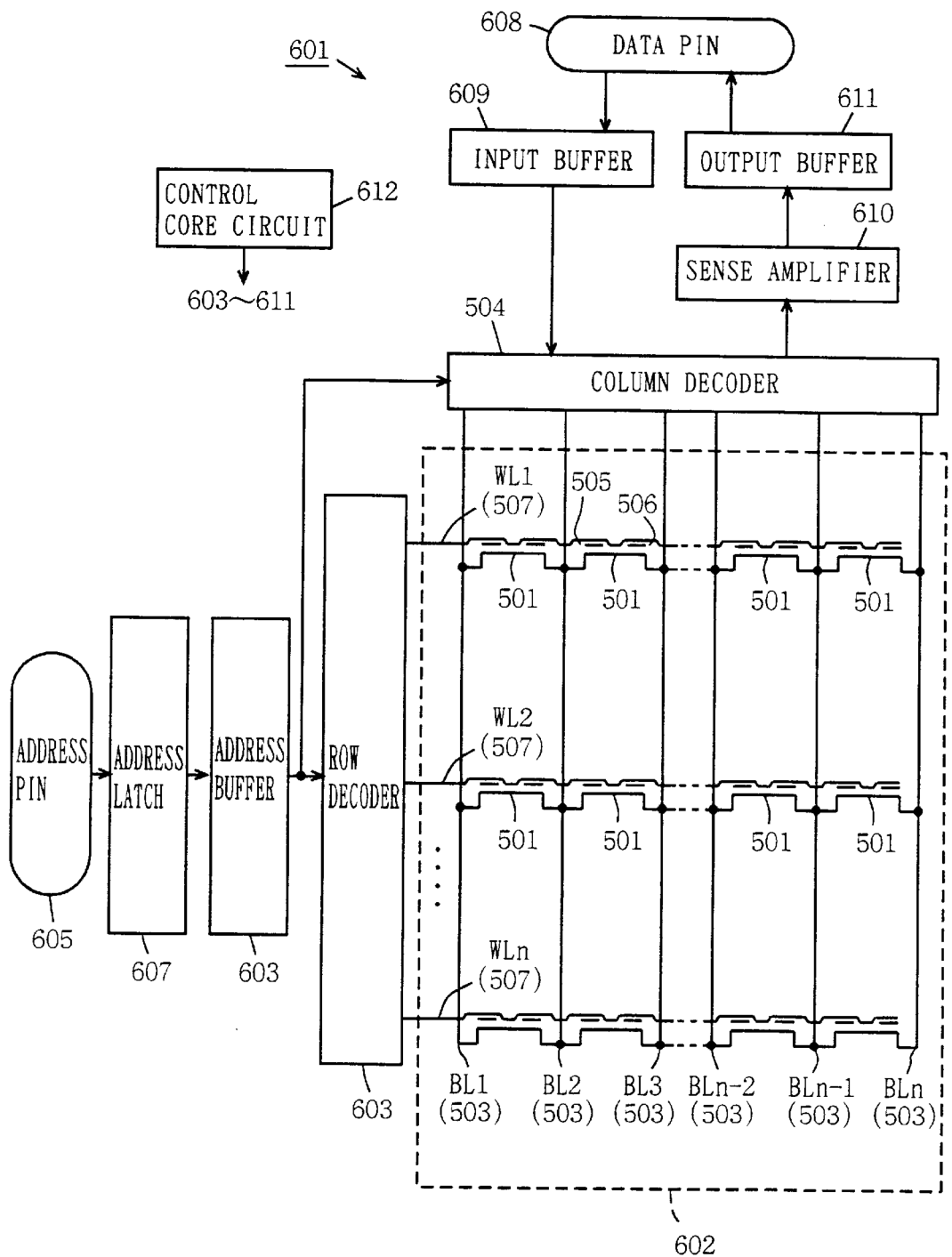
F I G. 4 6

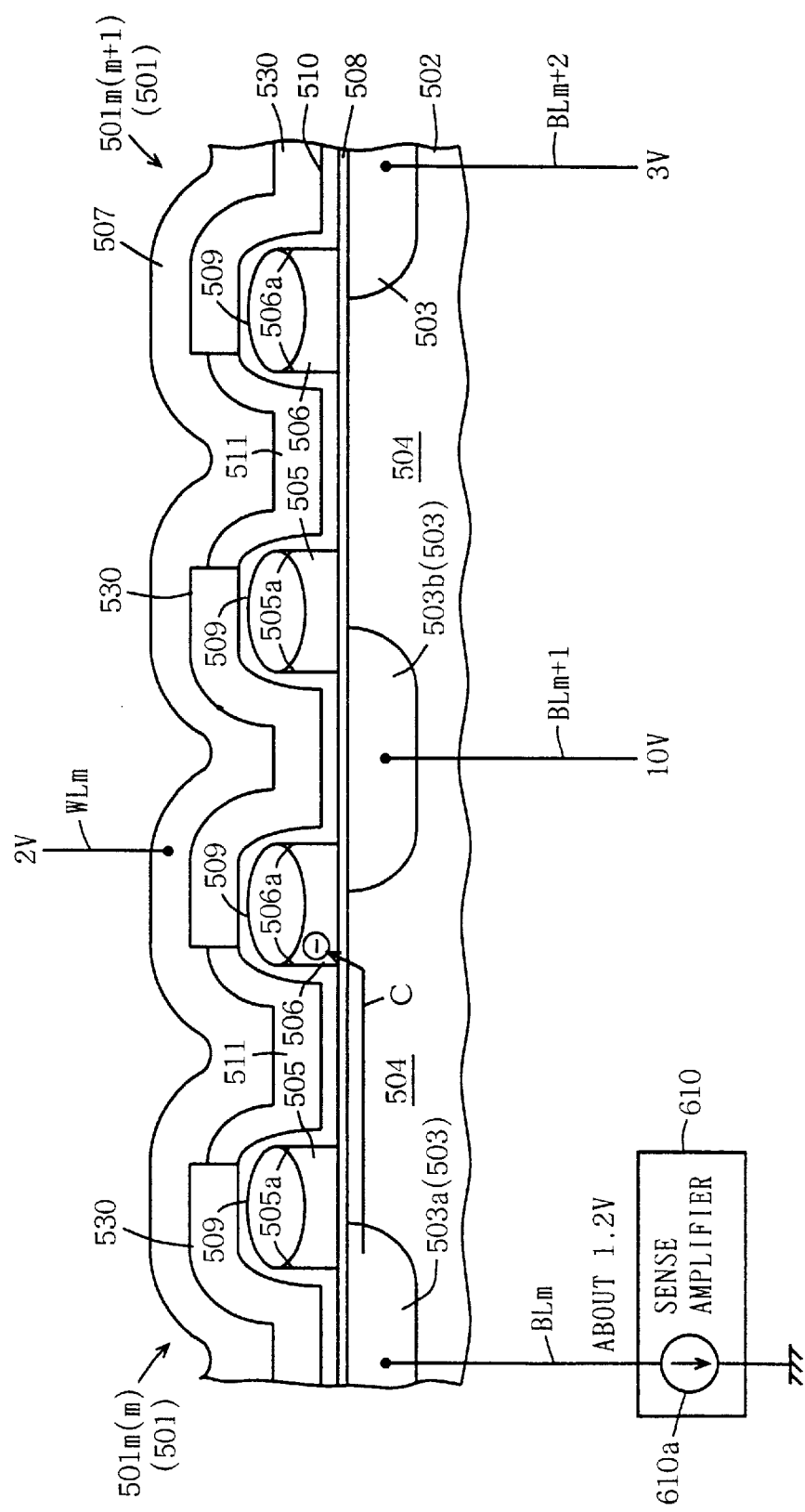

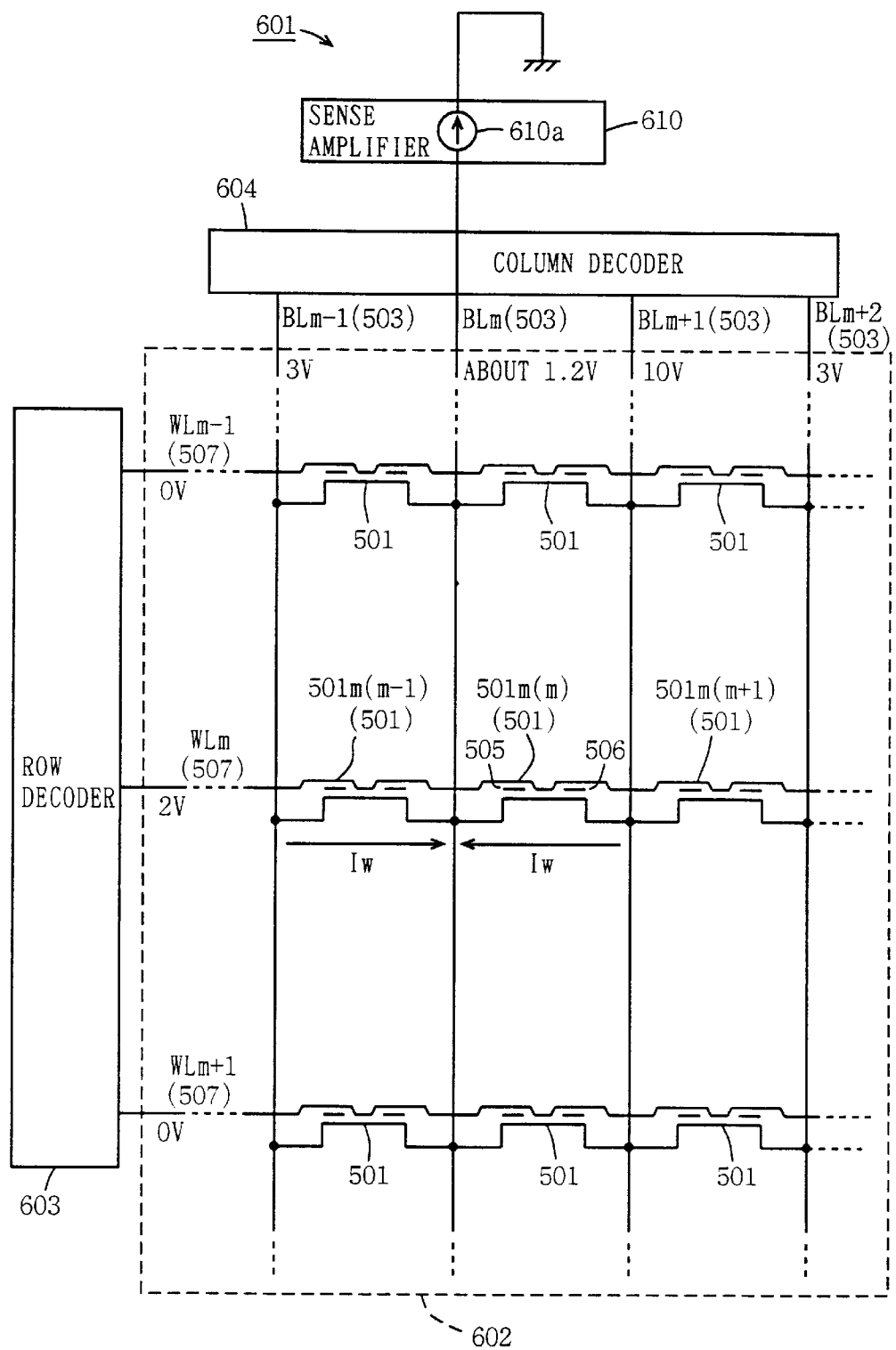

F I G. 5 4
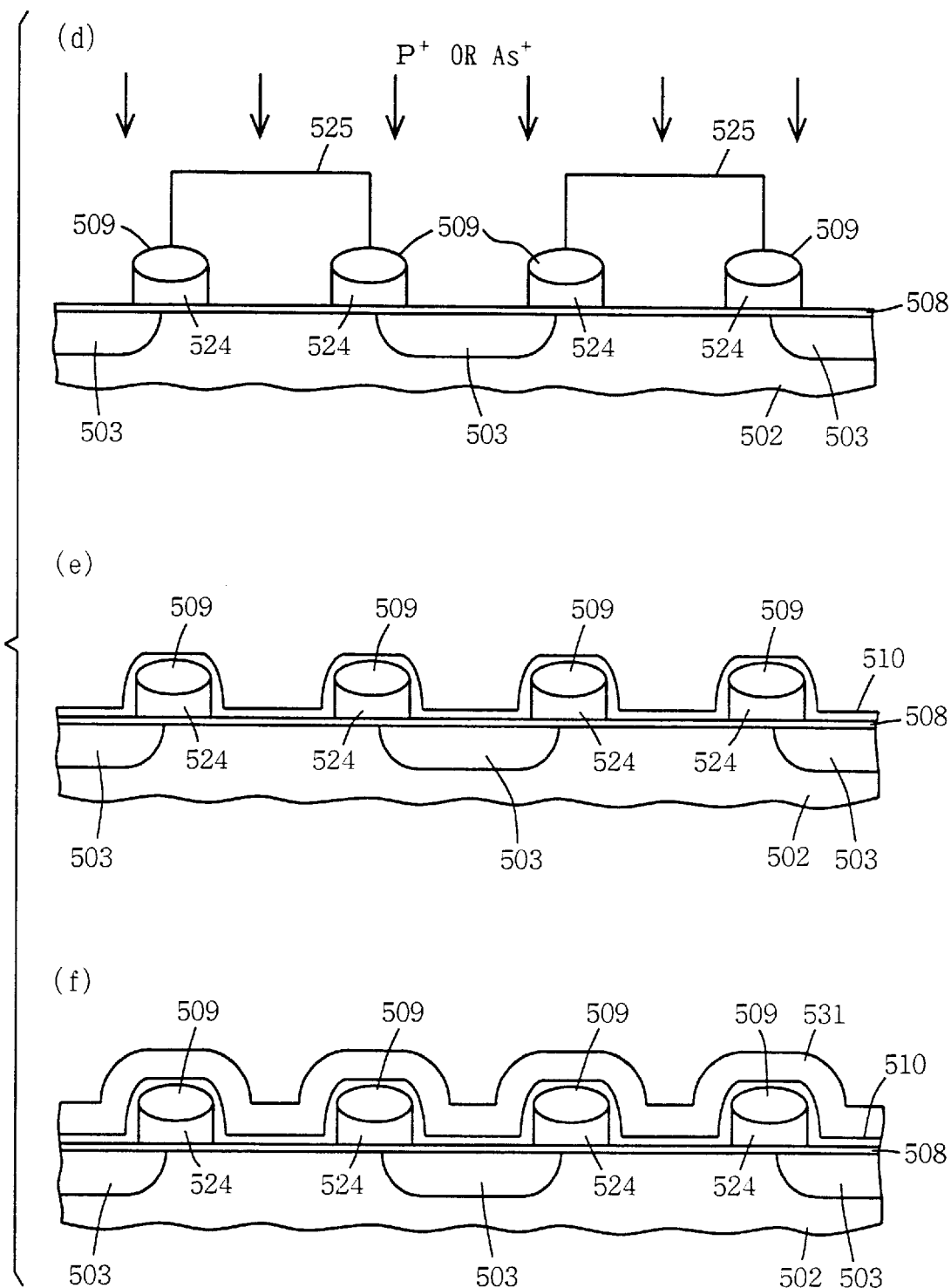

FIG. 55
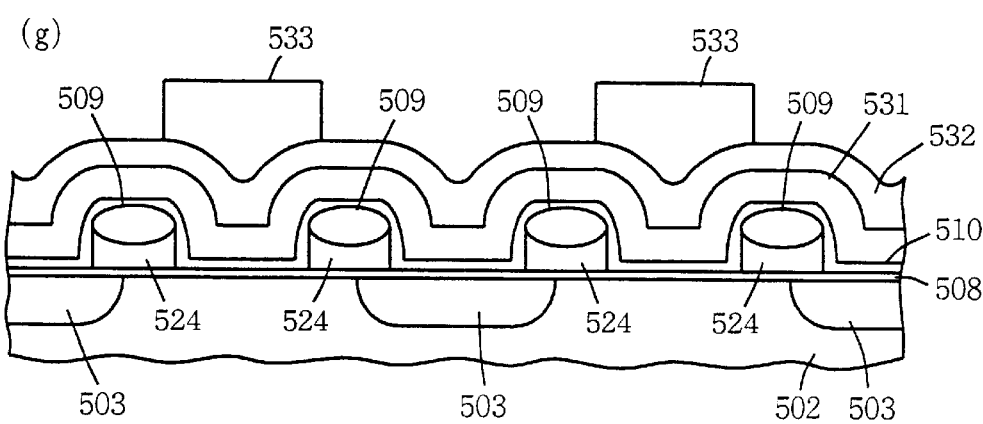
(g)
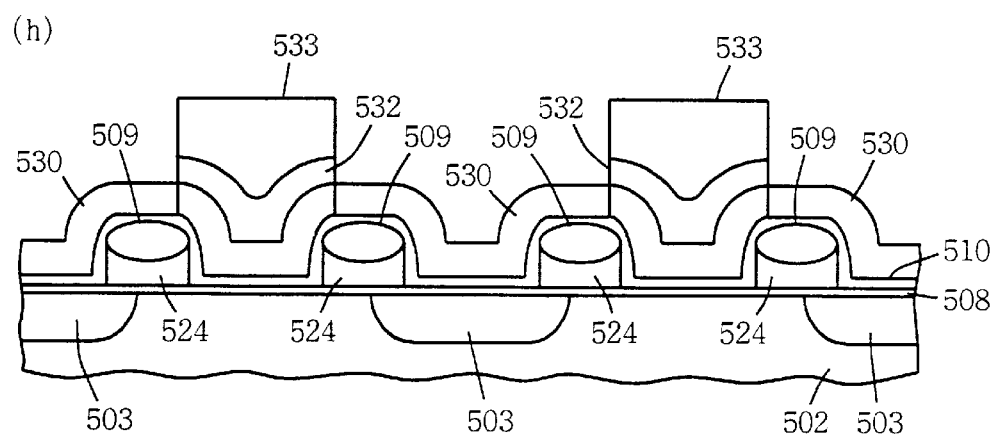
(h)
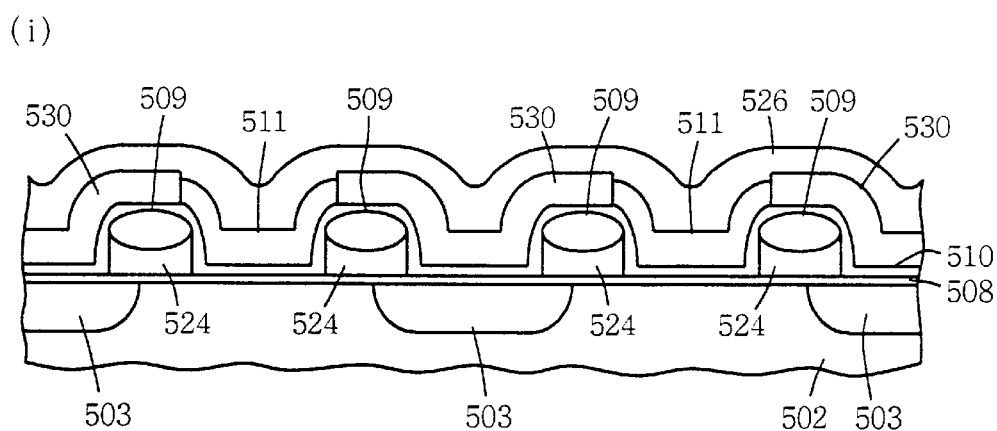
(i)

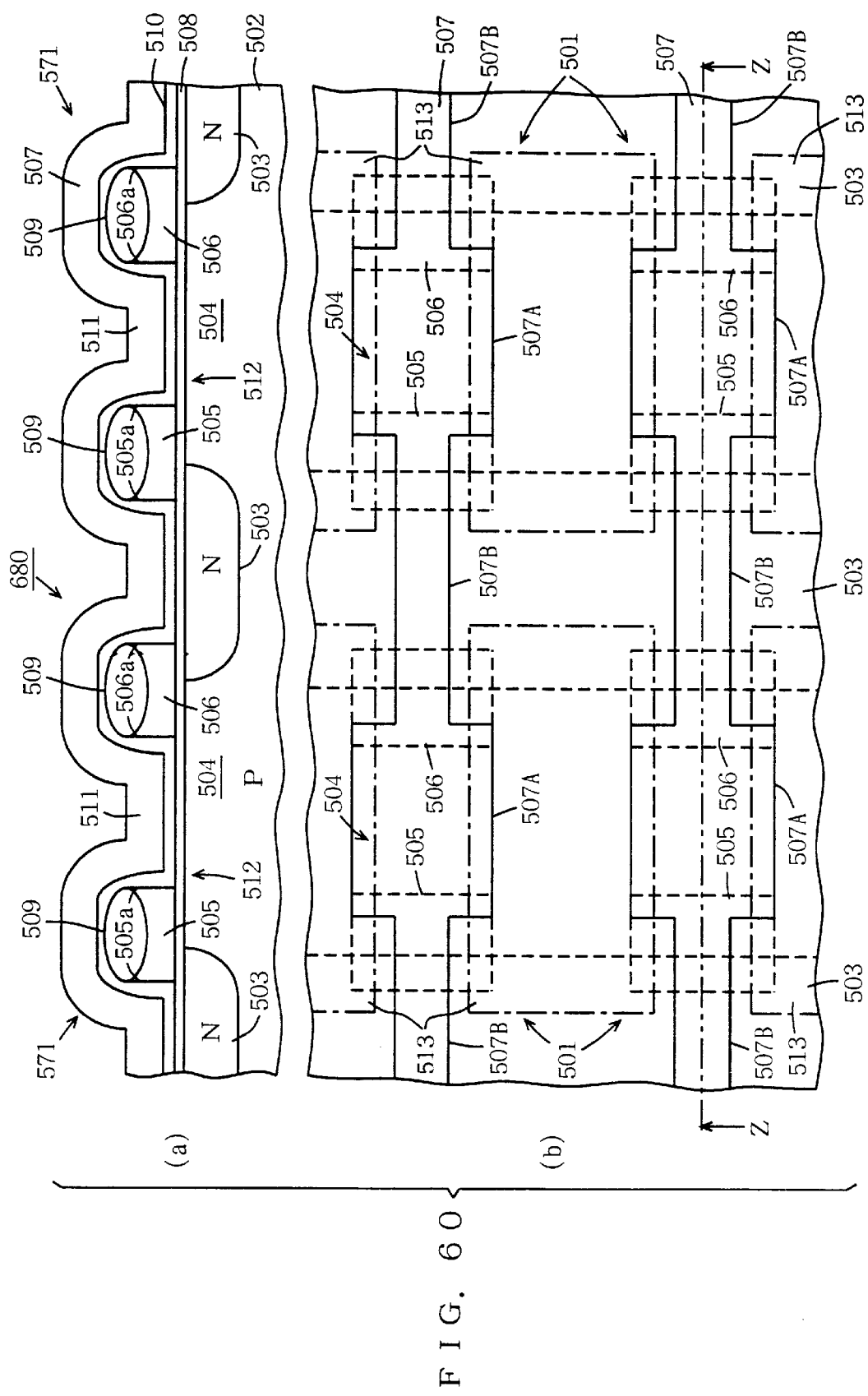
F I G. 6 0

TRANSISTOR, SEMICONDUCTOR MEMORY AND METHOD OF FABRICATING THE SAME

BACKGROUND OF THE INVENTION

1. Field of the Invention

The present invention relates to a transistor, a semiconductor memory comprising the same and a method of fabricating the same.

2. Description of the Related Art

Nonvolatile semiconductor memories such as a ferroelectric random access memory, an EPROM (erasable and programmable read only memory), an EEPROM (electrically erasable and programmable read only memory) and the like have been recently considered.

A memory cell (memory transistor) of an EPROM or an EEPROM stores charges in a floating gate electrode for storing data in response to presence/absence of the charges while sensing change of a threshold voltage resulting from presence/absence of charges for reading the data. In particular, the EEPROM includes a flash EEPROM entirely erasing data in a memory cell array or dividing the memory cell array into arbitrary blocks for erasing data in units of the blocks.

Memory cells forming the flash EEPROM are roughly classified into a stacked gate memory cell and a split gate memory cell.

In the stacked gate memory cell, a source region and a drain region are formed on a silicon substrate and a floating gate electrode in an electrically floating state is formed on a channel region held between the source region and the drain region through a silicon oxide film. A control gate electrode is formed on the floating gate electrode through a silicon oxide film.

The floating gate electrode and the control gate electrode are identical in size to each other along the direction of the channel length, and stacked with each other with no misalignment. The control gate electrode is extended in a direction perpendicular to that of the channel length to be common to a plurality of floating gate electrodes, for forming a word line.

The flash EEPROM employing stacked gate memory cells having the aforementioned structure has no function of selecting each memory cell itself. If charges are excessively extracted from the floating gate electrode for erasing data, therefore, such a problem of overerasing is caused that the memory cell regularly enters an ON state (conducting state) and is broken.

In order to prevent overerasing, the erasing procedure must be controlled in a peripheral circuit or an external circuit for the memory device.

The split gate memory cell has been developed in order to solve the problem of overerasing in the stacked gate memory cell. For example, U.S. Pat. No. 5,029,130, WO92/18980 (G11C 13/001 3/00) or the like discloses a flash EEPROM employing split gate memory cells.

FIG. 70 is a sectional view of a conventional split gate memory cell 200. Referring to FIG. 70, a source region 202 and a drain region 203 are formed on a surface of a silicon substrate 201 at a prescribed space. A floating gate electrode 206 is formed on a channel region 204 held between the source region 202 and the drain region 203 through a first insulator film 205 of silicon oxide. A control gate electrode 208 is formed on the floating gate electrode 206 through a second insulator film 207 of silicon oxide.

The source region 202, the drain region 203, the channel region 204, the first insulator film 205, the floating gate electrode 206, the second insulator film 207 and the control gate electrode 208 form the split gate memory cell (split gate transistor) 200.

A part of the control gate electrode 208 is arranged on the channel region 204 through an insulator film 209 of silicon oxide. The part of the control gate electrode 208 located on the channel region 204 forms a selection gate electrode 210. The selection gate electrode 210, the source region 202, the drain region 203 and the channel region 204 form a selection transistor 211 for selecting the memory cell 200 itself.

In other words, the split gate memory cell 200 has such a structure that a transistor formed by the gate electrodes 206 and 208 and the regions 202, 203 and 204 and the selection transistor 211 are serially connected with each other.

The split gate memory cell 200 having the aforementioned structure has a function of selecting itself with the selection transistor 211. Even if overerasing takes place, therefore, the selection transistor 211 can control conduction and non-conduction of the memory cell 200, to cause no problem.

A write operation and an erase operation in the split gate memory cell 200 are now described with reference to FIG. 71 and FIG. 72, respectively.

(a) Write Operation

In data writing, the potential of the drain region 203 is set at 0 V, a high voltage exceeding 10 V is applied to the source region 202, and a voltage of about several V is applied to the control gate electrode 208, as shown in FIG. 71. Thus, the selection transistor 211 is turned on so that electrons travel from the drain region 203 to the source region 202.

At this time, the potential of the floating gate electrode 206, which is capacitively coupled with the source region 202 through the first insulator film 205 and with the control gate electrode 208 through the second insulator film 207, increases to about 10 V, i.e., a value close to the potential of the source region 202. Therefore, the electrons travelling through the channel region 204 are attracted by the floating gate electrode 206 and injected into the same beyond a potential barrier of the first insulator film 205 as hot electrons.

When the floating gate electrode 206 thus stores electrons, no channel is formed on the channel region 204 located under the floating gate electrode 206 and no cell current flows even if a positive voltage is applied to the control gate electrode 208. This state is called a write state, in which the memory cell 200 stores data "0".

(b) Erase Operation

In data erasing, the potentials of both of the source region 202 and the drain region 203 are set at 0 V and a high voltage exceeding 10 V is applied to the control electrode 208, as shown in FIG. 72. In this case, the potential of the floating gate electrode 206, which is capacitively coupled with the source region 202 through the first insulator film 205 and with the control gate electrode 208 through the second insulator film 207, reduces to about several V, i.e., a value close to the potential of the source region 202. Thus, potential difference of about 10 V is caused between the floating gate electrode 206 and the control gate electrode 208.

Consequently, electrons stored in the floating gate electrode 206 are extracted to the control gate electrode 208 through the second insulator film 207 as a Fowler-Nordheim tunnel current (hereinafter referred to as an F-N tunnel current).

When a positive voltage is applied to the control gate electrode 208 while the electrons are extracted from the floating gate electrode 206 as described above, a channel is formed on the channel region 204 located under the control gate electrode 206 and a cell current flows. This state is called an erase state, in which the memory cell 202 stores data "1".

At this time, the electrons jump out from a projection 206a formed on the floating gate electrode 206 and move toward the control gate electrode 208. Thus, movement of the electrons is so facilitated that the electrons can be efficiently extracted from the floating gate electrode 206.

A method of fabricating such a split gate memory cell is disclosed in U.S. Pat. No. 5,045,488, for example. A thin oxide film is formed on the semiconductor substrate 201 and a polysilicon film for forming the floating gate electrode 206 is deposited on the thin oxide film. Thereafter a silicon nitride film is stacked on the polysilicon film and an opening is formed in a portion of the silicon nitride film for forming the floating gate electrode 206.

Further, the polysilicon film exposed on the opening of the silicon nitride film is oxidized in an oxidizing atmosphere, for forming an oxide film of polysilicon in the opening. Further, the remaining silicon nitride film is removed and the polysilicon film is etched through the oxide film of polysilicon serving as a mask, thereby forming the floating gate electrode 206.

However, it is difficult to highly integrate the aforementioned split gate memory cell 200 as compared with the stacked gate memory cell, as described below:

In the stacked gate memory cell, the floating gate electrode and the control gate electrode, which are identical in width to each other, are stacked with each other with no misalignment. In the split gate memory cell 200, on the other hand, a part of the control gate electrode 208 is arranged on the channel region 204 to form the selection gate electrode 210. In the split gate memory cell 200, therefore, the area occupied by the element on the silicon substrate 201 is increased by the selection gate electrode 210 as compared with the stacked gate memory cell. In other words, it is difficult to highly integrate the split gate memory cell 200, although no problem of overerasing takes place.

FIG. 73(a) is a sectional view of the conventional split gate memory cell shown in FIG. 70 taken along the line E—E in FIG. 73(b), FIG. 73(b) is a plan view of the split gate memory cell, and FIG. 73(c) is a sectional view taken along the line.

FIG. 73(a) is a sectional view of the conventional split gate memory cell shown in FIG. 70 taken along the line E—E in FIG. 73(b), FIG. 73(b) is a plan view of the split gate memory cell, and FIG. 73(c) is a sectional view taken along the line F—F FIG. 73(b), respectively.

In the write operation shown in FIG. 71, the potential of the floating gate electrode 206, which is decided by the ratio of the coupling capacitance C1 between the source electrode 202 and the floating gate electrode 206 to the coupling capacitance C2 between the floating gate electrode 206 and the control gate electrode 208, is increased as the ratio of the coupling capacitance C1 to the coupling capacitance C2 is increased.

As hereinabove described, the floating gate electrode 206 and the control gate electrode 208 form the electric capacitance through three surfaces, to increase the coupling capacitance C2 therebetween. Consequently, it is difficult to inject electrons from the channel region 204 into the floating gate electrode 206 at a high speed, and the speed of the write operation is reduced.

A word line defined by the control gate electrode 208 is formed on the silicon substrate 201 through a field isolation film 213, as shown in FIGS. 73(b) and 73(c). Thus, a wiring capacitance is formed between the control gate electrode 208 and the silicon substrate 201. This wiring capacitance delays a signal on the control gate electrode 208.

FIG. 74 is a sectional view showing another conventional split gate memory cell 701.

The split gate memory cell (split gate transistor) 701 is formed by a source region 703, a drain region 704, a channel region 705, a floating gate electrode 706 and a control gate electrode 707.

The n-type source and drain regions 703 and 704 are formed on a p-type single-crystalline silicon substrate 702. The floating gate electrode 706 is formed on the channel region 705 held between the source region 703 and the drain region 704 through a gate isolation film 708. An insulator film 709 and a tunnel isolation film 710 are formed on the floating gate electrode 706 by a LOCOS (local oxidation of silicon) method, and the control gate electrode 707 is formed on the tunnel isolation film 710. The insulator film 709 forms a projection 706a on the floating gate electrode 706.

A part of the control gate 707 is arranged on the channel region 705 through the isolation films 708 and 710, to form a selection gate 711. The selection gate 711 and the source and drain regions 703 and 704 form a selection transistor 712. In other words, the split gate memory cell 701 has such a structure that a transistor formed by the gate electrodes 706 and 707 and the regions 703 and 704 and the selection transistor 712 are serially connected with each other.

FIGS. 75(a) and 75(b) show a memory cell array 802 of a flash EEPROM employing a plurality of such split gate memory cells 701. FIG. 75(b) is a partially fragmented plan view of the memory cell array 802, and FIG. 75(a) is a sectional view taken along the line X—X in FIG. 75(b).

The memory cell array 802 is formed by the plurality of memory cells 701 formed on the p-type single-crystalline silicon substrate 702. In order to reduce the occupied area on the substrate 702, each pair of memory cells 701 (hereinafter denoted by 701a and 701b) share each source region 703 in common, and the floating gate electrodes 706 and the control gate electrodes 707 thereof are arranged to be line-symmetrical to each other about the common source region 703.

Field isolation films 713 are formed on the substrate 702 for isolating the memory cells 701 from each other. The memory cells 701 vertically arranged in FIG. 75(b) share the source regions 703 in common. Further, the memory cells 701 vertically arranged in FIG. 75(b) also share the control gate electrodes 707 in common, and these control gate electrodes 707 form word lines. On the other hand, the drain regions 704 transversely arranged in FIG. 75(b) are connected to bit lines (not shown) through bit line contacts 714.

Operation modes (write, read and erase operations) of the flash EEPROM are now described with reference to FIGS. 76(a), 76(b) and 76(c).

(a) Write Operation (see FIG. 76(a))

The drain region 704 of a selected memory cell 701 is connected to a constant current source 810a provided in a sense amplifier 810, so that its potential is set at 1.2 V. The potentials of the drain regions 704 of the remaining memory cells 701 are set at 3 V.

The potential of the control gate electrode 707 of the selected memory cell 701 is set at 2 V. The potentials of the control gate electrodes 707 of the remaining memory cells 701 are set at 0 V.

The potentials of the source regions 703 of all memory cells 701 are set at 12 V.

In each memory cell 701, the threshold voltage Vth of the selection transistor 712 is about 0.5 V. In the selected memory cell 701, therefore, electrons in the drain region 704 move to the channel region 705, which is in an inverted state. Thus, a cell current flows from the source region 703 toward the drain region 704. The potential of the source region 703 is 12 V, and hence the potential of the floating gate electrode 706 is pulled up to be close to 12 V due to coupling through the electrostatic capacitance between the source region 703 and the floating gate electrode 706. Thus, a high electric field is formed between the channel region 705 and the floating gate electrode 706. Therefore, the electrons in the channel region 705 are accelerated to form hot electrons, which in turn are injected into the floating gate electrode 706 as shown by arrow A in FIG. 76(*a*). Consequently, charges are stored in the floating gate electrode 706 of the selected memory cell 701 so that 1-bit data is written and stored therein.

This write operation can be performed every selected memory cell 701.

(b) Read Operation (see FIG. 76(*b*))

The potential of the drain region 704 of the selected memory cell 701 is set at 2 V. The potentials of the drain regions 704 of the remaining memory cells 701 are set at 0 V.

The potential of the control gate electrode 707 of the selected memory cell 701 is set at 4 V. The potentials of the control gate electrodes 707 of the remaining memory cells 701 are set at 0 V.

The potentials of the source regions 703 of all memory cells 701 are set at 0 V.

As described later, the floating gate electrode 706 of a memory cell 701 which is in an erase state stores no charges. On the other hand, the floating gate electrode 706 of a memory cell 701 which is in a write state stores charges, as described above. Therefore, the channel region 705, located immediately under the floating gate electrode 706, of the memory cell 701 in the erase state is in an ON state, while the channel region 705, located immediately under the floating gate electrode 706, of the memory cell 701 in the write state is close to an OFF state. When a voltage of 4 V is applied to the control gate electrode 707, therefore, a larger cell current flows from the drain region 704 toward the source region 703 in the memory cell 701 in the erase state, as compared with that in the write state.

The value of the data stored in the memory cell 701 can be read by determining the values of the cell currents flowing in the memory cells 701 with the sense amplifier 810. For example, the value of the data in the memory cell 701 of the erase state is set at "1" and that of the data in the memory cell 701 of the write state is set at "0" for performing the read operation. In other words, the data values "1" and "0" in the erase and write states can be stored in the memory cells 701 for reading the data values.

(c) Erase State (see FIG. 76(*c*))

The potentials of the drain regions 704 of all memory cells 701 are set at 0 V.

The potential of the control gate electrode 707 of the selected memory cell 701 is set at 15 V. The potentials of the control gate electrodes 707 of the remaining memory cells 701 are set at 0 V.

The potentials of the source regions 703 of all memory cells 701 are set at 0 V.

The electrostatic capacitance between the source region 703 and the substrate 702 and the floating gate electrode 706 is extremely larger than that between the control gate electrode 707 and the floating gate electrode 706. In other words, the floating gate electrode 706 is strongly coupled with the source region 703 and the substrate 702. Even if the potentials of the control gate electrode 707 and the drain region 704 reach 15 V and 0 V respectively, therefore, the potential of the floating gate electrode 706 substantially remains around 0 V and the potential difference between the control gate electrode 707 and the floating gate electrode 706 is increased to form a high electric field between these electrodes 707 and 706.

Consequently, a Fowler-Nordheim tunnel current (hereinafter referred to as an F-N tunnel current) flows to extract electrons in the floating gate electrode 706 toward the control gate electrode 707 as shown by arrow in FIG. 76(*c*), for erasing data stored in the memory cell 701.

At this time, the electrons in the floating gate electrode 706 jump from the projection 706*a* formed thereon and move toward the control gate electrode 707. Thus, movement of the electrons is so facilitated that the electrons can be efficiently extracted from the floating gate electrode 706.

The control gate electrodes 707 of the memory cells 701 arranged along the row direction form common word lines. Therefore, the erase operation is performed on all memory cells 701 connected to a selected word line.

A plurality of word lines can be simultaneously selected for erasing data from all memory cells 701 connected thereto. An erase operation of dividing the memory cell array 802 into arbitrary blocks for a plurality of sets of word lines and erasing data in units of the blocks is called block erasing.

In the flash EEPROM employing the split gate memory cells 701 having the aforementioned structure, each memory cell 701 has a function of selecting itself due to the selection transistor 712. Even if charges are excessively extracted from the floating gate electrode 706 for erasing data, the selection gate 711 can bring the channel region 705 into an OFF state. Even if overerasing takes place, therefore, the selection transistor 712 can control the ON/OFF state of the memory cell 701 and the overerasing causes no problem. In other words, the selection transistor 712 provided in the memory cell 701 can select the ON/OFF state of the memory cell 701 itself.

A method of fabricating the memory cell array 802 is now described in order.

(1) Step 1 (see FIG. 77(*a*))

The field isolation films 713 (not shown) are formed on the substrate 702 by LOCOS. Then, the gate isolation film 708 of silicon oxide is formed on portions (element regions) of the substrate 702 provided with no field isolation films 713 by thermal oxidation. Then, a doped polysilicon film 715 for defining the floating gate electrodes 706 is formed on the gate isolation film 708. Then, a silicon nitride film 716 is formed on the overall surface of the doped polysilicon film 715 by LPCVD (low-pressure chemical vapor deposition). Then, a photoresist is applied to the overall surface of the silicon nitride film 716 and thereafter an etching mask 717 for defining the floating gate electrodes 706 is formed by general photolithography.

(2) Step 2 (see FIG. 77(b))

The silicon nitride film 716 is anisotropically etched through the etching mask 717. Then, the etching mask 717 is removed. Then, the doped polysilicon film 715 is oxidized by LOCOS through the etched silicon nitride film 716 serving as an oxidation mask, thereby forming the insulator films 709. At this time, ends of the insulator films 709 enter end portions of the silicon nitride film 716, to form bird's beaks 709a.

(3) Step 3 (see FIG. 77(c))

The silicon nitride film 716 is removed. Then, the doped polysilicon film 715 is anisotropically etched through the insulator films 709 serving as etching masks, for forming the floating gate electrodes 706. At this time, upper edge portions of the floating gate electrodes 706 sharpen along the shapes of the bird's beaks 709a formed on the end portions of the insulator films 709, to form the projections 706a.

(4) Step 4 (see FIG. 77(d))

The tunnel isolation film 710 of silicon oxide is formed on the overall surface of the device formed in the aforementioned step by thermal oxidation and/or LPCVD. Thus, the stacked isolation films 708 and 710 and the stacked insulator and isolation films 709 and 710 are integrated with each other respectively.

(5) Step 5 (see FIG. 78(e))

A doped polysilicon film 718 for defining the control gate electrodes 707 is formed on the overall surface of the device formed in the aforementioned step.

(6) Step 6 (see FIG. 78(f))

A photoresist is applied to the overall surface of the device formed in the aforementioned step, and thereafter an etching mask 719 for defining the control gate electrodes 707 is formed by general photolithography.

(7) Step 7 (see FIG. 78(g))

The doped polysilicon film 718 is anisotropically etched through the etching mask 719 for forming the control gate electrodes 707. Thereafter the etching mask 719 is removed.

(8) Step 8 (see FIG. 79(h))

A photoresist is applied to the overall surface of the device formed in the aforementioned step and thereafter an ion implantation mask 720 for defining the source regions 703 is formed by general photolithography. Then, phosphorus ions (P$^+$) are injected into the surface of the substrate 702 by general ion implantation for forming the source regions 703. Thereafter the ion implantation mask 720 is removed.

At this time, the ion implantation mask 720 is so formed as to cover at least portions of the substrate 702 for forming the drain regions 704 while not jutting out from the floating gate electrodes 706. Consequently, end portions of the floating gate electrodes 706 define the positions of the source regions 703.

(9) Step 9 (see FIG. 79(i))

A photoresist is applied to the overall surface of the device formed in the aforementioned step and thereafter an ion implantation mask 721 for defining the drain regions 704 is formed by general photolithography. Then, arsenic ions (As$^+$) are injected into the surface of the substrate 702 by general ion implantation for forming the drain regions 704.

At this time, the ion implantation mask 721 is so formed as to cover at least the source regions 703 while not jutting out from the control gate electrodes 707. Consequently, end portions of the control gate electrodes 707 closer to the selection gates 711 define the positions of the drain regions 704.

Then, the ion implantation mask 721 is removed for completing the memory cell array 802.

However, the flash EEPROM employing the aforementioned split gate memory cells 701 has the following problems:

(1) The write characteristics of the memory cells 701 are dispersed due to misalignment of the etching mask 719 for forming the control gate electrodes 707.

(1) If the position of the etching mask 719 for forming the control gate electrodes 707 is misaligned with respect to the memory cells 701a and 701b in the step 6 as shown in FIG. 80(a), the control gate electrodes 707 of the memory cells 701a and 701b are formed in shapes different from each other in the step 7.

In formation of the drain regions 704 by ion implantation in the step 9, the end portions of the control gate electrodes 707 closer to the selection gates 711 define the positions of the drain regions 704.

When the position of the etching mask 719 is misaligned as shown in FIG. 80(a), therefore, the lengths (channel lengths) L1 and L2 of the channel regions 705 of the memory cells 701a and 701b differ from each other, as shown in FIG. 80(b). When the position of the etching mask 719 is misaligned toward the memory cell 701b, for example, the channel length L2 of the memory cell 701b is smaller than the channel length L1 of the memory cell 701a.

When the channel lengths L1 and L2 are different from each other, the channel regions 705 are also different in resistance from each other and hence the values of cell currents flowing in the write operation differ from each other. As the channel length is increased, the resistance of each channel region 705 is increased and the cell current flowing in the write operation is reduced. When the values of the cell currents flowing in the write operation differ from each other, the rates of generation of hot electrons also differ from each other. Consequently, the memory cells 701a and 701b have different write characteristics.

(2) Refinement of the memory cells 701 is inhibited due to avoidance of the aforementioned problem (1).

When designing the split gate memory cell 701, the positional relation between the gate electrodes 706 and 707 and the regions 703 and 704 must previously be set with allowance in consideration of not only dimensional accuracy of worked line widths of the gate electrodes 706 and 707 but also superposition dimensional accuracy of the gate electrodes 706 and 707. When working a thin line of about 0.5 μm in width through a recent semiconductor refinement technique, however, obtained superposition dimensional accuracy is only about 0.1 to 0.2 μm, although dimensional accuracy for the worked line width is obtained up to about 0.05 μm. In other words, refinement of the split gate memory cell 701 is hindered due to the low superposition dimensional accuracy for the gate electrodes 706 and 707.

(3) The split gate memory cell 701 is hard to refine as compared with the stacked gate memory cell.

In the stacked gate memory cell, the floating gate electrode and the control gate electrode, which are identical in width to each other, are stacked with each other with no misalignment. In the split gate memory cell 701, on the other hand, a part of the control gate electrode 707 is arranged on the channel region 705 to form the selection gate 711. In the split gate memory cell 701, therefore, the area occupied by the element on the substrate 702 is increased by the selection gate 711 as compared with the stacked gate memory cell. In other words, it is difficult to highly integrate the split gate memory cell due to the aforementioned problems (2) and (3), although the same has no problem of overerasing.

(4) The memory cell array 802 employing the split gate memory cells 701 is complicated in structure and requires a long time for fabrication.

SUMMARY OF THE INVENTION

An object of the present invention is to provide a transistor capable of a high-speed operation and a semiconductor memory employing the same.

Another object of the present invention is to provide a method of fabricating a semiconductor memory capable of a high-speed operation.

Still another object of the present invention is to provide a transistor capable of a high-speed operation and high integration and a semiconductor memory employing the same.

A further object of the present invention is to provide a method of fabricating a semiconductor memory capable of a high-speed operation and high integration.

A further object of the present invention is to provide a semiconductor memory which causes no dispersion in write characteristics, has a high operating speed, can be refined, causes no overerasing, and can improve write and read characteristics, and a method of fabricating the same.

A transistor according to an aspect of the present invention comprises two cells having floating gate electrodes, respectively, and sharing a control gate electrode serving also as a selection gate electrode and an interconnection layer arranged above the floating gate electrodes of the two cells through an interlayer isolation film, and the control gate electrode is connected to the interconnection layer.

The transistor, having the two cells sharing the control gate electrode serving also as the selection gate electrode, can be highly integrated. The interconnection layer is arranged above the floating gate electrodes through the interlayer isolation film, whereby the capacitance between the interconnection layer and a substrate is reduced. Thus, signal delay on the interconnection layer is reduced to enable a high-speed operation.

The floating gate electrode of each cell is preferably opposed to the control gate electrode at one surface through an insulator film.

In this case, the floating gate electrode is opposed to the control gate electrode at one surface through the insulator film, whereby the opposition areas of the floating gate electrode and the control gate electrode are reduced as compared with those in the conventional transistor and the coupling capacitance between the floating gate electrode and the control gate electrode is reduced. Therefore, the potential of the floating gate electrode can be readily increased for injecting charges into the floating gate electrode at a high speed. Consequently, a high-speed write operation is enabled.

The floating gate electrode of each cell may have a projection on the side opposed to the control gate electrode.

In this case, charges can be efficiently extracted from the floating gate electrode of each cell, having the projection on the side opposed to the control gate electrode, to the control gate electrode.

The two cells may further include a common channel region and two impurity regions provided through the channel region so that the two floating gate electrodes are arranged on the channel region at a prescribed space through a first insulator film, the control gate electrode extends from above the channel region located between the two floating gate electrodes to above the two floating gate electrodes respectively through a second insulator film and the interconnection layer is arranged above the two impurity regions and the two floating gate electrodes through an interlayer isolation film.

The transistor, having the two floating gate electrodes sharing the control gate electrode, can be highly integrated. The part of the control gate electrode located on the channel region serves as the selection gate electrode, to cause no problem of overerasing.

The control gate electrode extends from above the channel region toward above the two floating gate electrodes and one side of each floating gate electrode is opposed to the control gate electrode, whereby the opposition areas of the floating gate electrode and the control gate electrode are reduced as compared with those in the conventional transistor and the coupling capacitance between the floating gate electrode and the control gate electrode is reduced. Therefore, the potential of the floating gate electrode can be readily increased for injecting charges from the channel region into the floating gate electrode at a high speed. Consequently, a high-speed write operation is enabled.

The interconnection layer is arranged above the floating gate electrodes through the interlayer isolation film, whereby the capacitance between the interconnection layer and the substrate is reduced. Thus, signal delay on the interconnection layer is reduced and a high-speed operation is enabled.

Charges may be injected from the channel region into one of the two floating gate electrodes by hot carriers in a write operation, while charges may be extracted from the two floating gate electrodes to the control gate electrode by tunnel currents in an erase operation.

In this case, the potential of each floating gate electrode can be readily increased due to the small coupling capacitance between the floating gate electrode and the control gate electrode, for enabling a high-speed write operation.

A semiconductor memory according to another aspect of the present invention comprises a plurality of word lines extending in a first direction, a plurality of bit lines extending in a second direction intersecting with the first direction and a plurality of transistors connected between each pair of bit lines and arranged along each word line. Each transistor includes a channel region, two impurity regions provided through the channel region for partially forming the corresponding bit lines respectively, two floating gate electrodes arranged on the channel region at a prescribed space through a first insulator film and a control gate electrode extending from above the channel region located between the two floating gate electrodes to above the two floating gate electrodes respectively through a second insulator film. Each word line is arranged above the impurity regions and the floating gate electrodes of the corresponding plurality of transistors arranged along the first direction through an interlayer isolation film and connected to the control gate electrodes of the corresponding plurality of transistors.

The semiconductor memory, having the transistors each provided with the two floating gate electrodes sharing the control gate electrode, can be highly integrated. Further, a part of the control gate electrode located on the channel region serves as a selection transistor, to cause no problem of overerasing.

The control gate electrode of each transistor extends from above the channel region to above the two floating gate electrodes and one side of each floating gate electrode is opposed to the control gate electrode, whereby the opposition areas of the floating gate electrode and the control gate electrode are reduced as compared with those in the conventional semiconductor memory and the coupling capacitance between the floating gate electrode and the control gate electrode is reduced. Therefore, the potential of the floating gate electrode can be readily increased and for injecting charges from the channel region into the floating gate electrode at a high speed. Consequently, a high-speed write operation is enabled.

Further, each word line is arranged above the impurity regions and the floating gate electrodes of the transistors through the interlayer isolation film, whereby the capacitance between the word line and a substrate is reduced. Thus, signal delay on the word line is reduced and a high-speed operation is enabled.

The two floating gate electrodes of each transistor may have projections at least on the sides closer to the control gate electrode.

In this case, charges can be efficiently extracted from the floating gate electrodes of each transistor to the control gate electrode due to the projections provided on the sides of the floating gate electrodes closer to the control gate electrode. Therefore, an erase operation can be performed at a high speed.

Each transistor may share one of the two impurity regions with another transistor adjacent to one side thereof in the first direction while sharing the remaining one of the two impurity regions with still another transistor adjacent to the other side thereof in the first direction.

In this case, each adjacent pair of transistors share either impurity region, whereby the semiconductor memory can be highly integrated.

The semiconductor memory may further comprise a selection circuit for selecting one or more of the plurality of transistors and a potential set circuit for setting the potentials of the plurality of bit lines and the plurality of word lines so that charges are injected into one of the floating gate electrodes from the channel region of a transistor selected by the selection circuit by hot carriers in a write operation while setting the potentials of the plurality of bit lines and the plurality of word lines so that charges are extracted from one or both of the floating gate electrodes to the control gate electrode of a transistor selected by the selection circuit by a tunnel current in an erase operation.

A method of fabricating a semiconductor memory, including a plurality of transistors arranged in the form of a matrix in a first direction and a second direction intersecting with the first direction, according to still another aspect of the present invention comprises steps of forming a plurality of pairs of floating gate electrodes corresponding to the plurality of transistors on a semiconductor substrate along the first direction through a first insulator film, forming a plurality of impurity regions in portions of the semiconductor substrate between the floating gate electrodes of the transistors adjacent to each other in the first direction, forming a plurality of control gate electrodes corresponding to the plurality of transistors from above regions of the semiconductor substrate held between the pairs of floating gate electrodes to above the pairs of floating gate electrodes in the first direction through a second insulator film respectively, forming an interlayer isolation film on the plurality of impurity regions and the plurality of pairs of floating gate electrodes, and forming an interconnection layer for a plurality of word lines connected in common to the control gate electrodes of the plurality of transistors arranged in the first direction on the interlayer isolation film located on the plurality of impurity regions and the plurality of floating gate electrodes.

According to the inventive method, the semiconductor memory having the transistors each provided with the two floating gate electrodes sharing the control gate electrode can be highly integrated. A part of the control gate electrode located on the channel region serves as a selection transistor, to cause no problem of overerasing.

The control gate electrode of each transistor extends from above a region held between the pair of floating gate electrodes to above the floating gate electrodes while one side of each floating gate electrode is opposed to the control gate electrode, whereby the opposition areas of the floating gate electrode and the control gate electrode are reduced as compared with those in the conventional semiconductor memory and the coupling capacitance between the floating gate electrode and the control gate electrode is reduced. Therefore, the potential of the floating gate electrode can be readily increased for injecting charges from the channel region into the floating gate electrode at a high speed. Consequently, a high-speed write operation is enabled.

Further, the interconnection layer for the word lines is arranged above the plurality of impurity regions and the pairs of floating gate electrodes through the interlayer isolation film, whereby the capacitance between the word line and a substrate is reduced. Thus, signal delay on the word line is reduced and a high-speed operation is enabled.

The method may further comprise a step of forming projections on at least parts of opposed sides of each pair of floating gate electrodes.

In this case, the floating gate electrodes of each transistor have the projections on the sides opposed to the control gate electrode, whereby charges can be efficiently extracted from the floating gate electrodes to the control gate electrode.

The method may further comprise a step of reducing the thickness of the interlayer isolation film so that upper surfaces of the control gate electrodes of the plurality of transistors are exposed.

In this case, no contact holes may be formed in the interlayer isolation film for connecting the interconnection layer for the word lines to the plurality of control gate electrodes. Thus, the number of fabrication steps is reduced.

The method may further comprise steps of forming a mask on the interconnection layer for the plurality of word lines and successively patterning the interconnection layer for the plurality of word lines, the control gate electrodes and the floating gate electrodes through the mask.

Thus, the control gate electrodes and the floating gate electrodes can be formed in a self-alignment manner with respect to the word lines, whereby refinement can be enabled by reducing positioning allowance with no requirement for consideration of misalignment in lithography steps. Further, dispersion in coupling capacitance between the control gate electrodes and the floating gate electrodes is reduced. Thus, dispersion in characteristics is reduced and the element characteristics as well as the fabrication yield can be improved.

A transistor according to a further aspect of the present invention comprises a floating gate electrode, a control gate electrode serving also as a selection gate electrode and an interconnection layer arranged above the floating gate electrode through an interlayer isolation film, and the control gate electrode is connected to the interconnection layer.

In this transistor, the interconnection layer is arranged above the floating gate electrode through the interlayer isolation film, whereby the capacitance between the interconnection layer and a substrate is reduced. Thus, signal delay on the interconnection layer is reduced and a high-speed operation is enabled.

The floating gate electrode is preferably opposed to the control gate electrode at one surface through an insulator film.

In this case, the floating gate electrode is opposed to the control gate electrode at one surface through the insulator film, whereby the opposition areas of the floating gate electrode and the control gate electrode are reduced as compared in the conventional transistor and the coupling capacitance between the floating gate electrode and the control gate electrode is reduced. Thus, the potential of the floating gate electrode can be readily increased for injecting charges into the floating gate electrode at a high speed. Consequently, a high-speed write operation is enabled.

The floating gate electrode may have a projection on the side opposed to the control gate electrode. In this case, charges can be efficiently extracted from the floating gate electrode to the control gate electrode due to the projection provided on the side of the floating gate electrode opposed to the control gate electrode.

The transistor may further comprise a channel region and first and second impurity regions provided through the channel region so that the floating gate electrode is arranged on a side of the channel region closer to the first impurity region through a first insulator film, the control gate electrode extends from above a side of the channel region closer to the second impurity region to above the floating gate electrode through a second insulator film and the interconnection layer is arranged above the floating gate electrode through an interlayer isolation film.

In this case, the part of the control gate electrode located on the channel region serves as a selection gate electrode, to cause no problem of overerasing.

The control gate electrode extends from above the channel region to above the floating gate electrode and one side of the floating gate electrode is opposed to the control gate electrode, whereby the opposition areas of the floating gate electrode and the control gate electrode are reduced as compared in the conventional transistor and the coupling capacitance between the floating gate electrode and the control gate electrode is reduced. Therefore, the potential of the floating gate electrode can be readily increased for injecting charges from the channel region into the floating gate electrode at a high speed. Consequently, a high-speed write operation is enabled.

The interconnection layer is arranged above the floating gate electrode through the interlayer isolation film, whereby the capacitance between the interconnection layer and a substrate is reduced. Thus, signal delay on the interconnection layer is reduced and a high-speed operation is enabled.

A semiconductor memory according to a further aspect of the present invention comprises a plurality of bit lines extending in a first direction, a plurality of word lines extending in a second direction intersecting with the first direction and a plurality of transistors provided at intersection points between the plurality of bit lines and the plurality of word lines. Each transistor includes a channel region, first and second impurity regions provided through the channel region, a floating gate electrode arranged on a side of the channel region closer to the first impurity region through a first insulator film and a control gate electrode extending from above a side of the channel region closer to the second impurity region to above the floating gate electrode through a second insulator film, and each word line is arranged above the floating gate electrodes of a plurality of corresponding transistors arranged along the second direction through an interlayer isolation film and connected to the control gate electrodes of the corresponding plurality of transistors.

In this semiconductor memory, a part of the control gate electrode located on each channel region serves as a selection transistor, to cause no problem of overerasing.

The control gate electrode of each transistor extends from above the channel region to above the floating gate electrode and one side of the floating gate electrode is opposed to the control gate electrode, whereby the opposition areas of the floating gate electrode and the control gate electrode are reduced as compared with those in the conventional semiconductor memory and the coupling capacitance between the floating gate electrode and the control gate electrode is reduced. Therefore, the potential of the floating gate electrode can be readily increased and for injecting charges from the channel region into the floating gate electrode at a high speed. Consequently, a high-speed write operation is enabled.

Each word line is arranged above the floating gate electrodes of the corresponding plurality of transistors arranged along the second direction through the interlayer isolation film, whereby the capacitance between the word line and a substrate is reduced. Thus, signal delay on the word line is reduced and a high-speed operation is enabled.

Each bit line may be connected to the second impurity regions of the corresponding plurality of transistors arranged along the first direction.

The floating gate electrode of each transistor is preferably opposed to the control gate electrode at one surface through an insulator film.

In this case, the floating gate is opposed to the control gate electrode at one surface through the insulator film, whereby the opposition areas of the floating gate electrode and the control gate electrode are reduced as compared with those in the conventional semiconductor memory and the coupling capacitance between the floating gate electrode and the control gate electrode is reduced. Therefore, the potential of the floating gate electrode can be readily increased for injecting charges into the floating gate electrode at a high speed. Consequently, a high-speed write operation is enabled.

The one surface of the floating gate electrode of each transistor may be the side surface closer to the first impurity region.

Each transistor may share the first impurity region with another transistor adjacent to one side thereof in the first direction while sharing the second impurity region with still another transistor adjacent to the other side thereof in the first direction.

In this case, each adjacent pair of transistors share either impurity region, whereby the semiconductor memory can be highly integrated.

The floating gate electrode of each transistor may have a projection on the side opposed to the control gate electrode.

In this case, charges can be effectively extracted from the floating gate electrode, having the projection on the side opposed to the control gate electrode, to the control gate electrode.

The semiconductor memory may further include a selection circuit for selecting one or more of the plurality of transistors and a potential set circuit for setting the potentials of the plurality of bit lines and the plurality of word lines so that charges are injected from the channel region of any transistor selected by the selection circuit into the floating gate electrode by hot carriers in a write operation while setting the potentials of the plurality of bit lines and the plurality of word lines so that charges are extracted from the floating gate electrode to the control gate electrode of any transistor selected by the selection circuit by a tunnel current in an erase operation.

A method of fabricating a semiconductor memory, including a plurality of transistors arranged in the form of a matrix in a first direction and a second direction intersecting with the first direction, according to a further aspect of the present invention comprises steps of forming a plurality of floating gate electrodes of the plurality of transistors on a semiconductor substrate along the first direction through a first insulator film, forming a plurality of control gate electrodes of the plurality of transistors from regions on the semiconductor substrate to above the floating gate electrodes in the first direction through a second insulator film respectively, forming a plurality of impurity regions of the plurality of transistors on portions of the semiconductor substrate located on both sides of the floating and control gate electrodes respectively, forming an interlayer isolation film on the semiconductor substrate and the plurality of floating gate electrodes, and forming interconnection layers for a plurality of word lines connected in common to a plurality of control gate electrodes of a plurality of transistors arranged in the second direction on the interlayer isolation film.

According to this method, a part of the control gate electrode located on each channel region serves as a selection transistor, to cause no problem of overerasing.

The control gate electrode of each transistor extends from above the semiconductor substrate to above the floating gate electrode and one side of the floating gate electrode is opposed to the control gate electrode, whereby the opposition areas of the floating gate electrode and the control gate electrode are reduced as compared with those in the conventional semiconductor memory and the coupling capacitance between the floating gate electrode and the control gate electrode is reduced. Therefore, the potential of the floating gate electrode can be readily increased for injecting charges from the channel region into the floating gate electrode at a high speed. Consequently, a high-speed write operation is enabled. The interconnection layers for the word lines are arranged on the interlayer isolation film along the second direction, whereby the capacitance between each word line and the substrate is reduced. Thus, signal delay on the word line is reduced, and a high-speed operation is enabled.

The method may further comprise a step of forming a projection on an edge portion of at least the side of the floating gate electrode of each transistor opposed to the control gate electrode.

In this case, the floating gate electrode of each transistor has the projection on the side opposed to the control gate electrode, whereby charges can be efficiently extracted from the floating gate electrode to the control gate electrode.

The method may further comprise a step of reducing the thickness of the interlayer isolation film so that upper surfaces of the control gate electrodes of the plurality of transistors are exposed.

In this case, no contact holes may be formed in the interlayer isolation film for connecting the interconnection layer for the word lines to the plurality of control gate electrodes. Thus, the number of fabrication steps is reduced.

A semiconductor memory according to a further aspect of the present invention comprises a semiconductor substrate, one or more control lines arranged above the semiconductor substrate, a plurality of impurity regions provided in the semiconductor substrate along the one or more control lines at a prescribed space, a plurality of channel regions provided on the semiconductor substrate between the plurality of impurity regions and a plurality of floating gate electrodes arranged on the plurality of channel regions, and the electrostatic capacitance between the control line on each channel region and the semiconductor substrate is set larger than that between the control line on each impurity region and the semiconductor substrate.

The electrostatic capacitance between each floating gate electrode and the semiconductor substrate may be set larger than that between each floating gate electrode and the control line.

Each of the one or more control lines may form a control gate electrode above each floating gate electrode while forming a selection gate electrode above each channel region.

Each of the one or more control lines may include a lower layer having non-conductivity on each impurity region while having conductivity on each channel region, and an upper layer, formed on the lower layer, having conductivity. The lower layer may be a conductor layer partially oxidized on each impurity region.

The semiconductor memory may further comprise a plurality of conductive block layers selectively formed on the plurality of impurity regions respectively and electrically connected with the plurality of impurity regions respectively, so that the plurality of floating gate electrodes are adjacent to the plurality of conductive block layers through a dielectric member.

Each of the one or more control lines may include a lower layer, separated into a plurality of parts, having conductivity, and an upper layer, formed on the lower layer, having conductivity, and a part of the lower layer located on each channel region may be electrically connected with the upper layer, while a part of the lower layer located on each impurity region may be isolated from the upper layer for forming the conductive block layer.

Each of the one or more control lines may have a width smaller than that of each floating gate electrode.

Each of the one or more control lines may have a first width on each channel region while having a second width smaller than the first width on each impurity region. The first width may be substantially equal to the width of each floating gate electrode, and the second width may be smaller than the width of each floating gate electrode.

Each floating gate electrode may have a sharp-angled projection on an upper edge portion opposed to the control line.

The plurality of floating gate electrodes may be arranged on each channel region at a prescribed space, and each of the one or more control lines may form a control gate electrode on the floating gate electrode located on each channel region while forming a selection gate electrode on the channel region located between the floating gate electrodes.

The one or more control lines may include a plurality of control lines, the plurality of impurity regions and the plurality of channel regions may be arranged in the form of a matrix along the direction of the plurality of control lines and a direction intersecting with the plurality of control lines, and the plurality of impurity regions arranged in the direction intersecting with the plurality of control lines may form bit lines respectively.

According to the present invention, a semiconductor memory which has no dispersion in write operation, can be refined, has a small problem of overerasing and can improve write and read characteristics by attaining optimization of the electrostatic capacitances in the channel region parts and those in the impurity region parts.

The foregoing and other objects, features, aspects and advantages of the present invention will become more apparent from the following detailed description of the

BRIEF DESCRIPTION OF THE DRAWINGS

FIG. 40(a) is a sectional view showing an eleventh step in the method of fabricating the memory cell array shown in FIGS. 30(a) to 30(c) taken along the line E—E in FIG. 40(b), FIG. 40(b) is a plan view showing the step and FIG. 40(c) is a sectional view taken along the line F—F in FIG. 40(b);

FIG. 43(a) is a sectional view showing a fourteenth step in the method of fabricating the memory cell array shown in FIGS. 30(a) to 30(c) taken along the line E—E in FIG. 43(b), FIG. 43(b) is a plan view showing the step and FIG. 43(c) is a sectional view taken along the line F—F in FIG. 43(b);

FIG. 46 is a block diagram showing the overall structure of the nonvolatile semiconductor memory according to the third embodiment of the present invention;

FIG. 47 is a partially fragmented sectional view for illustrating a function of the nonvolatile semiconductor memory according to the third embodiment of the present invention;

FIG. 48 is a partially fragmented circuit diagram for illustrating a function of the nonvolatile semiconductor memory according to the third embodiment of the present invention;

FIGS. 54(d) to 54(f) are sectional views showing steps of fabricating the nonvolatile semiconductor memory according to the third embodiment of the present invention;

FIGS. 55(g) to 55(i) are sectional views showing steps of fabricating the nonvolatile semiconductor memory according to the third embodiment of the present invention;

FIG. 60(a) is a sectional view of a nonvolatile semiconductor memory according to a fifth embodiment of the present invention taken along the line Z—Z in FIG. 60(b), and FIG. 60(b) is a partially fragmented plan view showing the step;

DESCRIPTION OF THE PREFERRED EMBODIMENTS

First Embodiment

Figure 1:
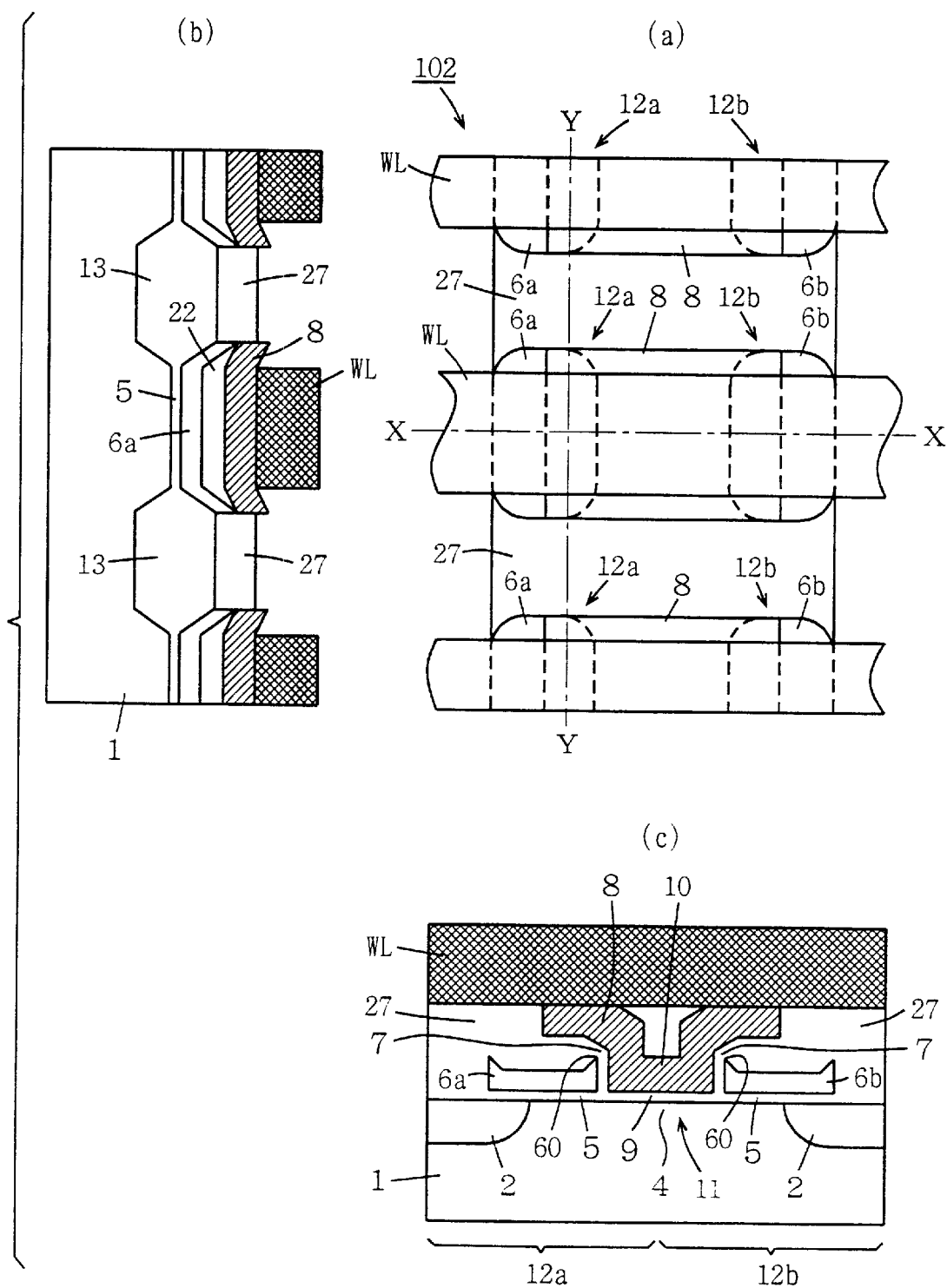
FIGS. 1(a) is a plan view showing a memory cell array of a nonvolatile semiconductor memory according to a first embodiment of the present invention.
FIGS. 1(b) and 1(c) are sectional views taken along the lines Y—Y and X—X in FIG. 1(a) respectively.

FIG. 1(a) is a plan view of a memory cell array 102 of a nonvolatile semiconductor memory 101 according to a first embodiment of the present invention, FIG. 1(b) is a sectional view of the memory cell array 102 taken along the line Y—Y in FIG. 1(a), and FIG. 1(c) is a sectional view of the memory cell array 102 taken along the line X—X in FIG. 1(a).

Referring to FIGS. 1(a) to 1(c), the memory cell array 102 is formed by a plurality of split gate memory cells 12a and 12b arranged in the form of a matrix. Each pair of memory cells 12a and 12b form a single split gate transistor. N-type source/drain regions 2 doped with an n-type impurity are formed on a surface of a p-type single-crystalline silicon substrate 1 at a prescribed space. A region of the silicon substrate 1 located between each pair of source/drain regions 2 defines a channel region 4. Each source/drain region 2 serves as a source or a drain.

A floating gate electrode 6a is formed on one of the source/drain regions 2 located on the channel region 4 through a first insulator film 4 while another floating gate electrode 6b is formed on the other source/drain region 2 located on the channel region 4 through the first insulator film 5. Projections 60 are formed on peripheral edge parts of upper surfaces of the floating gate electrodes 6a and 6b, respectively.

A control gate electrode 8 is formed on a region over single side surfaces and upper portions of the floating gate electrodes 6a and 6b through a second insulator film 7 of silicon oxide.

The control gate electrode 8 partially extends onto the channel region 4 located between the floating gate electrodes 6a and 6b through an insulator film 9 of silicon oxide. The part of the control gate electrode 8 located on the channel region 4 forms a selection gate electrode 10. The parts of the control gate electrode 8 located on the side surfaces and the upper portions of the floating gate electrodes 6a and 6b and the selection gate electrode 10 are integrated with each other. The control gate electrode 8 is in contact with the floating gate electrodes 6a and 6b at one surface through the second insulator film 7.

The two source/drain regions 2, the channel region 4, the first and second insulator films 5 and 7, the insulator film 9, the floating gate electrode 6a and the control gate electrode 8 form the memory cell 12a. The two source/drain regions 2, the channel region 4, the first and second insulator films 5 and 7, the insulator film 9, the floating gate electrode 6b and the control gate electrode 8 form the memory cell 12b. Further, the two source/drain regions 2, the channel region 4, the insulator film 9 and the control gate electrode 8 form a selection transistor 11 for selecting the memory cells 12a and 12b.

On the silicon substrate 1, the first insulator film 5, the second insulator film 7 and the insulator film 9 are stacked and integrated with each other except the regions of the floating gate electrodes 6a and 6b. As shown in FIG. 1(b), a field isolation film 13 is formed on the silicon substrate 1 for electrically isolating the memory cells 12a and 12b from each other. An interlayer isolation film 27 is provided on the source/drain regions 2 and the floating gate electrodes 6a and 6b on the silicon substrate 1.

Word lines WL are arranged on the interlayer isolation film 27 along the channel length direction of the channel regions 4 located between the source/drain regions 2. The control gate electrodes 8 are connected to the word lines WL. The source/drain regions 2 extend in a direction perpendicular to the word lines WL, to be employed as bit lines. The word lines WL are connected to a row address decoder described later, and the bit lines are connected to a column address decoder described later. Thus, a flash EEPROM is formed.

The nonvolatile semiconductor memory according to the first embodiment, provided with the selection transistor 11 for each pair of memory cells 12a and 12b, has a function of selecting each memory cell 12a or 12b itself. Even if overerasing takes place, therefore, no problem arises since the selection transistor 11 can control conduction and non-conduction of the memory cells 12a and 12b.

Figure 2:
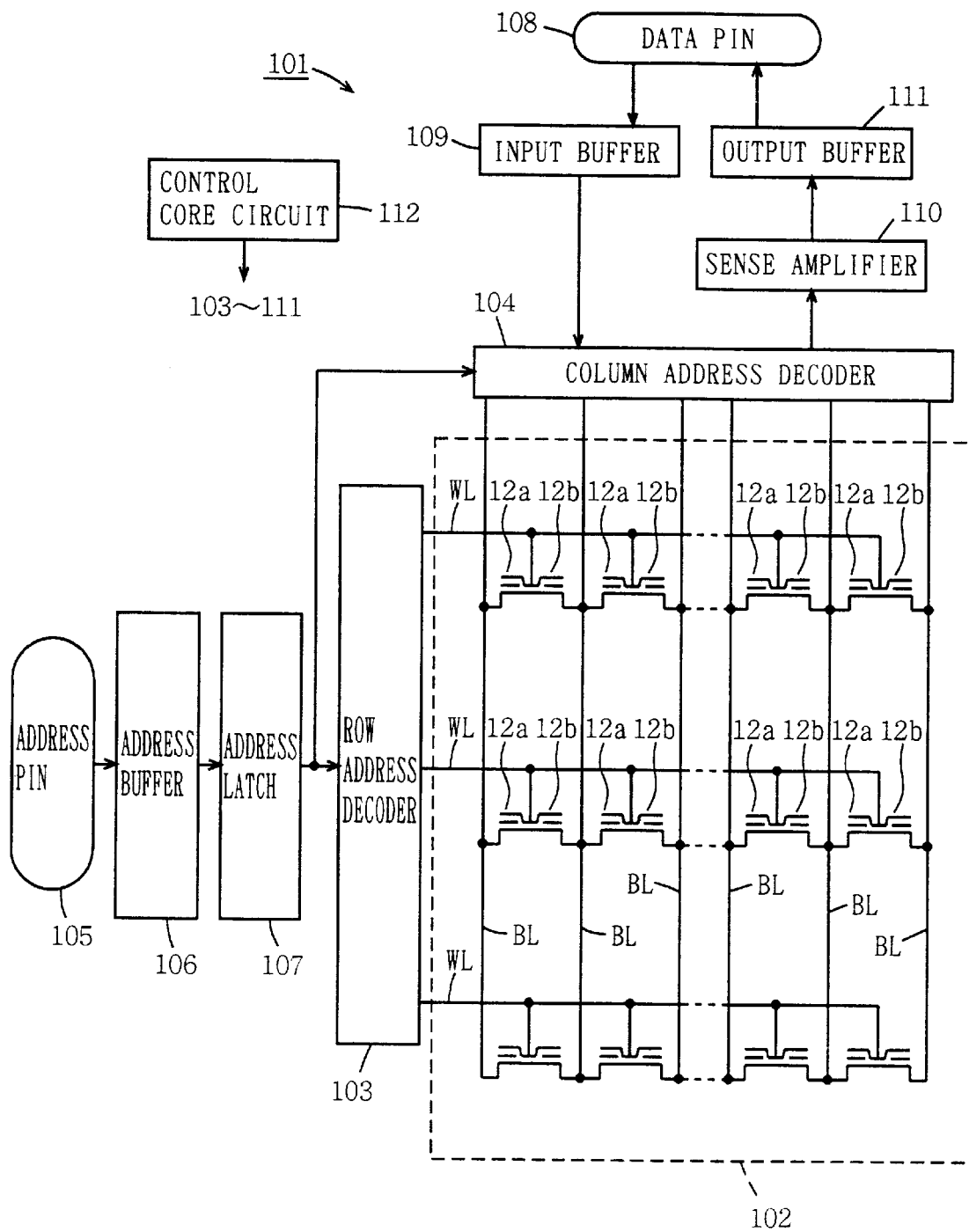
FIG. 2 is a block diagram showing the overall structure of the nonvolatile semiconductor memory according to the first embodiment of the present invention.

FIG. 2 illustrates the overall structure of the nonvolatile semiconductor memory 101 according to this embodiment. The nonvolatile semiconductor memory 101 according to this embodiment is a flash EEPROM employing split gate memory cells.

In the memory cell array 102 of the nonvolatile semiconductor memory 101 shown in FIG. 2, a plurality of bit lines BL and a plurality of word lines WL are arranged to substantially perpendicularly intersect with each other. The bit lines BL are arranged along a column direction, and the word lines W are arranged along a row direction. A plurality of memory cells 12a and 12b are arranged on intersection points between the bit lines BL and the word lines WL.

Each pair of memory cells 12a and 12b are serially connected between two bit lines BL. The plurality of word lines WL of the memory cell array 102 are connected to a row address decoder 103, while the plurality of bit lines BL are connected to a column address decoder 104.

An address pin 105 is externally supplied with a row address signal and a column address signal. The row address signal and the column address signal supplied to the address pin 105 are transferred to an address latch 107 through an address buffer 106. The row address signal latched by the address latch 107 is supplied to the row address decoder 103, and the column address signal is supplied to the column address decoder 104.

The row address decoder 103 selects a word line WL specified by the row address signal and controls the potential of the selected word line WL and those of the remaining word lines WL. Thus, the potential of the control gate electrode 8 of each pair of memory cells 12a and 12b is controlled.

The column address decoder 104 selects a bit line BL specified by the column address signal and controls the potentials or connection states of the selected bit line BL and the remaining bit lines BL. Thus, the potentials or connection states of the source/drain regions 2 of the memory cells 12a and 12b are controlled.

A data pin 108 is externally supplied with data. The data supplied to the data pin 108 is transferred to the column address decoder 104 through an input buffer 109. The column address decoder 104 controls the potential of each bit line BL in correspondence to the data.

Data read from an arbitrary memory cell 12a or 12b is transferred from the corresponding bit line BL to a sense amplifier 110, formed by a current sense amplifier, through the column address decoder 104. In this case, the column address decoder 104 connects the selected bit line BL with the sense amplifier 110. The sense amplifier 110 determines the value of the read data on the basis of the value of a current flowing through the selected bit line BL and outputs the result of the determination to the data pin 108 through an output buffer 111.

A control core circuit 112 controls the aforementioned operations of the circuits 103 to 111 of the nonvolatile semiconductor memory 101.

According to this embodiment, the memory cells 12a and 12b correspond to transistors, and the memory cell array 102 corresponds to a transistor array. The row address decoder 103 and the column address decoder 104 form a selection circuit and a potential set circuit respectively.

Write, erase and read operations of the nonvolatile semiconductor memory 101 according to this embodiment are now described with reference to FIGS. 3 to 5.

Figure 3:
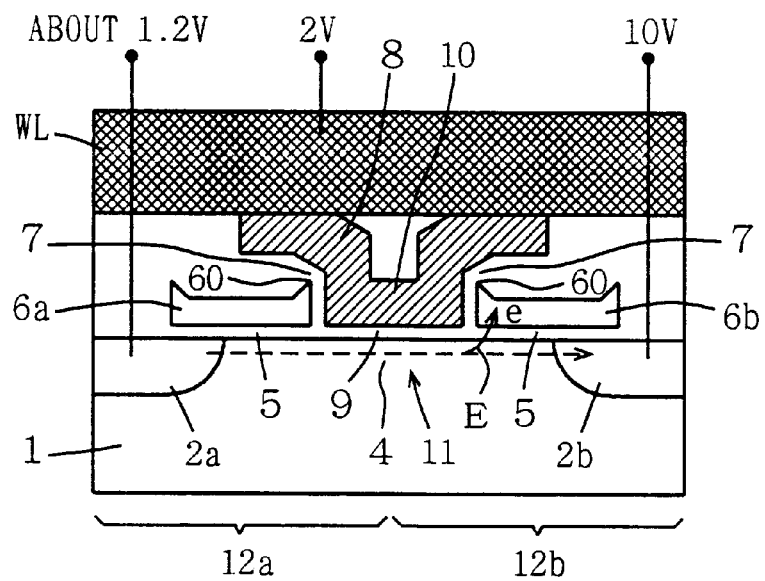
FIG. 3 illustrates a write operation of the nonvolatile semiconductor memory according to the first embodiment of the present invention.
Figure 4:
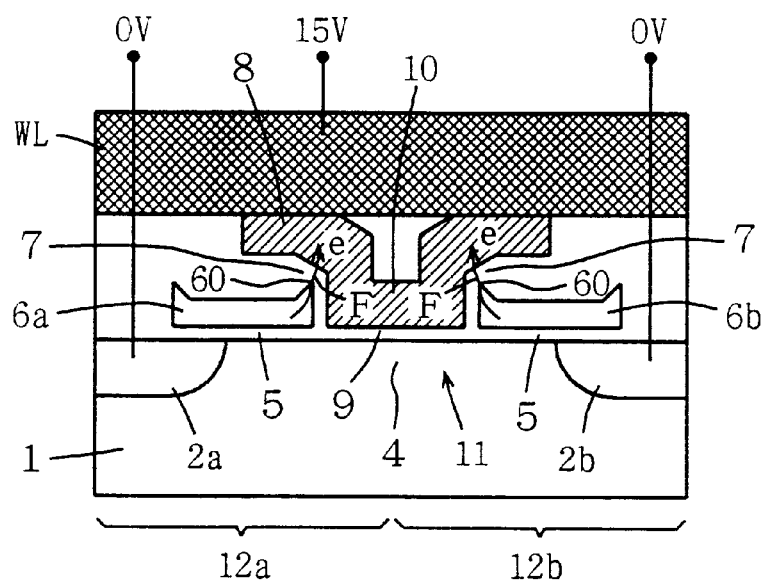
FIG. 4 illustrates an erase operation of the nonvolatile semiconductor memory according to the first embodiment of the present invention.
Figure 5:
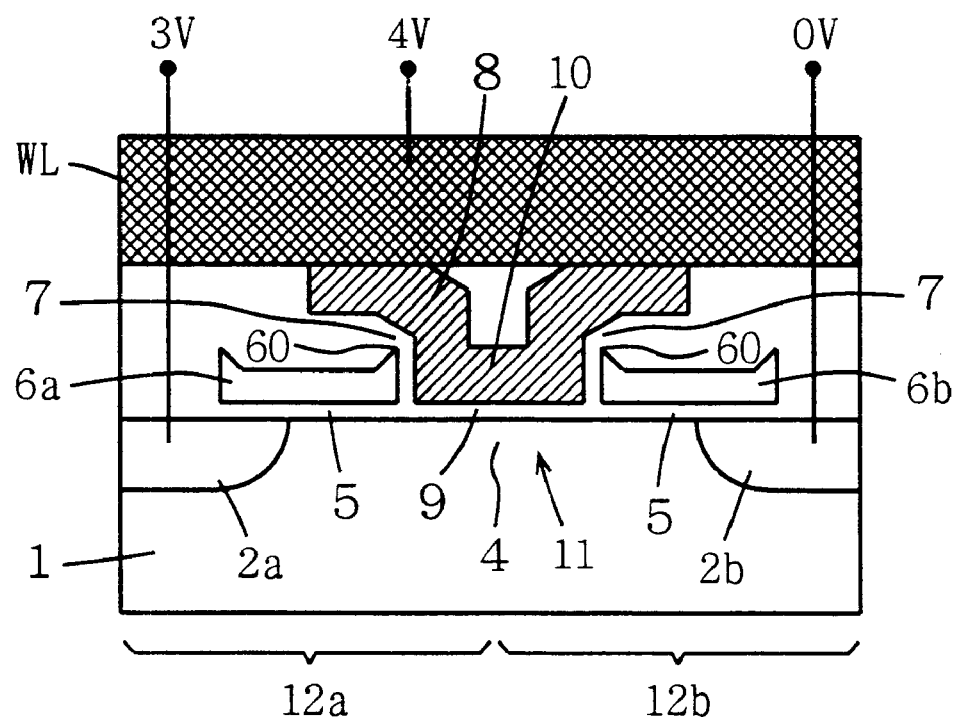
FIG. 5 illustrates a read operation of the nonvolatile semiconductor memory according to the first embodiment of the present invention.
Figure 6:
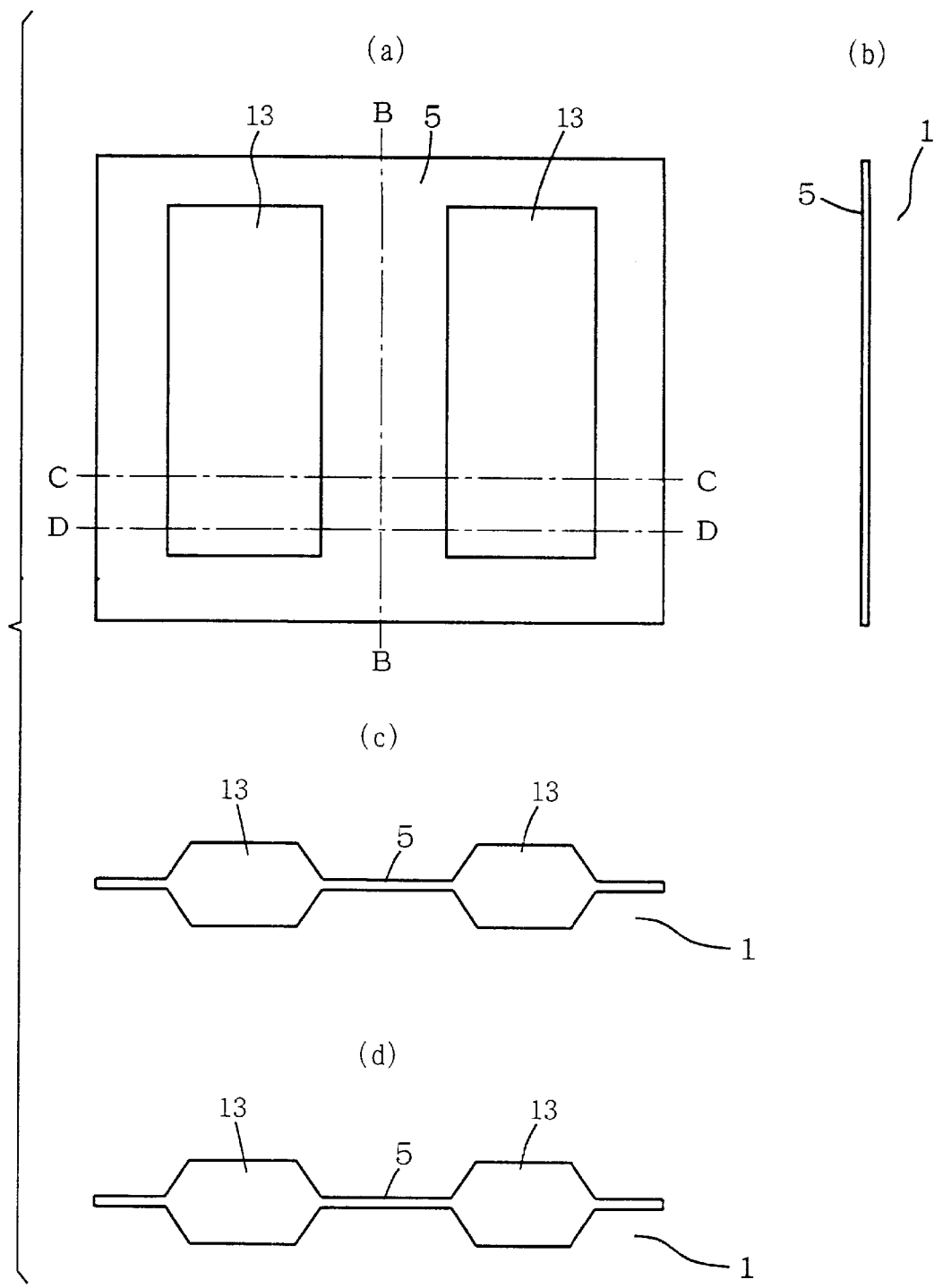
FIG. 6(a) is a plan view showing a first step in a first method of fabricating the memory cell array shown in FIG. 1, and FIGS. 6(b) to 6(d) are sectional views taken along the lines B—B, C—C and D—D in FIG. 6(a) respectively.
Figure 7:
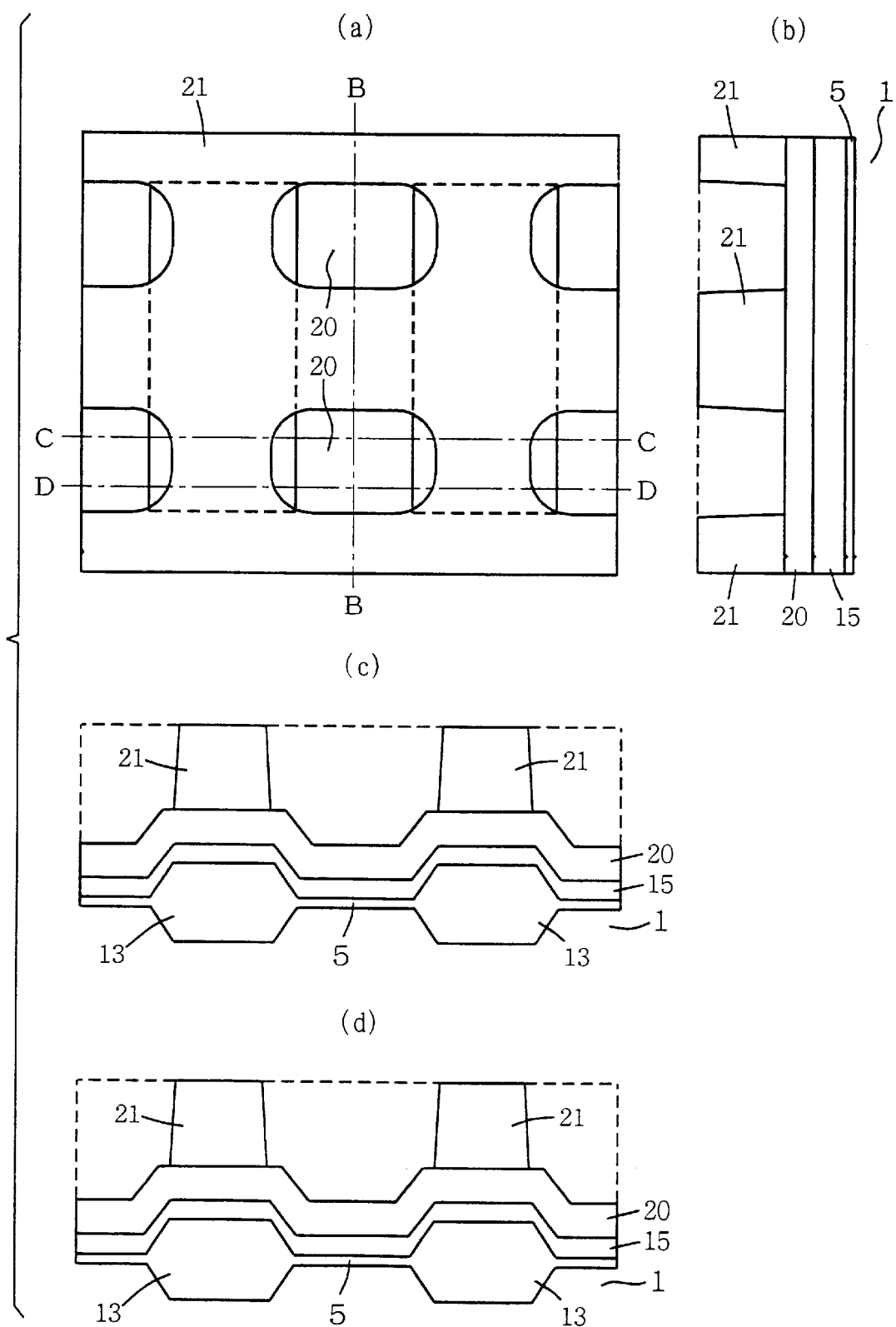
FIG. 7(a) is a plan view showing a second step in the first method of fabricating the memory cell array shown in FIG. 1, and FIGS. 7(b) to 7(d) are sectional views taken along the lines B—B, C—C and D—D in FIG. 7(a) respectively.
Figure 8:
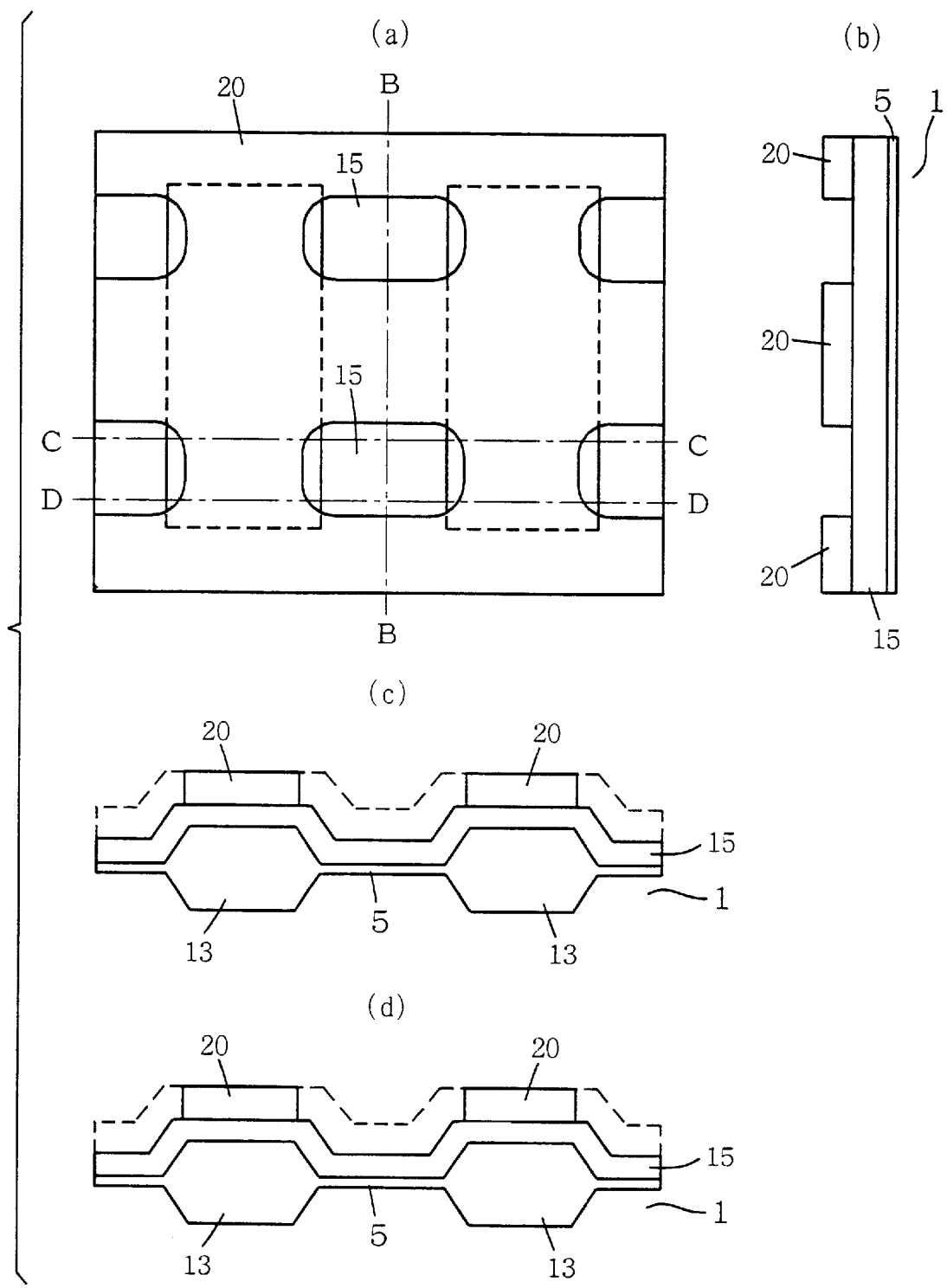
FIG. 8(a) is a plan view showing a third step in the first method of fabricating the memory cell array shown in FIG. 1, and FIGS. 8(b) to 8(d) are sectional views taken along the lines B—B, C—C and D—D in FIG. 8(a) respectively.
Figure 9:
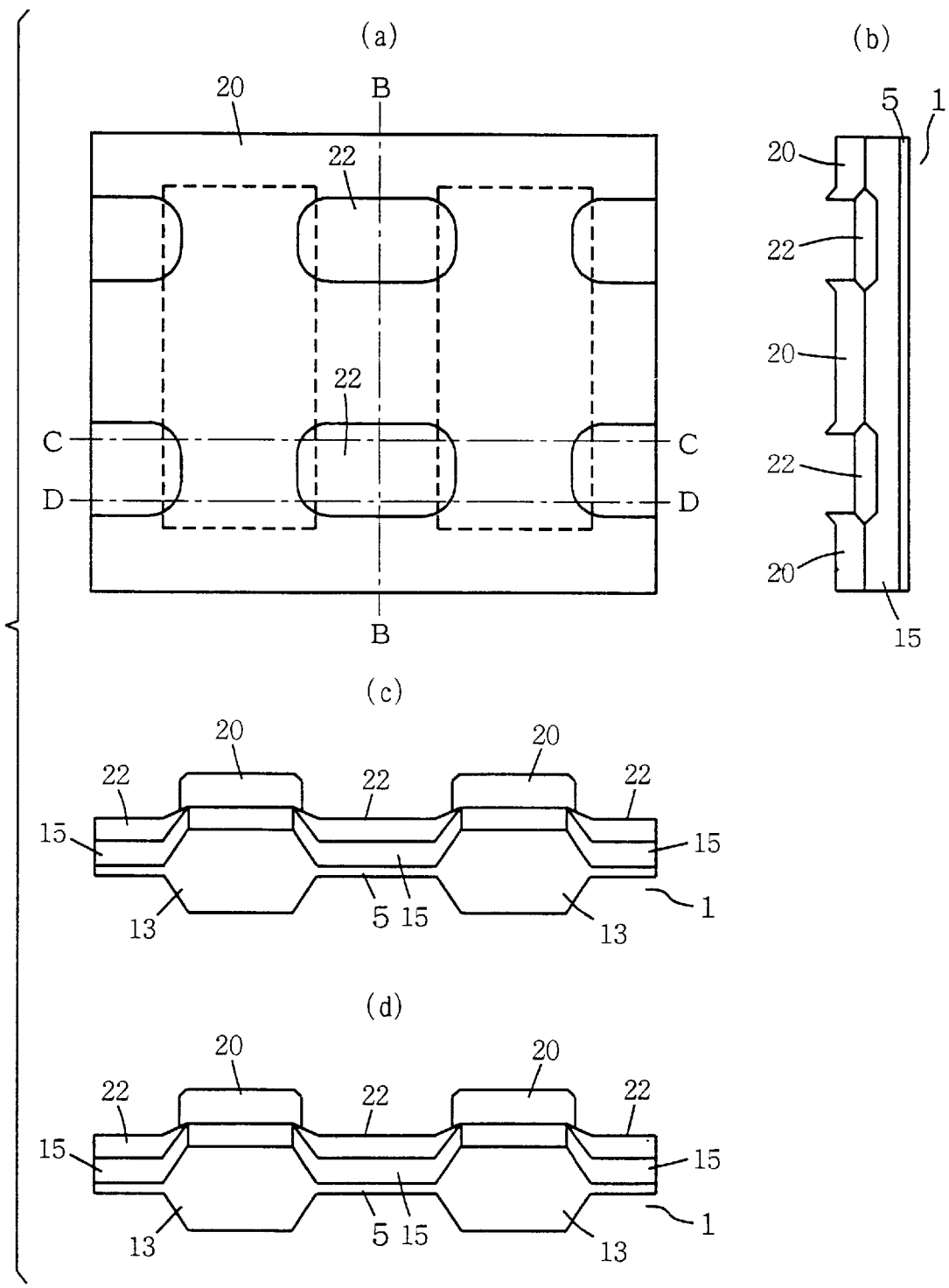
FIG. 9(a) is a plan view showing a fourth step in the first method of fabricating the memory cell array shown in FIG. 1, and FIGS. 9(b) to 9(d) are sectional views taken along the lines B—B, C—C and D—D in FIG. 8(a) respectively.
Figure 10:
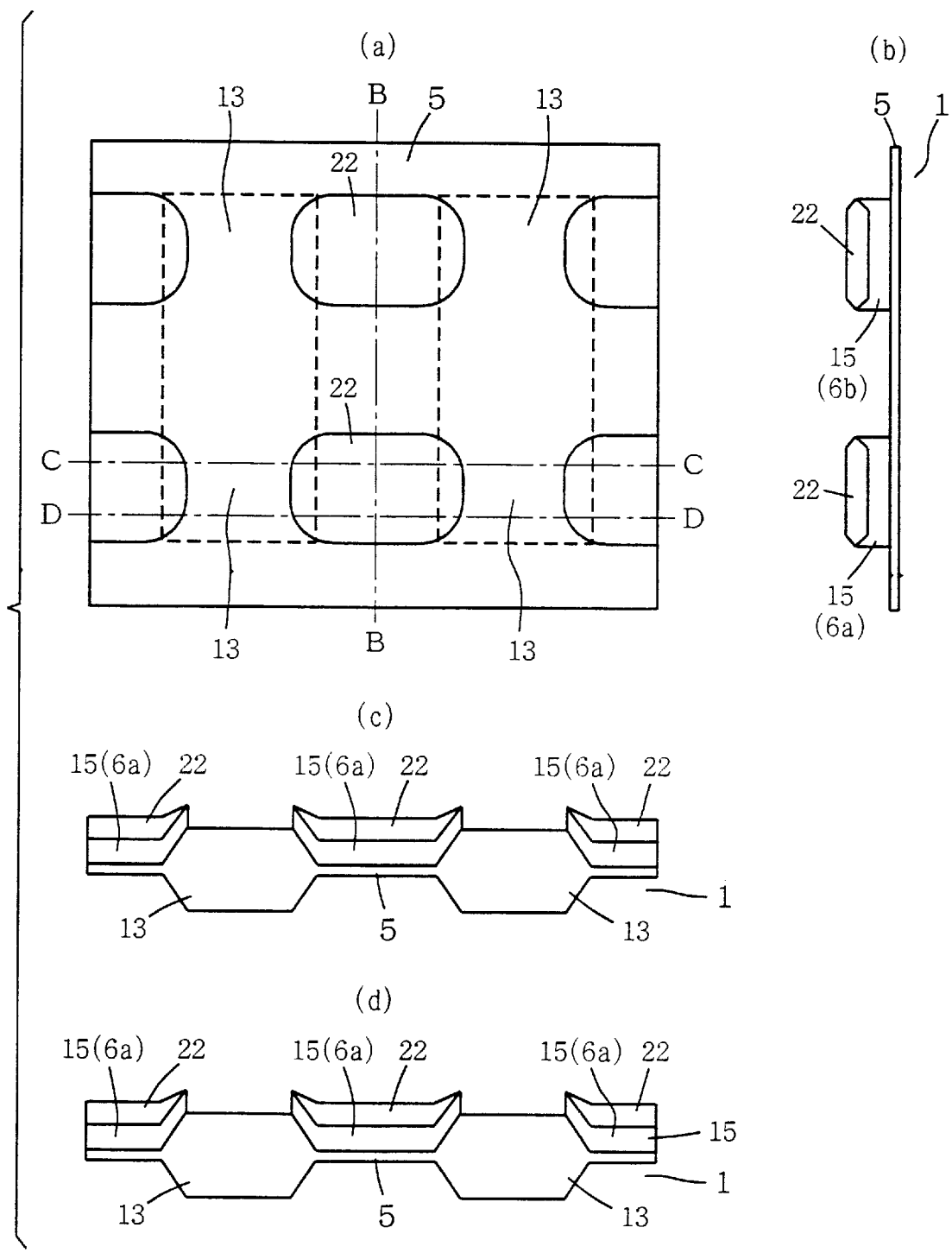
FIG. 10(a) is a plan view showing a fifth step in the first method of fabricating the memory cell array shown in FIG. 1, and FIGS. 10(b) to 10(d) are sectional views taken along the lines B—B, C—C and D—D in FIG. 10(a) respectively.
Figure 11:
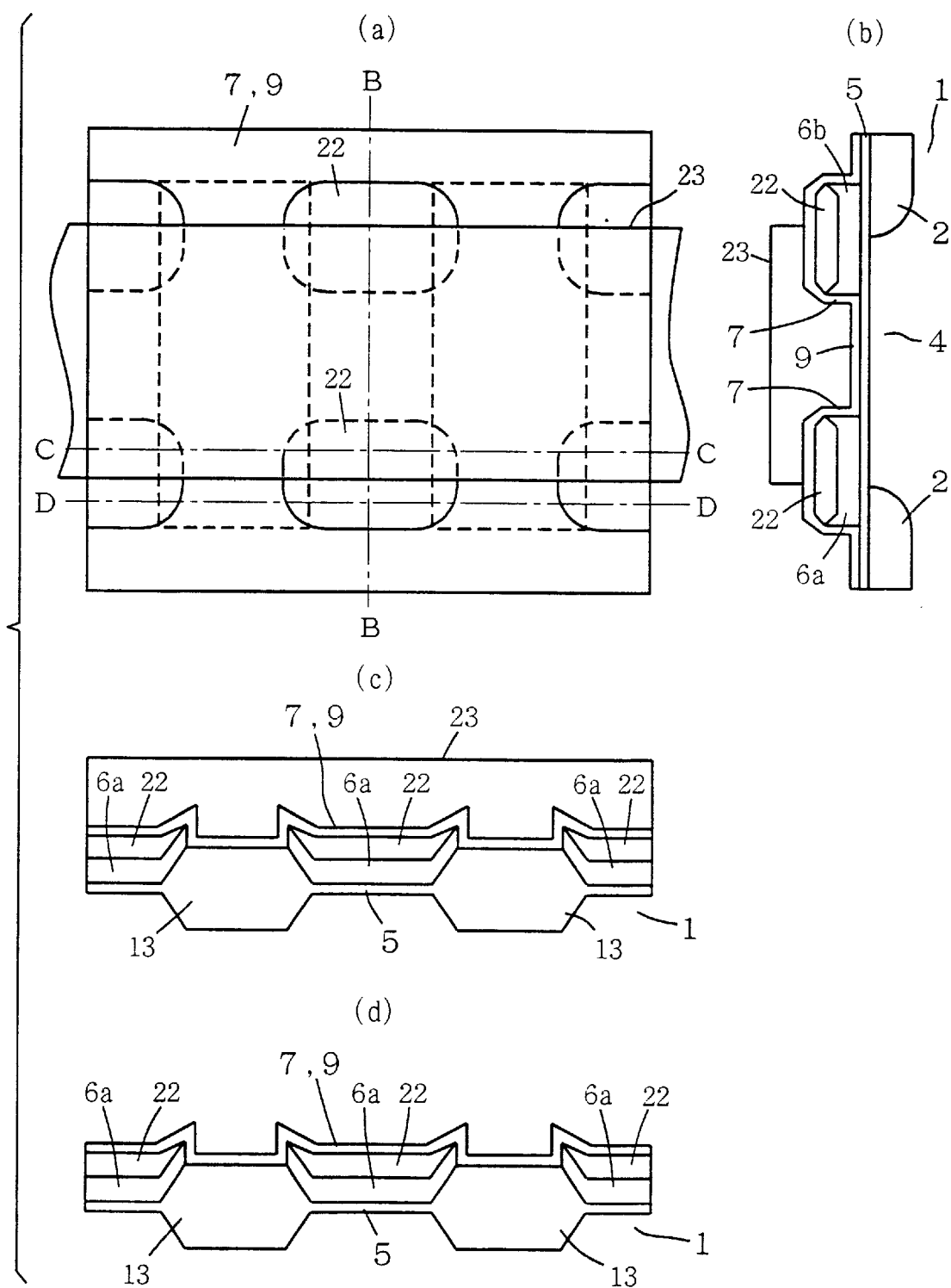
FIG. 11(a) is a plan view showing a sixth step in the first method of fabricating the memory cell array shown in FIG. 1, and FIGS. 11(b) to 11(d) are sectional views taken along the lines B—B, C—C and D—D in FIG. 11(a) respectively.
Figure 12:
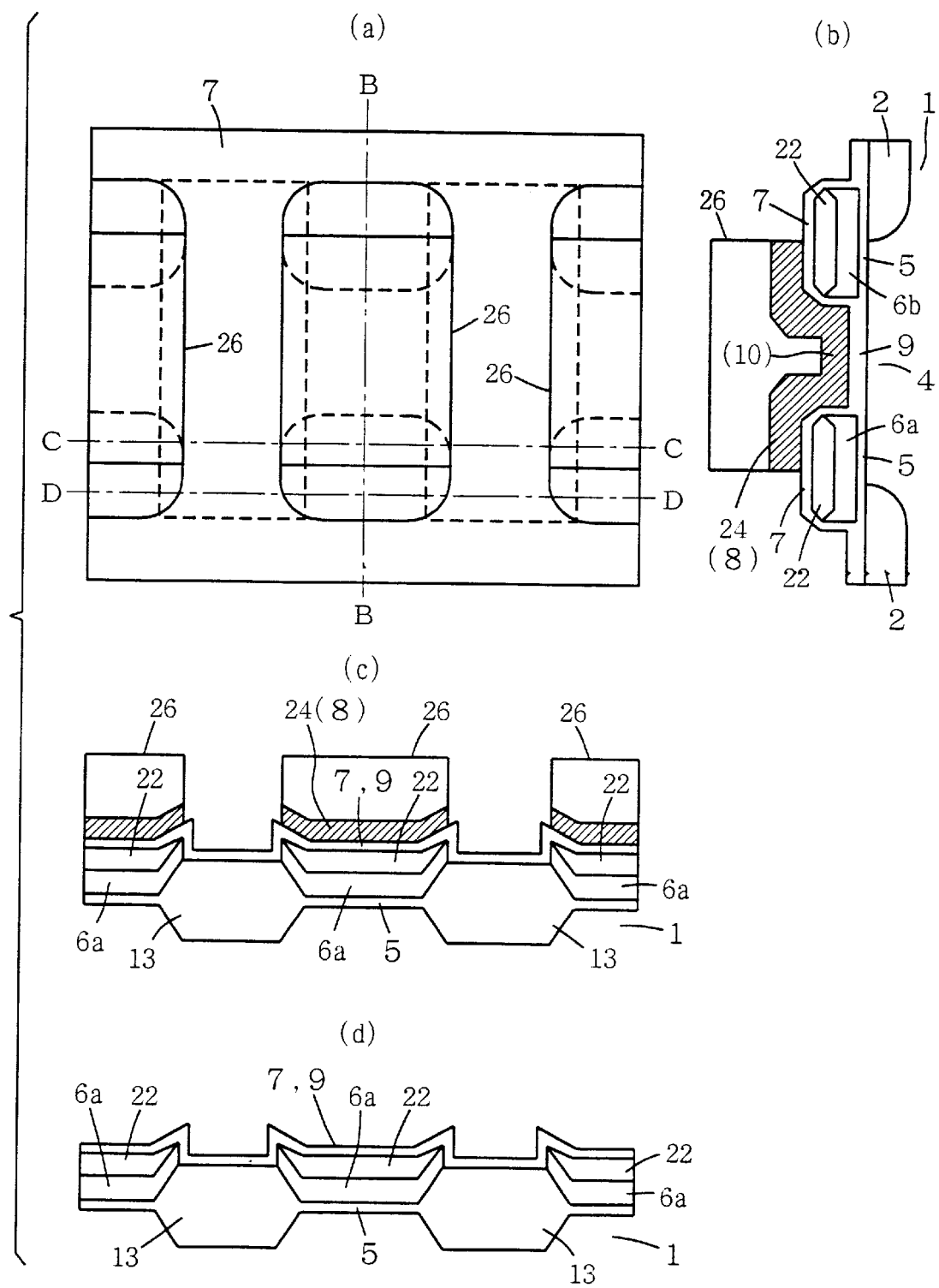
FIG. 12(a) is a plan view showing a seventh step in the first method of fabricating the memory cell array shown in FIG. 1, and FIGS. 12(b) to 12(d) are sectional views taken along the lines B—B, C—C and D—D in FIG. 12(a) respectively.
Figure 13:
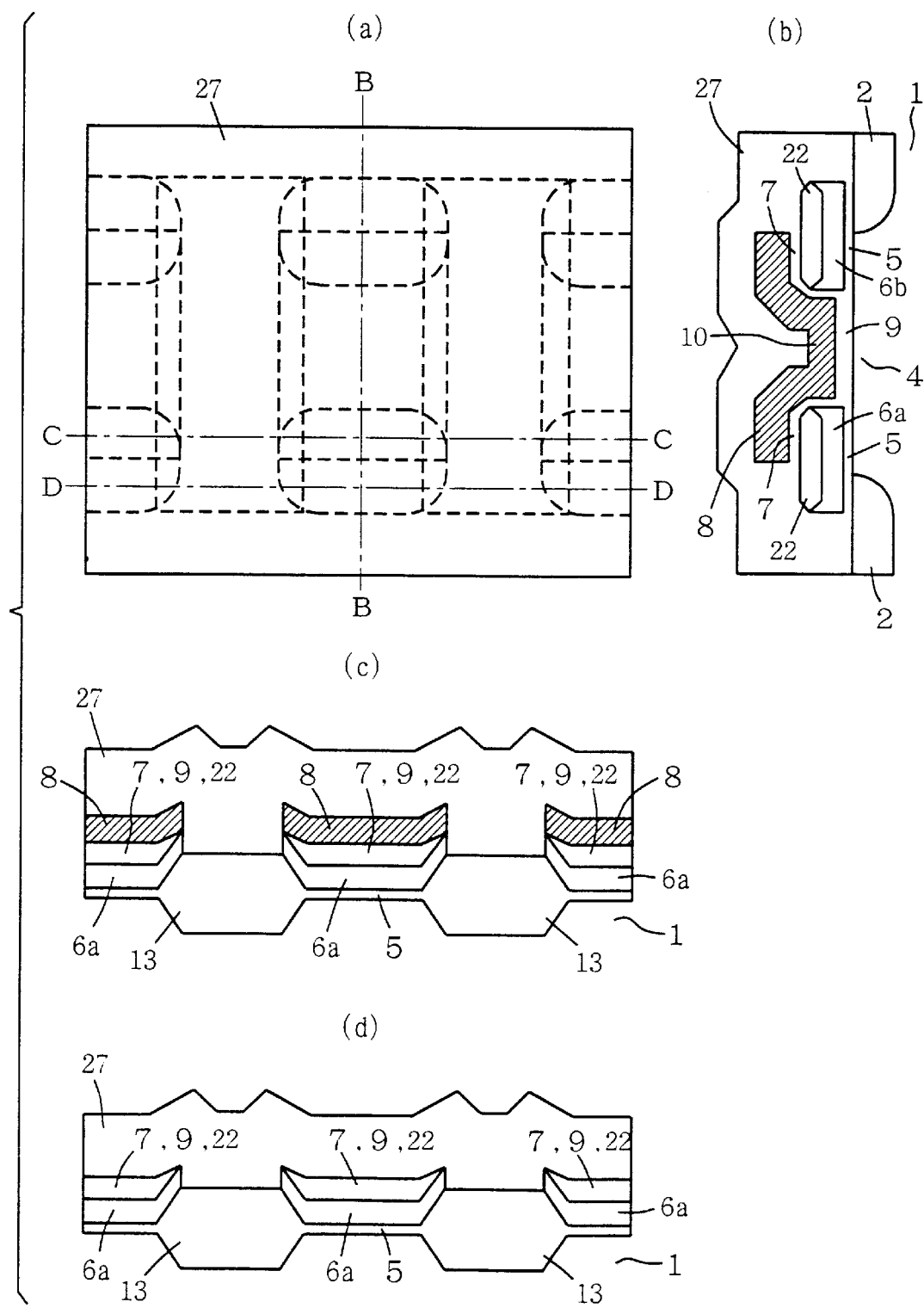
FIG. 13(a) is a plan view showing an eighth step in the first method of fabricating the memory cell array shown in FIG. 1, and FIGS. 13(b) to 13(d) are sectional views taken along the lines B—B, C—C and D—D in FIG. 13(a) respectively.
Figure 14:
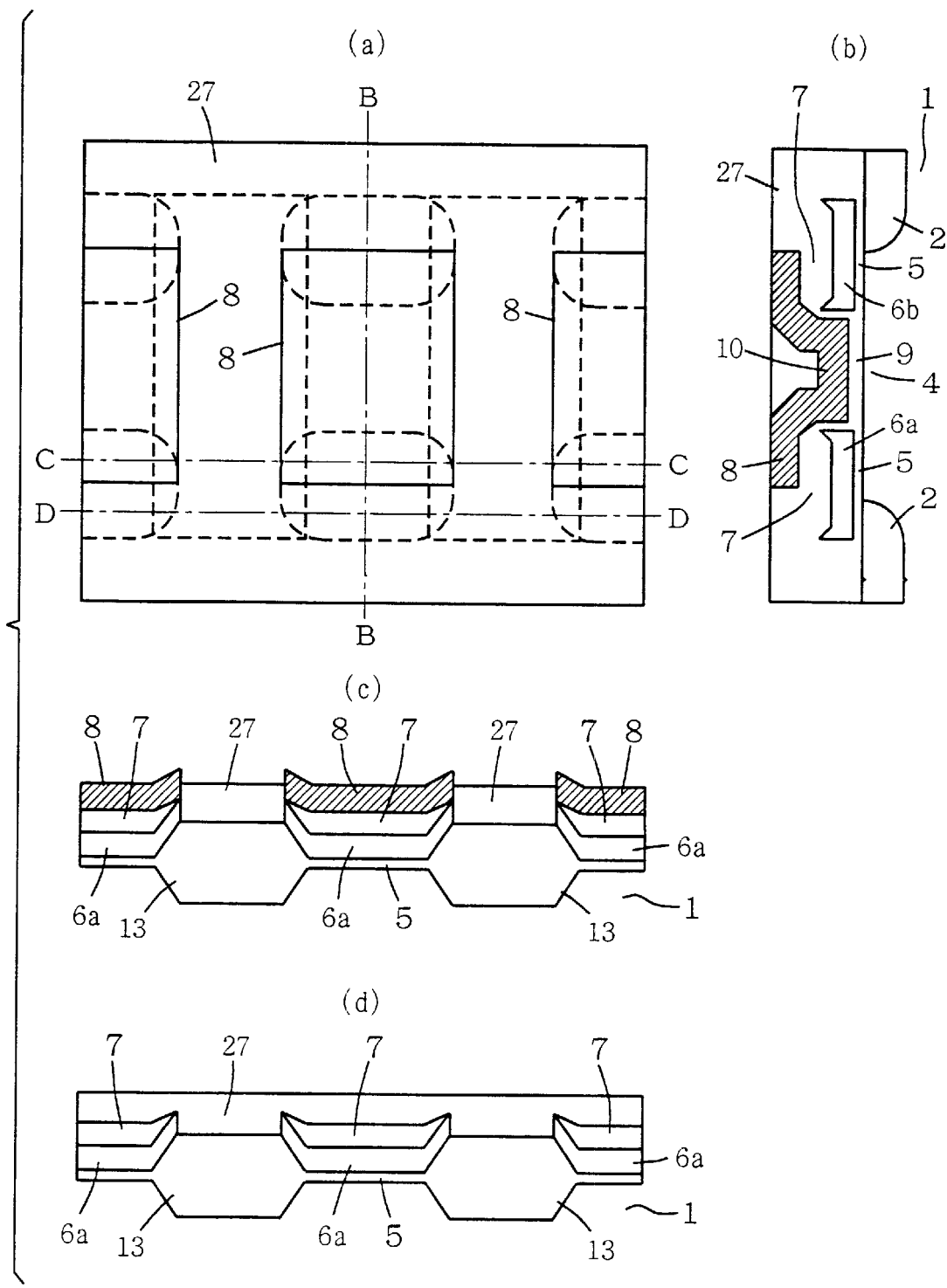
FIG. 14(a) is a plan view showing a ninth step in the first method of fabricating the memory cell array shown in FIG. 1, and FIGS. 14(b) to 14(d) are sectional views taken along the lines B—B, C—C and D—D in FIG. 14(a) respectively.
Figure 15:
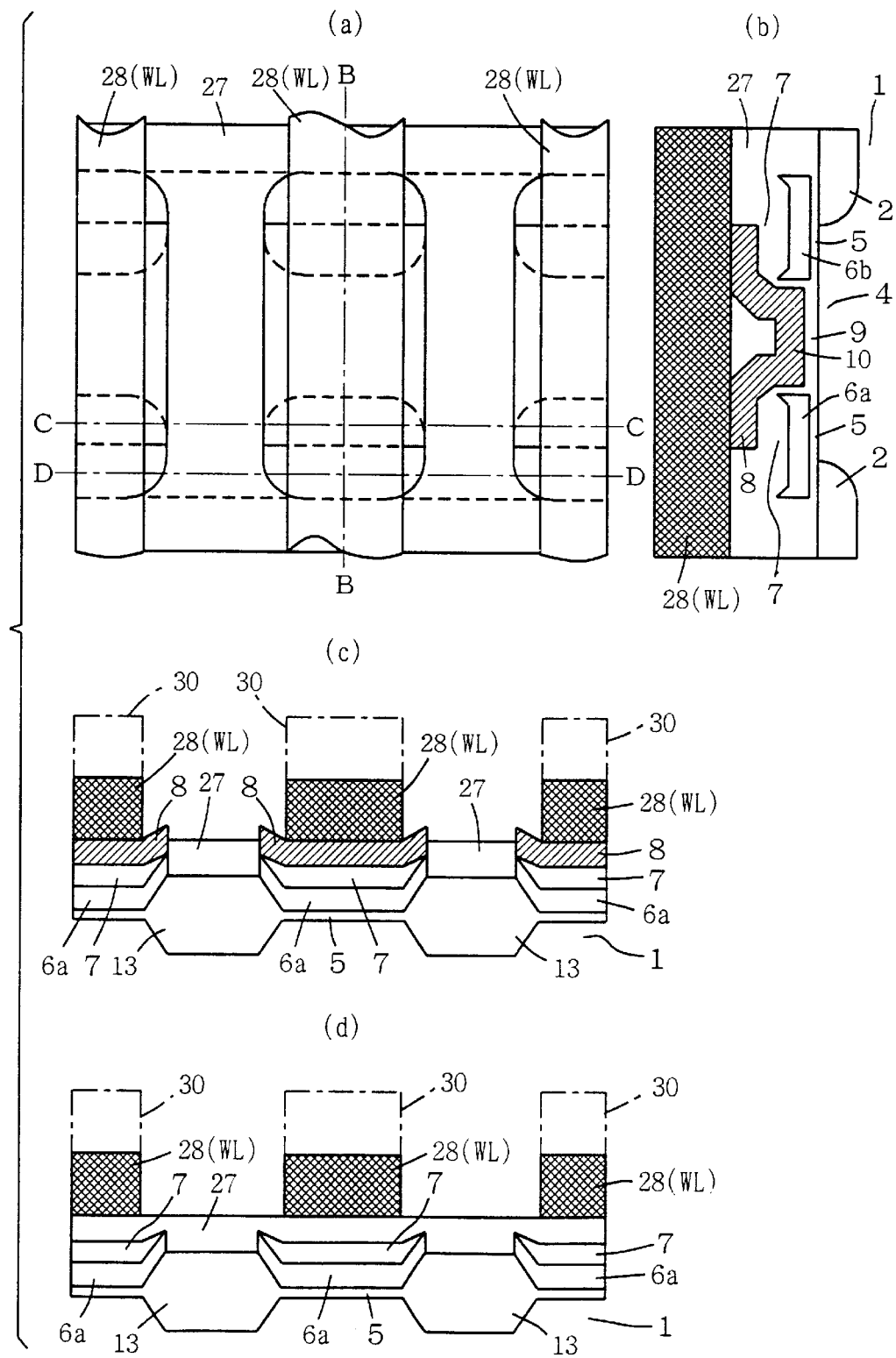
FIG. 15(a) is a plan view showing a tenth step in the first method of fabricating the memory cell array shown in FIG. 1, and FIGS. 15(b) to 15(d) are sectional views taken along the lines B—B, C—C and D—D in FIG. 15(a) respectively.
Figure 16:
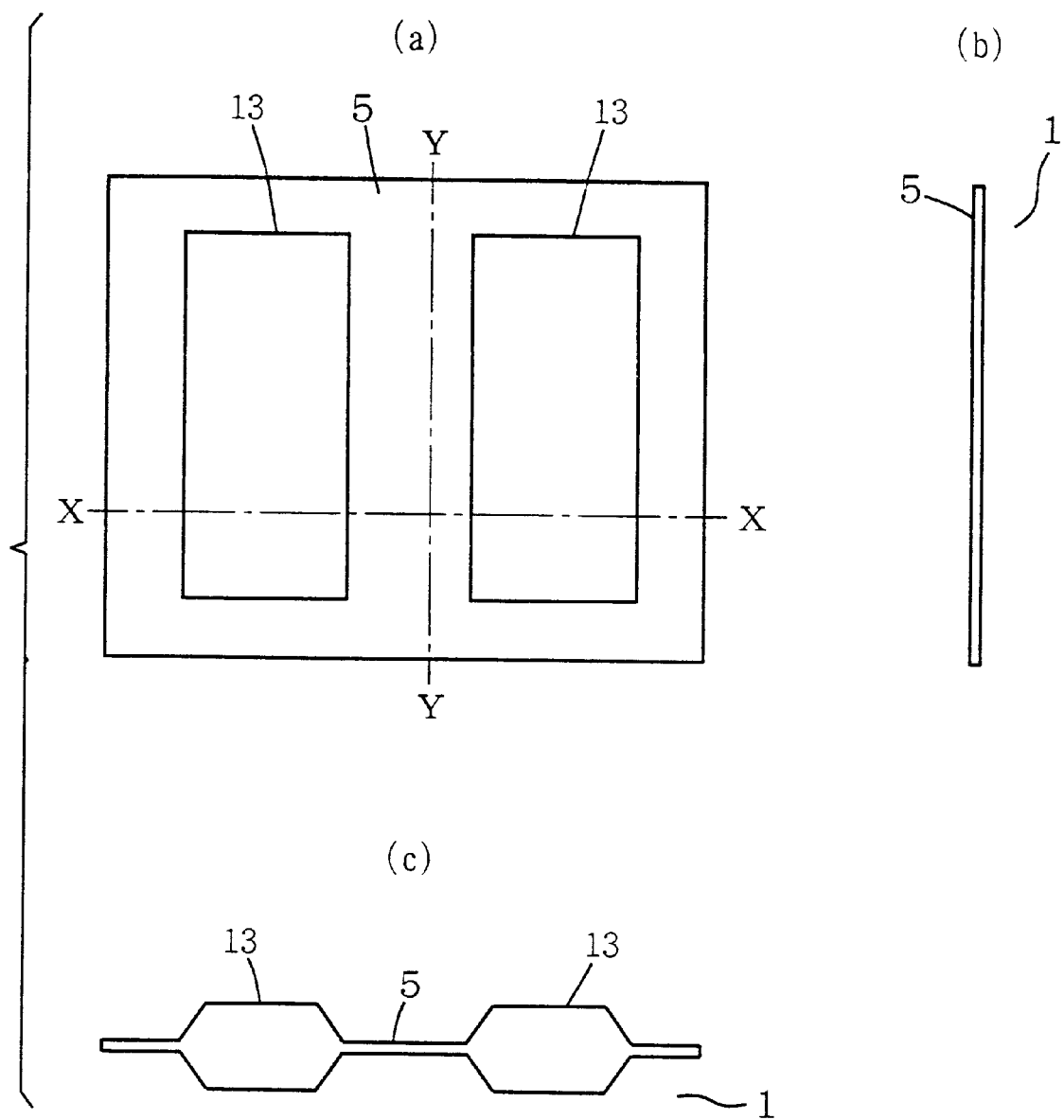
FIG. 16(a) is a plan view showing a first step in a second method of fabricating the memory cell array shown in FIG. 1, and FIGS. 16(b) and 16(c) are sectional views taken along the lines Y—Y and X—X in FIG. 16(a) respectively.
Figure 17:
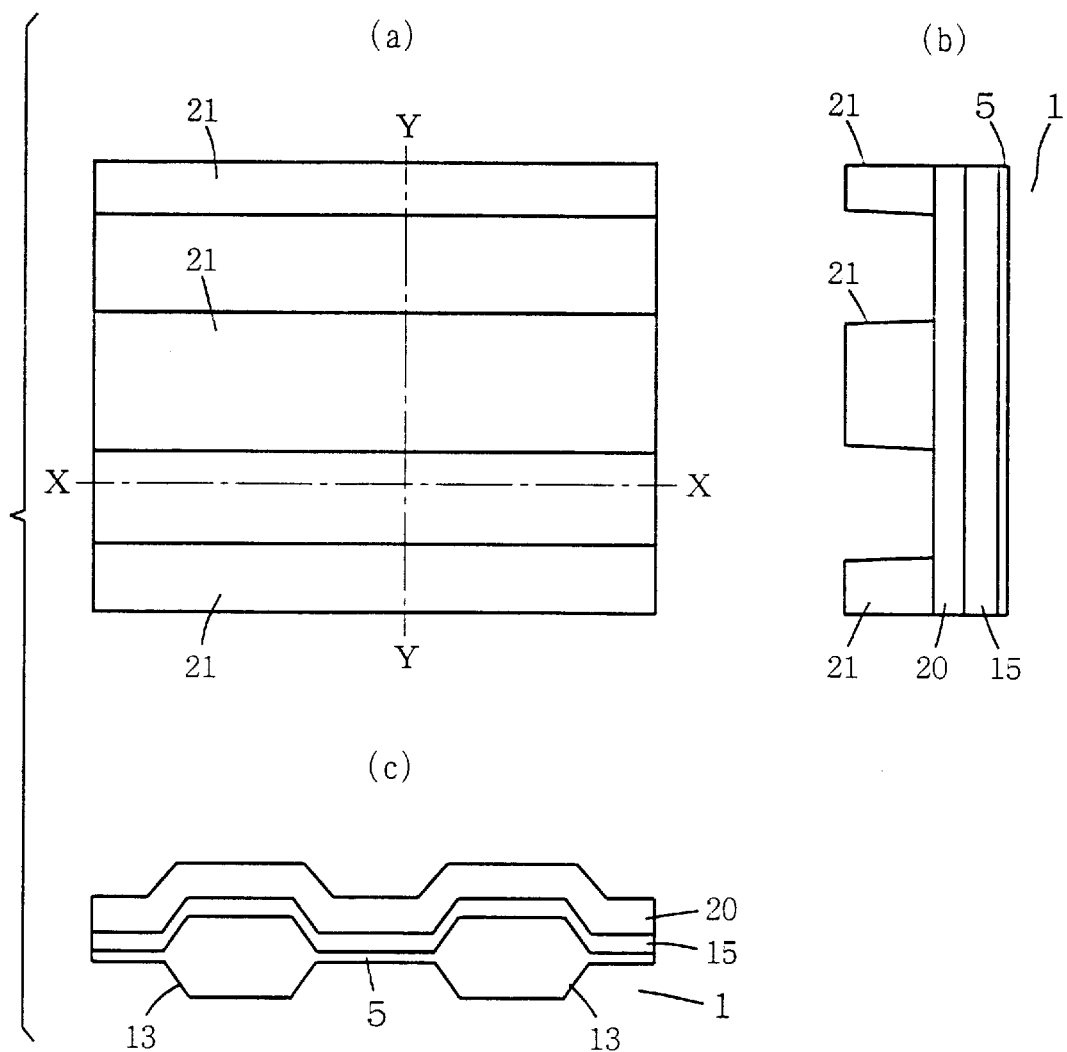
FIG. 17(a) is a plan view showing a second step in the second method of fabricating the memory cell array shown in FIG. 1, and FIGS. 17(b) and 17(c) are sectional views taken along the lines Y—Y and X—X in FIG. 17(a) respectively.
Figure 18:
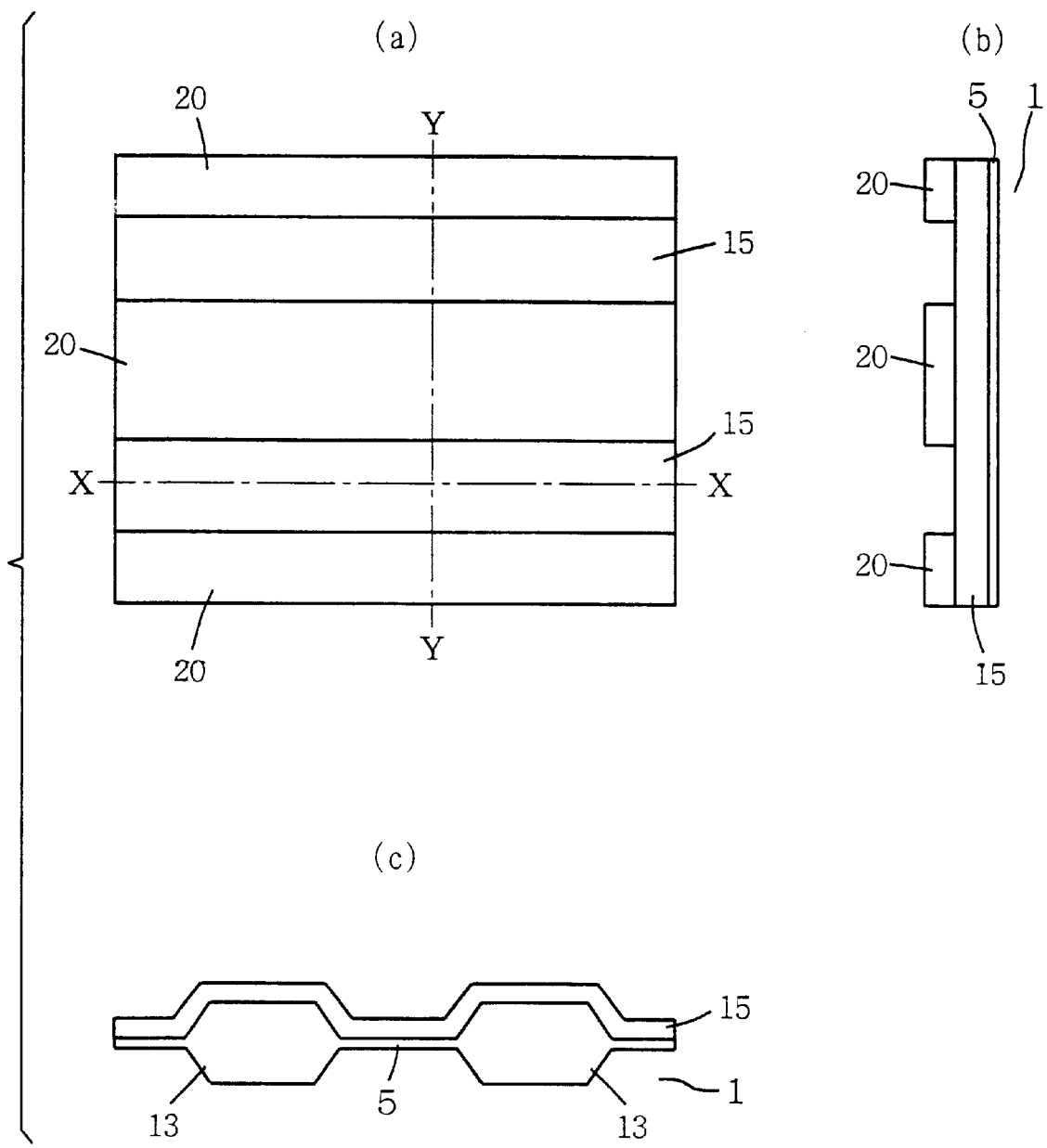
FIG. 18(a) is a plan view showing a third step in the second method of fabricating the memory cell array shown in FIG. 1, and FIGS. 18(b) and 18(c) are sectional views taken along the lines Y—Y and X—X in FIG. 18(a) respectively.
Figure 19:
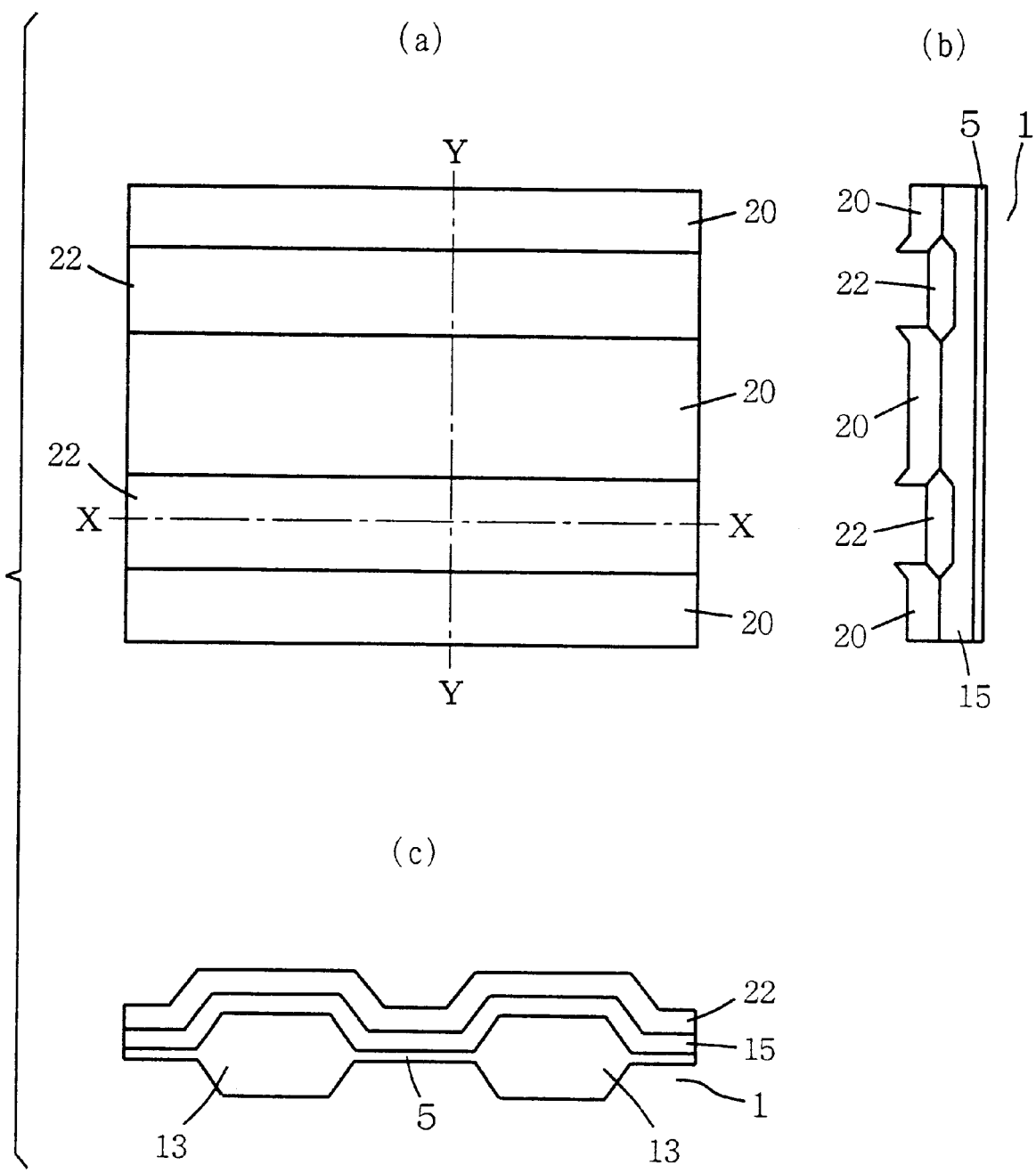
FIG. 19(a) is a plan view showing a fourth step in the second method of fabricating the memory cell array shown in FIG. 1, and FIGS. 19(b) and 19(c) are sectional views taken along the lines Y—Y and X—X in FIG. 19(a) respectively.
Figure 20:
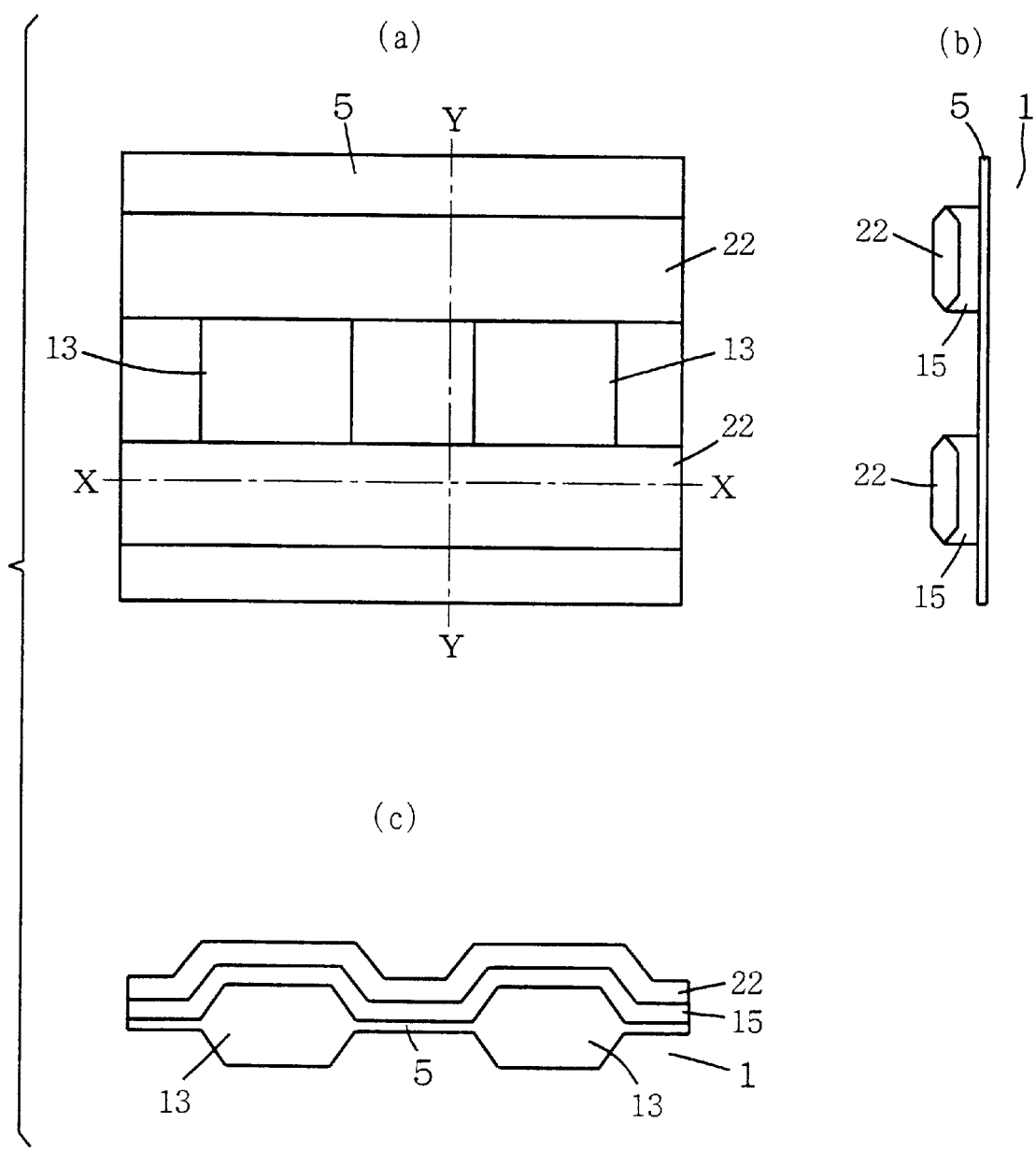
FIG. 20(a) is a plan view showing a fifth step in the second method of fabricating the memory cell array shown in FIG. 1, and FIGS. 20(b) and 20(c) are sectional views taken along the lines Y—Y and X—X in FIG. 20(a) respectively.
Figure 21:
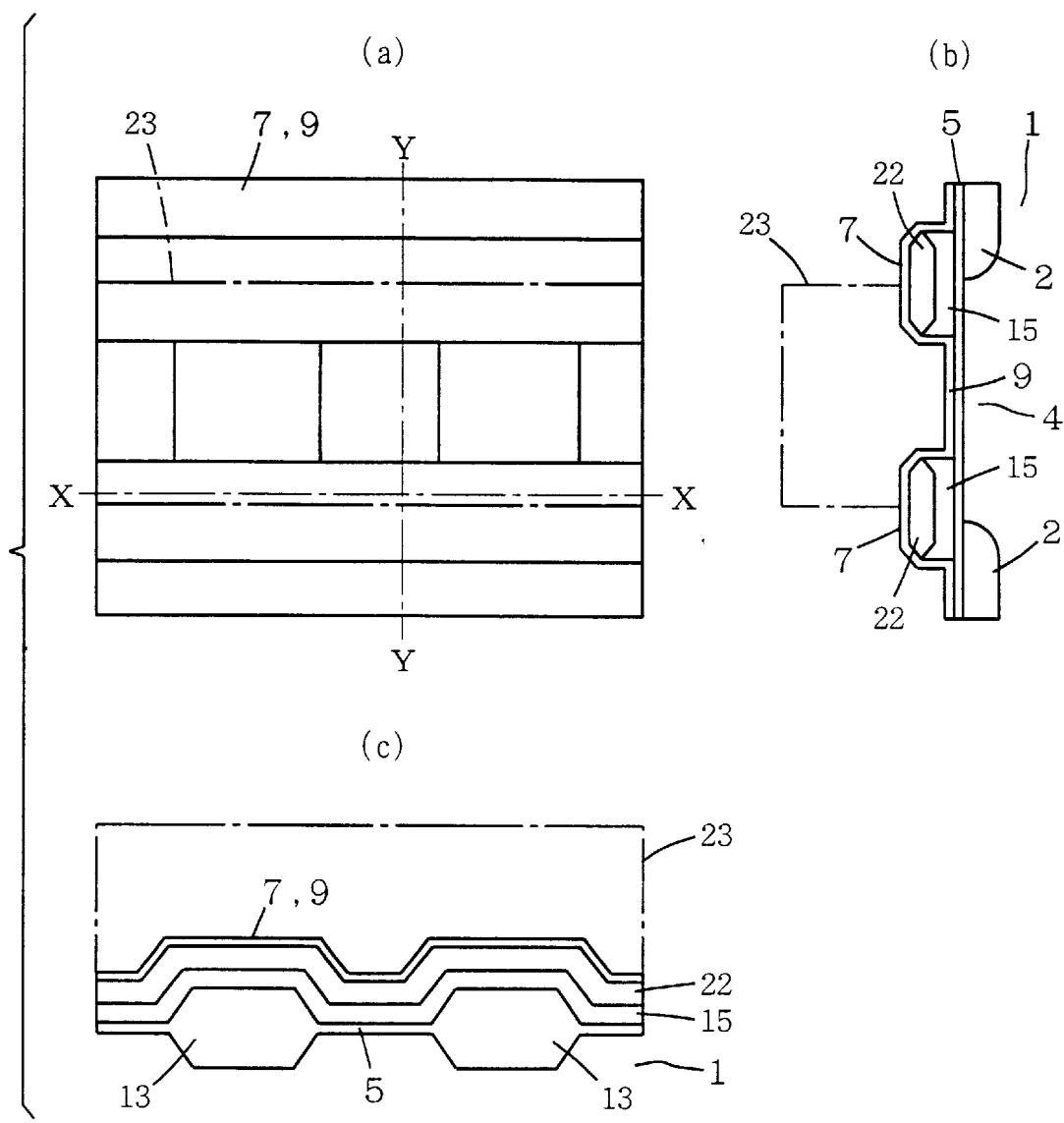
FIG. 21(a) is a plan view showing a sixth step in the second method of fabricating the memory cell array shown in FIG. 1, and FIGS. 21(b) and 21(c) are sectional views taken along the lines Y—Y and X—X in FIG. 21(a) respectively.
Figure 22:
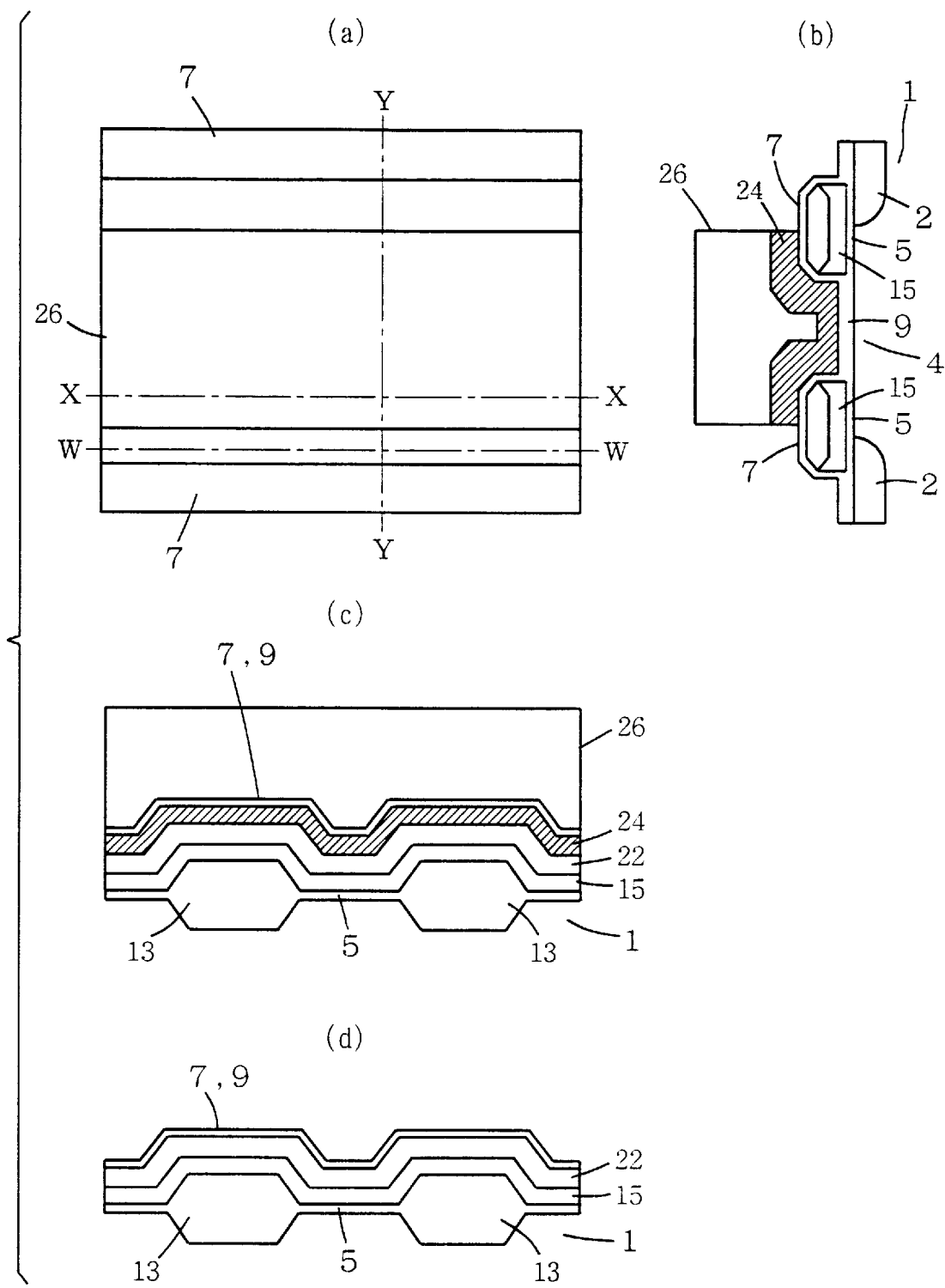
FIG. 22(a) is a plan view showing a seventh step in the second method of fabricating the memory cell array shown in FIG. 1, and FIGS. 22(b) to 22(d) are sectional views taken along the lines Y—Y, X—X and W—W in FIG. 22(a) respectively.
Figure 23:
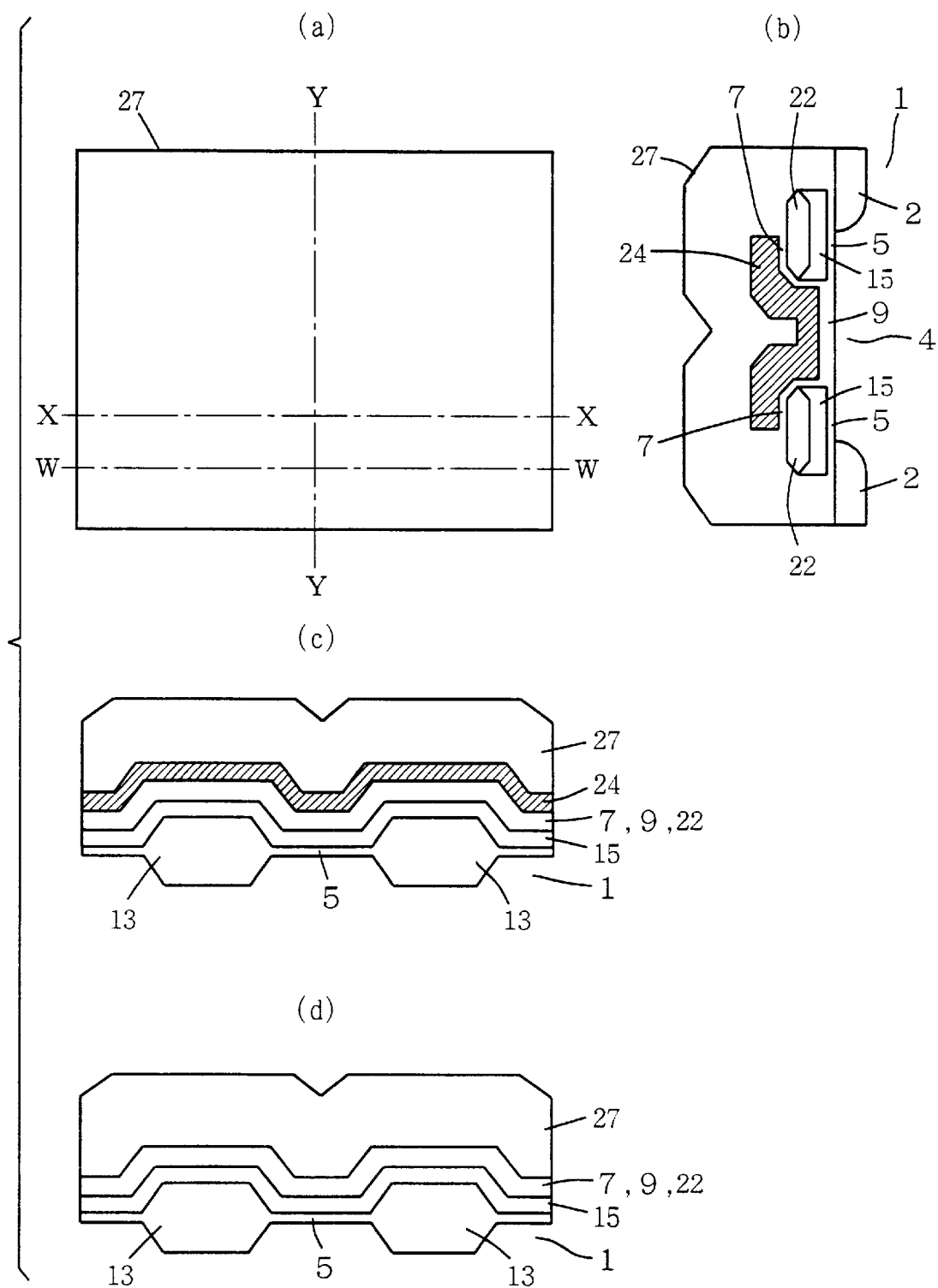
FIG. 23(a) is a plan view showing an eighth step in the second method of fabricating the memory cell array shown in FIG. 1, and FIGS. 23(b) to 23(d) are sectional views taken along the lines Y—Y, X—X and W—W in FIG. 23(a) respectively.
Figure 24:
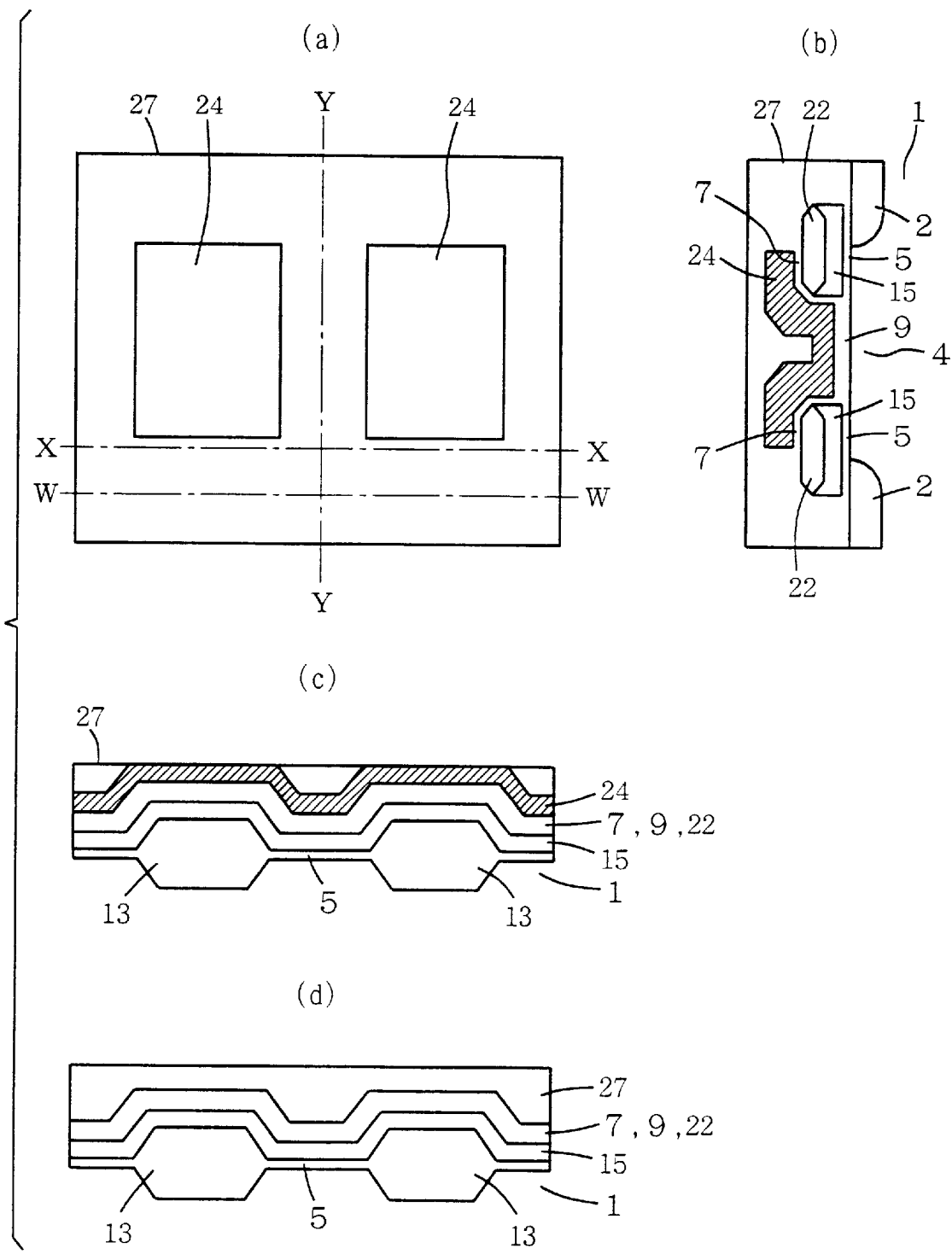
FIG. 24(a) is a plan view showing a ninth step in the second method of fabricating the memory cell array shown in FIG. 1, and FIGS. 24(b) to 24(d) are sectional views taken along the lines Y—Y, X—X and W—W in FIG. 24(a) respectively.
Figure 25:
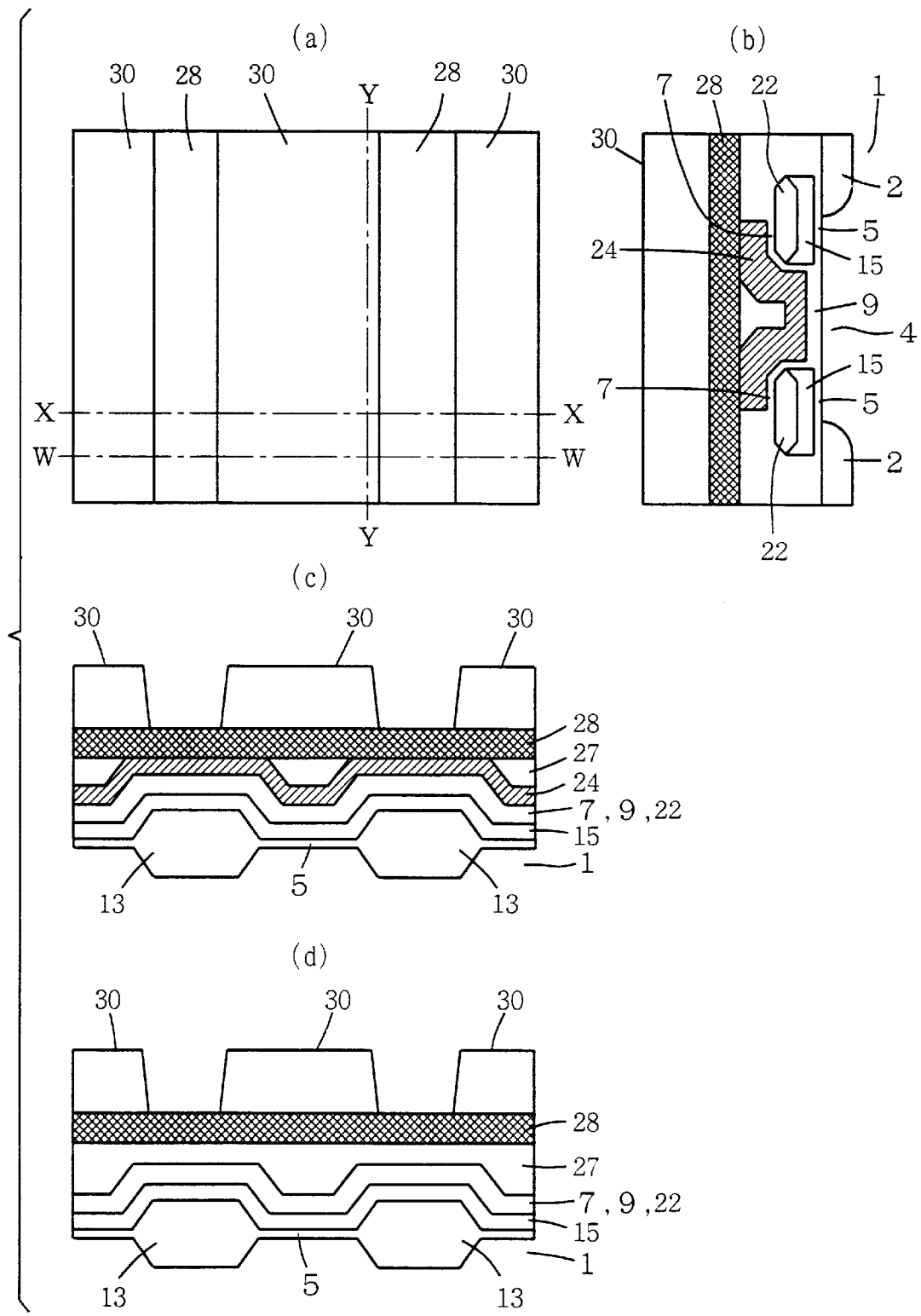
FIG. 25(a) is a plan view-showing a tenth step in the second method of fabricating the memory cell array shown in FIG. 1, and FIGS. 25(b) to 25(d) are sectional views taken along the lines Y—Y, X—X and W—W in FIG. 25(a) respectively.
Figure 26:
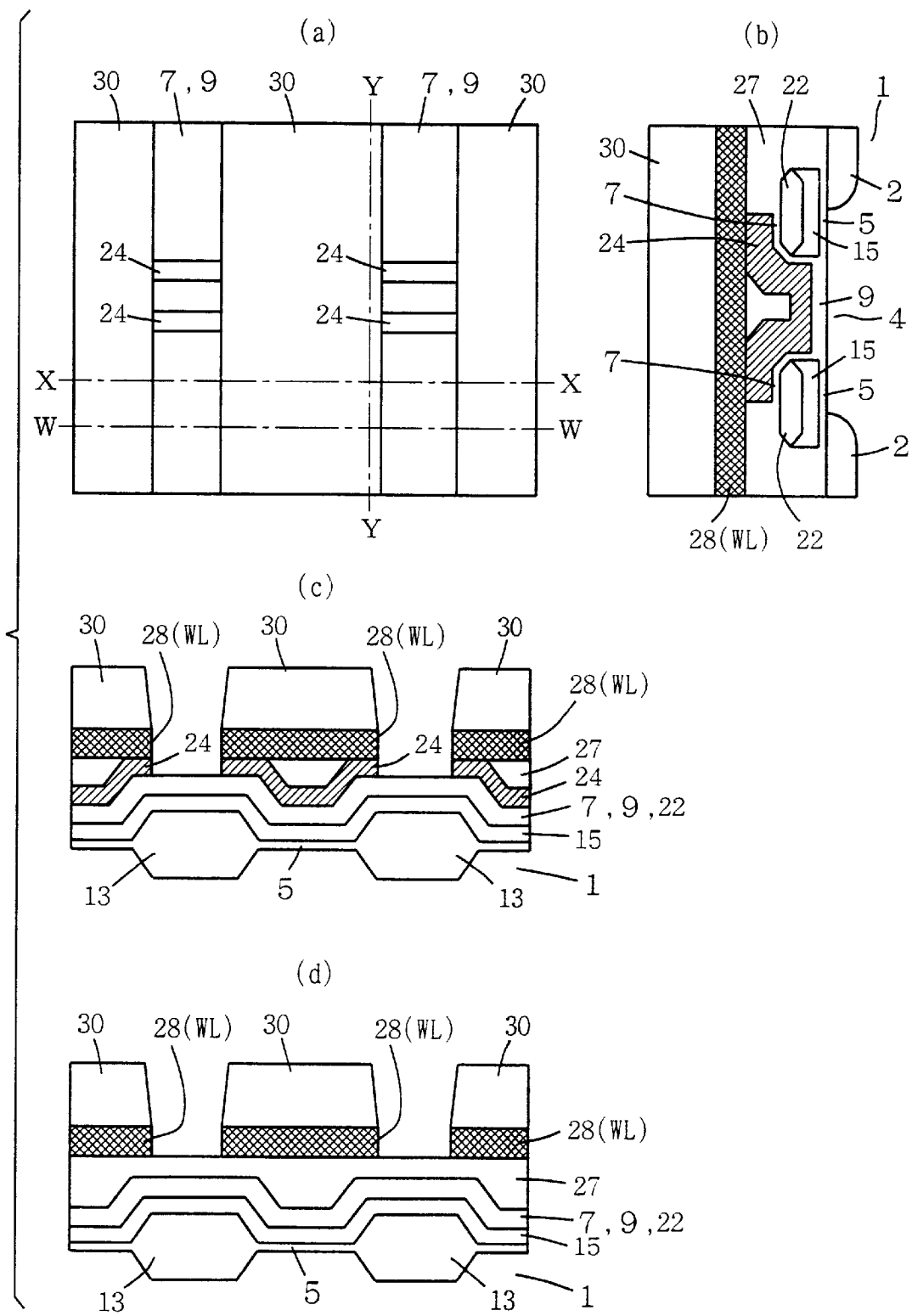
FIG. 26(a) is a plan view showing an eleventh step in the second method of fabricating the memory cell array shown in FIG. 1, and FIGS. 26(b) to 26(d) are sectional views taken along the lines Y—Y, X—X and W—W in FIG. 26(a) respectively.
Figure 27:
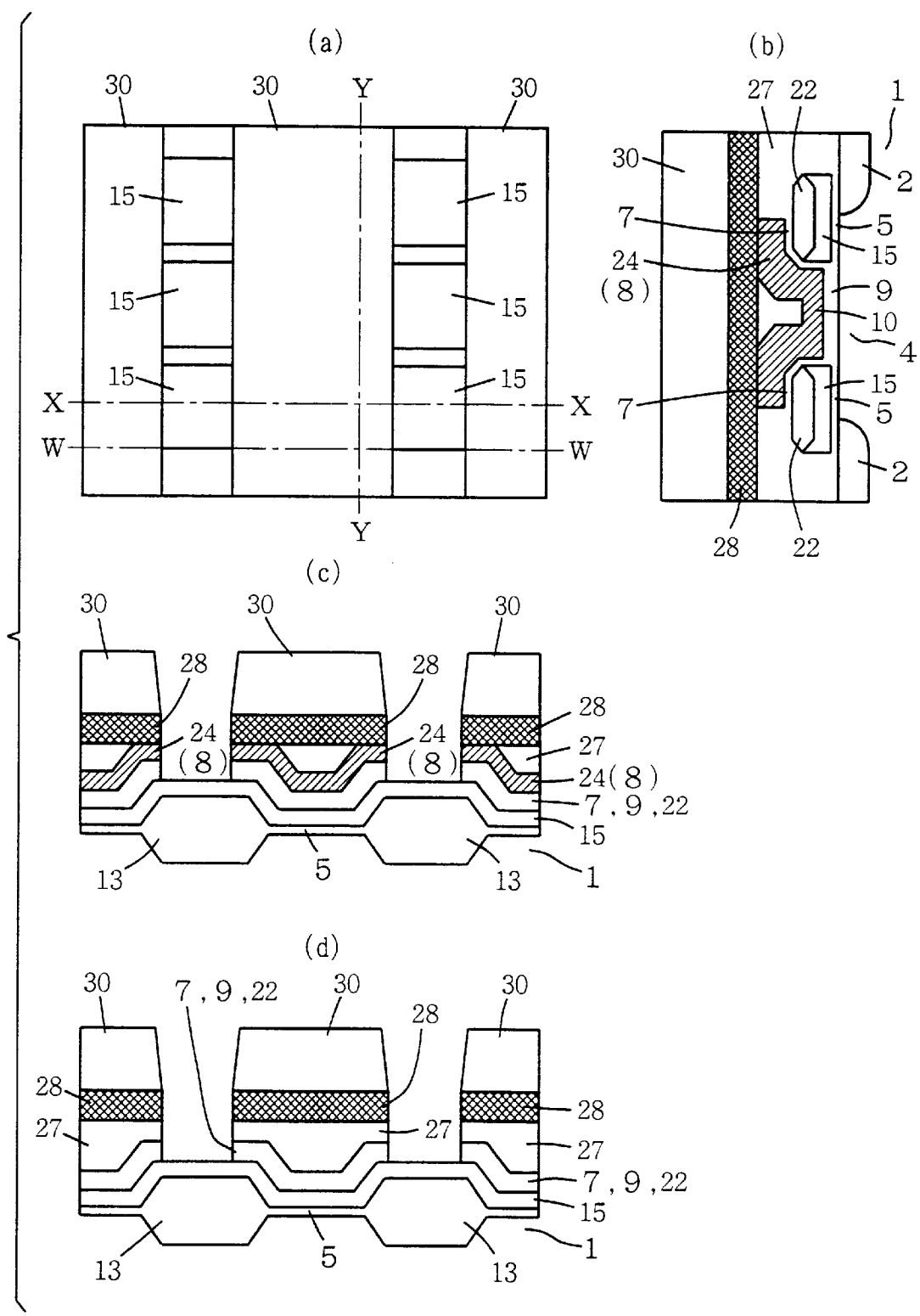
FIG. 27(a) is a plan view showing a thirteenth step in the second method of fabricating the memory cell array shown in FIG. 1, and FIGS. 27(b) to 27(d) are sectional views taken along the lines Y—Y, X—X and W—W in FIG. 27(a) respectively.
Figure 28:
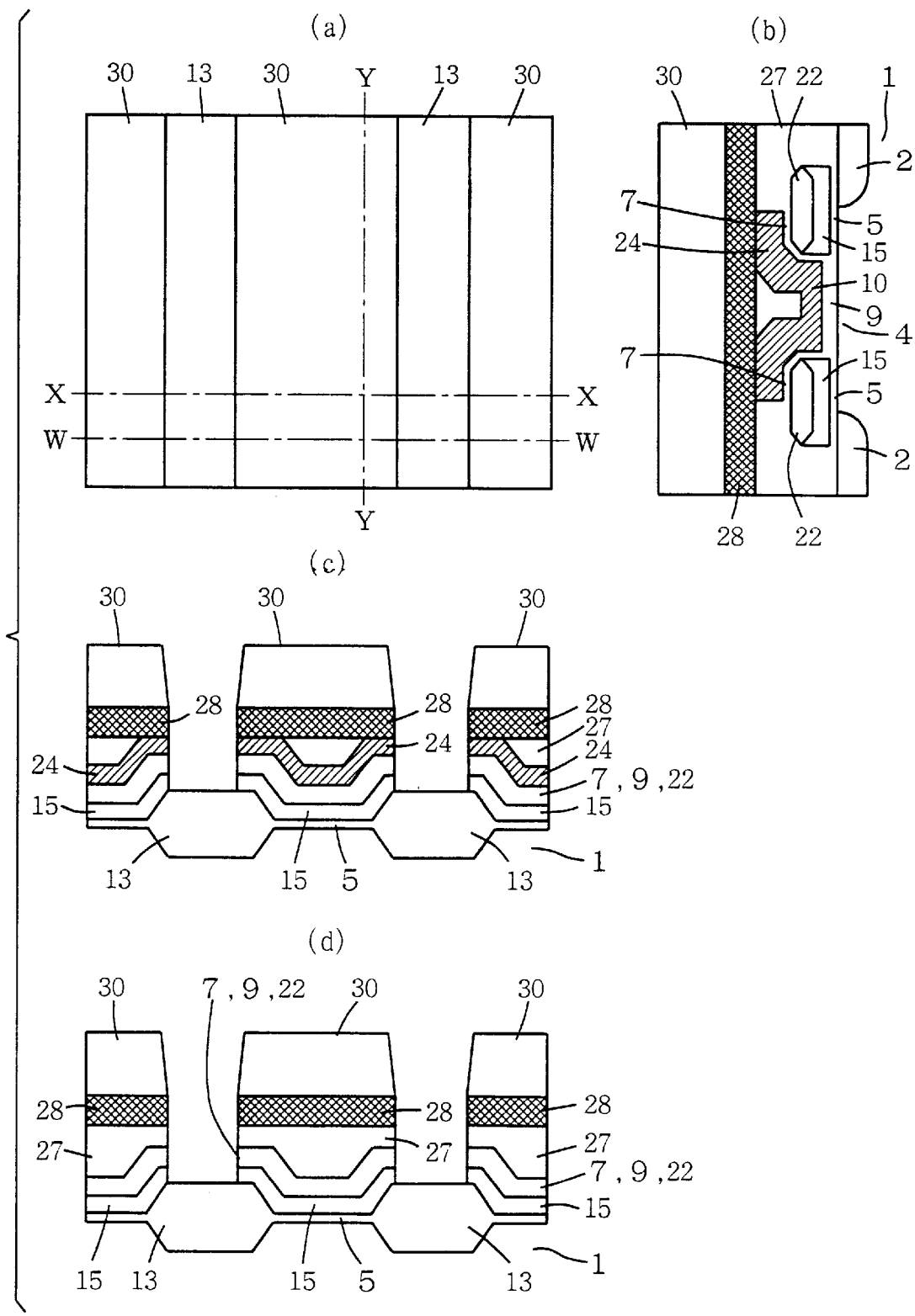
FIG. 28(a) is a plan view showing a fourteenth step in the second method of fabricating the memory cell array shown in FIG. 1, and FIGS. 28(b) to 28(d) are sectional views taken along the lines Y—Y, X—X and W—W in FIG. 28(a) respectively.
Figure 29:
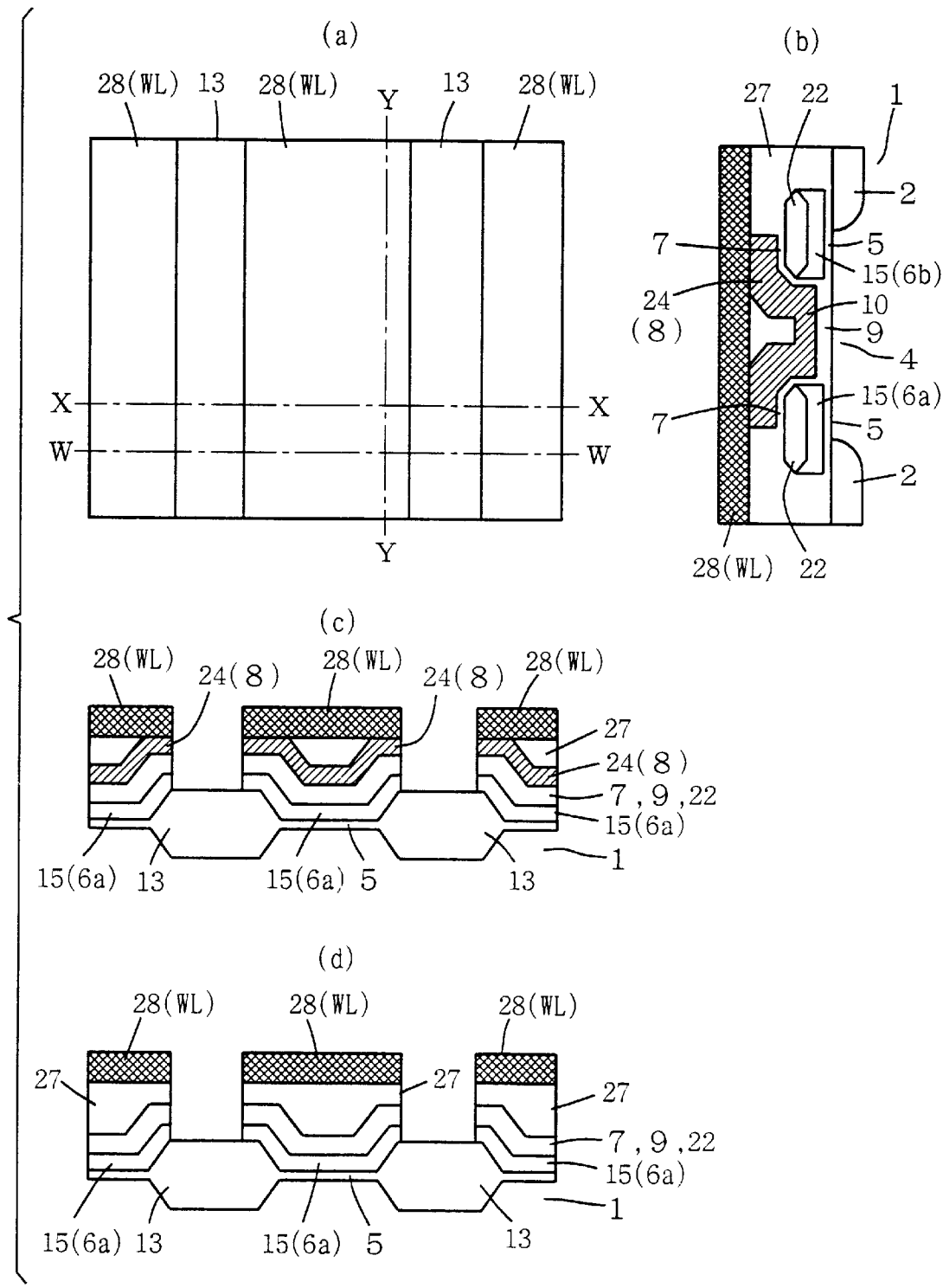
FIG. 29(a) is a plan view showing a fifteenth step in the second method of fabricating the memory cell array shown in FIG. 1, and FIGS. 29(b) to 29(d) are sectional views taken along the lines Y—Y, X—X and W—W in FIG. 29(a) respectively.

FIGS. 3, 4 and 5 are diagrams for illustrating the write, erase and read operations respectively. Referring to FIGS. 3 to 5, reference numeral 2a denotes the source/drain region 2 of the first memory cell 12a and reference numeral 2b denotes the source/drain region 2 of the second memory cell 12b for convenience of illustration.

(a) Write Operation (see FIG. 3)

An operation of writing data in the memory cell 12b connected to the word line WL shown in FIG. 3 is now described. The potential of the source/drain region 2a is set at about 1.2 V through the bit line BL, and that of the source/drain region 2b is set at 10 V through the bit line BL. The potentials of the remaining source/drain regions 2 are set at 3 V through the corresponding bit lines BL. Further, the potential of the word line WL is set at 2 V, while those of the remaining word lines WL are set at 0 V.

The threshold voltage Vth of the selection transistor 11 for the memory cell 12b is about 0.5 V. Therefore, electrons in the source/drain region 2a move into the channel region 4, which is in an inverted state. Thus, a cell current flows from the source/drain region 2b toward the source/drain region 2a.

The potential of the source/drain region 2b is 10 V, and hence the potential of the floating gate electrode 6b is pulled up to be close to 10 V due to coupling between the source/drain region 2b and the floating gate electrode 6b through the electrostatic capacitance. Therefore, a high electric field is formed between the channel region 4 and the floating gate electrode 6b.

Thus, the electrons in the channel region 4 are accelerated to form hot electrons and injected into the floating gate electrode 6b, as shown by arrow E in FIG. 3. Consequently, the electrons are stored in the floating gate electrode 6b. Thus, 1-bit data "0" is written in the memory cell 12b.

In particular, each floating gate electrode 6a or 6b is opposed to the control gate electrode 8 at only one surface, and hence the coupling capacitance C2 between the floating gate electrode 6a or 6b and the control gate electrode 8 is reduced. Therefore, the ratio [coupling ratio: C1/(C1+C2)] of the coupling capacitance C1 between the silicon substrate 1 and each source/drain region 2a or 2b and each floating gate electrode 6a or 6b to the coupling capacitance C2 between each floating gate electrode 6a or 6b and the control gate electrode 8 is increased.

Therefore, the potential of the floating gate electrode 6b can be readily increased for injecting the electrons from the channel region 4 into the floating gate electrode 6b at a high speed. Consequently, a high-speed write operation is enabled.

At this time, the potential of the floating gate electrode 6a is pulled up to be close to about 1.2 V due to coupling between the source/drain region 2a and the floating gate electrode 6a through the electrostatic capacitance. At such a low potential, however, no hot electrons are substantially injected into the floating gate electrode 6a. Thus, the hot electrons are injected only into the floating gate electrode 6b of the memory cell 12b.

(b) Erase Operation (see FIG. 4)

An operation of erasing data in all memory cells 12a and 12b connected to the word line WL shown in FIG. 4 is described. The potentials of all source/drain regions 2a and 2b are set at 0 V through the bit line BL. The potential of the selected word line WL is set at 15 V, while those of the remaining word lines WL are set at 0 V.

The electrostatic capacitance between the silicon substrate 1 and each source/drain region 2a or 2b and each floating gate electrode 6a or 6b is overwhelmingly larger than that between each floating gate electrode 6a or 6b and the control gate electrode 8. In other words, each floating gate electrode 6a or 6b is strongly coupled with the silicon substrate 1 and the source/drain region 2a or 2b. Even if the potential of the control gate electrode 8 reaches 15 V, therefore, the potentials of the floating gate electrodes 6a and 6b substantially remain at 0 V and a high electric field is formed between each floating gate electrode 6a or 6b and the control gate electrode 8.

Consequently, an F-N tunnel current flows between each floating gate electrode 6a or 6b and the control gate electrode 8, electrons in each floating gate electrode 6a or 6b are extracted toward the control gate electrode 8 as shown by arrow F, and data stored in each memory cell 12a or 12b is erased. In this case, the data of the memory cell 12b is "1".

At this time, the electrons in each floating gate electrode 6a or 6b jump out from the projection 60 formed on the peripheral edge portion of each floating gate electrode 6a or 6b and move toward the control gate electrode 8. Thus, movement of the electrons is facilitated and the electrons can be efficiently extracted from each floating gate electrode 6a or 6b.

When simultaneously selecting the plurality of word lines WL, data can be erased in all memory cells 12a and 12b connected to these word lines WL. Such an operation of dividing the memory cell array 12 into arbitrary blocks including the plurality of word lines WL and erasing data in units of the blocks is called a block erase operation.

(c) Read Operation (see FIG. 5)

An operation of reading data from the memory cell 12b connected to the word line WL shown in FIG. 5 is now described. The potential of the source/drain region 2a is set at 3 V through the bit line BL, and that of the source/drain region 2b is set at 0 V through the bit line BL. The remaining source/drain regions 2 are brought into open states. The potential of the word line WL is set at 4 V, and those of the remaining word lines WL are set at 0 V.

When the potential of the source/drain region 2a reaches 3 V, the potential of the floating gate electrode 6a is pulled up to be close to 3 V due to coupling between the source/drain region 2a and the floating gate electrode 6a through the electrostatic capacitance. Consequently, the channel region 4 located immediately under the floating gate electrode 6a enters an ON state regardless of presence/absence of electrons in the floating gate electrode 6a.

When the memory cell 12b is in a write state, electrons are stored in the floating gate electrode 6b and hence the channel region 4 located immediately under the floating gate electrode 6b is close to an OFF state. When the memory cell 12b is in an erase state, on the other hand, no electrons are stored in the floating gate electrode 6b and hence the channel region 4 located immediately under the floating gate electrode 6b is in an ON state.

When applying a voltage of 4 V to the control electrode 8, therefore, a cell current Ir flowing from the source/drain region 2a toward the source/drain region 2b in the erase state of the memory cell 12b is larger than that in the write state. Therefore, the value of the data stored in the memory cell 12b can be read by sensing the value of the cell current Ir through the sense amplifier 110.

A first method of fabricating the memory cell array 102 of the nonvolatile semiconductor memory 101 according to this embodiment is now described with reference to FIGS. 6(a) to 15(d). FIGS. 6(a) to 15(a) are plan views, FIGS. 6(b) to 15(b) are sectional views taken along the lines B—B in FIGS. 6(a) to 15(a) respectively, FIGS. 6(c) to 15(c) are sectional views taken along the lines C—C in FIGS. 6(a) to 15(a) respectively, and FIGS. 6(d) to 15(d) are sectional views taken along the lines D—D in FIGS. 6(a) to 15(a) respectively.

(1) Step 1 (see FIGS. 6(a) to 6(d))

The field oxide film 13 is formed on the silicon substrate 1 by selective oxidation (LOCOS: Local Oxidation on Silicon). Then, the first insulator film 5 of silicon oxide having a thickness of 10 to 15 nm is formed on element regions of the silicon substrate 1 excluding the field isolation film 13 by thermal oxidation.

(2) Step 2 (see FIGS. 7(a) to 7(d))

A polysilicon film 15 of about 200 nm in thickness is formed on the silicon substrate 1 and thereafter a silicon nitride film 20 of about 50 nm in thickness is formed on the polysilicon film 15. Thereafter a resist film 21 is applied to the overall surface of the silicon nitride film 20 and patterned through general photolithography, for forming openings in the element regions.

(3) Step 3 (see FIGS. 8(a) to 8(d))

The silicon nitride film 20 is partially removed by RIE (reactive ion etching) through the resist film 21 serving as a mask, for forming openings in the silicon nitride film 20. P (phosphorus) atoms are introduced as an impurity into parts of the polysilicon film 15 for defining the floating gate electrodes 6a and 6b by ion implantation or the like for providing conductivity, and thereafter the resist film 21 is removed. Thus, the polysilicon film 15 is exposed on the openings. The remaining regions on the polysilicon film 15 are covered with the silicon nitride film 20.

(4) Step 4 (see FIGS. 9(a) to 9(d))

The silicon substrate 1 is heat-treated in an oxidation atmosphere (pyrogenic oxidized at 900° C., for example) through the silicon nitride film 20, formed in the step 3, serving as a mask, for forming silicon oxide films 22 of about 150 nm in thickness on the polysilicon film 15.

At this time, regions of the polysilicon film 15 covered with the silicon nitride film 20 are not oxidized so that only the portions of the polysilicon film 15 exposed in the openings formed in the step 3 are selectively oxidized, while the oxidation species is also transversely diffused in the boundary regions therebetween. Thus, the obtained silicon oxide films 22 have thin ends in sectional shape, as shown in FIGS. 9(b), 9(c) and 9(d).

(5) Step 5 (see FIGS. 10(a) to 10(d))

The silicon nitride film 20 is removed with heated phosphoric acid or the like. Thus, two-layer structures of the silicon oxide films 22 and the polysilicon film 15 are formed on the regions for defining the floating gate electrodes 6a and 6b. Then, the polysilicon film 15 is removed by RIE through the silicon oxide films 22 serving as masks. Thus, the floating gate electrodes 6a and 6b are formed.

(6) Step 6 (see FIGS. 11(a) to 11(d))

The second insulator film 7 of silicon oxide and the insulator film 9 of silicon oxide are formed on the side walls of the floating gate electrodes 6a and 6b, the silicon oxide films 22 and the first insulator film 5 by thermal oxidation and/or LPCVD (liquid-phase chemical vapor deposition). At this time, the silicon oxide films 22, the second insulator film 7 and the insulator film 9 are stacked and integrated with each other.

Then, an ion implantation mask 23 is formed to cover at least the channel region 4 held between the floating gate electrodes 6a and 6b while not jutting out from the floating gate electrodes 6a and 6b. P (phosphorus) ions are injected at injection energy of about 40 keV at a dosage of 1×15 to 4×15 cm$^{-2}$ by general ion implantation for forming the source/drain regions 2 on the surface of the silicon substrate 1. Thereafter the ion implantation mask 23 is removed. Consequently, end portions of the floating gate electrodes 6a and 6b substantially define the positions of the source/drain regions 2.

(7) Step 7 (see FIGS. 12(a) to 12(d))

A polysilicon film for defining the control gate electrode 8 and the selection gate electrode 10 is formed on the silicon substrate 1 formed in the step 6 and thereafter P atoms are introduced into the polysilicon film as an impurity through ion implantation or the like for providing conductivity. Further, a tungsten silicide film is formed on the polysilicon film by CVD or the like for reducing resistance, thereby forming a multilayer film of the tungsten silicide film and the polysilicon film. FIGS. 12(b) and 12(c) show a tungsten polycide film 24 of the tungsten silicide film and the polysilicon film integrated with each other.

Then, an island-shaped resist pattern 26 including parts located on the channel region 4 and the pair of floating gate electrodes 6a and 6b is formed by general photolithography. The tungsten polycide film 24 is removed by RIE through the resist pattern 26 serving as a mask, and thereafter the resist pattern 26 is removed. Thus, the control gate electrode 8 is obtained in the form of an island extending from the channel region 4 located between the pair of floating gate electrodes 6a and 6b toward the two floating gate electrodes 6a and 6b. The part of the control gate electrode 8 located on the channel region 4 defines the selection gate electrode 10.

(8) Step 8 (see FIGS. 13(a) to 13(d).)

Then, the interlayer isolation film 27 of silicon oxide having a thickness of about 1000 nm is formed on the overall surface of the silicon substrate 1 formed in the step 7 by LPCVD or the like. Alternatively, the interlayer isolation film 27 may be formed by a BPSG (boro-phospho-silicate glass) film formed by plasma CVD or the like or a combination of a silicon oxide film and a BPSG film, in place of the silicon oxide film.

(9) Step 9 (see FIGS. 14(a) to 14(d))

Then, the interlayer isolation film 27 is polished by general CMP (chemical mechanical polishing) to expose a surface of the control gate electrode 8. Alternatively, the thickness of the interlayer isolation film 27 may be reduced by another method such as an etch-back method.

(10) Step 10 (see FIGS. 15(a) to 15(d))

A polysilicon film is formed on the silicon substrate 1 formed in the step 9 and thereafter P atoms are introduced into the polysilicon film as an impurity by ion implantation or the like for providing conductivity. Further, a tungsten silicide film is formed on the polysilicon film by CVD or the like for reducing resistance, thereby defining a multilayer film of the polysilicon film and the tungsten silicide film. FIGS. 15(a) to 15(d) show a tungsten polycide film 28 of the polysilicon film and the tungsten silicide film integrated with each other.

Then, stripy resist patterns 30 including adjacent ones of the control gate electrodes 8 are formed by general photolithography. The tungsten polycide films 28 are removed by RIE through the resist patterns 30 serving as masks, and thereafter the resist patterns 30 are removed. Thus, the word lines WL are obtained.

In this case, the word lines WL formed by conductor layers are formed on the control gate electrodes 8 having the surfaces exposed in the step 9, whereby the adjacent control gate electrodes 8 can be connected with each other without opening contact holes through masks.

(11) Step 11

Subsequent steps are similar to those for fabricating a general MOS-LSI (metal-oxide silicon large-scale integrated circuit).

In the memory cell array 102 of the nonvolatile semiconductor memory 101 according to this embodiment fabricated through the aforementioned method, each floating gate electrode 6a or 6b is capacitively coupled with the control gate electrode 8 only through the second insulator film 7 closer to the selection transistor 11, whereby a memory cell having a high coupling ratio can be obtained.

Further, the capacitance of the word line WL is reduced due to the thick interlayer isolation film 27 provided between the word line WL and the silicon substrate 1.

A second method of fabricating the memory cell array 102 of the nonvolatile semiconductor memory 101 according to this embodiment is now described with reference to FIGS. 16(a) to 29(d). FIGS. 16(a) to 29(a) are plan views, FIGS. 16(b) to 29(b) are sectional views taken along the lines Y—Y in FIGS. 16(a) to 29(a) respectively, and FIGS. 16(c) to 29(c) are sectional views taken along the lines X—X in FIGS. 16(a) to 29(a) respectively. FIGS. 22(d) to 29(d) are sectional views taken along the lines W—W in FIGS. 22(a) to 29(a) respectively.

(1) Step 1 (see FIGS. 16(a) to 16(c))

The field isolation film 13 is formed on the silicon substrate 1 by selective oxidation (LOCOS). Then, the first insulator film 5 of silicon oxide having a thickness of 10 to 15 nm is formed on element regions of the silicon substrate 1 excluding the field isolation film 13 by thermal oxidation.

(2) Step 2 (see FIGS. 17(a) to 17(c))

A polysilicon film 15 of about 200 nm in thickness is formed on the silicon substrate 1 and thereafter a silicon nitride film 20 of about 50 nm in thickness is formed on the polysilicon film 15. Thereafter a resist film 21 is applied to the overall surface of the silicon nitride film 20 and patterned through general photolithography, for forming stripy openings in the element regions. No resist film 21 appears in FIG. 17(c) showing the section taken along the line X—X.

(3) Step 3 (see FIGS. 18(a) to 18(c))

The silicon nitride film 20 is partially removed by RIE (reactive ion etching) through the resist film 21 serving as a mask, for working the silicon nitride film 20 in the form of stripes. P (phosphorus) atoms are introduced as an impurity into parts of the polysilicon film 15 for defining the floating gate electrodes 6a and 6b by ion implantation or the like for providing conductivity, and thereafter the resist film 21 is removed. Thus, the polysilicon film 15 is exposed on the stripy openings. The remaining regions on the polysilicon film 15 are covered with the silicon nitride film 20.

(4) Step 4 (see FIGS. 19(a) to 19(c))

The silicon substrate 1 is heat-treated in an oxidation atmosphere (pyrogenic oxidized at 900° C., for example) through the silicon nitride film 20, formed in the step 3, serving as a mask, for forming silicon oxide films 22 of about 150 nm in thickness on the polysilicon film 15.

At this time, regions of the polysilicon film 15 covered with the silicon nitride film 20 are not oxidized so that only the portions of the polysilicon film 15 exposed in the stripy openings formed in the step 3 are selectively oxidized, while the oxidation species is also transversely diffused in the boundary regions therebetween. Thus, the obtained silicon oxide films 22 have thin ends in sectional shape, as shown in FIG. 19(b).

(5) Step 5 (see FIGS. 20(a) to 20(c))

The silicon nitride film 20 is removed with heated phosphoric acid or the like, and the polysilicon film 15 is removed by RIE through the silicon oxide films 22 serving as masks. Thus, two-layer structures (multilayer films) of the stripy silicon oxide films 22 and the polysilicon film 15, including the parts for defining the floating gate electrodes 6a and 6b, are formed.

(6) Step 6 (see FIGS. 21(a) to 21(c))

The second insulator film 7 of silicon oxide and the insulator film 9 of silicon oxide are formed on the side walls of the stripy polysilicon film 15, the silicon oxide films 22 and the first insulator film 5 by thermal oxidation and/or LPCVD (liquid-phase chemical vapor deposition). At this time, the silicon oxide films 22, the second insulator film 7 and the insulator film 9 are stacked and integrated with each other.

Then, an ion implantation mask 23 is formed to cover at least the channel region 4 held between the stripy multilayer films of the silicon oxide films 22 and the polysilicon film while not jutting out from the stripy multilayer films of the silicon oxide films 22 and the polysilicon film 15. P (phosphorus) ions are injected at injection energy of about 40 keV in a dosage of 1×15 to 4×15 cm² by general ion implantation for forming the source/drain regions 2 on the surface of the silicon substrate 1. Thereafter the ion implantation mask 23 is removed. Consequently, end portions of the stripy multilayer films formed by the silicon oxide films 22 and the polysilicon film 15 substantially define the positions of the source/drain regions 2.

(7) Step 7 (see FIGS. 22(a) to 22(d))

A polysilicon film for defining the control gate electrode 8 and the selection gate electrode 10 is formed on the silicon substrate 1 formed in the step 6 and thereafter P atoms are introduced into the polysilicon film as an impurity through ion implantation or the like for providing conductivity. Further, a tungsten silicide film is formed on the polysilicon film by CVD or the like for reducing resistance, thereby forming a multilayer film of the tungsten silicide film and the polysilicon film. FIGS. 22(b) and 22(c) show a tungsten polycide film 24 of the tungsten silicide film and the polysilicon film integrated with each other.

Then, a stripy resist pattern 26 including parts of the channel region 4 and the stripy multilayer films formed by each pair of silicon oxide films 22 and the polysilicon film 15 is formed by general photolithography. The tungsten polycide film 24 is removed by RIE through the resist pattern 26 serving as a mask, and thereafter the resist pattern 26 is removed. Thus, the stripy tungsten polycide film 24 extending from above the channel region 4 located between the stripy multilayer films formed by each pair of silicon oxide films 22 and the polysilicon film 15 to above the stripy multilayer films formed by two silicon oxide films 22 and the polysilicon film 15 is obtained. The tungsten polycide film 24 defines the control gate electrode 8 and the selection gate electrode 10 later.

(8) Step 8 (see FIGS. 23(a) to 23(d))

Then, the interlayer isolation film 27 of silicon oxide having a thickness of about 1000 nm is formed on the overall surface of the silicon substrate 1 formed in the step 7 by LPCVD or the like. Alternatively, the interlayer isolation film 27 may be formed by a BPSG (boro-phospho-silicate glass) film formed by plasma CVD or the like or a combination of a silicon oxide film and a BPSG film, in place of the silicon oxide film.

(9) Step 9 (see FIGS. 24(a) to 24(d))

Then, the interlayer isolation film 27 is polished by general CMP (chemical mechanical polishing) to expose a surface of the tungsten polycide film 24. Alternatively, the thickness of the interlayer isolation film 27 may be reduced by another method such as an etch-back method. No surface of the tungsten polycide film 24 is exposed on the section shown in FIG. 24(b) taken along the line Y—Y, which is the central portion of an active region (channel region 4).

(10) Step 10 (see FIGS. 25(a) to 25(d))

A polysilicon film is formed on the silicon substrate 1 formed in the step 9 and thereafter P atoms are introduced into the polysilicon film as an impurity by ion implantation or the like for providing conductivity. Further, a tungsten silicide film is formed on the polysilicon film by CVD or the like for reducing resistance, thereby defining a multilayer film of the polysilicon film and the tungsten silicide film. FIGS. 25(a) to 25(d) show a tungsten polycide film 28 of the polysilicon film and the tungsten silicide film integrated with each other.

Then, stripy resist patterns 30 are formed by general photolithography. On the section shown in FIG. 25(b) taken along the line Y—Y slightly deviating from the central portion of the channel region 4, the surface of the tungsten polycide film 24 is exposed and the tungsten polycide films 24 and 28 are electrically connected with each other.

(11) Step 11 (see FIGS. 26(a) to 26(d))

The tungsten polycide film 28 is selectively etched with respect to the silicon oxide film by RIE through the resist patterns 30 formed in the step 10 serving as masks. In this case, conditions slightly etching the silicon oxide film are employed.

The tungsten polycide films 24 and 28, which are continuous with each other, are etched until the silicon oxide film is exposed in the stripy openings and partially removed. Consequently, the tungsten polycide film 28 is patterned in the form of stripes. Thereafter the resist patterns 30 are removed. The stripy tungsten polycide film 28 forms the word line WL.

(12) Step 12 (see FIGS. 27(a) to 27(d))

The silicon oxide film is selectively etched with respect to the tungsten polycide film 24 by RIE through the resist patterns 30 formed on the silicon substrate 1 in the step 11 serving as masks. Consequently, the silicon oxide film is etched until the polysilicon film 15 and the tungsten polycide film 24 are exposed in the stripy openings, and removed.

(13) Step 13 (see FIGS. 28(a) to 28(d))

The tungsten polycide film 24 is selectively etched with respect to the silicon oxide film by RIE through the resist patterns 30 formed on the silicon substrate 1 in the step 12 serving as masks.

Consequently, the polysilicon film 15 and the tungsten silicide film 24 are removed from the stripy openings, as shown in FIGS. 28(c) and 28(d). Thus, the tungsten polycide film 24 is patterned in the form of an island. The polysilicon film 15 is also patterned in the form of islands.

(14) Step 14 (see FIGS. 29(a) to 29(d))

The resist patterns 30 employed in the step 13 are removed. The patterned stripy tungsten polycide film 28 forms the word line WL. The patterned stripy tungsten polycide film 24 forms the control gate electrode 8. The part of the control gate electrode 8 located on the channel region 4 forms the selection gate electrode 10. The polysilicon film 15 patterned in the form of islands forms the floating gate electrodes 6a and 6b.

(15) Step 15

Subsequent steps are similar to those for a general MOS-LSI (metal-oxide silicon large-scale integrated circuit).

According to the aforementioned method, the tungsten polycide film 24 for forming the control gate electrode 8 is patterned in a self-alignment manner with respect to the word line WL. Thus, no misalignment in the photolithography step may be taken into consideration and refinement is enabled by reduction of allowance for alignment. Further, dispersion of the coupling capacitances between the control gate electrode 8 and the floating gate electrodes 6a and 6b is reduced. Thus, dispersion of the characteristics is reduced to enable improvement of the element characteristics and the fabrication yield.

Also in the memory cell array 102 of the nonvolatile semiconductor memory 101 according to this embodiment fabricated by the aforementioned method, each floating gate electrode 6a or 6b is capacitively coupled with the control gate electrode 8 only through the second insulator film 7 closer to the selection transistor 11, whereby a memory cell having a high coupling ratio can be obtained.

Further, the capacitance of the word line WL is reduced due to the thick interlayer isolation film 27 provided between the word line WL and the silicon substrate 1.

Second Embodiment

Figure 30:
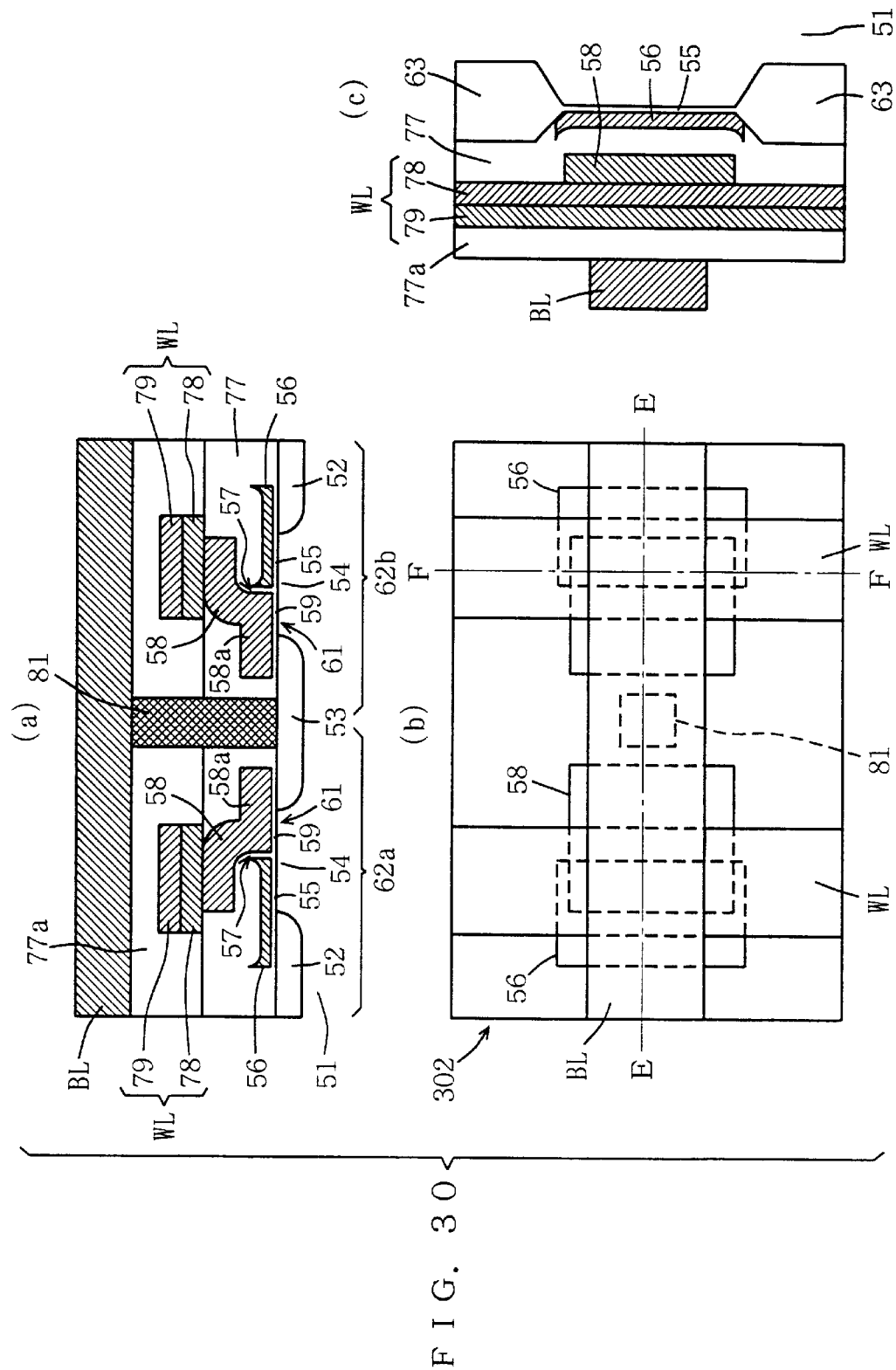
FIG. 30(a) is a sectional view of a memory cell array of a nonvolatile semiconductor memory according to a second embodiment of the present invention taken along the line E—E in FIG. 30(b)
FIG. 30(b) is a plan view thereof.
FIG. 30(c) is a sectional view taken along the line F—F in FIG. 30(b)

FIG. 30(a) is a sectional view of a memory cell array 302 of a nonvolatile semiconductor memory according to a second embodiment of the present invention taken along the line E—E in FIG. 30(b), FIG. 30(b) is a plan view of the memory cell array 302 shown in FIG. 30(a), and FIG. 30(c) is a sectional view of the memory cell array 302 shown in FIG. 30(a) taken along the line F—F in FIG. 30(b).

Referring to FIGS. 30(a) to 30(c), the memory cell array 302 is formed by a plurality of split gate memory cells 62a and 62b arranged in the form of a matrix. FIGS. 30(a) to 30(c) show only a pair of memory cells 62a and 62b. Source regions 52 doped with an n-type impurity and a drain region 53 doped with an n-type impurity are alternately formed on a surface of a p-type single-crystalline silicon substrate 51 at prescribed spaces. Regions of the silicon substrate 51 located between the source regions 52 and the drain region 53 form channel regions 54.

A floating gate electrode 56 is formed on a side of each channel region 54 closer to each source region 52 through a first insulator film 55. Projections are formed on peripheral edge portions of an upper surface of each floating gate electrode 56. A control gate electrode 58 is formed on a region over a single side surface and an upper portion of each floating gate electrode 56 through a second insulator film 57 of silicon oxide.

A part of each control gate electrode 58 is arranged on each channel region 54 through an insulator film 59 of silicon oxide, to extend onto the drain region 53. Apart of the control gate electrode 58 located on the channel region 54 forms a selection gate electrode 58a. The control gate electrode 58 is opposed to the floating gate electrode 56 at one surface through the second insulator film 57, as described later.

The common drain region 53, the first source region 52, the first channel region 54, the first and second insulator films 55 and 57, the insulator film 59, the first floating gate electrode 56 and the first control gate electrode 58 form the memory cell 62a, while the common drain region 53, the second source region 52, the second channel region 54, the first and second insulator films 55 and 57, the insulator film 59, the second floating gate electrode 56 and the second control gate electrode 58 form the memory cell 62b. Further, the common drain region 53, the first source region 52, the first channel region 54, the insulator film 59 and the first control gate electrode 58 form a selection transistor 61 for selecting the memory cell 62a, while the common drain region 53, the second source region 52, the second channel region 54, the insulator film 59 and the second control gate electrode 58 form a selection transistor 61 for selecting the memory cell 62b.

On the silicon substrate 51, the first insulator film 55, the second insulator film 57 and the insulator film 59 are stacked and integrated with each other except the regions of the floating gate electrodes 56. As shown in FIGS. 30(b) and 30(c), a field isolation film 63 is formed on the silicon substrate 51 for electrically isolating the memory cells 62a and 62b from each other. An interlayer isolation film 77 is provided on the source regions 52, the drain region 53 and the floating gate electrodes 56 of the silicon substrate 51.

Word lines WL formed by multilayer structures of polysilicon films 78 and tungsten silicide films 79 are arranged on the interlayer isolation film 77 along a direction perpendicular to the channel length direction of the channel regions 54 located between the source regions 52 and the drain region 53. Each control gate electrode 58 is connected to each word line WL. Each source region 52 extends in a direction parallel to each word line WL, to be employed as a source line.

Another interlayer isolation film 77a is formed on the word lines WL and the interlayer isolation film 77. Bit lines BL made of a conductive material such as a metal are arranged along a direction perpendicular to the word lines WL. A plurality of drain regions 53 arranged along the bit lines BL are connected to the bit lines BL through conductive contacts 81.

The nonvolatile semiconductor memory according to this embodiment, which is provided with the selection transistor 61 for each memory cell 62a or 62b, has a function of selecting each memory cell 62a or 62b itself. Even if overerasing takes place, therefore, no problem arises since the selection transistor 11 can control conduction and non-conduction of the memory cell 12a or 12b.

Figure 31:
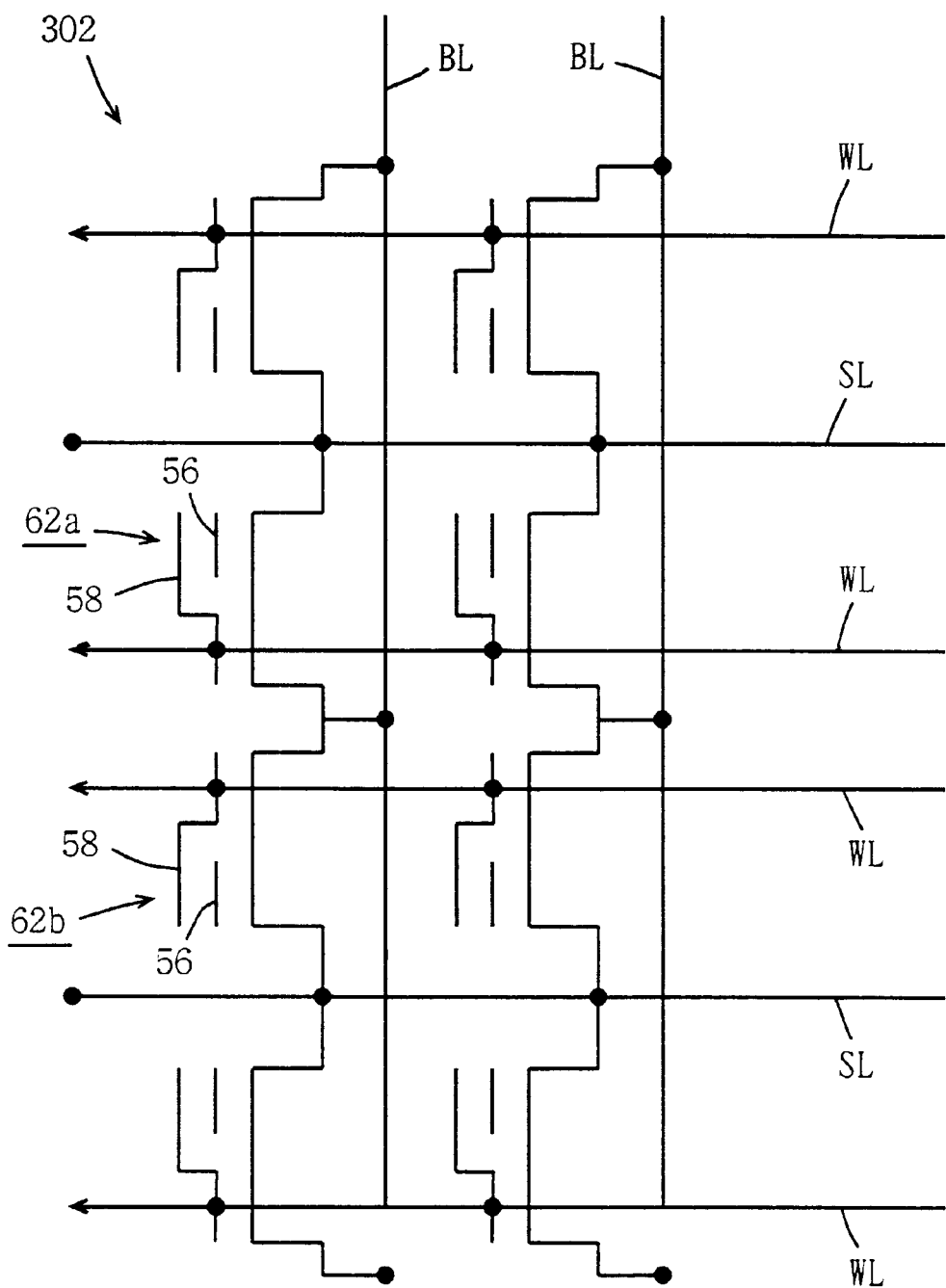
FIG. 31 is a circuit diagram showing the structure of the memory cell array of the nonvolatile semiconductor memory according to the second embodiment of the present invention.

FIG. 31 illustrates the structure of the nonvolatile semiconductor memory 302 according to this embodiment. The nonvolatile semiconductor memory according to this embodiment is a flash EEPROM employing split gate memory cells.

In the memory cell array 302 of the nonvolatile semiconductor memory shown in FIG. 31, a plurality of bit lines BL and a plurality of word lines WL are arranged to substantially perpendicularly intersect with each other. Further, a plurality of source lines SL are arranged in parallel with the plurality of word lines WL. The bit lines BL are arranged along a column direction, and the word lines W are arranged along a row direction. The memory cells 62a and 62b are arranged on intersection points between the bit lines BL and the word lines WL.

The plurality of word lines WL of the memory cell array 302 are connected to a row address decoder 103 (see FIG. 2), while the plurality of bit lines BL are connected to a column address decoder 104 (see FIG. 2). The peripheral part of the memory cell array 302 of the nonvolatile semiconductor memory according to this embodiment is similar in structure to that of the memory cell array 102 of the nonvolatile semiconductor memory 101 shown in FIG. 2.

Figure 71:
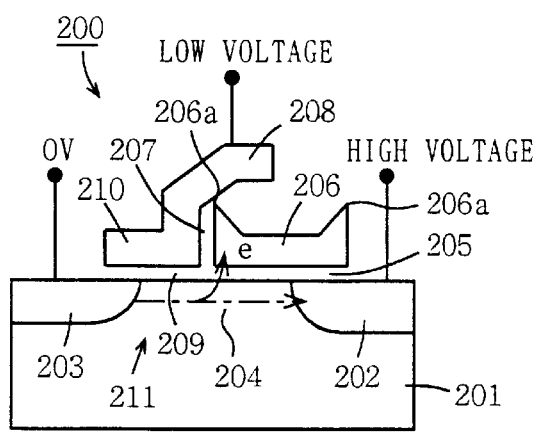
FIG. 71 illustrates a write operation in the conventional split gate memory cell.
Figure 72:
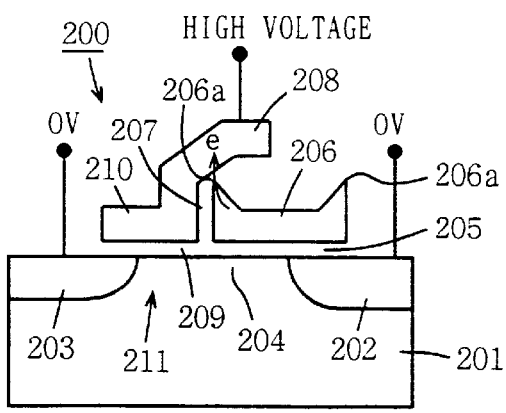
FIG. 72 illustrates an erase operation in the conventional split gate memory cell.
Figure 73:
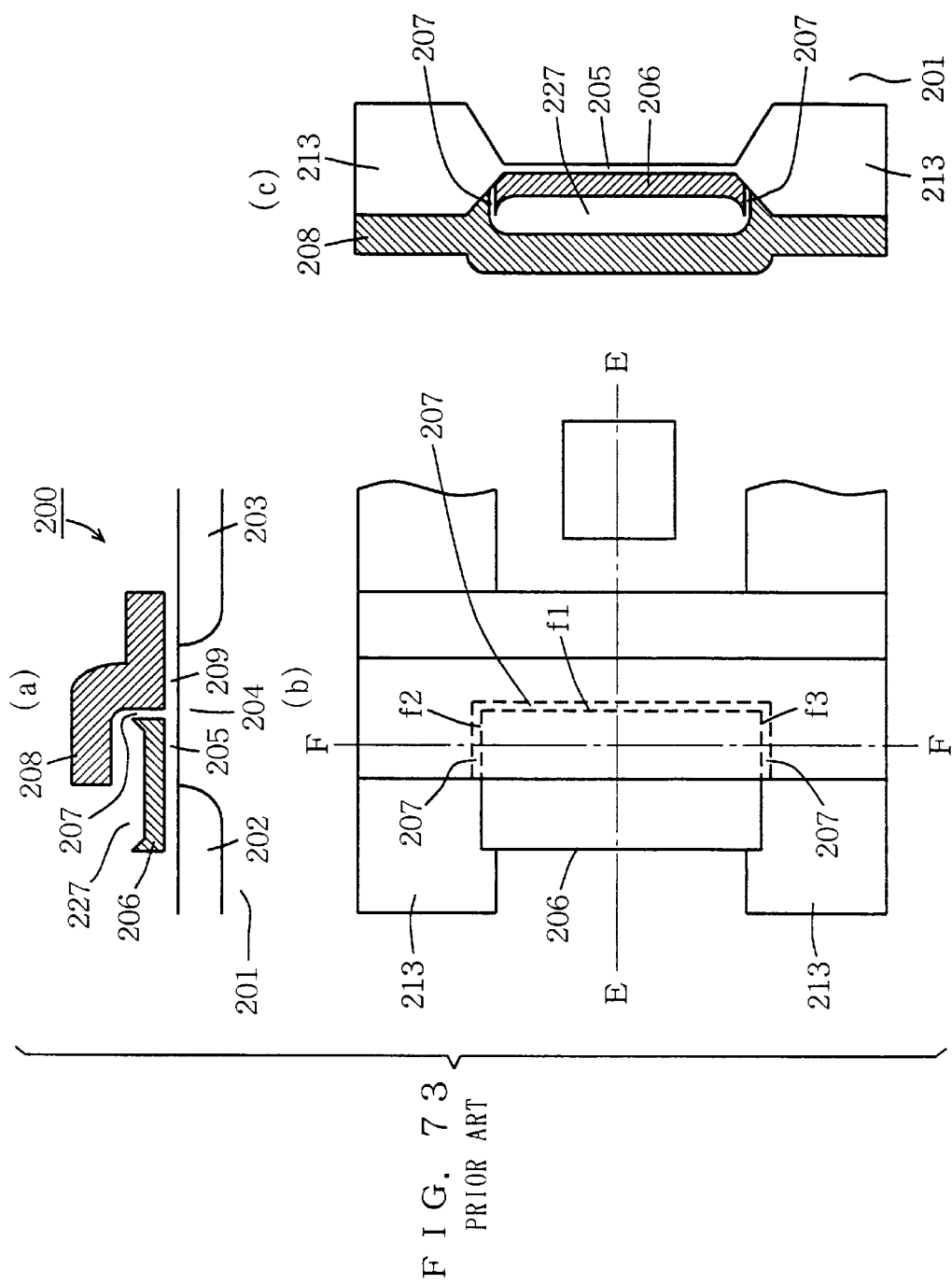
FIG. 73(a) is a sectional view taken along:the line E—E in FIG. 73(b) for illustrating problems in the conventional split gate memory cell.
FIG. 73(b) is a plan view thereof and FIG. 73(c) is a sectional view taken along the line F—F in FIG. 73(b)
Figure 74:
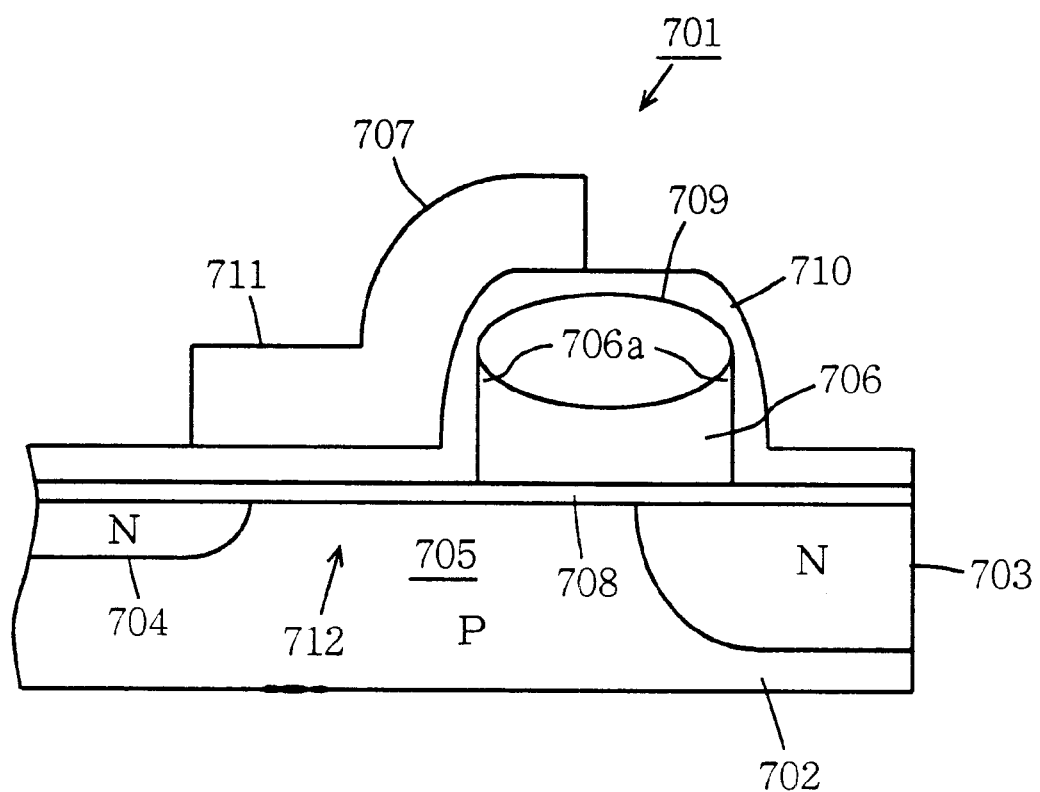
FIG. 74 is a schematic sectional view showing another conventional split gate memory cell.
Figure 75:
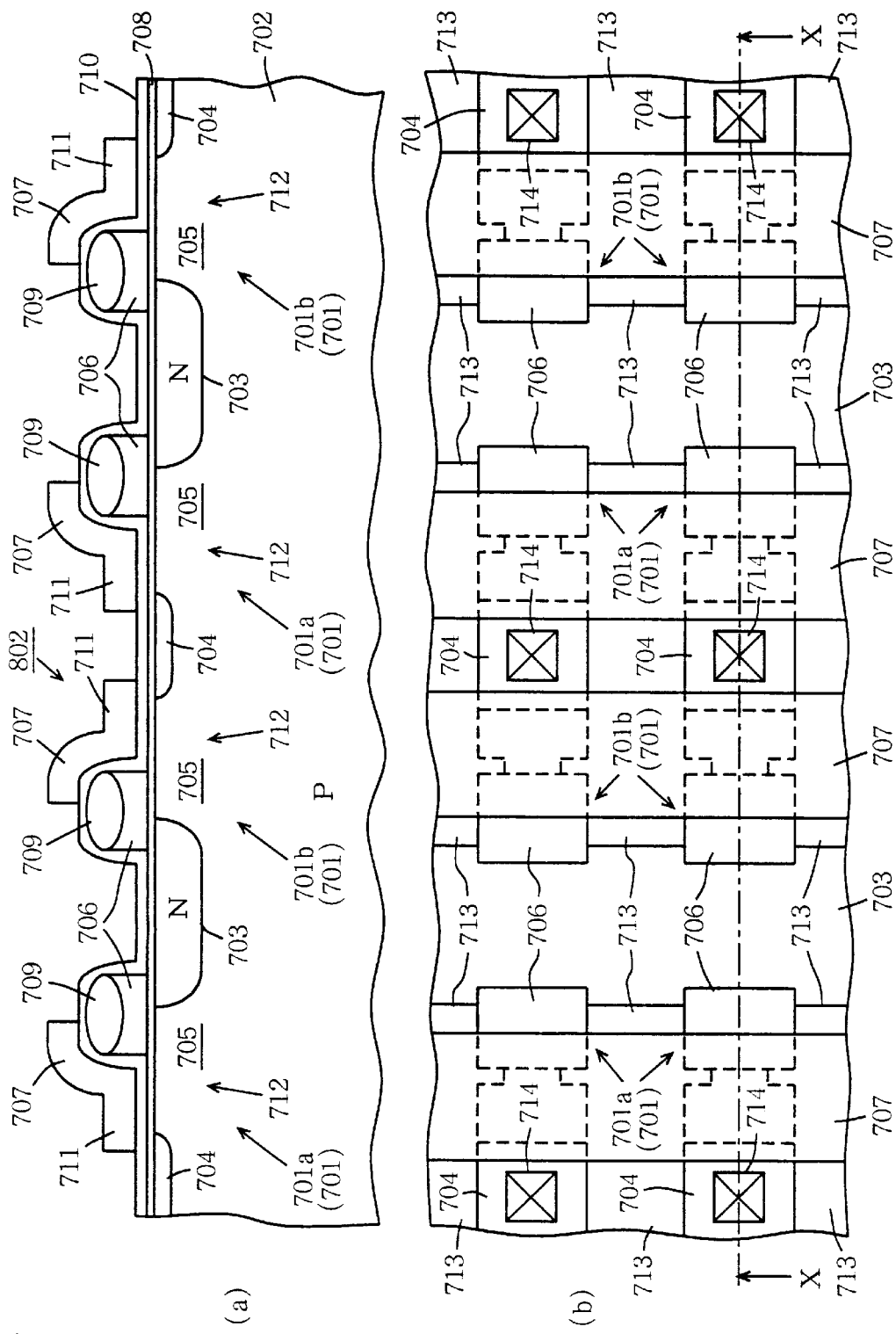
FIG. 75(a) is a sectional view of a conventional nonvolatile semiconductor memory taken along the line X—X in FIG. 75(b)
FIG. 75(b) is a partially fragmented plan view thereof.
Figure 76:
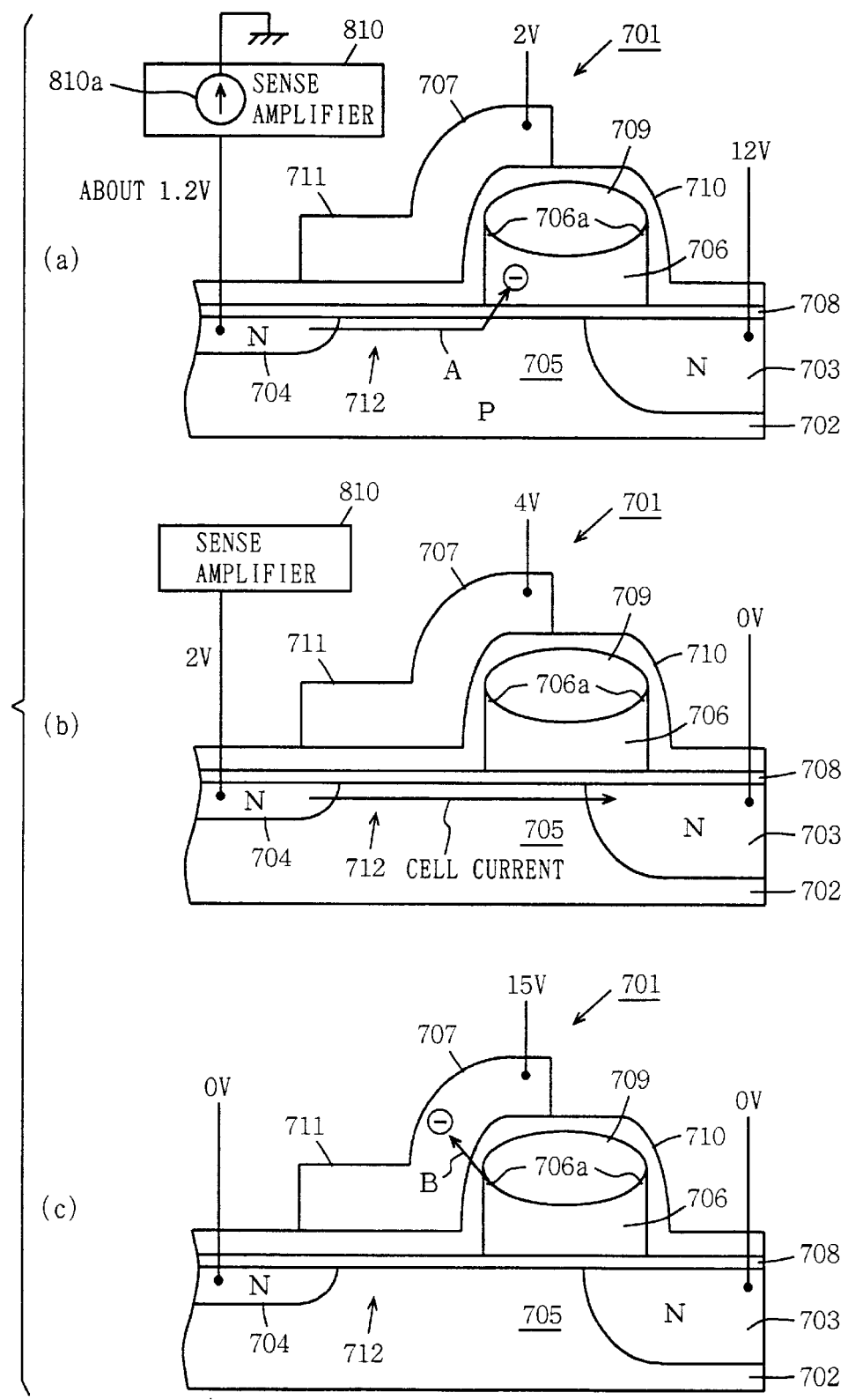
FIGS. 76(a) to 76(c) are partially fragmented sectional views for illustrating functions of the conventional split gate memory cell.
Figure 77:
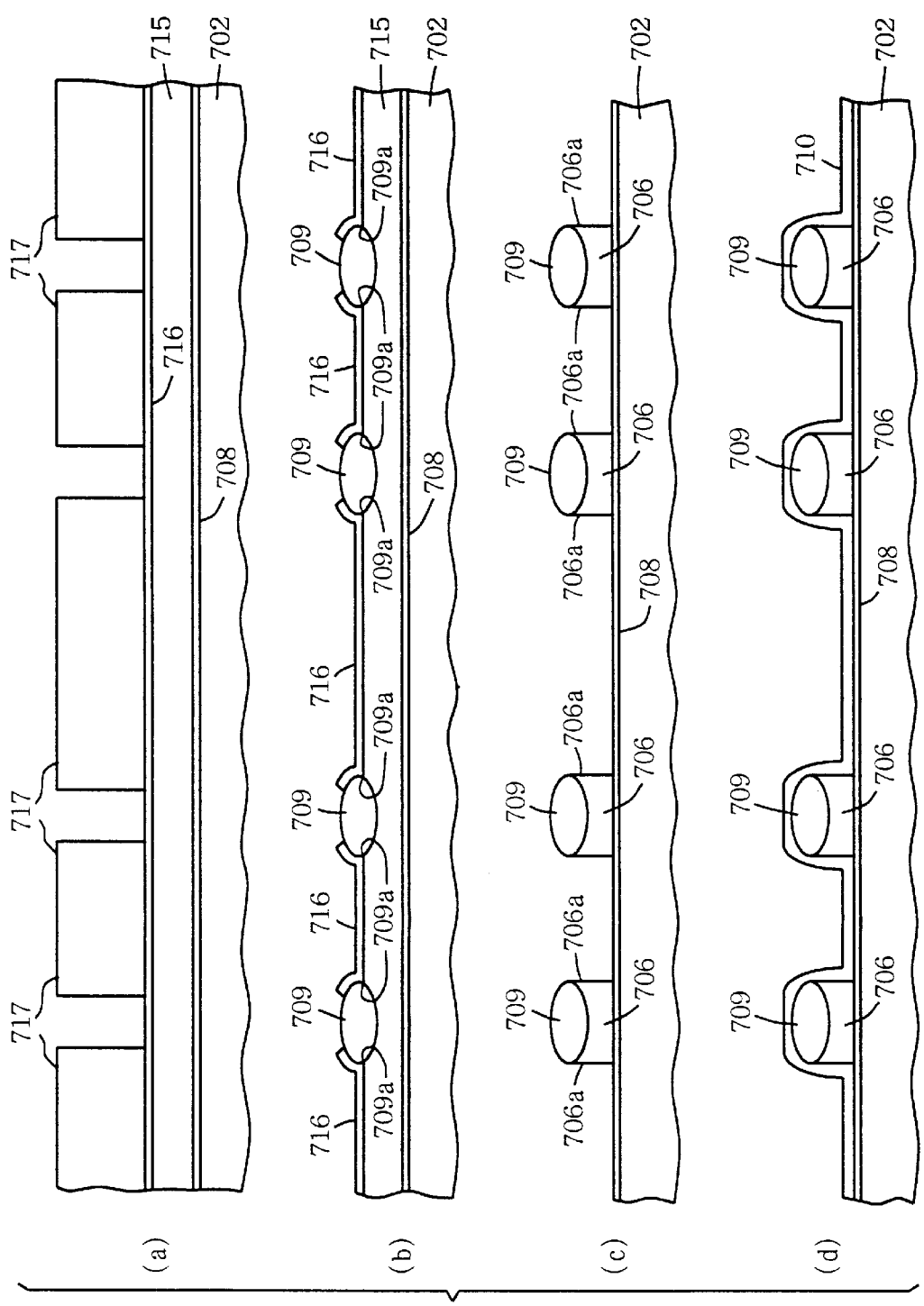
FIGS. 77(a) to 77(d) are sectional views for illustrating a method of fabricating the conventional nonvolatile semiconductor memory.
Figure 78:
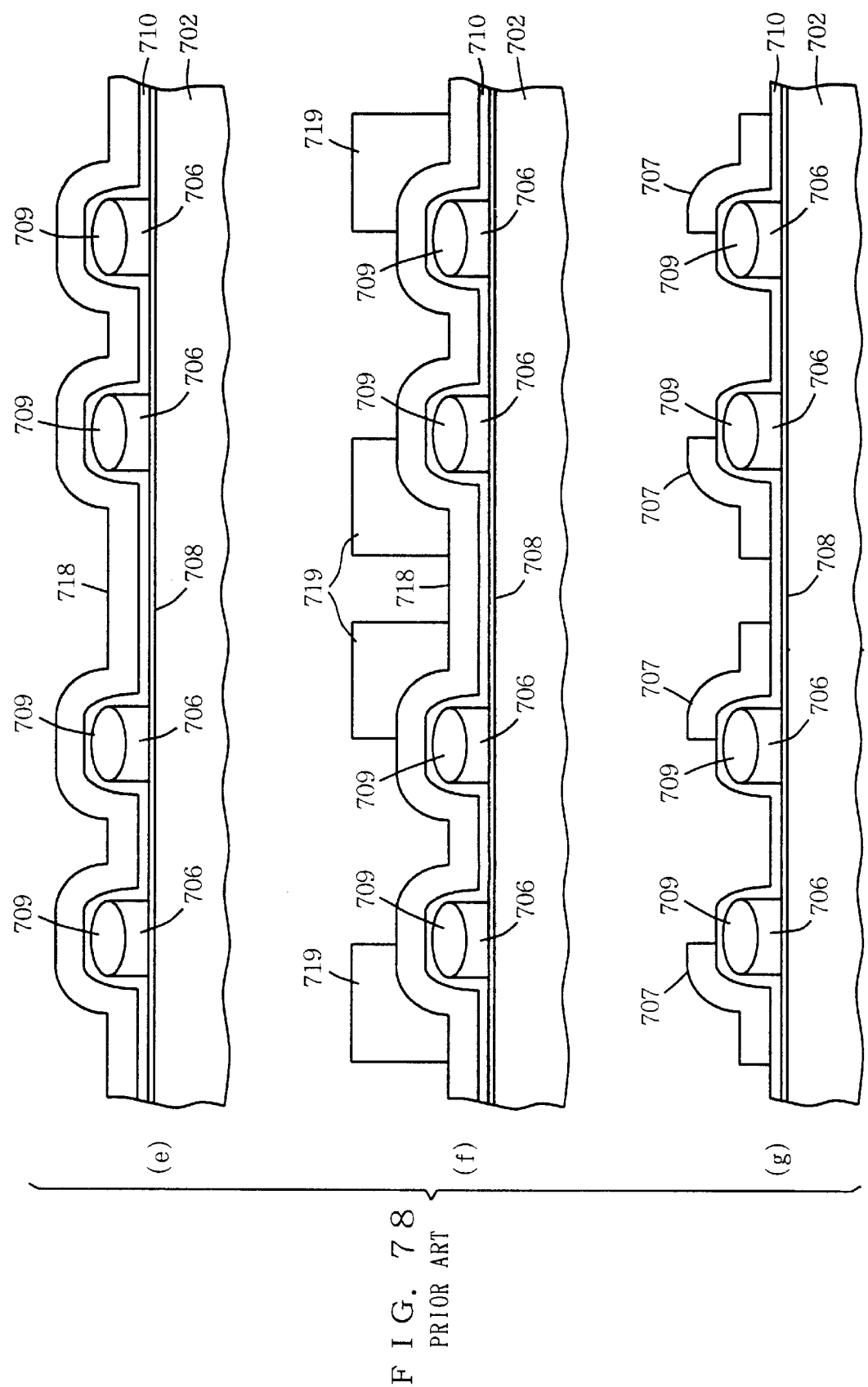
FIGS. 78(e) to 78(g) are sectional views for illustrating the method of fabricating the conventional nonvolatile semiconductor memory.
Figure 79:
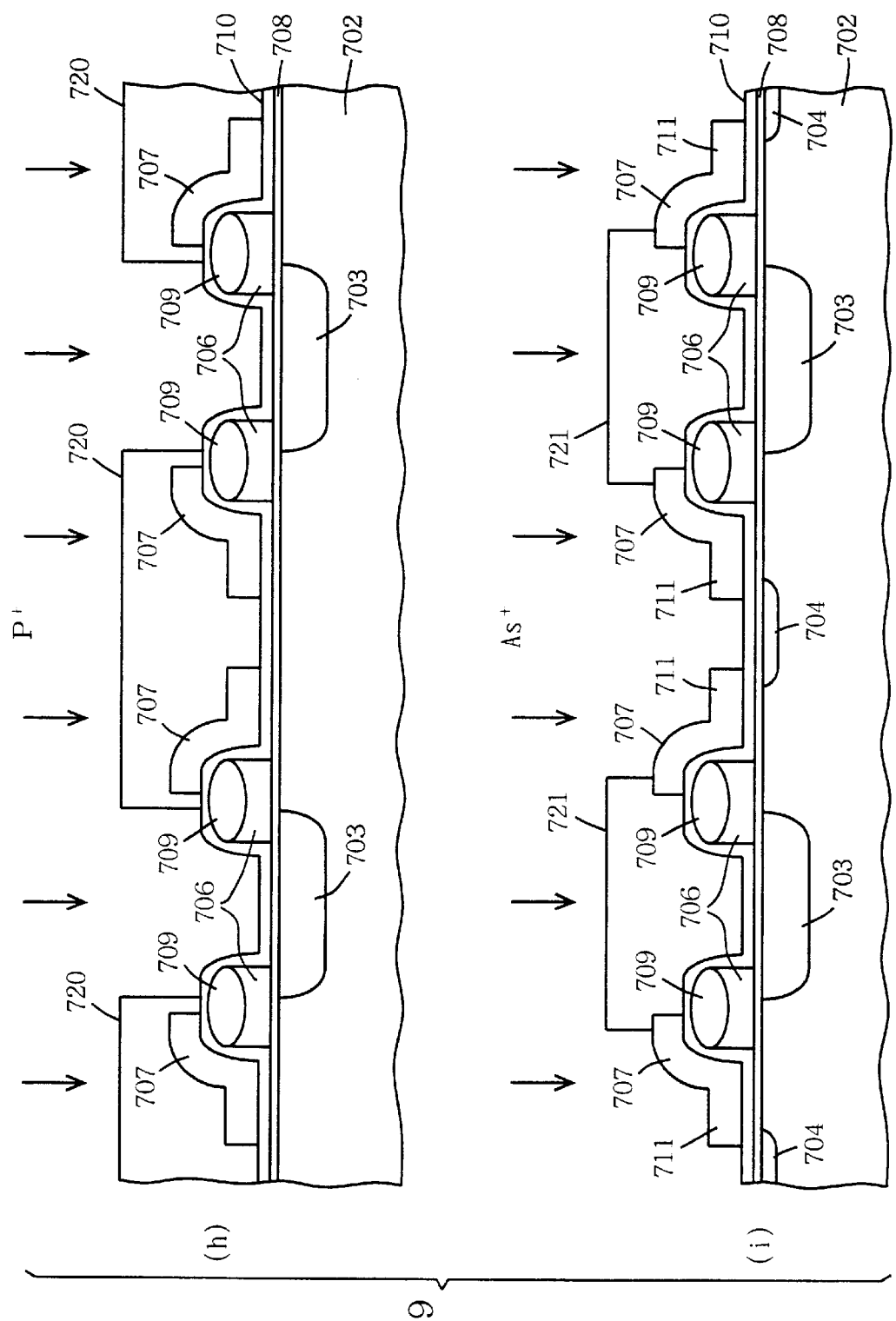
FIGS. 79(h) and 79(i) are sectional views for illustrating the method of fabricating the conventional nonvolatile semiconductor memory.
Figure 80:
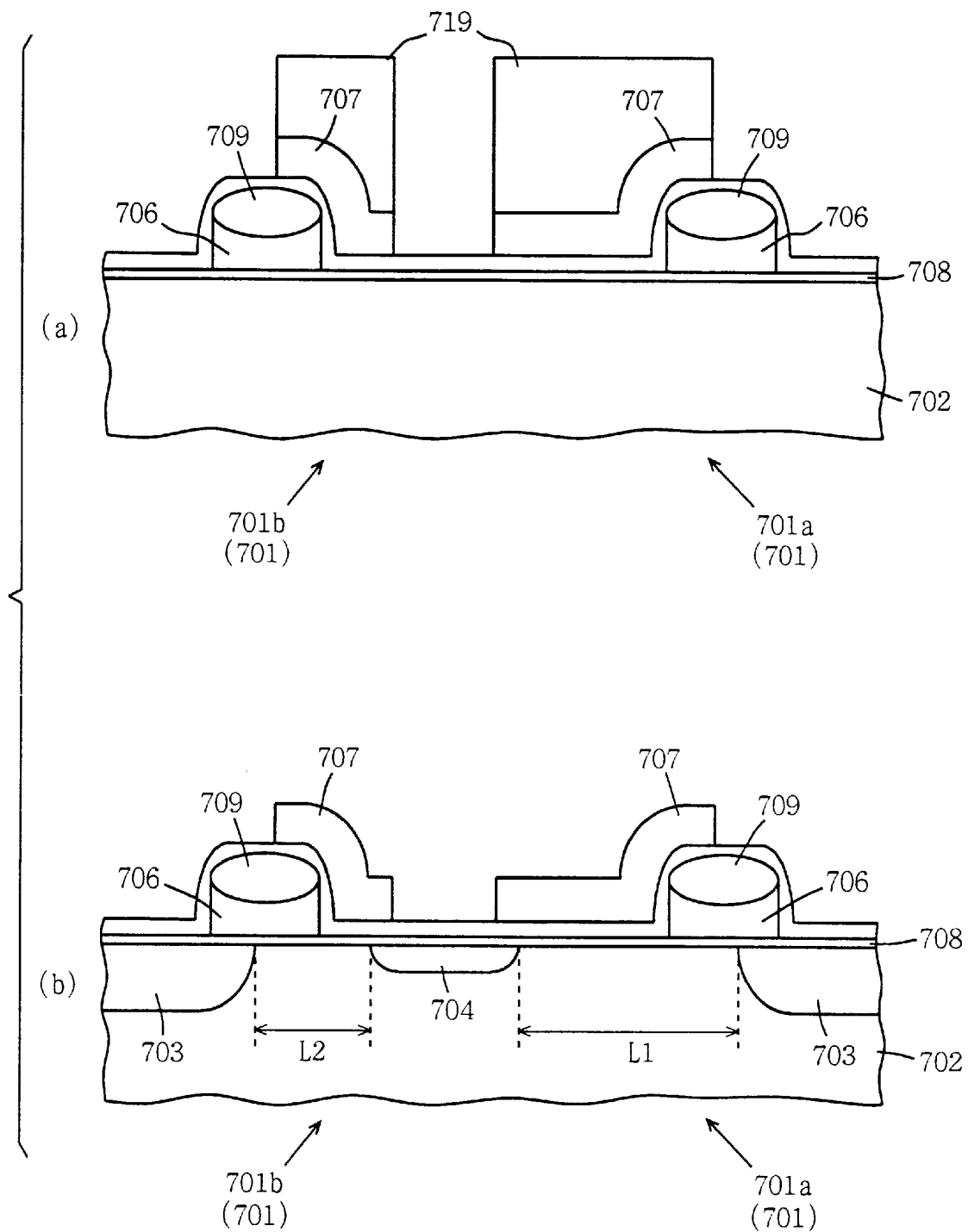
FIGS. 80(a) and 80(b) are partially fragmented sectional views for illustrating functions of the conventional nonvolatile semiconductor memory.

Write, erase and read operations of each memory cell 62a or 62b are similar to those of the memory cell 200 shown in FIGS. 71 and 72.

According to this embodiment, the memory cells 62a and 62b correspond to transistors, and the memory cell array 302 corresponds to a transistor array.

Figure 32:
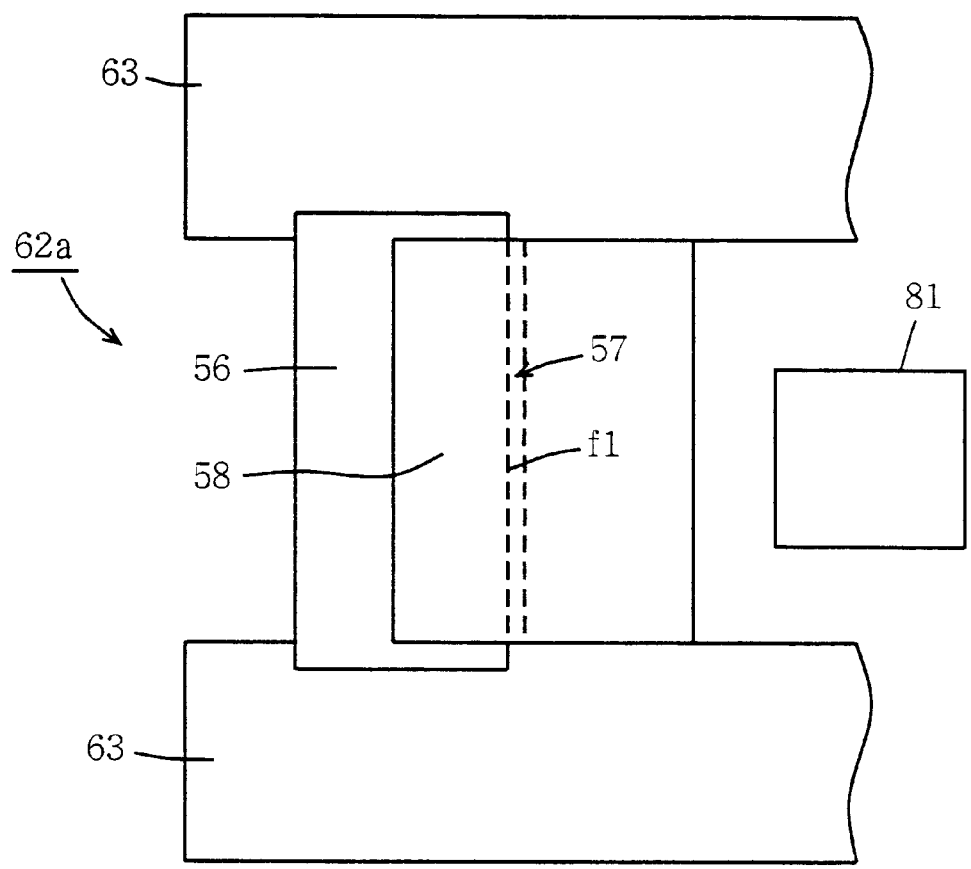
FIG. 32 is a plan view showing a memory cell in the nonvolatile semiconductor memory shown in FIGS. 30(a) to 30(c)
Figure 33:
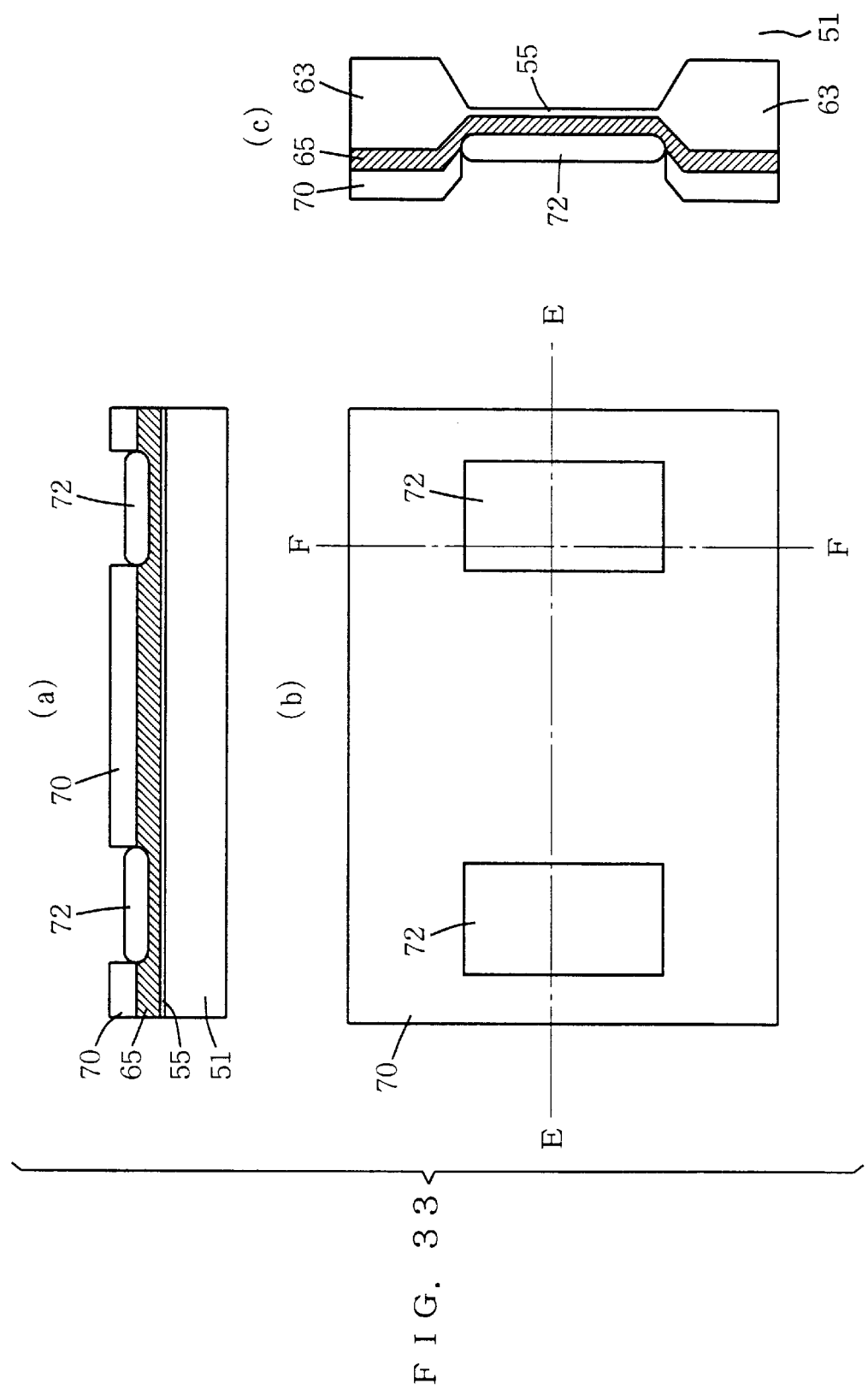
FIG. 33(a) is a sectional view showing first to fourth steps in a method of fabricating the memory cell array shown in FIGS. 30(a) to 30(c) taken along the line E—E in FIG. 33(b)
FIG. 33(b) is a plan showing the steps and FIG. 33(c) is a sectional view taken along the line F—F in FIG. 33(b)
Figure 34:
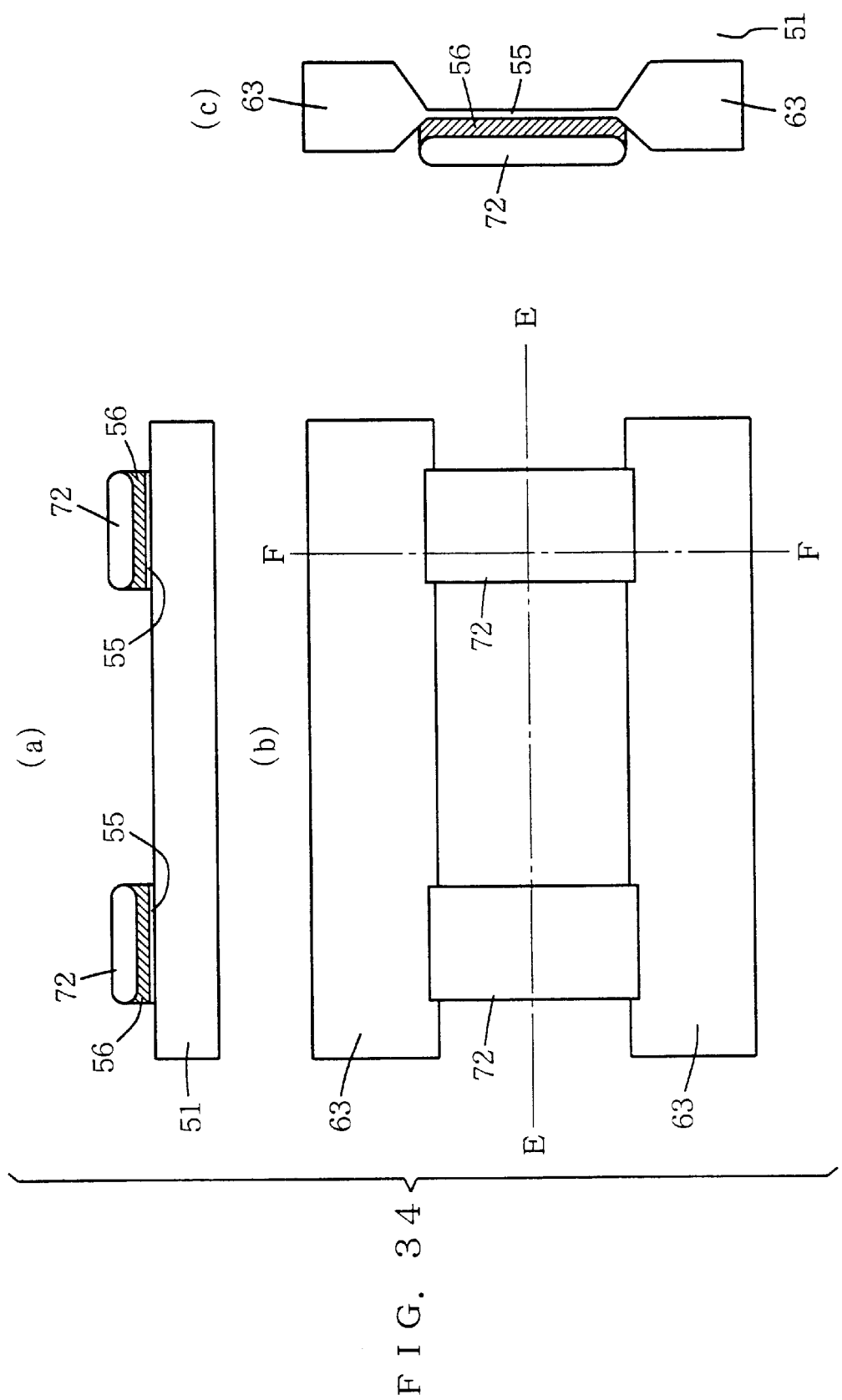
FIG. 34(a) is a sectional view showing a fifth step in the method of fabricating the memory cell array shown in FIGS. 30(a) to 30(c) taken along the line E—E in FIG. 34(b)
FIG. 34(b) is a plan view showing the step and FIG. 34(c) is a sectional view taken along the line F—F in FIG. 34(b)
Figure 35:
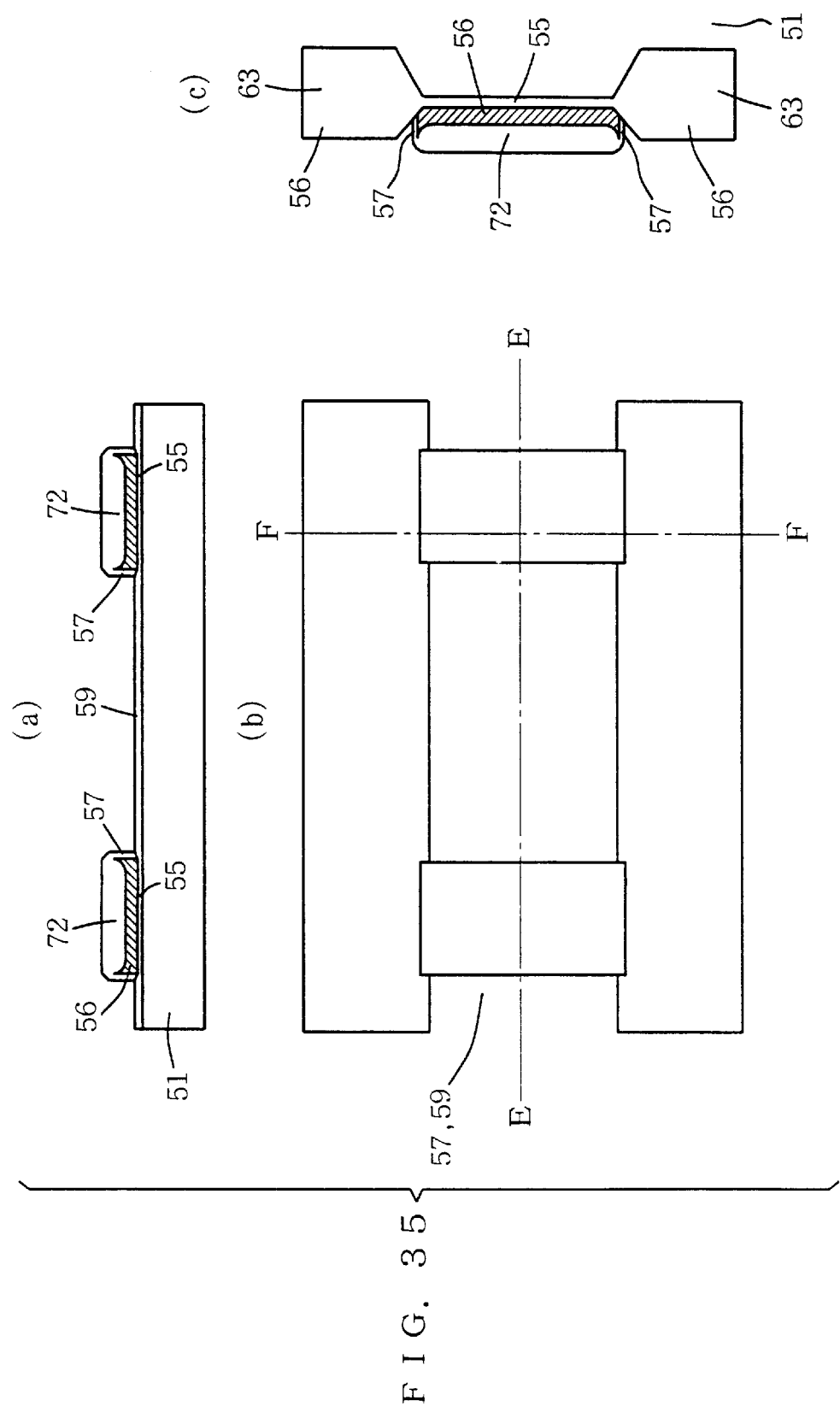
FIG. 35(a) is a sectional view showing a sixth step in the method of fabricating the memory cell array shown in FIGS. 30(a) to 30(c) taken along the line E—E in FIG. 35(b)
FIG. 35(b) is a plan view showing the step and FIG. 35(c) is a sectional view taken along the line F—F in FIG. 35(b)
Figure 36:
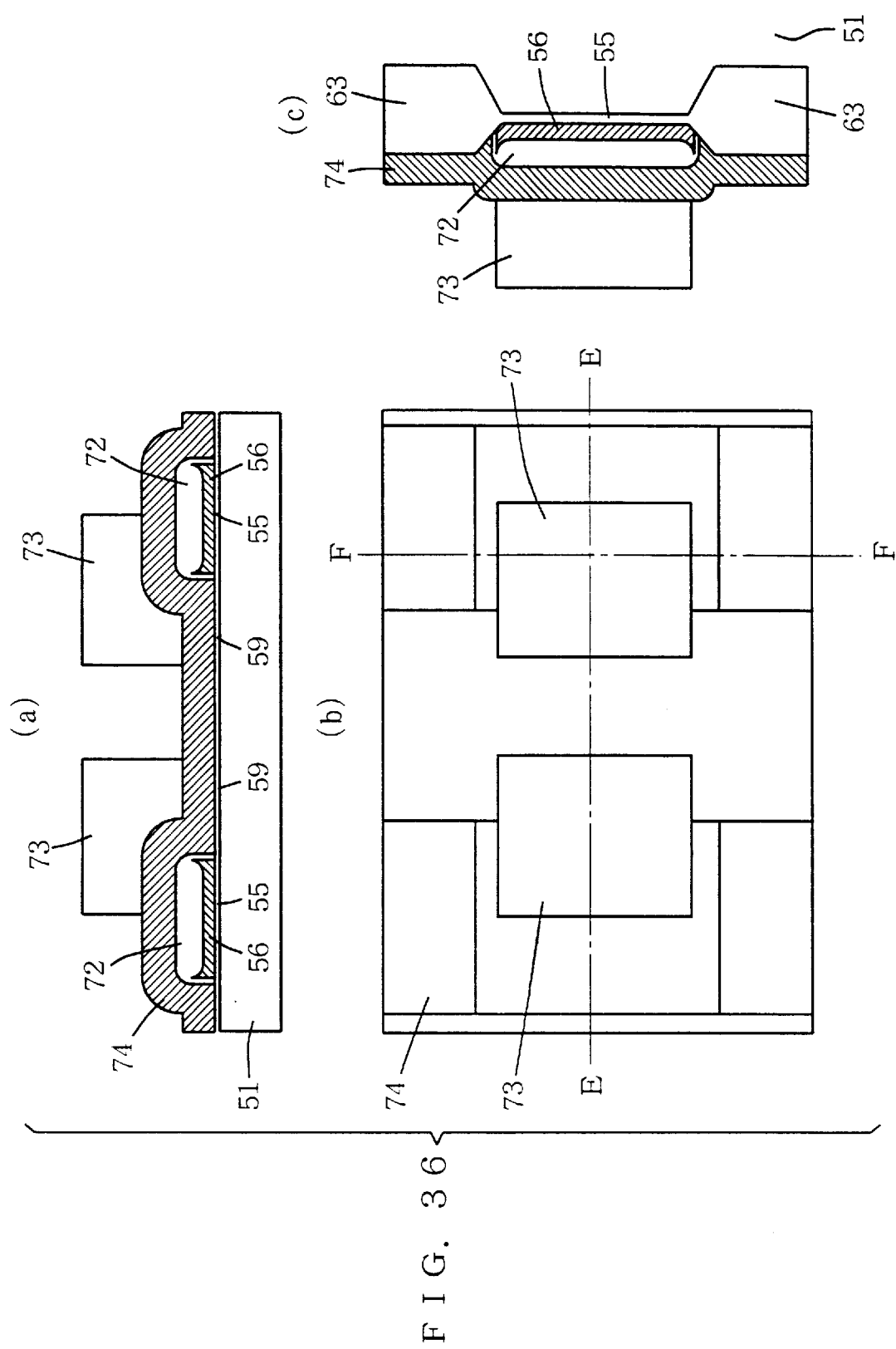
FIG. 36(a) is a sectional view showing a seventh step in the method of fabricating the memory cell array shown in FIGS. 30(a) to 30(c) taken along the line E—E in FIG. 36(b)
FIG. 36(b) is a plan view showing the step and FIG. 36(c) is a sectional view taken along the line F—F in FIG. 36(b)
Figure 37:
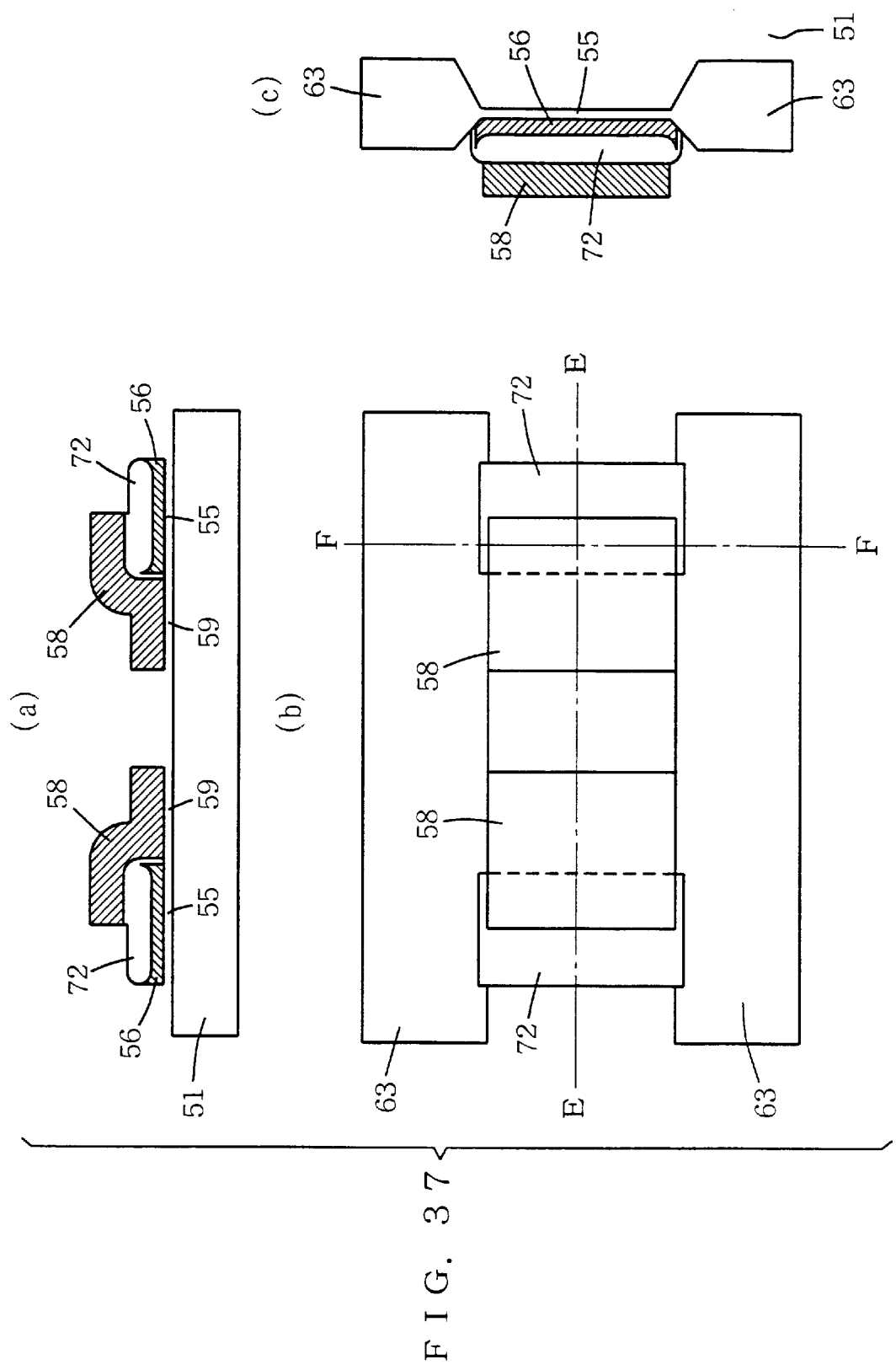
FIG. 37(a) is a sectional view showing an eighth step in the method of fabricating the memory cell array shown in FIGS. 30(a) to 30(c) taken along the line E—E in FIG. 37(b)
FIG. 37(b) is a plan view showing the step and FIG. 37(c) is a sectional view taken along the line F—F in FIG. 37(b)
Figure 38:
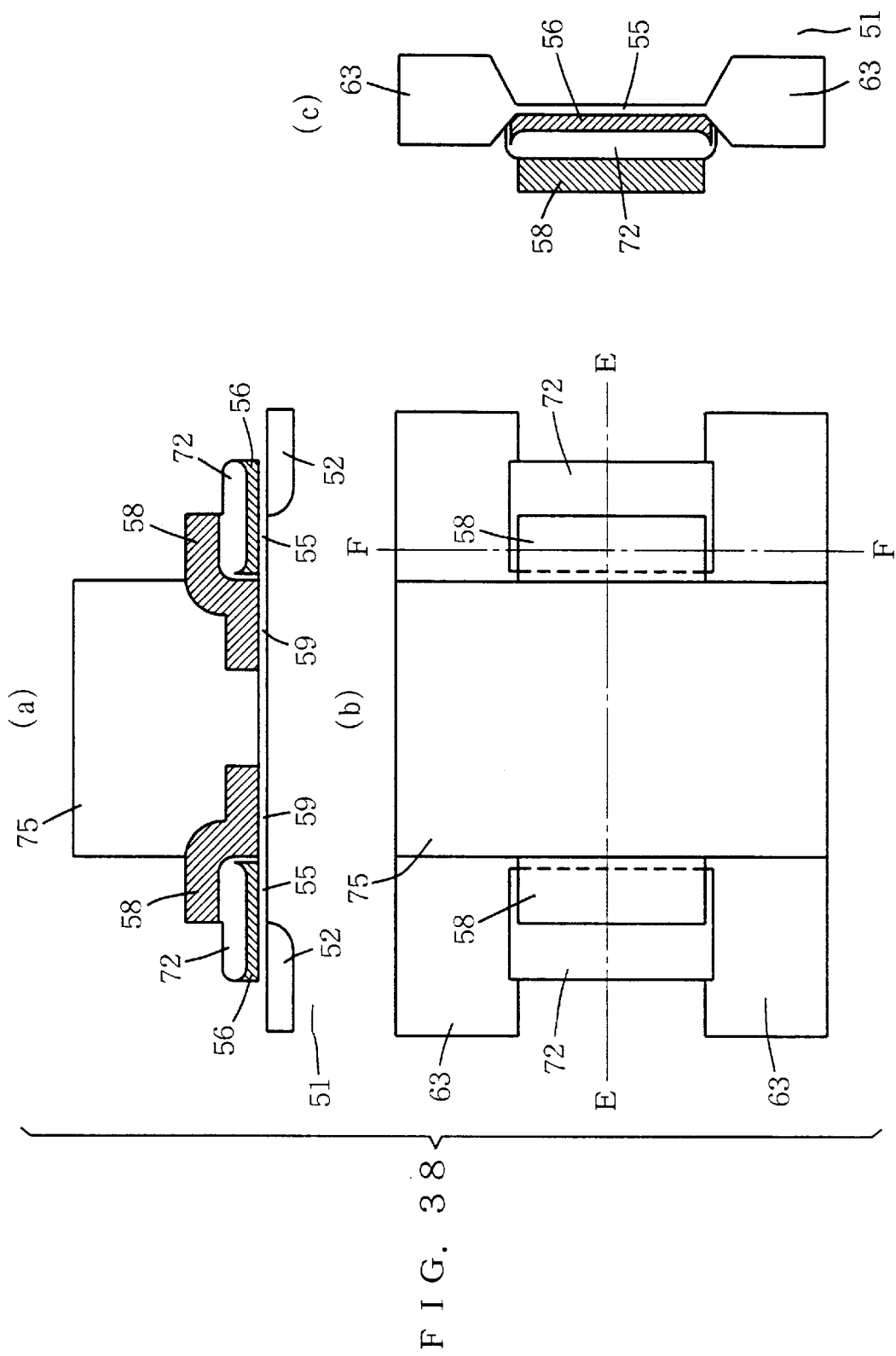
FIG. 38(a) is a sectional view showing a ninth step in the method of fabricating the memory cell array shown in FIGS. 30(a) to 30(c) taken along the line E—E in FIG. 38(b)
FIG. 38(b) is a plan view showing the step and FIG. 38(c) is a sectional view taken along the line F—F in FIG. 38(b)
Figure 39:
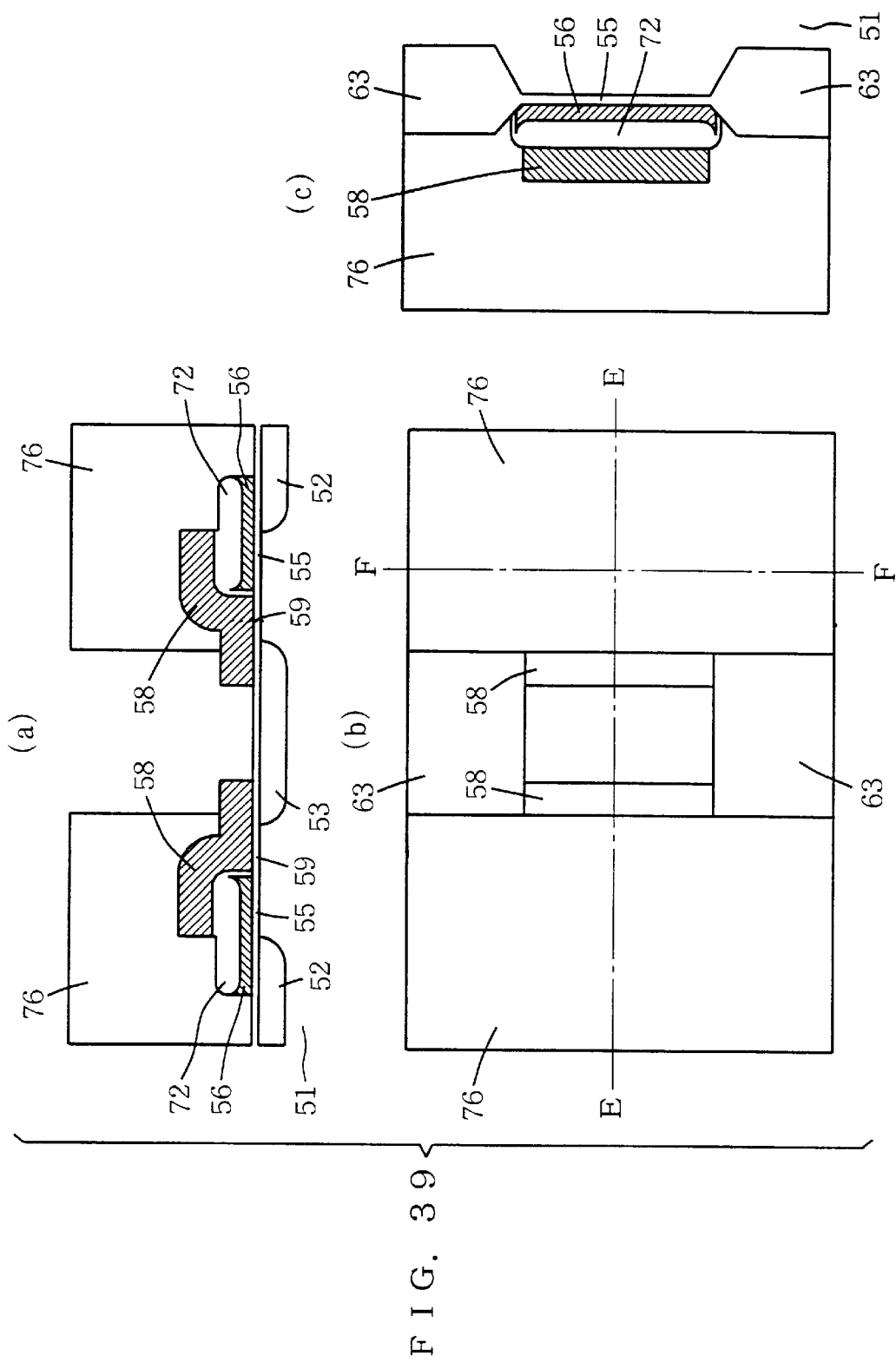
FIG. 39(a) is a sectional view showing a tenth step in the method of fabricating the memory cell array shown in FIGS. 30(a) to 30(c) taken along the line E—E in FIG. 39(b)
FIG. 39(b) is a plan view showing the step and FIG. 39(c) is a sectional view taken along the line F—F in FIG. 39(b)

FIG. 32 is a plan view showing a principal part of the memory cell 62a shown in FIGS. 30(a) to 30(c). As shown in FIG. 32, the floating gate electrode 56 is opposed to the control gate electrode 58 only at one surface f1 through the second insulator film 57. Thus, the coupling capacitance C2 between the floating gate electrode 56 and the control gate electrode 58 is reduced. Therefore, the ratio [coupling ratio: C1/(C1+C2)] of the coupling capacitance C1 between the silicon substrate 51 and the source region 52 and the floating gate electrode 56 to the coupling capacitance C2 between the floating gate electrode 56 and the control gate electrode 58 is increased.

Therefore, the potential of the floating gate electrode 56 can be readily increased for injecting electrons from the channel region 54 into the floating gate electrode 56 at a high speed. Consequently, a high-speed write operation is enabled.

In the nonvolatile semiconductor memory according to this embodiment, the thick interlayer isolation film 77 is present between the word line WL and the silicon substrate 51, whereby the capacitance of the word line WL is reduced. Thus, signal delay on the word line WL is reduced and a high-speed operation is enabled.

A method of fabricating the memory cell array 302 of the nonvolatile semiconductor memory according to this embodiment is now described with reference to FIGS. 33(a) to 44(c). FIGS. 33(b) to 44(b) are plan views, FIGS. 33(a) to 44(a) are sectional views taken along the lines E—E in FIGS. 33(b) to 44(b) respectively, and FIGS. 33(c) to 44(c) are sectional views taken along the lines F—F in FIGS. 33(b) to 44(b) respectively.

(1) Step 1 (see FIGS. 33(a) to 33(c))

The field isolation film 63 is formed on the silicon substrate 51 by LOCOS. Then, the first insulator film 55 of silicon oxide having a thickness of about 10 to 15 nm is formed on element regions of the silicon substrate 51 excluding the field isolation film 63 by thermal oxidation.

(2) Step 2 (see FIGS. 33(a) to 33(c))

A polysilicon film 65 of about 200 nm in thickness is formed on the silicon substrate 51 and thereafter a silicon nitride film 70 of 50 nm in thickness is formed on the polysilicon film 65. Thereafter a resist film (not shown) is applied to the overall surface of the silicon nitride film 70 and patterned through general photolithography, for providing openings in the element regions.

(3) Step 3 (see FIGS. 33(a) to 33(c))

The silicon nitride film 70 is partially removed by RIE through the resist film (not shown) serving as a mask, for forming openings in the silicon nitride film 70. P (phosphorus) atoms are introduced into parts of the polysilicon film 65 for forming the floating gate electrodes 56 for providing conductivity, and thereafter the resist film is removed. Thus, the polysilicon film 65 is exposed in the openings. The remaining regions located on the polysilicon film 65 are covered with the silicon nitride film 70.

(4) Step 4 (see FIGS. 33(a) to 33(c))

The silicon substrate 51 is thermally oxidized in an oxidation atmosphere (pyrogenic oxidized at 900° C., for example) through the silicon nitride film 70, formed in the step 3, serving as a mask, for forming silicon oxide films 72 of about 150 nm in thickness on the polysilicon film 65.

At this time, the regions of the polysilicon film 65 covered with the silicon nitride film 70 are not oxidized so that only the portions of the polysilicon film 65 exposed in the openings formed in the step 3 are selectively oxidized, while the oxidation species is also transversely diffused in the boundary regions therebetween. Thus, the obtained silicon oxide films 72 have thin ends in sectional shape, as shown in FIGS. 33(a) and 33(c).

(5) Step 5 (see FIGS. 34(a) to 34(c))

The silicon nitride film 75 is removed with heated phosphoric acid or the like. Thus, two-layer structures of the silicon oxide films 72 and the polysilicon film 65 are formed on the regions for defining the floating gate electrodes 56. Then, the polysilicon film 65 is removed by RIE through the silicon oxide films 72 serving as masks. Thus, the floating gate electrodes 56 are formed.

(6) Step 6 (see FIGS. 35(a) to 35(c))

The second insulator film 57 of silicon oxide and the insulator film 59 of silicon oxide are formed on the side walls of the floating gate electrodes 56, the silicon oxide films 72 and the first insulator film 55 by thermal oxidation and/or LPCVD. At this time, the silicon oxide films 72, the second insulator film 57 and the insulator film 59 are stacked and integrated with each other.

(7) Step 7 (see FIGS. 36(a) to 36(c))

A polysilicon film 74 for forming the control gate electrodes 58 and the selection gate electrodes 58a is formed on the silicon substrate 51 formed in the step 6, and thereafter P atoms are introduced into the polysilicon film 74 as an impurity for providing conductivity.

Then, island-shaped resist patterns 73 including parts located on the channel regions 54 and the floating gate electrodes 56 are formed through general photolithography.

(8) Step 8 (see FIGS. 37(a) to 37(c))

Then, the polysilicon film 74 is removed by RIE through the resist patterns 73 serving as masks, and thereafter the resist patterns 73 are removed. Thus, the control gate electrodes 58 in the form of islands extending from above the channel regions 54 to above the floating gate electrodes 56 are obtained.

(9) Step 9. (see FIGS. 38(a) to 38(c))

Then, a general ion implantation mask 75 is formed to cover at least the channel region 54 held between the floating gate electrodes 56 while not jutting out from the floating gate electrodes 56. P (phosphorus) ions are injected at injection energy of about 40 keV at a dosage of $1\times15$ to $4\times15$ cm$^{-2}$ by general ion implantation for forming the source regions 52 on the surface of the silicon substrate 51. Thereafter the ion implantation mask 75 is removed. Consequently, end portions of the floating gate electrodes 56 substantially define the positions of the source regions 52.

(10) Step 10 (see FIGS. 39(a) to 39(c))

Then, an ion implantation mask 76 is formed to cover at least the channel region 54 held between the control gate electrodes 58 while not jutting out from the control gate electrodes 58. As (arsenic) ions are injected at injection energy of about 100 keV at a dosage of 1×15 to 4×15 cm$^{-2}$ by general ion implantation for forming the drain region 53 on the surface of the silicon substrate 51. Thereafter the ion implantation mask 76 is removed. Consequently, end portions of the control gate electrodes 58 substantially define the position of the drain region 53.

(11) Step 11 (see FIGS. 40(*a*) to 40(*c*))

Then, the interlayer isolation film 77 of silicon oxide having a thickness of about 1000 nm is formed on the overall surface of the silicon substrate 51 formed in the step 10 by LPCVD or the like. Alternatively, the interlayer isolation film 77 may be formed by a BPSG film formed by plasma CVD or the like or a combination of a silicon oxide film and a BPSG film, in place of the silicon oxide film.

Figure 41:
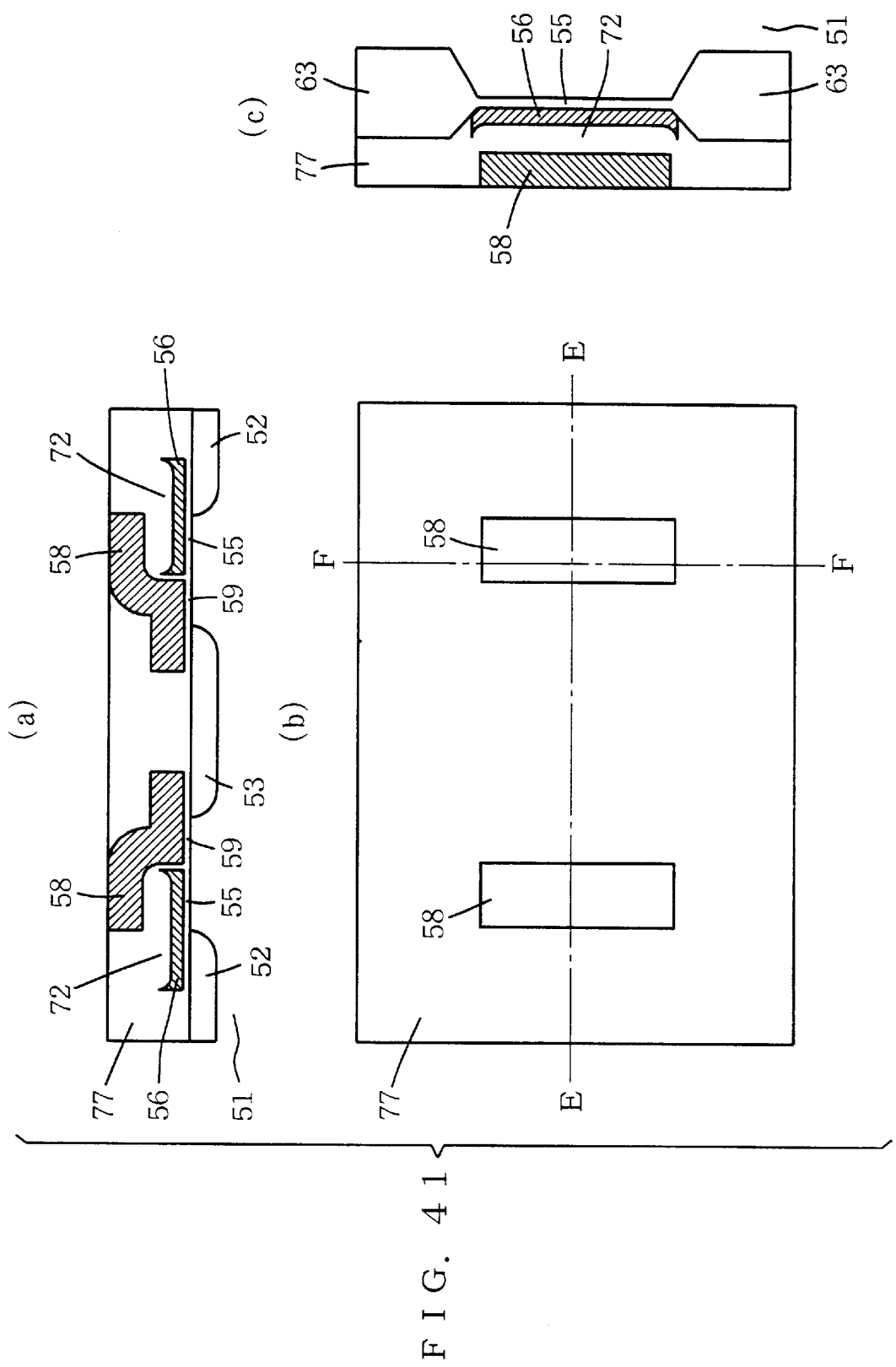
FIG. 41(a) is a sectional view showing a twelfth step in the method of fabricating the memory cell array shown in FIGS. 30(a) to 30(c) taken along the line E—E in FIG. 41(b)
FIG. 41(b) is a plan view showing the step and FIG. 41(c) is a sectional view taken along the line F—F in FIG. 41(b)

(12) Step 12 (see FIGS. 41(*a*) to 41(*c*))

Then, the interlayer isolation film 77 is polished by general CMP to expose surfaces of the control gate electrodes 58. Alternatively, the thickness of the interlayer isolation film 77 may be reduced by another method such as an etch-back method.

Figure 42:
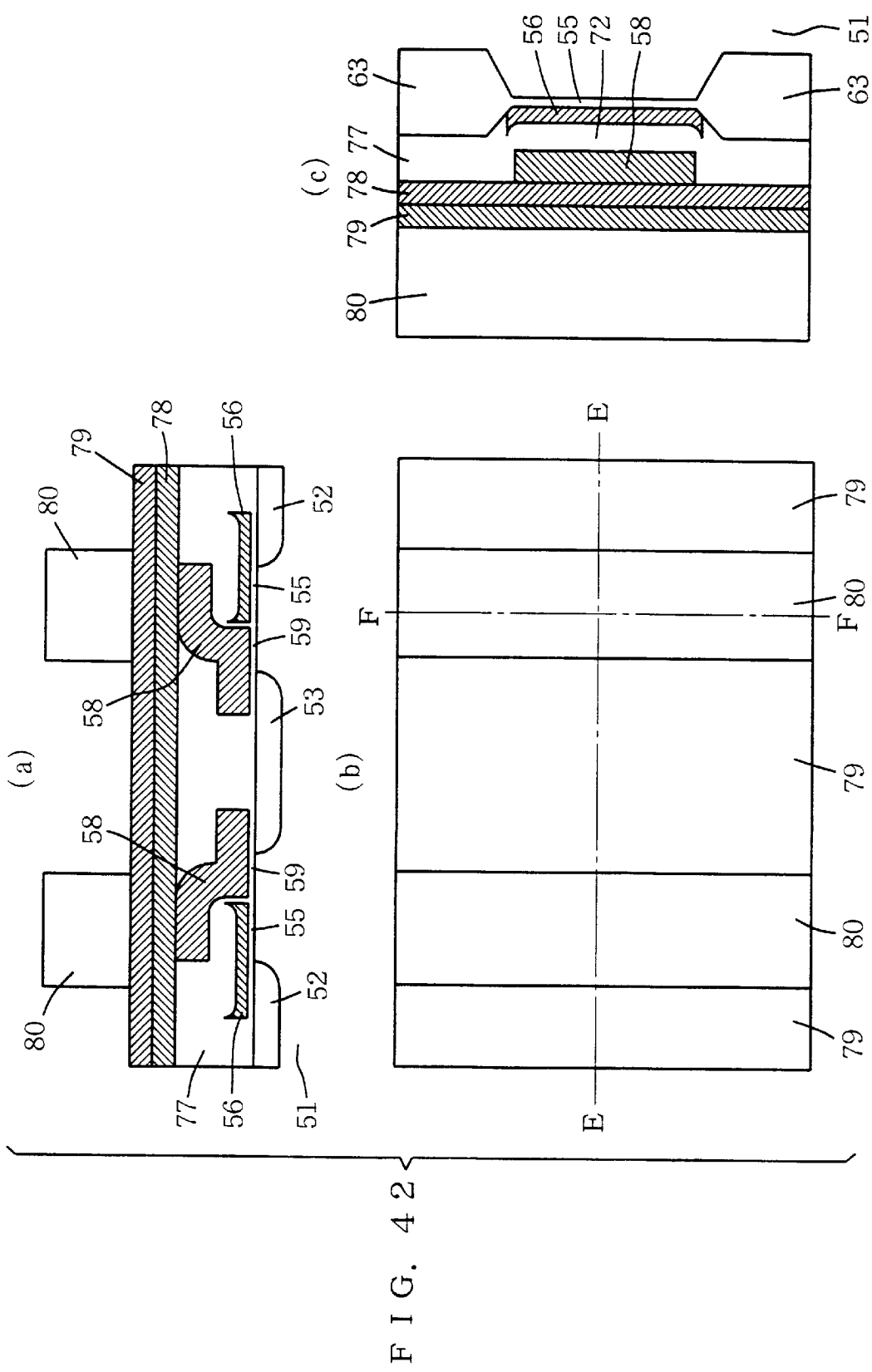
FIG. 42(a) is a sectional view showing a thirteenth step in the method of fabricating the memory cell array shown in FIGS. 30(a) to 30(c) taken along the line E—E in FIG. 42(b)
FIG. 42(b) is a plan view showing the step and FIG. 42(c) is a sectional view taken along the line F—F in FIG. 42(b)

(13) Step 13 (see FIGS. 42(*a*) to 42(*c*))

A polysilicon film 78 is formed on the silicon substrate 51 formed in the step 12 and thereafter P atoms are introduced into the polysilicon film 78 as an impurity by ion implantation or the like for providing conductivity. Further, a tungsten silicide film 79 is formed on the polysilicon film 78 by CVD or the like for reducing resistance, thereby defining a multilayer film of the polysilicon film 78 and the tungsten silicide film 79. Then, stripy resist patterns 80 are formed by general photolithography.

(14) Step 14 (see FIGS. 43(*a*) to 43(*c*))

The tungsten polycide film 79 and the polysilicon film 78 are removed by RIE through the resist patterns 80 serving as masks. Then, the resist patterns 80 are removed. Thus, the word lines WL are obtained. In this case, the word lines WL formed by conductor layers are formed on the control gate electrodes 58 having the surfaces exposed in the step 14, whereby the adjacent control gate electrodes 58 can be connected with each other without opening contact holes through masks.

Figure 44:
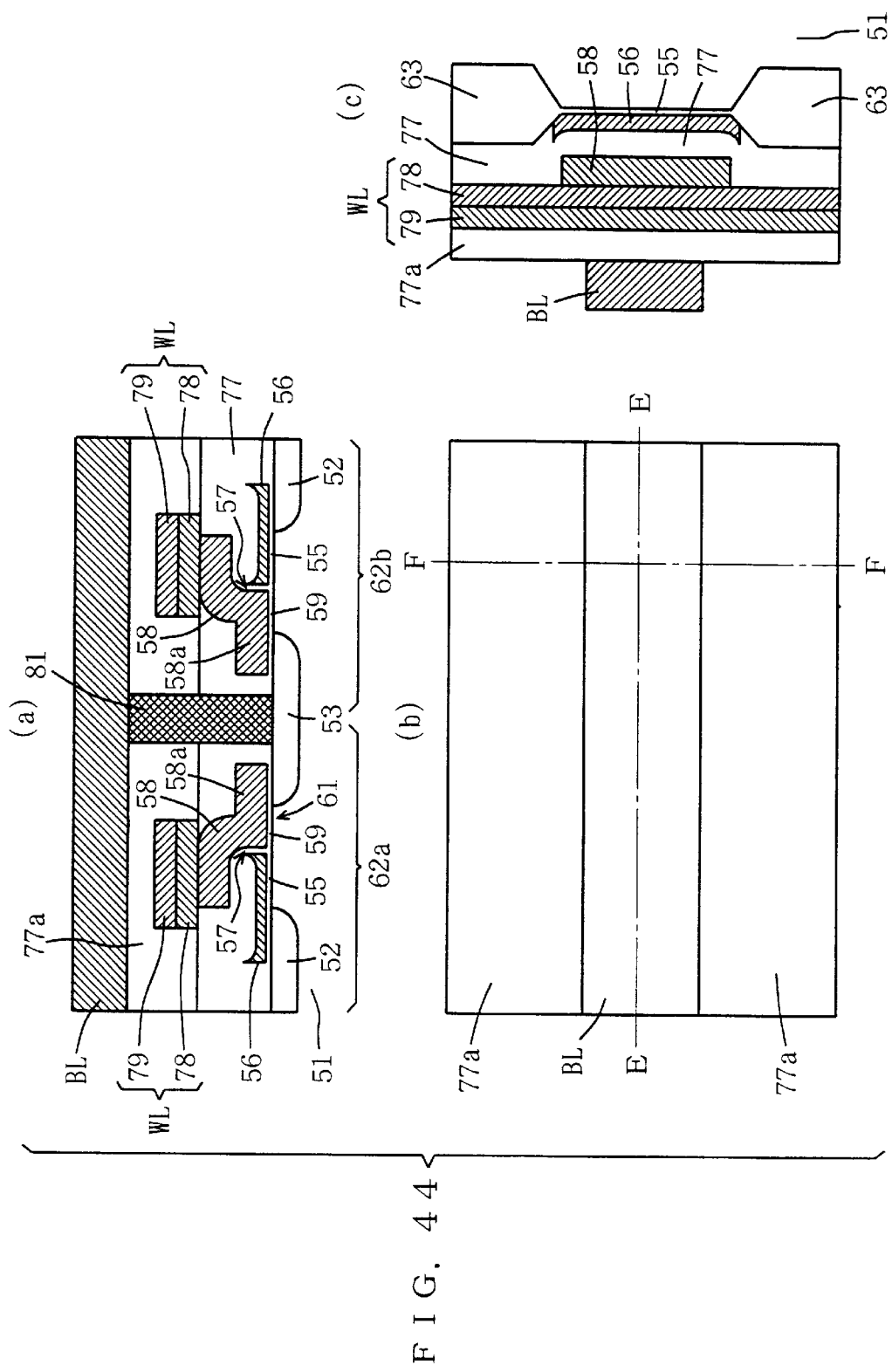
FIG. 44(a) is a sectional view showing a fifteenth step in the method of fabricating the memory cell array shown in FIGS. 30(a) to 30(c) taken along the line E—E in FIG. 44(b)
FIG. 44(b) is a plan view showing the step and FIG. 44(c) is a sectional view taken along the line F—F in FIG. 44(b)

(15) Step 15 (see FIGS. 44(*a*) to 44(*c*))

The interlayer isolation film 77*a* of silicon oxide or the like is formed on the word lines WL and the interlayer isolation film 77, and thereafter contact holes are formed in the interlayer isolation films 77*a* and 77 for providing the conductive contacts 81 in the contact holes. Thereafter the bit lines BL of a conductive material such as a metal are formed on the interlayer isolation film 77*a*.

Subsequent steps are similar to those for a general MOS-LSI (metal-oxide silicon large-scale integrated circuit).

In the memory cell array 302 of the nonvolatile semiconductor memory according to this embodiment fabricated through the aforementioned method, each floating gate electrode 56*a* is capacitively coupled with the control gate electrode 58 only through the second insulator film 57 closer to the selection transistor 58*a*, whereby a memory cell having a high coupling ratio can be obtained.

Further, the capacitance of the word line WL is reduced due to the thick interlayer isolation film 77 provided between the word line WL and the silicon substrate 51.

Third Embodiment

A third embodiment of the present invention is now described with reference to FIGS. 45(*a*) to 56(*k*).

Figure 45:
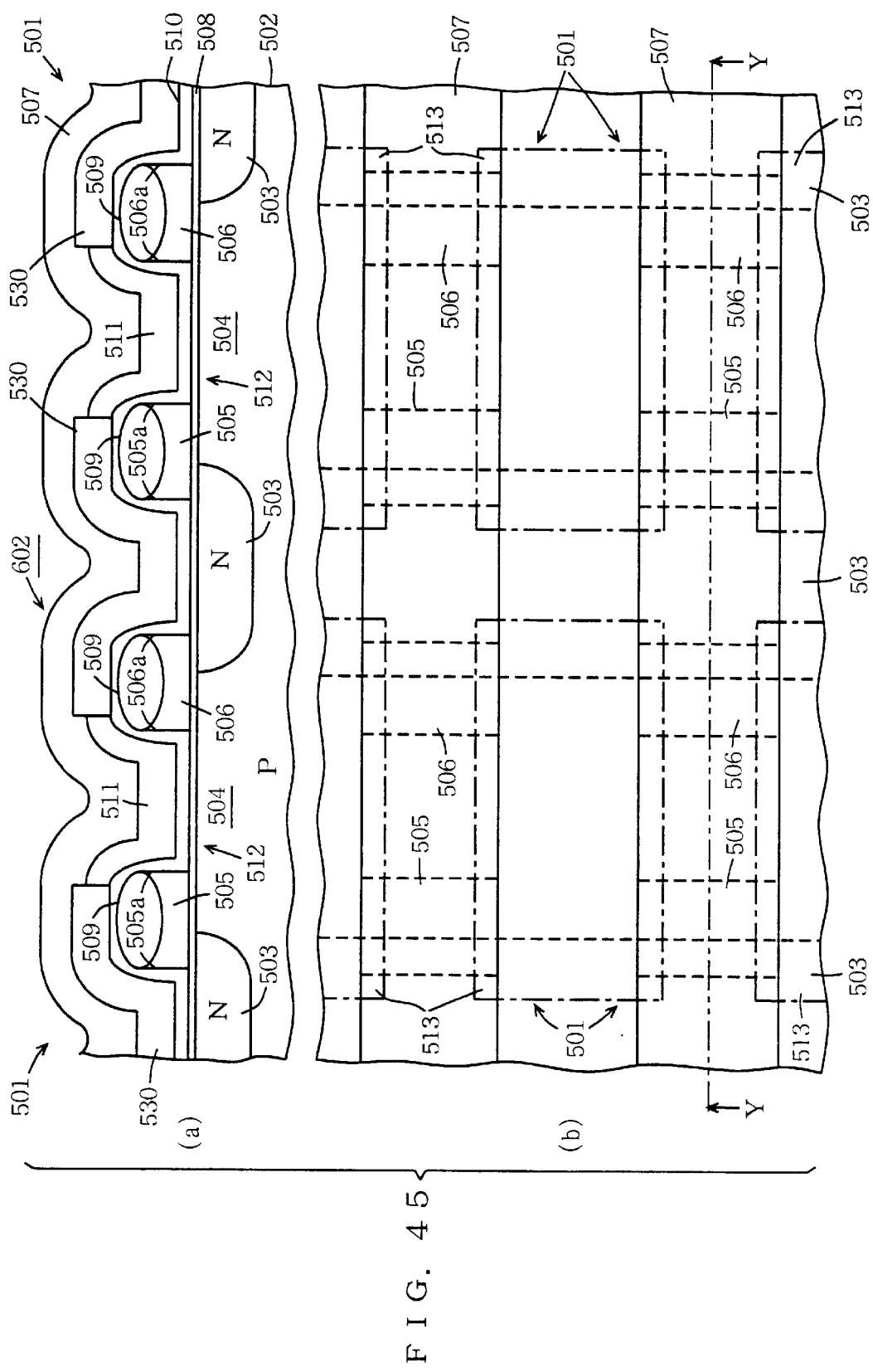
FIG. 45(a) is a sectional view of a memory cell array of a nonvolatile semiconductor memory according to a third embodiment of the present invention taken along the line Y—Y in FIG. 45(b)
FIG. 45(b) is a partially fragmented plan view thereof.

FIGS. 45(*a*) and 45(*b*) show a part of a memory cell array 602 of a flash EEPROM 601 employing memory cells 501 according to this embodiment. FIG. 45(*b*) is a partially fragmented plan view of the memory cell array 602, and FIG. 45(*a*) is a sectional view taken along the line Y—Y in FIG. 45(*b*).

Each memory cell 501 is formed by two source/drain regions 503, a channel region 504, two floating gate electrodes 505 and 506 and a control gate electrode 507.

The n-type source/drain regions 503 are formed on a p-type single-crystalline silicon substrate 502. The two floating gate electrodes 505 and 506 identical in dimension and shape to each other are formed on the channel region 504 held between the two source/drain regions 503 of symmetrical structures through a gate isolation film 508. An insulator film 509 is formed on each floating gate electrode 505 or 506 by LOCOS, and a tunnel isolation film 510 is formed on the insulator film 509 and the gate isolation film 508. The insulator film 509 forms a projection 505*a* or 506*a* on each floating gate electrode 505 or 506. On the tunnel isolation film 510, further, an insulator film 530 is formed on the insulator film 509 and the source/drain region 503. Between each pair of insulator films 530, a selection gate 511 is formed on the channel region 504 through the isolation films 508 and 510. According to this embodiment, the insulator film 530 is formed by partially oxidizing a conductor layer formed on the tunnel isolation film 510 for serving as an underlayer, while the remaining part forms the selection gate 511. The material for the conductor layer can be prepared from a semiconductor such as doped amorphous silicon, doped single-crystalline silicon or doped polycrystalline silicon, or a conductor such as aluminum.

The control gate electrode 507 is formed on the insulator film 530 and these selection gate 511. The control gate electrode 507 and the selection gate 511, which are directly in contact with each other, are in electrical conduction with each other.

Each pair of source/drain regions 503 holding the selection gate 511 therebetween and the selection gate 511 form a selection transistor 512. In other words, the memory cell 501 has such a structure that two transistors formed by the floating gate electrodes 505 and 506, the control gate electrode 507 and the source/drain regions 503 and the selection transistor 512 formed between these transistors are serially connected with each other.

In the memory cell 501, the electrostatic capacitance between the control gate electrode 507 and the selection gate 511 and the channel region 504, between which only the gate isolation film 508 and the tunnel isolation film 510 are interposed, is increased. The electrostatic capacitance between the control gate electrode 507 and the floating gate electrodes 505 and 506, between which the tunnel isolation film 510 and the insulator film 530 are interposed, is reduced as compared with that between the control gate electrode 507 and the channel region 507. Further, the electrostatic capacitance between the control gate electrode 507 and the source/drain regions 503, between which the gate isolation film 508, the tunnel isolation film 510 and the insulator film 530 are interposed, is reduced as compared with that between the control gate electrode 507 and the floating gate electrodes 505 and 506.

The memory cell array 602 is formed by a plurality of memory cells 501 formed on the substrate 502. In order to reduce the occupied area on the substrate 502, each pair of adjacent memory cells 501 are arranged with the common source/drain regions 503.

A field isolation film 513 is formed on the substrate 502 for isolating the memory cells 501 from each other.

The memory cells 501 vertically arranged in FIG. 45(b) have the common source/drain regions 503, which form bit lines. The memory cells 501 transversely arranged in FIG. 45(b) have the common control gate electrodes 507, which form word lines serving as control lines.

FIG. 46 illustrates the overall structure of the flash EEPROM 601 employing the memory cells 501.

A plurality of memory cells 501 are arranged in the form of a matrix to form the memory cell array 602. The control gate electrodes 507 of the memory cells 501 arranged along the row direction form common word lines WL1 to WLn. The source/drain regions 503 of the memory cells 501 arranged along the column direction form common bit lines BL1 to BLn.

In other words, the memory cell array 602 has an AND-NOR structure, in which the floating gate electrodes 505 and 506 of the memory cells 501 connected to the common word lines WL1 to WLn are serially arranged and the circuits thereof are connected in parallel with the common bit lines BL1 to BLn.

The word lines WL1 to WLn are connected to a row decoder 603, and the bit lines BL1 to BLn are connected to a column decoder 604.

Externally specified row and column addresses are inputted in an address pin 605. The row and column addresses are transferred from the address pin 605 to an address latch 607. In the addresses latched in the address latch 607, the row address is transferred to the row decoder 603 through an address buffer 606, and the column address is transferred to the column decoder 604 through the address buffer 606.

The address latch 607 may be properly omitted.

The row decoder 603 selects one (e.g., WLm (not shown)) of the word lines WL1 to WLn corresponding to the row address latched in the address latch 607 and controls the potentials of the word lines WL1 to WLn in correspondence to each operation mode described later. In other words, the row decoder 603 controls the potential of the control gate electrode 507 of each memory cell 501 by controlling the potentials of the word lines WL1 to WLn.

The column decoder 604 controls the potentials or open states of the bit lines BL1 to BLn in correspondence to each operation mode described later, in order to select one (e.g., BLm (not shown)) of the bit lines BL1 to BLn corresponding to the column address latched in the address latch 607. In other words, the column decoder 604 controls the potentials or open states of the source/drain regions 503 of each memory cell 501 by controlling the potentials or open states of the bit lines BL1 to BLn.

Externally specified data is inputted in a data pin 608. The data is transferred to the column decoder 604 from the data pin 608 through an input buffer 609. The column decoder 604 controls the potentials or open states of the bit lines BL1 to BLn in correspondence to the data, as described later.

Data read from an arbitrary memory cell 501 is transferred to a sense amplifier 610 from any of the bit lines BL1 to BLn through the column decoder 604. The sense amplifier 610 is a current sense amplifier. The column decoder 604 connects the selected one of the bit lines BL1 to BLn with the sense amplifier 610. The data determined by the sense amplifier 610 is outputted from an output buffer 611 through the data pin 608.

A control core circuit 612 controls the aforementioned operations of the circuits 603 to 611.

Figure 49:
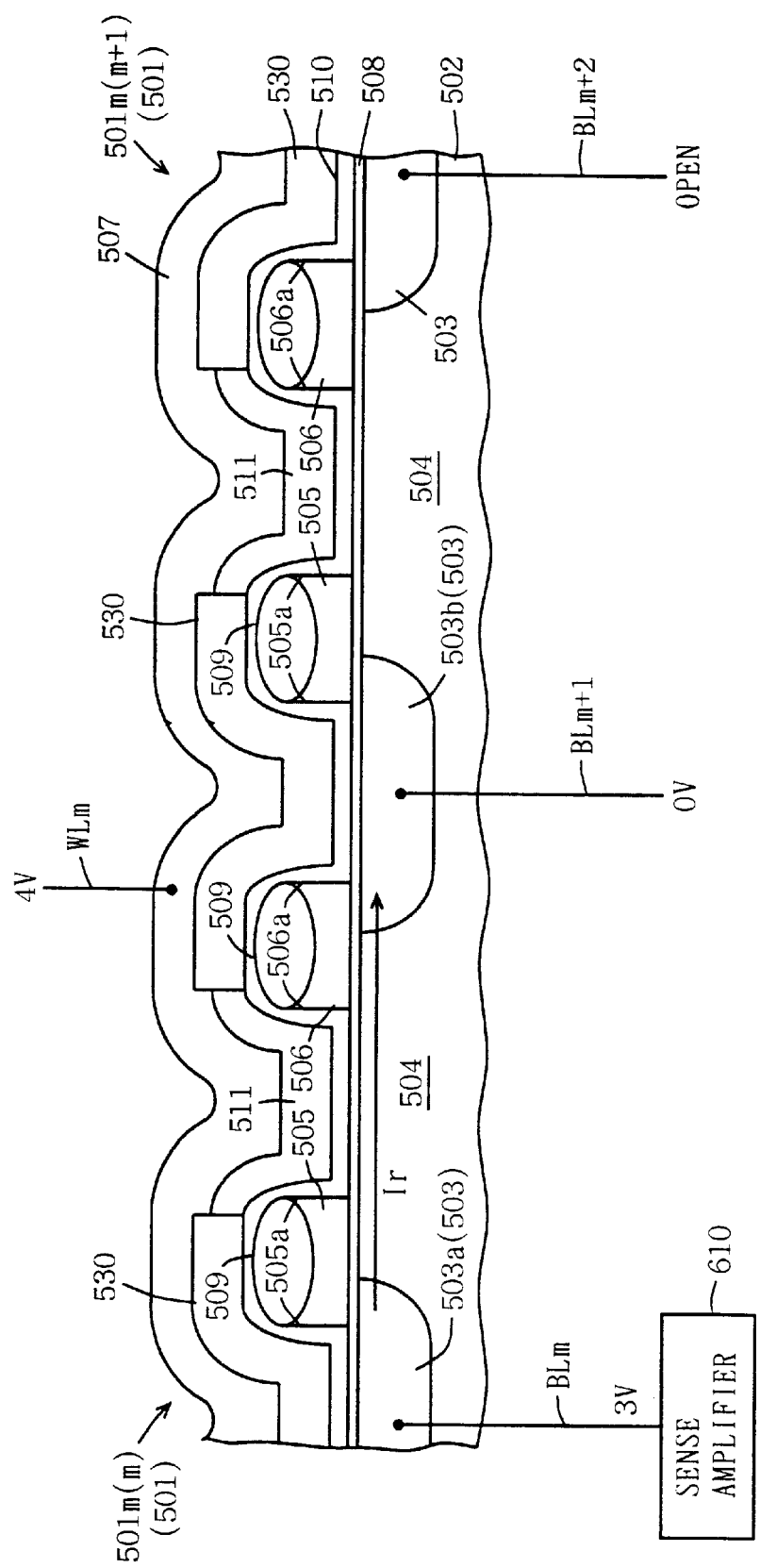
FIG. 49 is a partially fragmented sectional view for illustrating a function of the nonvolatile semiconductor memory according to the third embodiment of the present invention.

The operation modes (write, read and erase operations) of the flash EEPROM 601 are now described with reference to FIGS. 47 to 52. FIGS. 47, 49 and 51 illustrate only a part of FIG. 45(a), and FIGS. 48, 50 and 52 illustrate only a part of FIG. 46.

(a) Write Operation (see FIGS. 47 and 48)

In the following description, a memory cell 501 (hereinafter denoted by 501m(m)) connected to the intersection points between a word line WLm and bit lines BLm and BLm+1 is selected for writing data in the floating gate electrode 506 of the memory cell 501m(m).

The bit line BLm corresponding to the source/drain region 503 (hereinafter denoted by 503a) of the memory cell 501m(m) closer to the floating gate electrode 505 is connected to a constant current source 610a provided in the sense amplifier 610, so that the potential thereof is set at about 1.2 V.

The potential of the bit line BLm+1 corresponding to the source/drain region 503 (hereinafter denoted by 503b) of the memory cell 501m(m) closer to the floating gate electrode 506 is set at about 1.2 V.

The potentials of the bit lines BL1 . . . BLm−1 and BLm+2 . . . BLn corresponding to the source/drain regions 503 of the remaining memory cells 501 are set at 3 V.

The potential of the word line WLm corresponding to the control gate electrode 507 of the memory cell 501m(m) is set at 2 V. The potentials of the word lines WL1 . . . WLm−1 and WLm+2 . . . WLn corresponding to the control gate electrodes 507 of the remaining memory cells 501 are set at 0 V.

In the memory cell 501m(m), the threshold voltage Vth of the selection transistor 512 is about 0.5 V. In the memory cell 501m(m), therefore, electrons in the source/drain region 503a move into the channel region 504, which is in an inverted state. Thus, a cell current Iw flows from the source/drain region 503b toward the source/drain region 503a. The potential of the source/drain region 503b is 10 V, and hence the potential of the floating gate electrode 506 is pulled up to be close to 10 V due to coupling between the source/drain region 503b and the floating gate electrode 506 through the electrostatic capacitance. Thus, a high electric field is formed between the channel region 504 and the floating gate electrode 506. Therefore, the electrons in the channel region 504 are accelerated to form hot electrons, and injected into the floating gate electrode 506 as shown by arrow C in FIG. 47. Consequently, charges are stored in the floating gate electrodes 506 of the memory cell 501m(m) so that 1-bit data is written and stored therein.

At this time, the potential of the floating gate electrode 505 is pulled up to be close to about 1.2 V due to coupling between the source/drain region 503a and the floating gate electrode 505 through the electrostatic capacitance. At such a low potential, however, no hot electrons are substantially injected into the floating gate electrode 505. Thus, the hot electrons are injected only into the floating gate electrode 506 of the memory cell 501m(m).

Further, the cell current Iw also flows between the source/drain regions 603 of the memory cell 501 (hereinafter denoted by 501m(m−1)) connected to the intersection points between the word line WLm and the bit lines BLm−1 and BLm. In the memory cell 501m(m−1), however, the potential of the source/drain region 603 corresponding to the bit line BLm1 is 3 V and hence the potentials of the floating gate electrodes a 505 and 506 are not pulled up. Thus, no hot electrons are injected into the floating gate electrodes 505 and 506 of the memory cell 501m(m−1) and no data is written in the memory cell 501m(m−1).

In the memory cell 501 (hereinafter denoted by 501m(m+1)) connected to the intersection points between the word line WLm and the bit lines BLm+1 and BLm+2, the potential of the source/drain region 503 corresponding to the bit line BLm+2 is 3 V, which is higher than the potential (=2 V) of the control gate electrode 507 (the word line WLm), and hence no cell current flows between the source/drain regions 603. Thus, no hot electrons are injected into the floating gate electrodes 505 and 506 of the memory cell 501m(m+1) and no data is written in the memory cell 501m(m+1).

Further, no data is written in the memory cells 501 other than the memory cells 501m(m), 501m(m−1) and 501m(m+1) connected to the word line WLm, for a reason similar to that for the memory cell 501m(m+1).

Therefore, the aforementioned write operation is performed only on the floating gate electrode 506 of the selected memory cell 501m(m).

The value of the cell current Iw flowing between the source/drain regions 503a and 503b and the time for the write operation (the time for injecting the hot electrons into the floating gate electrode 506) are optimized for optimizing the quantity of the charges stored in the floating gate electrode 506 of the memory cell 501m(m).

The quantity of the charges stored in the floating gate electrode 506 of the memory cell 501m(m) is set to be smaller than that of charges stored in the floating gate electrode 706 of the conventional memory cell 701, for preventing an overwrite state. In the write operation, the potential of the source/drain region 503b (the bit line BLm+1) of the memory cell 501m(m) according to this embodiment is set at a low level of 10 V while the potential of the source/region 703 of the conventional memory cell 701 is set at 12 V, in order to prevent an overwrite state.

Before writing the data in the floating gate electrode 506 of the memory cell 501m(m), another data may already have been written in the floating gate electrode 505. If the floating gate electrode 505 stores a large quantity of charges and is in an overwrite state, the channel region 504 located immediately under the floating gate electrode 505 enters a complete OFF state and no cell current Iw flows between the source/drain regions 503a and 503b. Also when writing the data in the floating gate electrode 505, therefore, the quantity of charges stored in the floating gate electrode 505 is reduced to avoid an overwrite state, similarly to the aforementioned case of the floating gate electrode 506. Thus, the channel region 504 located immediately under the floating gate electrode 505 does not enter a complete OFF state but the cell current Iw flows between the source/drain regions 503a and 503b also when another data is written in the floating gate electrode 506.

In other words, the quantity of charges stored in the floating gate electrode 505 is so set that the cell current Iw of a necessary value flows when writing data in the floating gate electrode 506. Namely, the quantity of charges stored in the floating gate electrode 506 is set at such a small value that the cell current Iw of a necessary value flows when writing data in the floating gate electrode 505.

When writing data in the floating gate electrode 505 of the memory cell 501m(m), the bit line BLm+1 corresponding to the source/drain region 503b is connected to the constant current source 610a provided in the sense amplifier 610 and the potential of the bit line BLm corresponding to the source/drain region 503a is set at 10 V. The remaining potential conditions are similar to those for writing data in the floating gate electrode 506 of the memory cell 501m(m).

Therefore, this write operation can be performed for each floating gate electrode 505 or 506 as to the selected memory cell 501.

Figure 50:
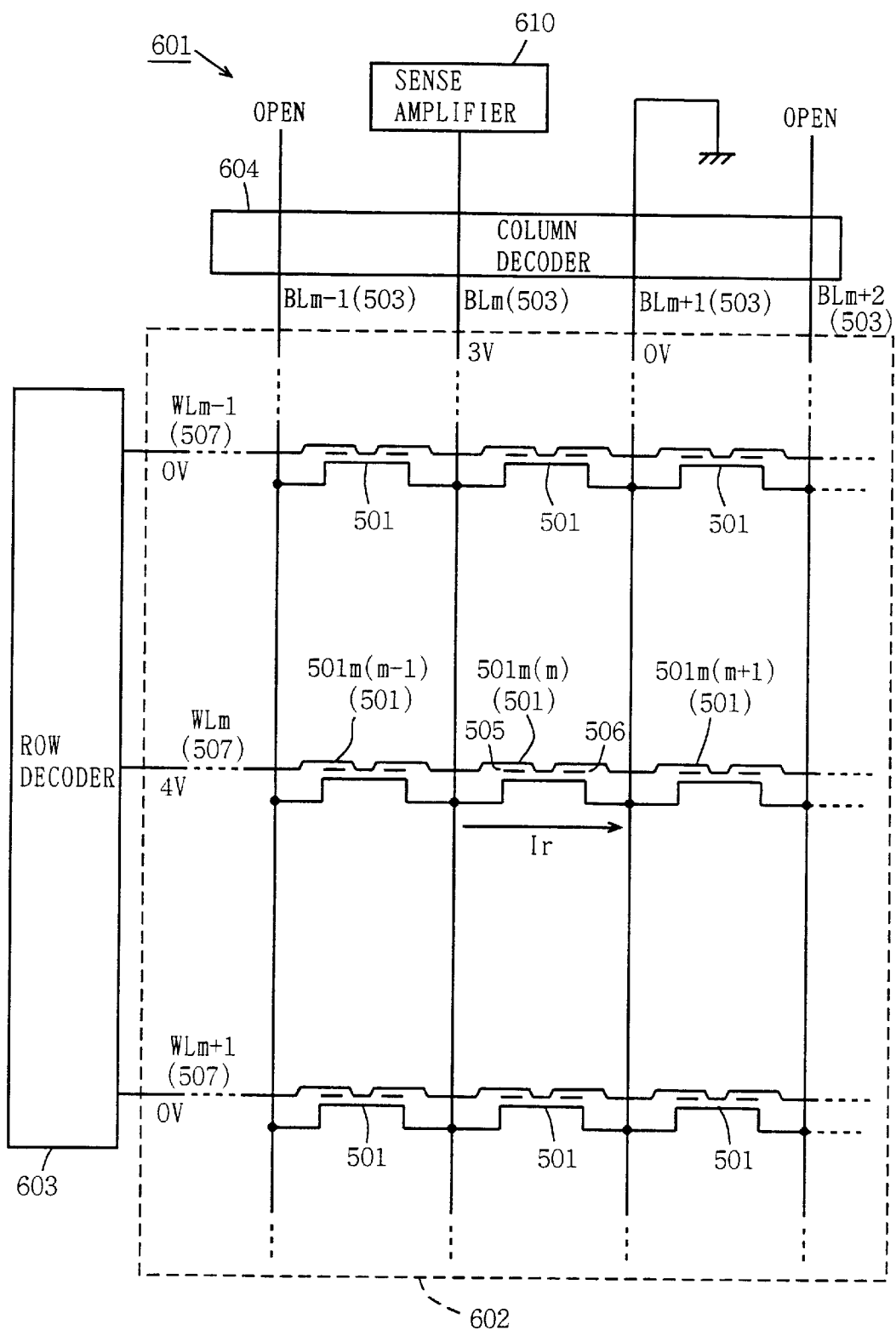
FIG. 50 is a partially fragmented circuit diagram for illustrating a function of the nonvolatile semiconductor memory according to the third embodiment of the present invention.
Figure 51:
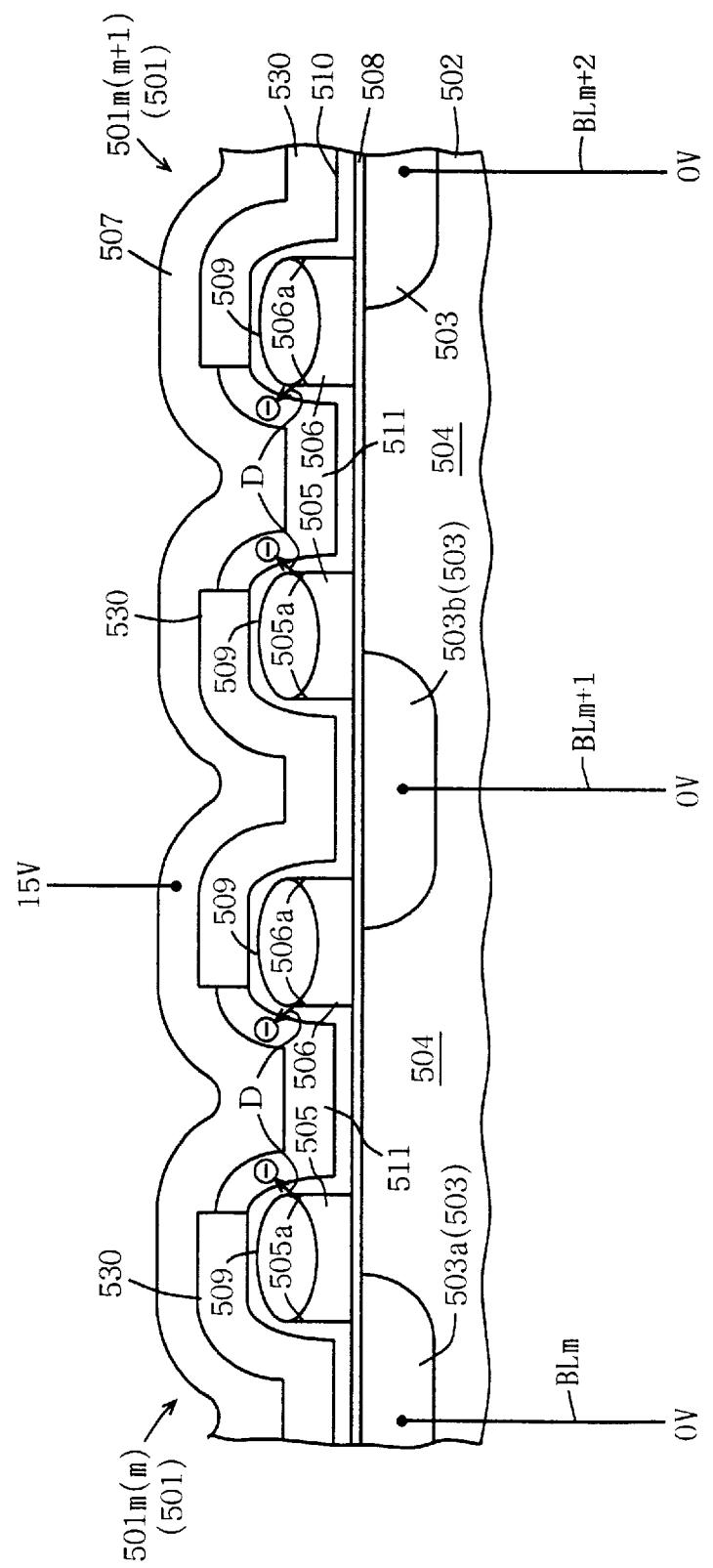
FIG. 51 is a partially fragmented sectional view for illustrating a function of the nonvolatile semiconductor memory according to the third embodiment of the present invention.

(b) Read Operation (see FIGS. 49 and 50)

In the following description, the memory cell 501m(m) is selected so that data is read from the floating gate electrode 506 thereof.

The potential of the bit line BLm corresponding to the source/drain region 503a of the memory cell 501m(m) is set at 3 V.

The potential of the bit line BLm+1 corresponding to the source/drain region 503b of the memory cell 501m(m) is set at 0 V.

Further, the remaining bit lines BL1 . . . Blm−1 and Blm+2 . . . BLn corresponding to the source/drain regions 503 of the remaining memory cells 501 are brought into open states.

The potential of the word line WLm corresponding to the control gate electrode 507 of the memory cell 501m(m) is set at 4 V. The potentials of the remaining word lines WL1 . . . WLm+1 and WLm+2 to WLn corresponding to the control gate electrodes 507 of the remaining memory cells 501 are set at 0 V.

When the potential of the source/drain region 503a is set at 3 V in the memory cell 501m(m), the potential of the floating gate electrode 505 is pulled up to a be close to 3 V due to coupling between the source/drain region 503a and the floating gate electrode 505 through the electrostatic capacitance. Consequently, the channel region 504 located immediately under the floating gate electrode 505 enters an ON state regardless of presence/absence of charges stored in the floating gate electrode 505.

As described later, the floating gate electrode 506 which is in an erase state stores no charges. On the other hand, the floating gate electrode 506 which is in a write state stores charges, as described above. Therefore, the channel region 504 located immediately under the floating gate electrode 506 of an erase state is in an ON state, while the channel region 504 located immediately under the floating gate electrode 506 in a write is close to an OFF state.

When a voltage of 4 V is applied to the control gate electrode 507, therefore, the cell current Ir flowing from the source/drain region 503a toward the source/drain region 503b when the floating gate electrode 506 is in an erase state is larger than that flowing when the floating gate electrode 506 is in a write state.

The value of the data stored in the floating gate electrode 506 of the memory cell 501m(m) can be read by sensing the value of the cell current Ir with the sense amplifier 610. For example, reading is performed on the assumption that the value of the data stored in the floating gate electrode 506 which is in an erase state is "1" and that of the data stored in the floating gate electrode 506 which is in a write state is "0". In this case, the sense amplifier 610 may be connected with the source/drain region 503b, for sensing the cell current Ir.

When reading data from the floating gate electrode 505 of the memory cell 501m(m), the potential of the bit line BLm+1 corresponding to the source/drain region 503b is set at 3 V, and that of the bit line BLm corresponding to the source/drain region 503a is set at 0 V. The remaining potential conditions or open states are similar to those in case of reading data from the floating gate 506 of the memory cell 501m(m).

In other words, the two values (=1 bit) of the data value "1" in the erase state and the data value "0" in the write state can be stored in either the floating gate electrode 505 or 506 of the selected memory cell 501m(m) so that the data values are read out.

Figure 52:
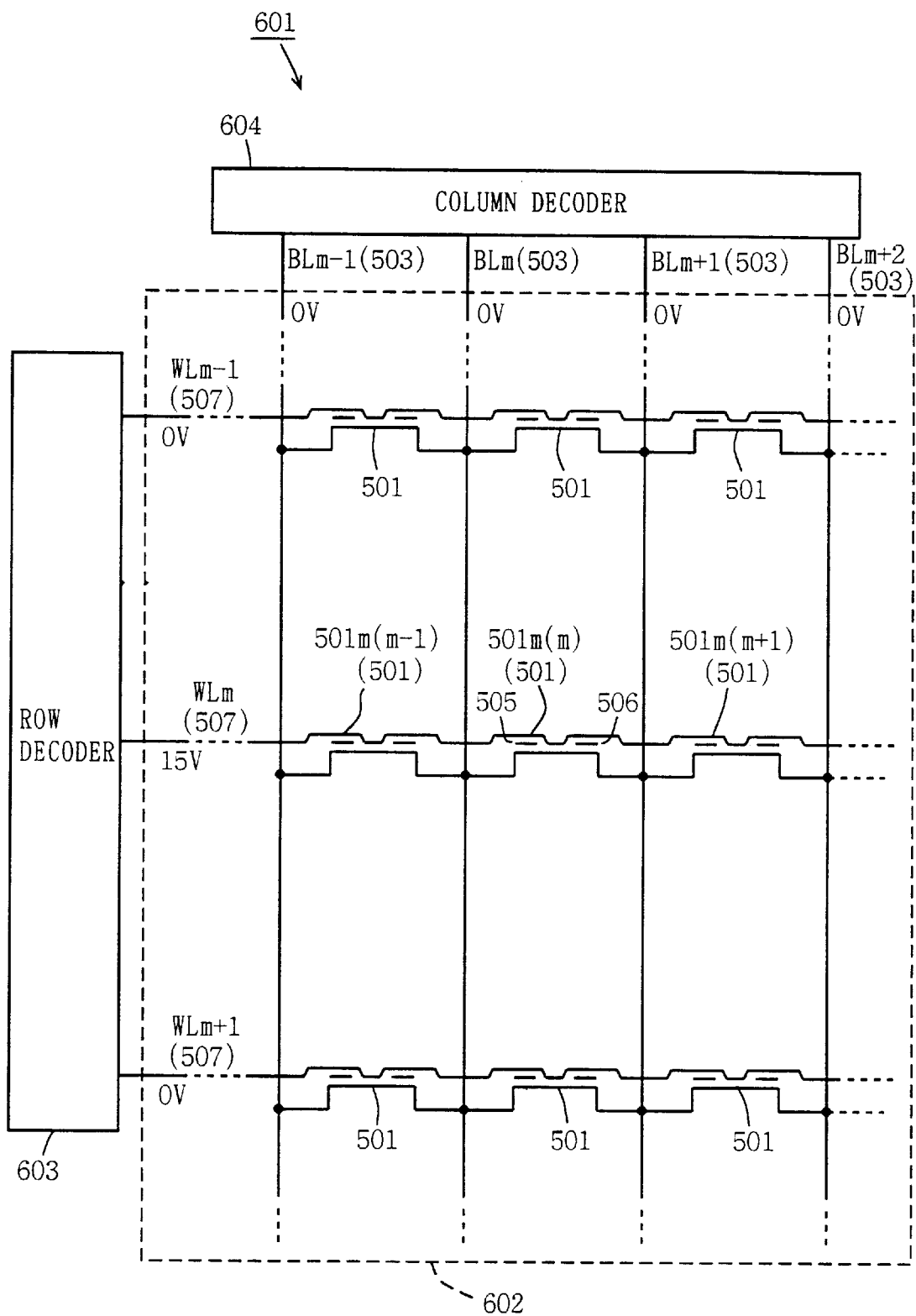
FIG. 52 is a partially fragmented circuit diagram for illustrating a function of the nonvolatile semiconductor memory according to the third embodiment of the present invention.
Figure 53:
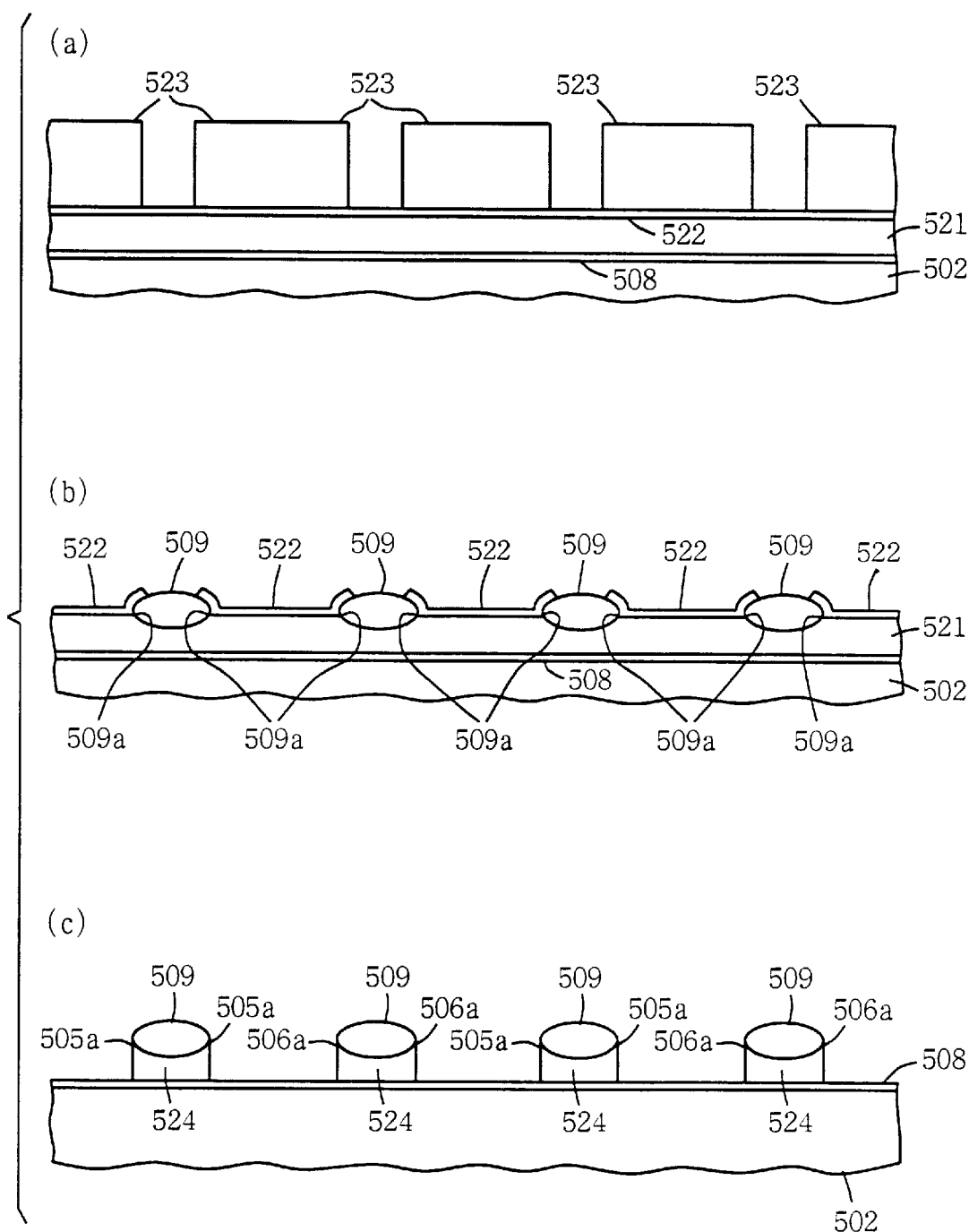
FIGS. 53(a) to 53(c) are sectional views showing steps of fabricating the nonvolatile semiconductor memory according to the third embodiment of the present invention.
Figure 56:
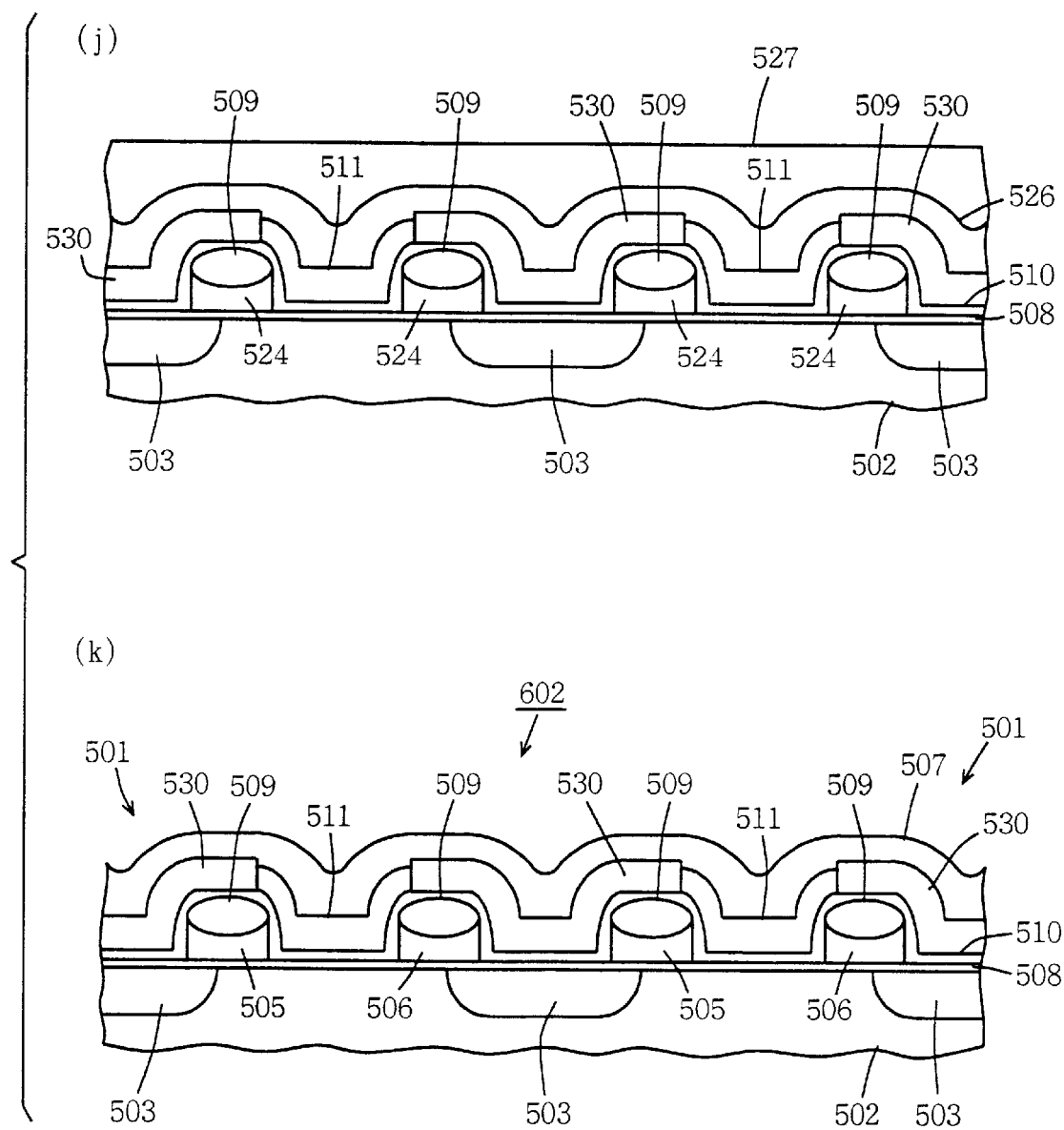
FIGS. 56(j) and 56(k) are sectional views showing steps of fabricating the nonvolatile semiconductor memory according to the third embodiment of the present invention.

(c) Erase Operation (see FIG. 51 or 52)

In the following description, data stored in the floating gate electrodes 505 and 506 of all memory cells 501 connected with the word line WLm are erased.

The potentials of all bit lines BL1 to BLn are set at 0 V.

The potential of the word line WLm is set at 15 V. The potentials of the remaining word lines WL1 . . . WLm+1 and WLm+2 . . . WLn are set at 0 V.

The electrostatic capacitance between each source/drain region 503a or 503b and the substrate 2 and each floating gate electrode 505 or 506 is overwhelmingly larger than that between the control gate electrode 507 and each floating gate electrode 505 or 506. In other words, each floating gate electrode 505 or 506 is strongly coupled with each source/drain region 503a or 503b and the substrate 502. Even if the potential of the control gate electrode 507 is set at 15 V and that of each source/drain region 503a or 503b is set at 0 V, therefore, the potential of each floating gate electrode 505 or 506 substantially remains around 0 V, the potential difference between the control gate electrode 507 and each floating gate electrode 505 or 506 is increased and a high electric field is formed between the control gate electrode 507 and each floating gate electrode 505 or 506.

Consequently, an F-N tunnel current flows, electrons in each floating gate electrode 505 or 506 are extracted toward the control gate electrode 507 as shown by arrows D in FIG. 51, and the data stored in each memory cell 501 is erased.

At this time, the electrons in each floating gate electrode 505 or 506 jump out from the projections 505a or 506a formed thereon and move toward the control gate electrode 507. Thus, movement of the electrons is facilitated so that the electrons can be efficiently extracted from each floating gate electrode 505 or 506.

When simultaneously selecting the plurality of word lines WL1 to WLn, data can be erased in all memory cells 501 connected to these word lines WL1 to WLn. Such an operation of dividing the memory cell array 602 into arbitrary blocks including the plurality of word lines WL1 to WLn and erasing data in units of the blocks is called a block erase operation.

A method of fabricating the memory cell array 602 is now described with reference to FIGS. 53(a) to 56(k).

(1) Step 1 (see FIG. 53(a))

The field isolation film 513 (shown in FIG. 45(b)) is formed on the substrate 502 by LOCOS. Then, the gate isolation film 508 of silicon oxide is formed on parts (element regions) of the substrate 502 provided with no field isolation film 513 by thermal oxidation. Then, a doped polysilicon film 521 serving as a first conductor film for forming the floating gate electrodes 505 and 506 is formed on the gate isolation film 508. A silicon nitride film 522 is formed on the overall surface of the doped polysilicon film 521 by LPCVD. A photoresist is applied to the overall surface of the silicon nitride film 522, and thereafter etching masks 523 are formed by general photolithography for forming both side walls of the floating gate electrodes 505 and 506 parallel to the source/drain regions 503.

(2) Step 2 (see FIG. 53(b))

The silicon nitride film 522 is anisotropically etched through the etching masks 523. Then, the etching masks 523 are removed. Then, the doped polysilicon film 521 is oxidized through the etched silicon nitride film 522 serving as an oxidation mask, for forming the insulator films 509. At this time, end portions of the insulator films 509 enter those of the silicon nitride film 522, to form bird's beaks 509a.

(3) Step 3 (see FIG. 53(c))

The silicon nitride film 522 is removed. Then, the doped polysilicon film 521 is anisotropically etched through the insulator films 509 serving as etching masks, for forming films 524 for defining the floating gate electrodes 505 and 506. These films 524 have shapes continuing the floating gate electrodes 505 arranged in parallel with the source/drain regions 503 and those continuing the floating gate electrodes 506 arranged in parallel with the source/drain regions 503. In other words, both side walls of the films 524 form those of the floating gate electrodes 505 and 506. Upper edge portions of the films 524 sharpen along the shapes of the bird's beaks 509a formed on the end portions of the insulator films 509, to form the projections 505a and 505b.

(4) Step 4 (see FIG. 54(d))

A photoresist is applied to the overall surface of the device formed in the aforementioned step, and thereafter ion implantation masks 525 for defining the source/drain regions 503 are formed by general photolithography. Then, n-type impurity ions such as phosphorus or arsenic ions are injected into the surface of the substrate 502 by general ion implantation, for forming the source/drain regions 503. Thereafter the ion implantation masks 525 are removed.

At this time, the ion implantation masks 525 are formed to cover at least portions of the substrate 502 provided with no source/drain regions 503 while not jutting out from the films 524. Consequently, the side walls of the films 524 (i.e., end portions of the floating gate electrodes 505 and 506) define the positions of the source/drain regions 503.

(5) Step 5 (see FIG. 54(e))

The tunnel isolation film 510 of silicon oxide is formed on the overall surface of the device formed in the aforementioned step by thermal oxidation and/or LPCVD. Thus, the stacked isolation films 508 and 510 and the stacked insulator and isolation films 509 and 510 are integrated with each other respectively.

(6) Step 6 (see FIG. 54(f))

A doped polysilicon film 531 serving as a second conductor film for defining the insulator film 530 (underlayer) and the selection gates 511 (underlayer) is formed on the overall surface of the device formed in the aforementioned step.

(7) Step 7 (see FIG. 55(g))

A silicon nitride film 532 is formed on the overall surface of the device formed in the aforementioned step. Then, a photoresist is applied to the overall surface of the silicon nitride film 532, and thereafter etching masks 533 for etching the silicon nitride film 532 are formed by general photolithography.

(8) Step 8 (see FIG. 55(h))

The silicon nitride film 532 is etched through the etching masks 533 for forming oxidation masks for defining boundaries between the selection gates 511 and the insulator film 530. The etching masks 533 are removed and thereafter the doped polysilicon film 531 is partially oxidized through the silicon nitride film 532 serving as a mask. Thus, the selection gates 511 and the insulator film 530 are formed from the doped polysilicon film 531. Thereafter the silicon nitride film 532 is removed.

(9) Step 9 (see FIG. 55(i))

A doped polysilicon film 526 serving as a third conductor film for defining the control gate electrodes 507 is formed on the overall surface of the device formed in the aforementioned step.

Each doped polysilicon film 521, 526 or 531 may be formed by any of the following methods:

Method 1: When forming the polysilicon film by LPCVD, gas containing impurities is mixed into the material gas.

Method 2: After forming a non-doped polysilicon film by LPCVD, an impurity diffusion source layer (POC13 or the like) is formed on the polysilicon film for diffusing impurities from the impurity diffusion layer into the polysilicon film.

Method 3: After forming a non-doped polysilicon film by LPCVD, impurity ions are injected.

(10) Step 10 (see FIG. 56(j))

A photoresist is applied to the overall surface of the device formed in the aforementioned step, and thereafter an etching mask 527 for defining the floating gate electrodes 505 and 506 and the control gate electrodes 507 is formed by general photolithography.

(11) Step 11 (see FIG. 56(k))

The doped polysilicon film 526, the tunnel isolation film 510, the insulator films 509 and the films 524 are simultaneously anisotropically etched through the etching mask 527 while controlling etching gas. Thus, the control gate electrodes 507 are formed from the doped polysilicon film 526 while the floating gate electrodes 505 and 506 are formed from the films 524.

Then the etching mask 527 is removed, for completing the memory cell array 602.

According to this embodiment, as hereinabove described in detail, the following functions and effects can be obtained:

[1] Each memory cell 501 has the two floating gate electrodes 505 and 506, which are arranged in parallel on the channel region 504 held between the two source/drain regions 503. Further, the floating gate electrodes 505 and 506 share the control gate electrode 507. Each memory cell 501 can store 1-bit data in each of the floating gate electrodes 505 and 506, for storing two-bit data in total.

Under the same design rule, therefore, the memory cell 501 can reduce the occupied area on the substrate 502 to about 66% as compared with the conventional memory cell 701. In other words, the memory cell 501 enables high integration comparing to that of a stacked gate memory cell.

[2] The control gate electrodes 507 of the memory cells 501 arranged along the row direction form the common word lines WL1 to WLn serving as control lines. In other words, the control gate electrodes 507 of the memory cells 501 arranged along the row direction are not separated but continuous to each other.

Thus, the problem (1) in the prior art can be completely avoided.

[3] No superposition dimensional accuracy may be taken into consideration with respect to the floating gate electrodes 505 and 506 and the control gate electrodes 507 due to the above item [2], and hence the problem (2) in the prior art can be completely avoided.

[4] According to this embodiment, only the gate isolation film 508 is provided between the floating gate electrodes 505 and 506 and the source/drain regions 503. Between the control gate electrode 507 and each pair of floating gate electrodes 505, on the other hand, the insulator film 509 and the tunnel isolation film 510 are provided while the insulator film 530 is provided by oxidizing the conductor layer, for increasing the distance between the control gate electrode 507 and the floating gate electrodes 505 and 506. Therefore, the ratio of the electrostatic capacitance between the floating gate electrodes 505 and 506 and the source/drain regions 503 to that between the control gate electrode 507 and the floating gate electrodes 505 and 506 can be increased. Thus, the potentials of the floating gate electrodes 505 and 506 can be readily pulled up to high levels on the basis of a high voltage applied to the source/drain regions 503 for writing data in the memory cell 501, thereby improving the write characteristics. Further, the control gate electrode 507 is directly in contact with the selection gate 511, only the gate isolation film 508 is provided between the selection gate 511 and the channel region 504 and the electrostatic capacitance between the control gate electrode 507 and the selection gate 511 and the channel region 504 is high, whereby a large cell current can be fed in data reading for improving the read characteristics.

[5] In the memory cell array 602 according to this embodiment, the control gate electrodes 507 of the memory cells 501 arranged along the row direction, forming the common word lines WL1 to WLn, are directly in contact with the selection gates 511 and formed on the same interconnection layer. Thus, no insulator films are interposed between the word lines WL1 to WLn and the control gate electrodes 507, whereby the device can be prevented from being vertically increased in size and an interconnection layer located on the word lines WL1 to WLn (the control gate electrodes 507) can be efficiently utilized for providing other wires.

[6] In the step 11 of this embodiment, the doped polysilicon film 526, the tunnel isolation film 510, the insulator film 509 and the films 524 are simultaneously etched while controlling the etching gas thereby forming the control gate electrodes 507 from the doped polysilicon film 526 and forming the floating gate electrodes 505 and 506 from the films 524. In the memory cell array 602, further, the source/drain regions 503 of the memory cells 501 arranged along the row direction form the common bit lines BL1 to BLn. In the memory cell array 602, therefore, no bit line contacts 714 maybe formed dissimilarly to the conventional memory cell array 802. Thus, the memory cell array 602 according to this embodiment is simple in structure and easy to fabricate as compared with the conventional memory cell array 802.

[7] The flash EEPROM 601 employing the memory cells 501, provided with the selection transistors 512, has a function of selecting each memory cell 501 itself. Even if charges are excessively extracted from the floating gate electrodes 505 and 506 in the erase operation, the selection gate 511 can bring the channel region 504 into an OFF state. Even if overerasing takes place, therefore, the selection transistor 512 can control the ON/OFF state of the memory cell 501 and the overerasing causes no problem. In other words, the selection transistor 512 provided in the memory cell 501 can select the ON/OFF state of the memory cell 501 itself.

[8] In order to optimize the quantities of the charges stored in the floating gate electrodes 505 and 506 of the memory cell 501 in the write operation, a technique (multivalued storage technique) of storing not only two values (=1 bit) of an erase state and a write state but three or more values in the memory cell 501 may be applied. In the multivalued storage technique, it is necessary and indispensable to correctly control the write state by precisely controlling the potentials of the floating gate electrodes of the memory cell in the write operation. When the technique of controlling the potentials of the floating gate electrodes, the quantities of the charges stored in the floating gate electrodes 505 and 506 of the memory cell 501 in the write operation can be readily optimized.

[9] In order to prevent an overwrite state in the write operation, the potential of the source/drain region 503b (the bit line BLm+1) of the memory cell 501m(m) is set at a low value of 10 V. Even if the power supply voltage for the flash EEPROM 601 is reduced to 3.3 V, therefore, the load of a charge pump is reduced to readily cope with such reduction of the voltage.

In the conventional memory cell 701, on the other hand, the potential of the source/region 703 is set at 12 V in the write operation. If the power supply voltage for the flash EEPROM 801 is 3.3 V, therefore, it is difficult to generate the voltage (=12 V) supplied to the source region 703 with a charge pump and a specific circuit is required for forming this voltage, to result in a complicated circuit structure.

[10] The channel region 504 of the memory cell 501 is larger in length than the channel region 705 of the conventional memory cell 701. Therefore, the withstand voltage of the channel region 504 is higher than that of the channel region 705. Consequently, data is hardly written in the floating gate electrodes 505 and 506 of the memory cells 501 other than the selected memory cell 501 in the write operation, and the aforementioned functions and effects in the write operation can be further reliably obtained.

[11] When sensing the value of the cell current Ir in the memory cell 501 in the read operation, the multivalued storage technique may be applied. In the multivalued storage technique, it is necessary and indispensable to precisely sense the cell current in the read operation. When utilizing the technique of sensing the cell current, the value of the cell current Ir in the memory cell 501 can be precisely sensed.

[12] In the write operation, the quantities of the charges stored in the floating gate electrodes 505 and 506 of the memory cell 501 are set at small values for preventing an overwrite state. In the erase operation, therefore, the quantities of electrons extracted from the floating gate electrodes 505 and 506 toward the control gate electrode 507 are reduced.

Fourth Embodiment

A fourth embodiment of the present invention is now described with reference to FIGS. 57(*a*) to 59(*h*).

Figure 59:
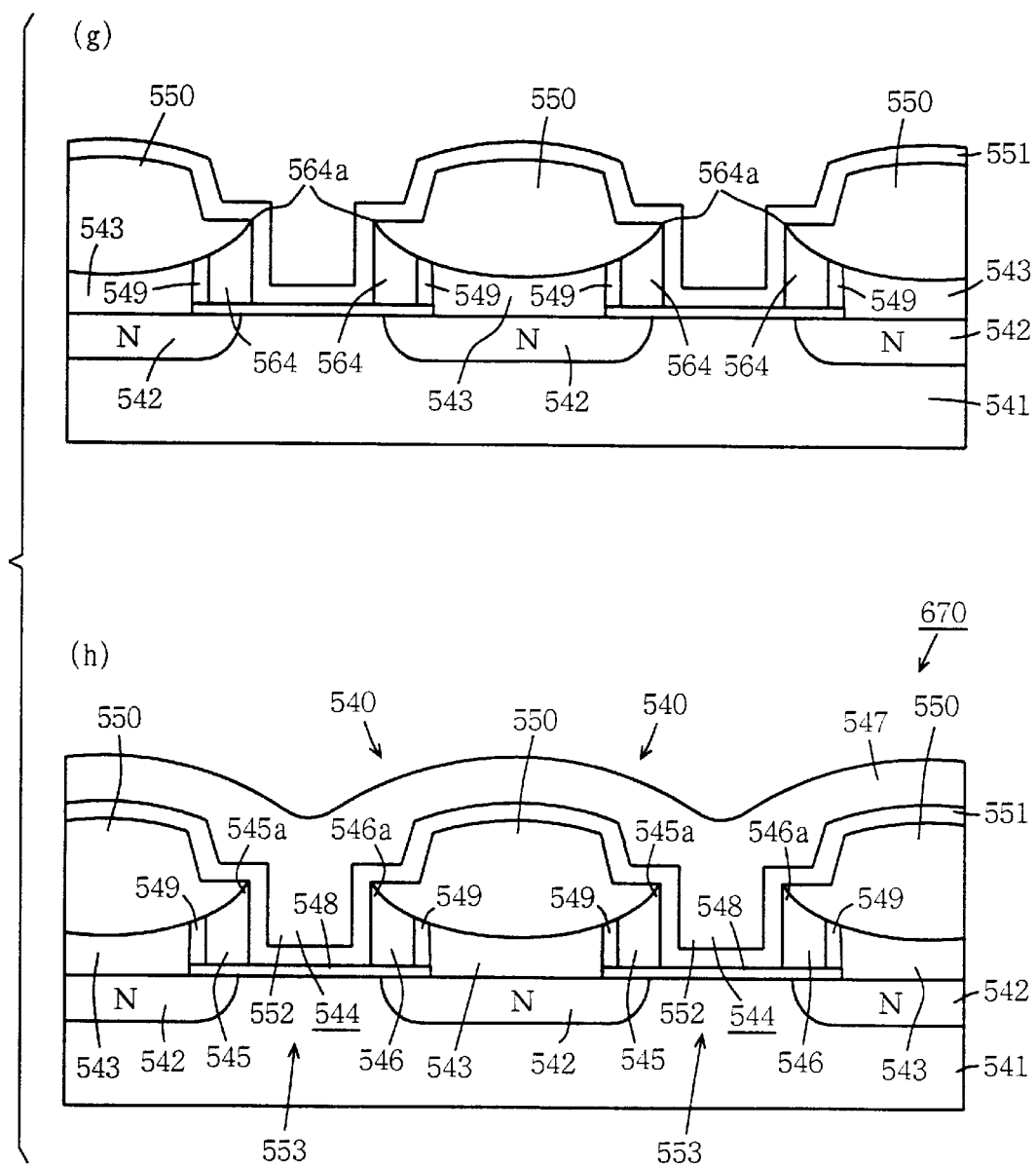
FIGS. 59(g) and 59(h) are sectional views showing steps of fabricating the nonvolatile semiconductor memory according to the fourth embodiment of the present invention.
Figure 61:
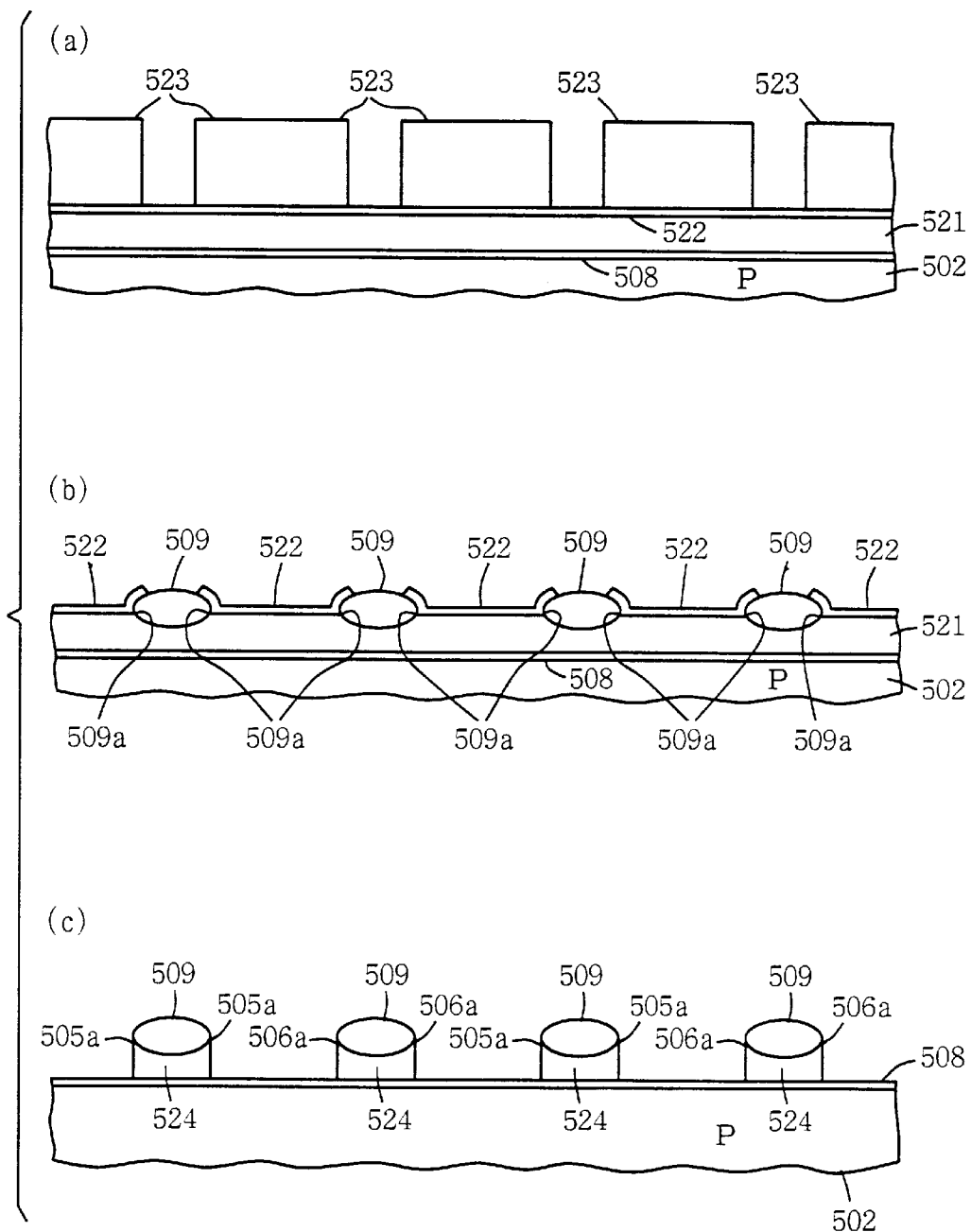
FIGS. 61(a) to 61(c) are sectional views showing steps of fabricating a nonvolatile semiconductor memory according to a sixth embodiment of the present invention.
Figure 62:
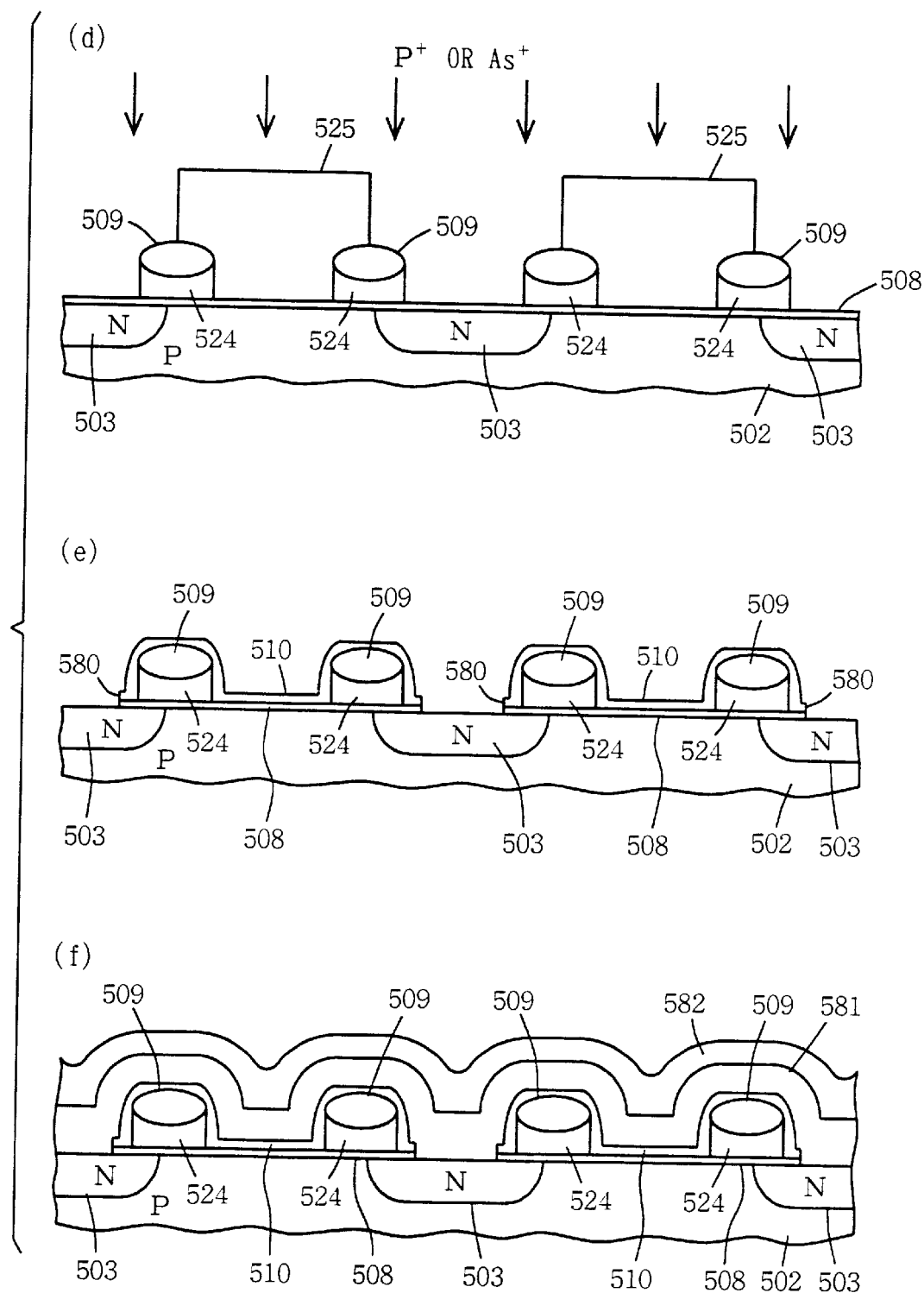
FIGS. 62(d) to 62(f) are sectional views showing steps of fabricating the nonvolatile semiconductor memory according to the sixth embodiment of the present invention.
Figure 63:
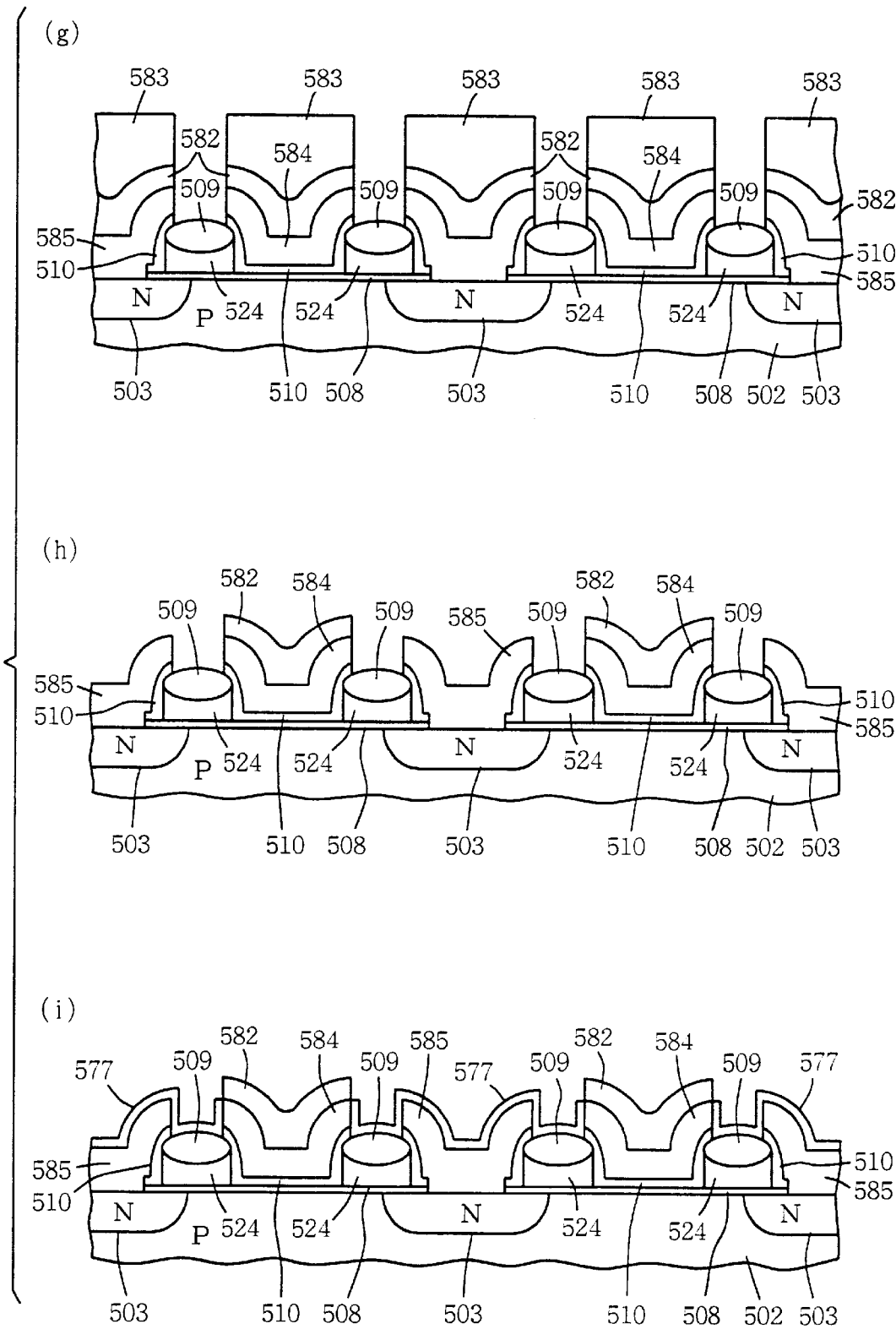
FIGS. 63(g) to 63(i) are sectional views showing steps of fabricating the nonvolatile semiconductor memory according to the sixth embodiment of the present invention.
Figure 64:
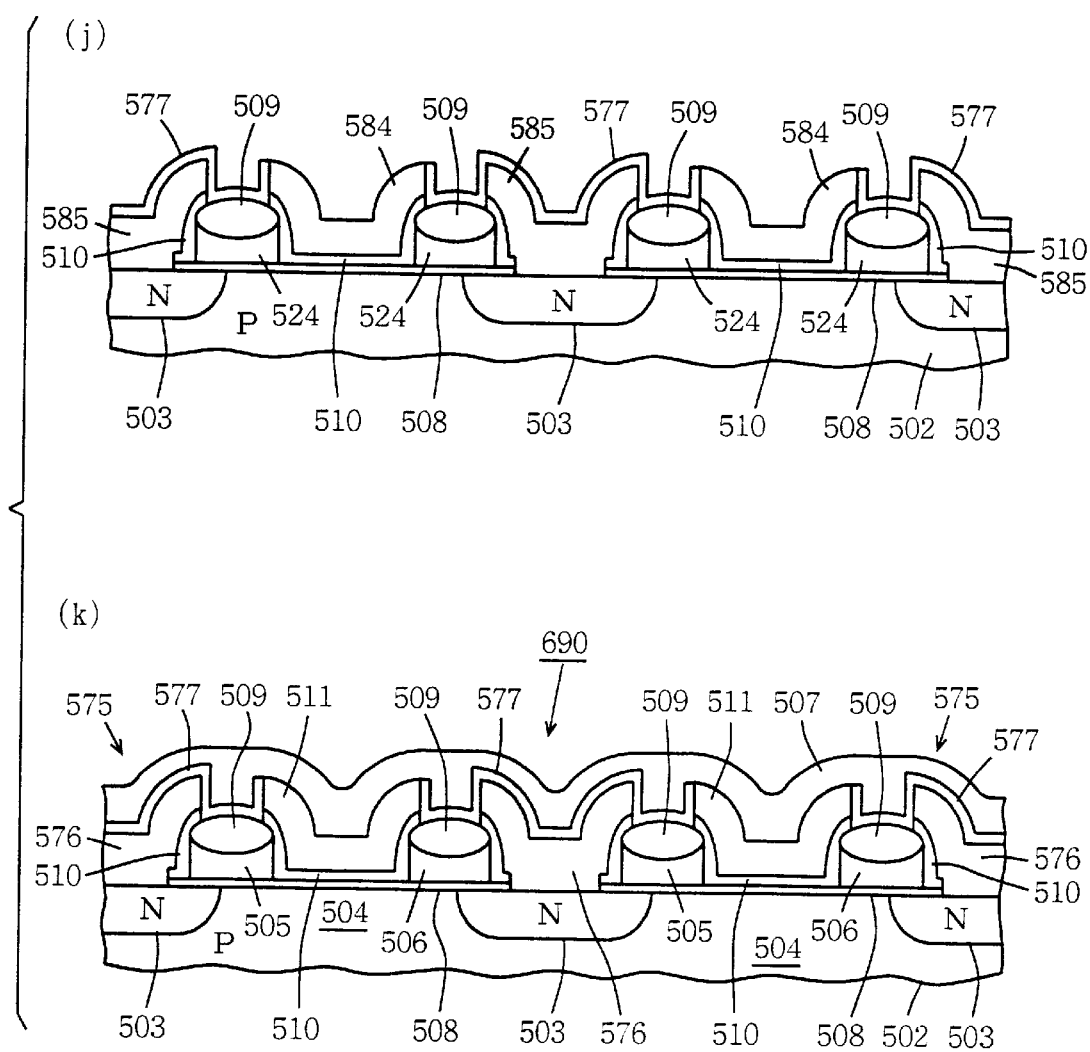
FIGS. 64(j) and 64(k) are sectional views showing steps of fabricating the nonvolatile semiconductor memory according to the sixth embodiment of the present invention.

FIG. 59(*h*) shows a part of a memory cell array 670 of a flash EEPROM employing memory cells 540 according to this embodiment. Each memory cell 540 is formed by two source/drain regions 542, a conductive block layer 543, a channel region 544, two floating gate electrodes 545 and 546 and a control gate electrode 547.

The n-type source/drain regions 542 are formed on a p-type single-crystalline silicon substrate 541. The conductive block layer 543 is formed on each source/drain region 542. A semiconductor such as doped amorphous silicon, doped single-crystalline silicon or doped polycrystalline silicon can be employed as the material for this conductor film.

The two floating gate electrodes 545 and 546, which are identical in dimension and shape to each other, are symmetrically formed on each source/drain region 542 to hold the conductive block layer 543 therebetween. Insulator films 549 serving as dielectric members are provided between the floating gate electrodes 545 and 546 and the conductive block layer 543, while the floating gate electrodes 545 and 546 are arranged on the channel region 544 held between the two source/drain regions 542 of symmetrical structures through a gate isolation film 548.

An insulator film 550 is formed on the conductive block layer 543 and the floating gate electrodes 545 and 546 located on each source/drain region 542 by LOCOS, and a tunnel isolation film 551 is formed on the insulator film 550 and the gate isolation film 548. The insulator film 550 defines projections 545*a* and 546*a* on upper portions of the floating gate electrodes 545 and 546. The control gate electrode 547 is formed on the tunnel isolation film 551.

A part of the control gate electrode 547 is arranged on the channel region 544 through the isolation films 548 and 551, to form a selection gate 552. The source/drain regions 542 holding the selection gate 552 therebetween and the selection gate 552 form a selection transistor 553. In other words, the memory cell 540 has such a structure that two transistors formed by the floating gate electrodes 545 and 546, the control gate electrode 547 and the source/drain regions 542 and the selection transistor 553 formed between these transistors are serially connected with each other.

In the memory cell 540, the electrostatic capacitance between the control gate electrode 547 and the channel region 544, between which only the gate isolation film 548 and the tunnel isolation film 551 are interposed, is increased. The electrostatic capacitance between the control gate electrode 547 and the floating gate electrodes 545 and 546, between which the tunnel isolation film 551 and the insulator film 550 are interposed, is reduced as compared with that between the control gate electrode 547 and the channel region 544. Further, the electrostatic capacitance between the control gate electrode 547 and the source/drain regions 542, between which the insulator film 550 and the tunnel isolation film 551 are interposed, is reduced as compared with that between the control gate electrode 547 and the floating gate electrodes 545 and 546. Each floating gate electrode 545 or 546 is opposed to the source/drain region 542 through the isolation film 548, while a side wall of each floating gate electrode 545 or 546 is opposed to the conductive block layer 543 (i.e., the source/drain region 542) through the insulator film 549. Therefore, the electrostatic capacitance between the source/drain region 542 and each floating gate electrode 545 or 546 can be increased.

A method of fabricating the memory cell array 670 is now described with reference to FIGS. 57(*a*) to 59(*h*).

Figure 57:
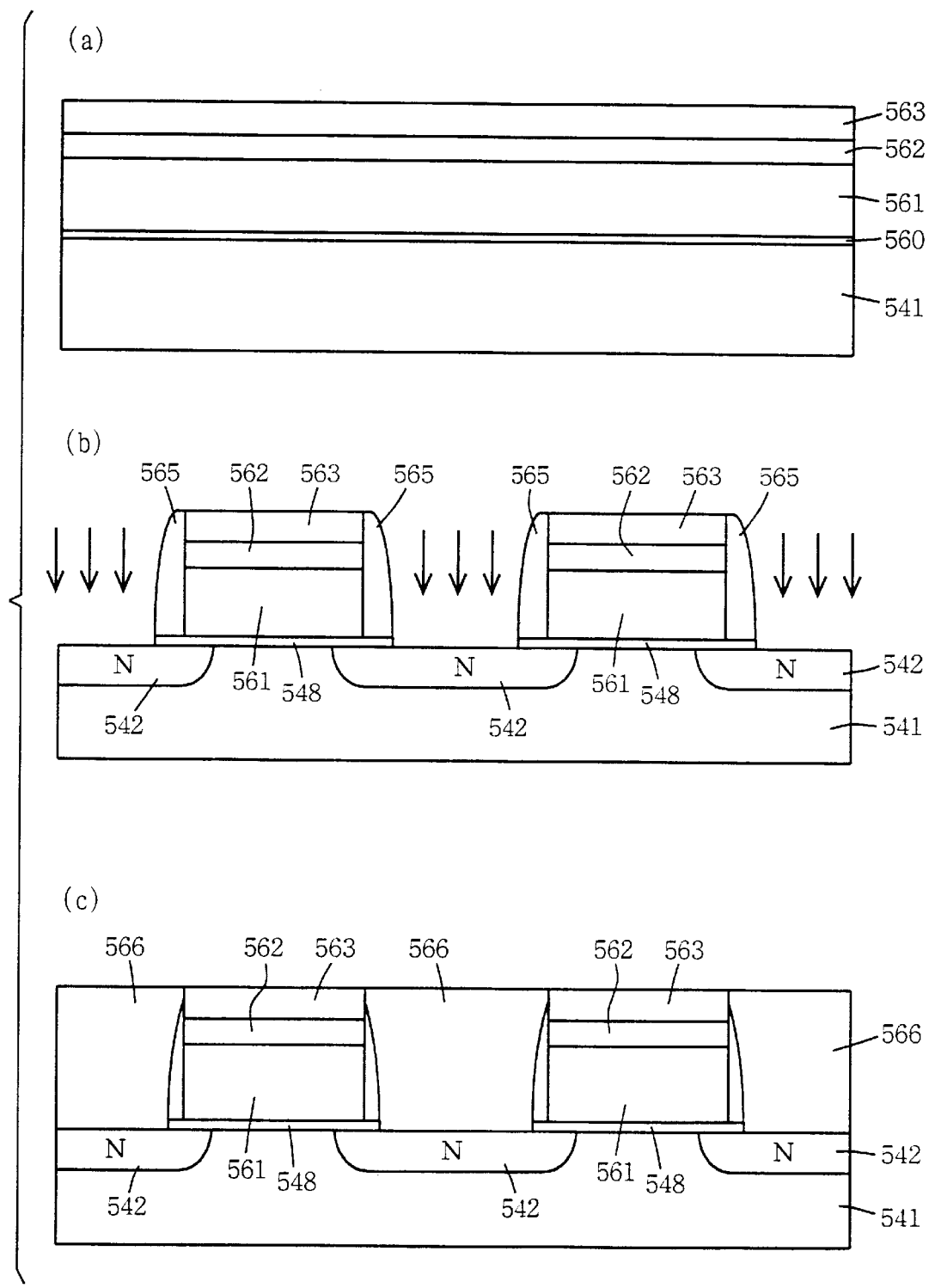
FIGS. 57(a) to 57(c) are sectional views showing steps of fabricating a nonvolatile semiconductor memory according to a fourth embodiment of the present invention.

(1) Step 1 (see FIG. 57(*a*))

A field isolation film is formed on the substrate 541 by LOCOS, and thereafter a silicon oxide film 560 for forming the gate isolation films 548 is formed on portions (element regions) of the substrate 541 provided with no field isolation film by thermal oxidation. Then, a doped polysilicon film 561 serving as a first conductor film for defining the conductive block layers 543 and the floating gate electrodes 545 and 546 is formed on the silicon oxide film 560. A silicon oxide film 562 is formed on the doped polysilicon film 561, and thereafter a silicon nitride film 563 is formed on the overall surface of the silicon oxide film 562 by LPCVD.

(2) Step 2 (see FIG. 57(*b*))

A photoresist is applied to the overall surface of the silicon nitride film 563, and thereafter an etching mask is formed by general photolithography for defining the source/drain regions 542. The silicon nitride film 563, the silicon oxide film 562 and the doped polysilicon film 561 are simultaneously anisotropically etched through the etching mask while controlling etching gas. Thereafter a silicon oxide film is formed on the overall surface of the device and etched back for forming the gate isolation films 548 from the silicon oxide film 560 while forming side walls 565 as isolation walls. Then, n-type impurity ions (phosphorus or arsenic ions) are injected into the surface of the substrate 541 by general ion implantation through openings between the side walls 565 serving as ion implantation masks, for forming the source/drain regions 542.

(3) Step 3 (see FIG. 57(*c*))

A doped polysilicon film 566 serving as a second conductor film is formed on the overall surface of the device and flattened by CMP (chemical mechanical polishing).

Figure 58:
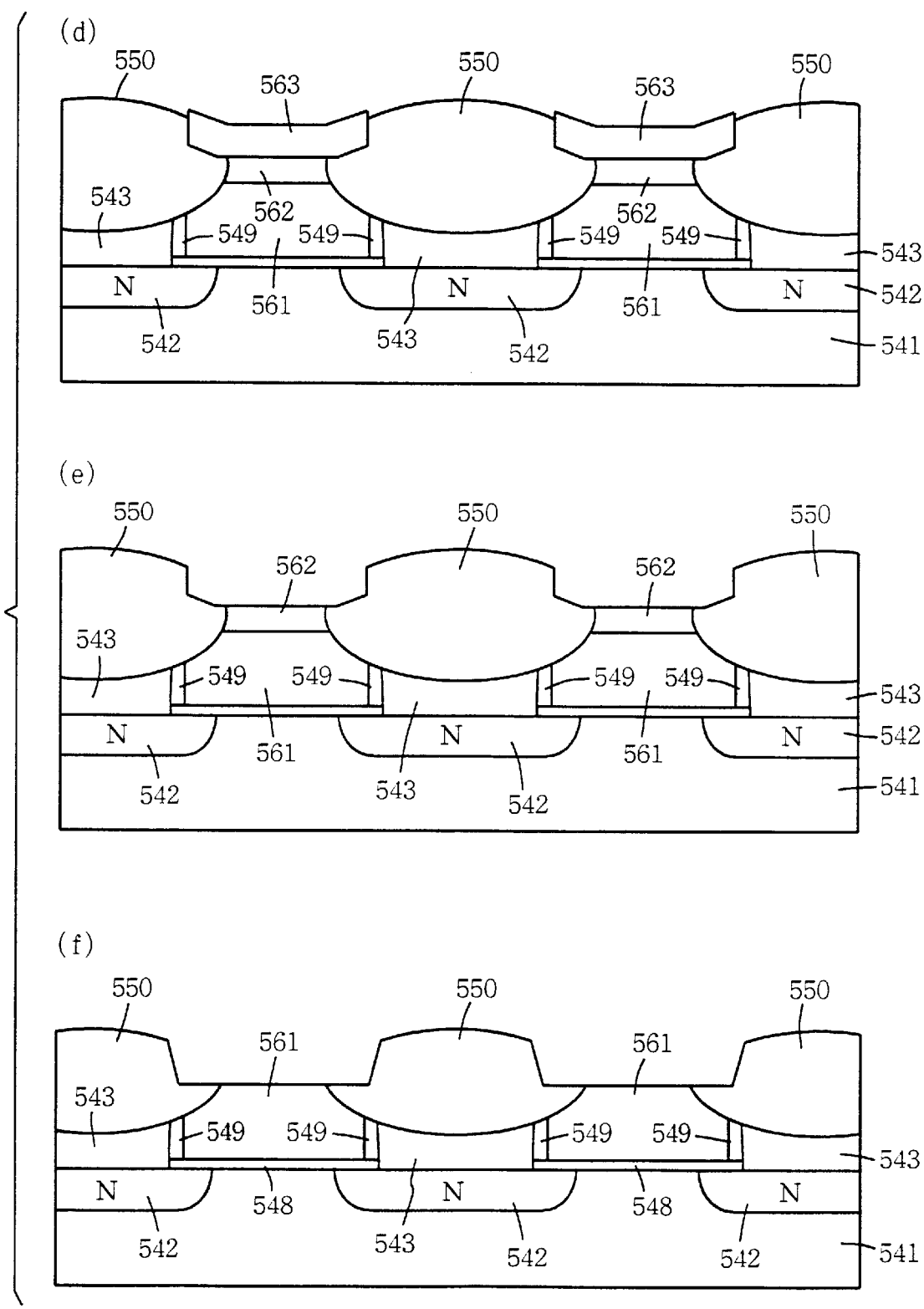
FIGS. 58(d) to 58(f) are sectional views showing steps of fabricating the nonvolatile semiconductor memory according to the fourth embodiment of the present invention.

(4) Step 4(see FIG. 58(*d*))

Then, the doped polysilicon film 566 is oxidized through the etched silicon nitride film 563 serving as an oxidation mask by LOCOS, for forming the insulator films 550. At this time, the conductive block layers 543 are formed on the source/drain regions 542 from the doped polysilicon film 566, while the insulator films 549 are formed on both sides of the conductive block layers 543 from the side walls 565.

(5) Step 5 (see FIG. 58(e))

The silicon nitride film 563 is removed.

(6) Step 6 (see FIG. 58(f))

The silicon oxide films 550 and 562 are etched and the silicon oxide film 562 is removed.

(7) Step 7 (see FIG. 59(g))

The doped polysilicon film 561 is anisotropically etched through the silicon oxide film 550 serving as an etching mask, for forming films 564 for defining the floating gate electrodes 545 and 546. At this time, the films 564 sharpen along the shapes of end portions of the insulator films 550, to form projections 564a. The tunnel isolation film 551 of silicon oxide is formed on the overall surface of the device by thermal oxidation and/or LPCVD. Then, the stacked isolation films 548 and 551 and the stacked insulator and isolation films 550 and 551 are integrated with each other respectively.

(8) Step 8 (see FIG. 59(h))

A doped polysilicon film serving as a third conductor film for defining the control gate electrodes 547 is formed on the overall surface of the device formed in the aforementioned step. An etching mask is formed by general photolithography for forming the floating gate electrodes 545 and 546 and the control gate electrodes 547, and the doped polysilicon film, the tunnel isolation film 551, the insulator films 550 and the films 564 are simultaneously anisotropically etched through the etching mask while controlling etching gas. Thus, the control gate electrodes 547 are formed from the doped polysilicon film while the floating gate electrodes 545 and 546 are formed from the films 564. Then, the etching mask is removed, to complete the memory cell array 670.

According to the embodiment having the aforementioned structure, the following functions and effects can be obtained in addition to those of the third embodiment:

[13] Each floating gate electrode 545 or 546 is opposed to the source/drain region 542 through the insulator film 548 while the side wall of each floating gate electrode 545 or 546 is opposed to the conductive block layer 543 (i.e., the source/drain region 542) through the insulator film 549. In other words, each floating gate electrode 545 or 546 is coupled with the source/drain region 542 provided in the substrate 541, and also coupled with the conductive block layer 543 connected to the source/drain region 542. When writing data in the memory cell 540, therefore, the potentials of the floating gate electrodes 545 and 546 can be readily pulled up on the basis of the coupling on the side of the source/drain region 542 and on that of the conductive block layer 543, for improving the write characteristics.

[14] Each floating gate electrode 545 or 546 is coupled with the source/drain region 542 provided in the substrate 541, and also coupled with the conductive block layer 543 connected to the source/drain region 542. In order to refine a memory cell array, impurity diffusion layers (source/drain regions) must be set shallow for reducing diffusion areas thereof. According to this embodiment, the floating gate electrodes 545 and 546 are also coupled with the conductive block layer 543 provided on the source/drain region 542, whereby the opposition areas of the floating gate electrodes 545 and 546 and the source/drain region 542 can be reduced for attaining further refinement.

Fifth Embodiment

A fifth embodiment of the present invention is now described with reference to FIGS. 60(a) and 60(b). In relation to this embodiment, elements identical to those in the third embodiment are denoted by the same reference numerals.

FIGS. 60(a) and 60(b) show a part of a memory cell array 680 of a flash EEPROM employing memory cells 571 according to this embodiment. FIG. 60(b) is a partially fragmented plan view of the memory cell array 680, and FIG. 60(a) is a sectional view taken along the line Z—Z in FIG. 60(b).

Each memory cell 571 according to this embodiment is similar in structure to the memory cell 501 according to the third embodiment, except the following points:

(1) As shown in FIG. 60(a), the memory cell 571 is not provided with the insulator film 530 and the selection gate 511 provided on the memory cell 501, but has a control gate electrode 507 (word line) provided on a tunnel isolation film 510.

(2) As shown in FIG. 60(b), the control gate electrode 507 of the memory cell 571 is formed by a wide part 507A located on a channel region 504 and narrow parts 507B located on floating gate electrodes 505 and 506 and source/drain regions 503 (impurity diffusion layers). The narrow parts 507B of the control gate 507 can be applied to parts other than that for controlling a substrate 502.

According to this embodiment having the aforementioned structure, the following functions and effects can be obtained in addition to those of the items [1] to [3] and [5] to [12] according to the third embodiment:

[15] In the memory cell 571, the narrow parts 507B of the control gate electrode 507 are arranged on the floating gate electrodes 505 and 506 for reducing the opposition areas of the control gate electrode 507 and the floating gate electrodes 505 and 506. Therefore, the ratio of the electrostatic capacitance between the control gate electrode 507 and the floating gate electrodes 506 and 506 to that between the floating gate electrodes 505 and 506 and the source/drain regions 503 can be increased. Thus, the potentials of the floating gate electrodes 505 and 506 can be readily pulled up to high levels in data writing on the basis of a high voltage applied to the source/drain regions 503 for improving the write characteristics. Further, the wide part 507A of the control gate electrode 507 is arranged on the channel region 504 to obtain large opposition areas, whereby the electrostatic capacitance between the control gate electrode 507 and the channel region 504 is increased and a large cell current can be fed for reading data for improving the write characteristics.

Sixth Embodiment

A sixth embodiment of the present invention is now described with reference to FIGS. 61(a) to 64(k). In this embodiment, elements identical to those in the third embodiment are denoted by the same reference numerals, to partially omit redundant description.

FIG. 64(k) illustrates a part of a memory cell array 680 of a flash EEPROM employing memory cells 575 according to this embodiment. Each memory cell 575 according to this embodiment is similar in structure to the memory cell 501 according to the third embodiment, except the following points:

In the memory cell 575 according to this embodiment, the gate isolation film 508 and the insulator film 530 provided on the source/drain regions 503 of the memory cell 501 are omitted but a conductive block layer 576 is directly provided on each source/drain region 503. The conductive block layer 576 is opposed to floating gate electrodes 505 and 506 through a tunnel isolation film 510. Between each pair of such conductive block layers 576, a selection gate 511 is provided on a channel region 504 through a gate isolation film 508 and the tunnel isolation film 510. In this embodiment, the conductive block layer 576 and the selection gate 511 are formed by etching a conductor layer serving as an underlayer and separating the same. This conductor layer can be prepared from a semiconductor such as doped amorphous silicon, doped single-crystalline silicon or doped polycrystalline silicon or a conductor such as aluminum.

A control gate electrode 507 is formed on the selection gate 511, to pass over the conductive block layer 576 through an insulator film 577. The control gate electrode 507 and the selection gate 511, which are directly in contact with each other, are in electrical conduction.

In the memory cell 575, the electrostatic capacitance between the control gate electrode 507 and the selection gate 511 and the channel region 504, between which only the gate isolation film 508 and the tunnel isolation film 510 are interposed, is increased. The electrostatic capacitance between the control gate electrode 507 and the floating gate electrodes 505 and 506, between which the insulator film 577 and an insulator film 509 are interposed, is reduced as compared with that between the control gate electrode 507 and the channel region 504. Further, each floating gate electrode 505 or 506 is opposed to the source/drain region 503 through the gate isolation film 508, while a side wall thereof is opposed to the conductive block layer 576 (i.e., the source/drain region 503) through the tunnel isolation film 510. Therefore, the electrostatic capacitance between the source/drain region 503 and each floating gate electrode 505 or 506 can be increased.

A method of fabricating the memory cell array 680 is now described with reference to FIGS. 61(a) to 64(k). Steps similar to those according to the third embodiment are described with the same step numbers.

FIGS. 61(a), 61(b), 61(c) and 62(d) illustrate steps 1, 2, 3 and 4 respectively. The steps 1 to 4 are identical to the steps 1 to 4 for fabricating the memory cell array 602 according to the third embodiment.

Step 5 (see FIG. 62(e))

The tunnel isolation film 510 of silicon oxide is formed on the overall surface of a device formed through the aforementioned steps by thermal oxidation and/or LPCVD. Thereafter the gate isolation film 508 and the tunnel isolation film 510 located on the source/drain regions 503 are partially removed to form contact holes 580.

Step 6 (see FIG. 62(f))

A doped polysilicon film 581 serving as a second conductor film for defining the conductive block layers 576 (underlayers) and the selection gates 511 (underlayers) is formed on the overall surface of the device formed in the aforementioned step, and a silicon nitride film 582 is formed on the doped polysilicon film 581. The doped polysilicon film 581 and the source/drain regions 503, which are in direct contact with each other, are in electrical conduction.

Step 7 (see FIG. 63(g))

A photoresist is applied to the overall surface of the silicon nitride film 582 and thereafter etching masks 583 for cutting/separating the doped polysilicon film 581 are formed by general photolithography. Then, the silicon nitride film 582, the doped polysilicon film 581 and the tunnel isolation film 510 located on the insulator films 509 are etched through the etching masks 583. The doped polysilicon film 581 is cut/separated into parts 584 for defining the selection gates 511 and parts 585 for defining the conductive block layers 576. Thereafter the etching masks 583 are removed.

Step 8 (see FIG. 63(h))

An etching mask is formed on the overall surface of the device formed in the aforementioned step by general photolithography for removing parts of the silicon nitride film 582 located on the source/drain regions 503 by etching through the etching mask while leaving the remaining parts of the silicon nitride film 582 located on the channel regions 504.

Step 9 (see FIG. 63(i))

Surface parts of the doped polysilicon film 585 located on the source/drain regions 503 and the insulator films 509 are oxidized through the parts of the silicon nitride film 582 left on the channel regions 504 serving as oxidation masks, for forming the insulator film 577. Thus, the selection gates 511 and the insulator films 530 are formed from the doped polysilicon film 531.

Step 10 (see FIG. 64(j))

The silicon nitride film 582 is removed from the overall surface of the device formed in the aforementioned step.

Step 11 (see FIG. 64(k))

A doped polysilicon film serving as a third conductor film for defining the control gate electrodes 507 is formed on the overall surface of the device formed in the aforementioned step. An etching mask for forming the floating gate electrodes 505 and 5.06 and the control gate electrodes 507 is formed by general photolithography for simultaneously anisotropically etching the doped polysilicon film, the insulator film 577, the insulator films 509, the tunnel isolation film 510 and the films 524 through the etching mask while controlling etching gas. Thus, the control gate electrodes 507 are formed from the doped polysilicon film while the floating gate electrodes 505 and 506 are formed from the films 524. Then, the etching mask is removed, for completing the memory cell array 680.

According to this embodiment having the aforementioned structure, the following functions and effects can be obtained in addition to those of the third embodiment:

[16] Each floating gate electrode 505 or 506 is opposed to the source/drain region 503 through the gate isolation film 508 while a side wall of each floating gate electrode 505 or 506 is opposed to the conductive block layer 576 (i.e., the source/drain region 503) through the tunnel isolation film 510. In other words, each floating gate electrode 505 or 506 is coupled with the source/drain region 503 provided in a substrate 502 and also coupled with the conductive block layer 576 connected to the source/drain region 503. Therefore, the potentials of the floating gate electrodes 505 and 506 can be readily pulled up on the basis of coupling on the side of the source/drain region 503 and that on the side of the conductive block layer 576 when writing data in the memory cell 575, for improving the write characteristics.

[17] Each floating gate electrode 505 or 506 is coupled with the source/drain region 503 provided in the substrate 502 and also coupled with the conductive block layer 576 connected to the source/drain region 503. In order to refine a memory cell array, impurity diffusion layers (source/drain regions) must be set shallow for reducing diffusion areas thereof. According to this embodiment, the floating gate electrodes 505 and 506 are also coupled with the conductive block layer 576 provided on the source/drain region 503, whereby the opposition areas of the floating gate electrodes 505 and 506 and the source/drain regions 503 can be reduced for attaining further refinement.

Seventh Embodiment

A seventh embodiment of the present invention is now described with reference to FIG. 65. In this embodiment, any of the memory cell structures illustrated with reference to the third to sixth embodiments is employed for each memory cell. In this embodiment, further, elements identical to those in the third embodiment are denoted by the same reference numerals to omit redundant description.

Figure 65:
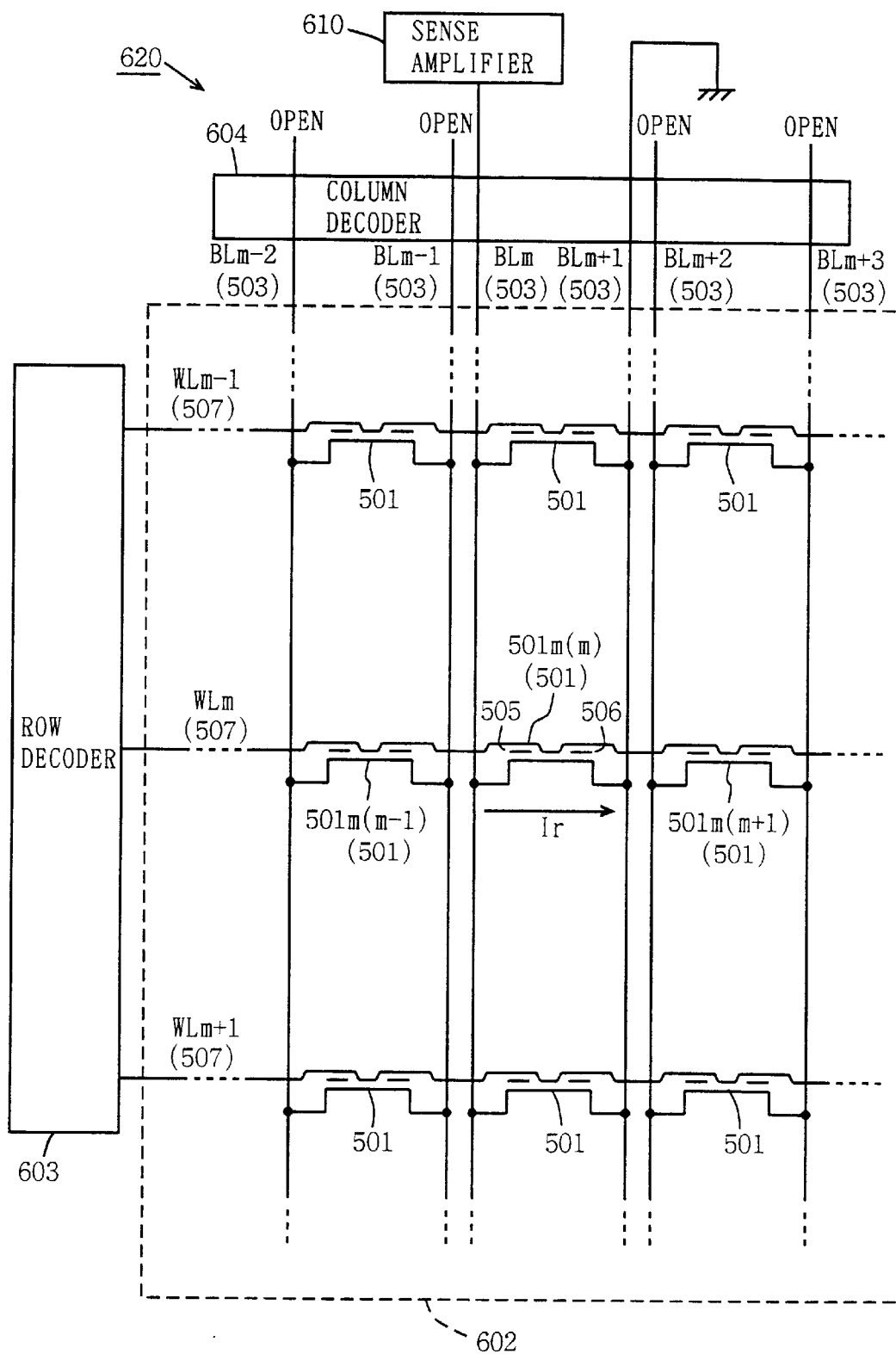
FIG. 65 is a partially fragmented circuit diagram of a nonvolatile semiconductor memory according to a seventh embodiment of the present invention.

FIG. 65 shows a part of the structure of a flash EEPROM 620 according to this embodiment.

The flash EEPROM 620 according to this embodiment is different from the flash EEPROM 601 according to the third embodiment shown in FIG. 46 only in the following points:

[1] In a memory cell array 602, source/drain regions 503 of memory cells 501 arranged along a row direction are separated from each other.

[2] In the memory cell array 602, source/drain regions 503 of memory cells 501 arranged along a column direction form independent bit lines BL1 to BLn for the memory cells 501 arranged along the row direction.

That is, a bit line BLm connected with a memory cell 501$m$(m) is separated from a bit line BLm−1 connected with a memory cell 501$m$(m−1). Further, a bit line BLm+1 connected with the memory cell 501$m$(m) is separated from a bit line BLm+2 connected with a memory cell 501$m$(m+1).

According to this embodiment having the aforementioned structure, the following function and effect can be obtained in addition to those according to the third embodiment:

In the third embodiment, charge/discharge currents flow to the bit lines BL1 . . . BLm−1 and BLm+2 . . . BLn corresponding to the source/drain regions 503 of the memory cells 501 other than the selected memory cell 501$m$(m) even if these bit lines BL1 . . . BLm−1 and BLm+2 . . . BLn are brought into open states in the read operation. Therefore, the sense amplifier 610 cannot correctly sense the value of the cell current Ir for the memory cell 501$m$(m) unless the bit lines BL1 . . . BLm−1 and BLm+2 . . . BLn are completely charged/discharged. In other words, the speed of the read operation may be slightly reduced by the time required for charging/discharging the bit lines BL1 . . . BLm−1 and BLm+2 . . . BLn brought into open states.

In this embodiment, on the other hand, the independent bit lines BL1 to BLn are provided for the respective memory cells 501 arranged along the row direction. Even if the bit lines BL1 . . . BLm−1 and BLm+2 . . . BLn corresponding to the source/drain regions 503 of the memory cells 501 other than the selected memory cell 501$m$(m) are brought into open states in the read operation, therefore, no charge/discharge currents flow to these bit lines BL1 . . . BLm−1 and BLm+2. . . BLn. According to this embodiment, therefore, the speed of the read operation can be prevented from reduction resulting from charge/discharge currents for the bit lines BL1 to BLn dissimilarly to the third embodiment, and a high-speed read operation can be implemented.

According to this embodiment, further, an erase operation can be performed every selected memory cell 501 due to the independent bit lines BL1 to BLn provided for the memory cells 501 arranged along the row direction.

Eighth Embodiment

An eighth embodiment of the present invention is now described with reference to FIG. 66. In this embodiment, any of the memory cell structures illustrated with reference to the third to sixth embodiments is employed for each memory cell. In this embodiment, further, elements identical to those in the third embodiment are denoted by the same reference numerals to omit redundant description.

Figure 66:
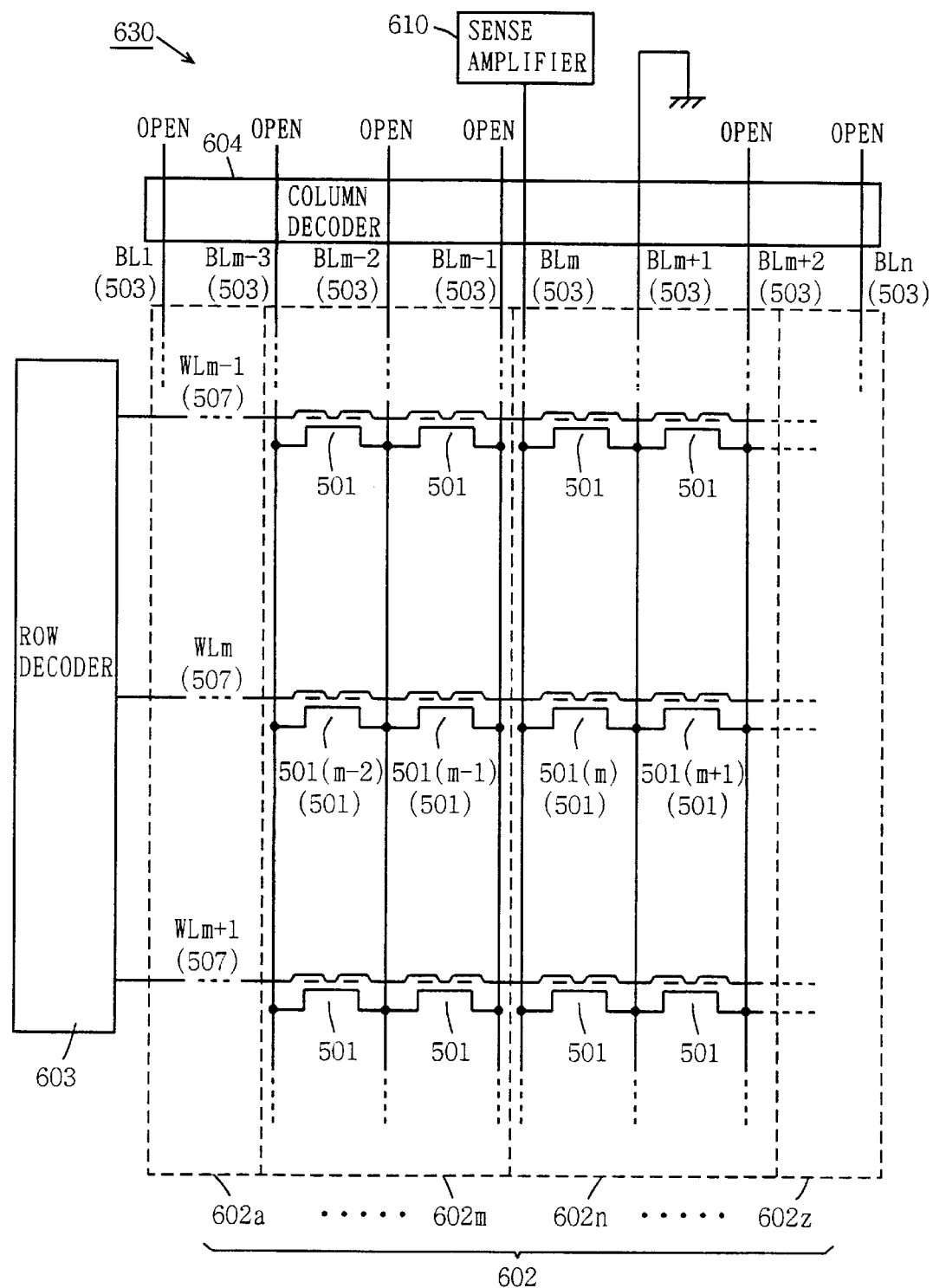
FIG. 66 is a partially fragmented circuit diagram of a nonvolatile semiconductor memory according to an eighth embodiment of the present invention.

FIG. 66 shows a part of a flash EEPROM 630 according to this embodiment.

The flash EEPROM 630 according to this embodiment is different from the flash EEPROM 620 according to the seventh embodiment only in the following points:

{1} A memory cell array 602 corresponds to bit lines BL1 to BLn, and is divided into a plurality of cell blocks 602$a$ to 602$z$ in a row direction. A cell block 602$m$ is formed by memory cells 501 connected to bit lines BLm−3 to BLm−1. Another cell block 602$n$ is formed by memory cells 501 connected to bit lines BLm to BLm+2. In other words, each of the cell blocks 602$a$ to 602$z$ includes three bit lines BL1 to BLn.

{2} In each of the cell blocks 602$a$ to 602$z$, source/drain regions 503 of memory cells 501 arranged along a column direction form common bit lines.

{3} In the cell blocks 602$a$ to 602$z$, source/drain regions 503 of the memory cells 501 arranged along the row direction are separated from each other. In each adjacent pair of the cell blocks 602$a$ to 602$z$, the source/drain regions 503 of the memory cells 501 arranged along the column direction are separated from each other to form separate bit lines. In other words, the source/drain regions 503 corresponding to the independent bit lines BLm−1 and BLm are separated from each other in the cell blocks 602$m$ and 602$n$.

Namely, memory cells 501$m$(m) and 501$m$(m+1) are connected to a common bit line BLm+1, and memory cells 501$m$(m−2) and 501$m$(m−1) are connected to a common bit line BLm−2. The bit line BLm connected with the memory cell 501$m$(m) is separated from the bit line BLm−1 connected with the memory cell 501$m$(m−1).

According to this embodiment having the aforementioned structure, the following function and effect can be obtained in addition to those of the third embodiment:

In the seventh embodiment, the source/drain regions 503 are formed in correspondence to the bit lines independent f or the respective memory cells 501 arranged along the row direction in the overall memory cell array 602, and hence the area of the memory cell array 602 is increased although the speed for the read operation is increased.

In this embodiment, on the other hand, the source/drain regions 503 of the memory cells 501 arranged along the column direction in each pair of the cell blocks 602$a$ to 602$z$ are separated from each other to form separate bit lines. In each of the cell blocks 602$a$ to 602$z$, the source/drain regions 503 of the memory cells 501 arranged along the column direction form the source/drain regions 503 corresponding to common bit lines, similarly to the third embodiment. According to this embodiment, therefore, the area of the memory cell array 602 can be reduced as compared with the seventh embodiment.

In this embodiment, however, a charge/discharge current flows to the bit line BLm+2 connected with the memory cell 501m(m+1) adjacent to the selected memory cell 501m(m). However, no charge/discharge currents flow to the remaining bit lines BL1 . . . BLm−1 and BLm+3 . . . BLn, and hence a read operation can be performed at a higher speed as compared with the third embodiment.

According to this embodiment, further, an erase operation can be performed only on all memory cells 501 in an arbitrary selected one of the cell blocks 602a to 60z among the memory cells 501 connected to a selected one of the word lines WL1 to WLn. For example, the erase operation can be made only on the memory cells 501m(m−2) and 501m(m−1) in the cell block 602m while performing no erase operation on the remaining memory cells 501 connected to the word line WLm. Alternatively, the erase operation can be performed only on the memory cells 501m(m−2), 501m(m−1), 501m(m) and 501m(m+1) in the cell blocks 602m and 602n while performing no erase operation on the remaining memory cells 501 connected to the word line WLm.

Ninth Embodiment

A ninth embodiment of the present invention is now described with reference to FIG. 67. In this embodiment, any of the memory cell structures illustrated with reference to the third to sixth embodiments is employed for each memory cell. In this embodiment, further, elements identical to those in the third embodiment are denoted by the same reference numerals to omit redundant description.

Figure 67:
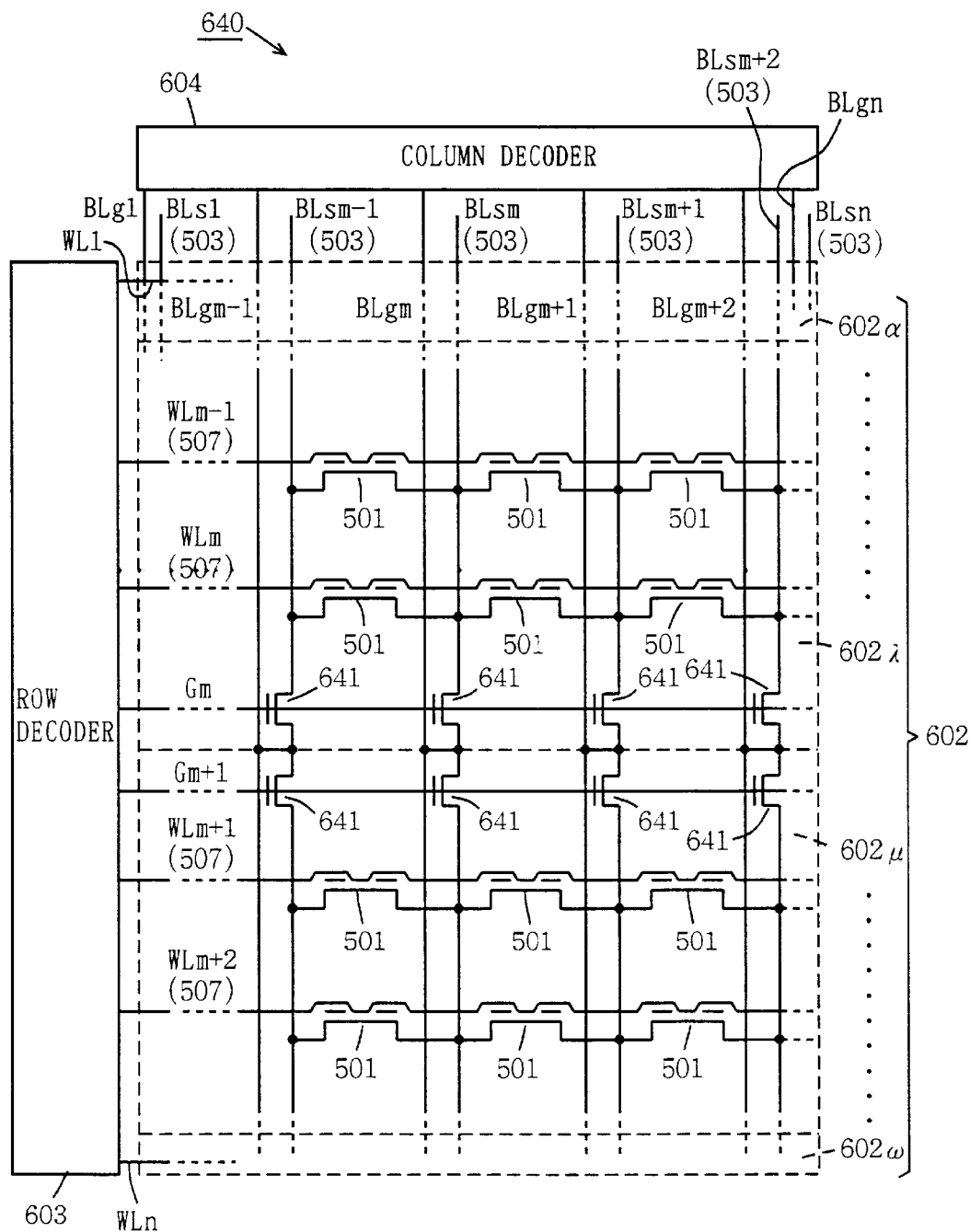
FIG. 67 is a partially fragmented circuit diagram of a nonvolatile semiconductor memory according to a ninth embodiment of the present invention.

FIG. 67 shows a part of the structure of a flash EEPROM 640 according to this embodiment.

The flash EEPROM 640 according to this embodiment is different from the flash EEPROM 601 according to the third embodiment shown in FIG. 46 only in the following points:

{1} A memory cell array 602 corresponds to word lines WL1 to WLn and is divided into a plurality of cell blocks 602α to 602ω in a column direction. A cell block 602λ is formed by memory cells 501 connected to word lines WLm−1 and WLm. Another cell block 602μ is formed by memory cells 501 connected to word lines WLm+1 and WLm+2.

{2} In the cell blocks 602α to 602ω, source/drain regions 503 of memory cells 501 arranged along the column direction form common local short bit lines BLs1 to BLsn.

{3} Global bit lines BLg1 to BLgn are arranged in parallel with the local short bit lines BLs1 to BLsn. The global bit lines BLg1 to BLgn are formed by interconnection layers made of a metal including a high-melting point metal.

{4} In the cell blocks 602α to 602ω, the local short bit lines BLs1 to BLsn and the global bit lines BLg1 to BLgn are connected with each other through MOS transistors 641. In the cell blocks 602α to 602ω, further, gates of the MOS transistors 641 provided for the respective local short bit lines BLs1 to BLsn are connected to common gate lines G1 to Gn.

In the cell block 602λ, the gates of the MOS transistors 641 provided for the local short bit lines BLs1 to BLsn are connected to a common gate line Gm. In the cell block 602μ, the gates of the MOS transistors 641 provided for the local short bit lines BLs1 to BLsn are connected to a common gate line Gm+1.

{5} The gate lines G1 to Gn are connected to a row decoder 603. When the word lines WL1 to WLn in an arbitrary one of the cell blocks 602α to 602ω are selected, the row decoder 603 selects the gate lines G1 to Gn corresponding to the selected one of the cell blocks 602α to 602ω. Consequently, the MOS transistors 641 connected to the selected gate lines G1 to Gn enter ON states to connect the local short bit lines BLs1 to BLsn and the global bit lines BLg1 to BLgn with each other.

When any of the word lines in the cell block 602λ is selected, the gate line Gm is selected. When any of the word lines in the cell block 602μ is selected, on the other hand, the gate line Gm+1 is selected.

According to this embodiment having the aforementioned structure, the local short bit lines BLs1 to BLsn formed by the source/drain regions 503 of the memory cells 501 are independently provided for the cell blocks 602α to 602ω. Therefore, the length of the local short bit lines BLs1 to BLsn is reduced as compared with that of the bit lines BL1 to BLn in the third embodiment. Further, the local short bit lines BLs1 to BLsn are lined with the global bit lines BLg1 to BLgn formed by metal interconnection layers.

Therefore, the electrostatic capacitance of each of the local short bit lines BLs1 to BLsn is reduced for reducing the time required for charging/discharging each of the local short bit lines BLs1 to BLsn, whereby the speed for a read operation can be increased.

The aforementioned embodiments can be modified as follows, to attain similar functions and effects:

In the write operation in each of the third to sixth embodiments, the quantities of charges stored in the floating gate electrodes 505 and 506 of each memory cell 501 are set at large values to obtain an overwrite state.

If the floating gate 505 is already in an overwrite state and the channel region located immediately under the floating gate electrode 505 is completely in an OFF state when writing data in the floating gate electrode 506 of the memory cell 501m(m), however, no cell current Iw flows between the source/drain regions 503b and 503a.

In this case, therefore, at least either the gate length of the floating gate electrodes 505 and 506 or the impurity concentration of the substrate 502 is so set that a constant leakage current flows to the channel region 504 located immediately under the floating gate electrodes 505 and 506. Thus, the necessary cell current Iw can be obtained by the leakage current even if the floating gate electrodes 505 and 506 are in overwrite states.

When the memory cell 501 is refined, the gate length of the floating gate electrodes 505 and 506 is also reduced in response so that a leakage current readily flows to the channel region 504. The method of feeding a constant leakage current to the channel region 504 in place of bringing the floating gate electrodes 505 and 506 into overwrite states can be regarded as effective for the refined memory cell 501.

In the eighth embodiment, each of the cell blocks 602a to 602z is set to have at least four bit lines BL1 to BLn.

Figure 68:
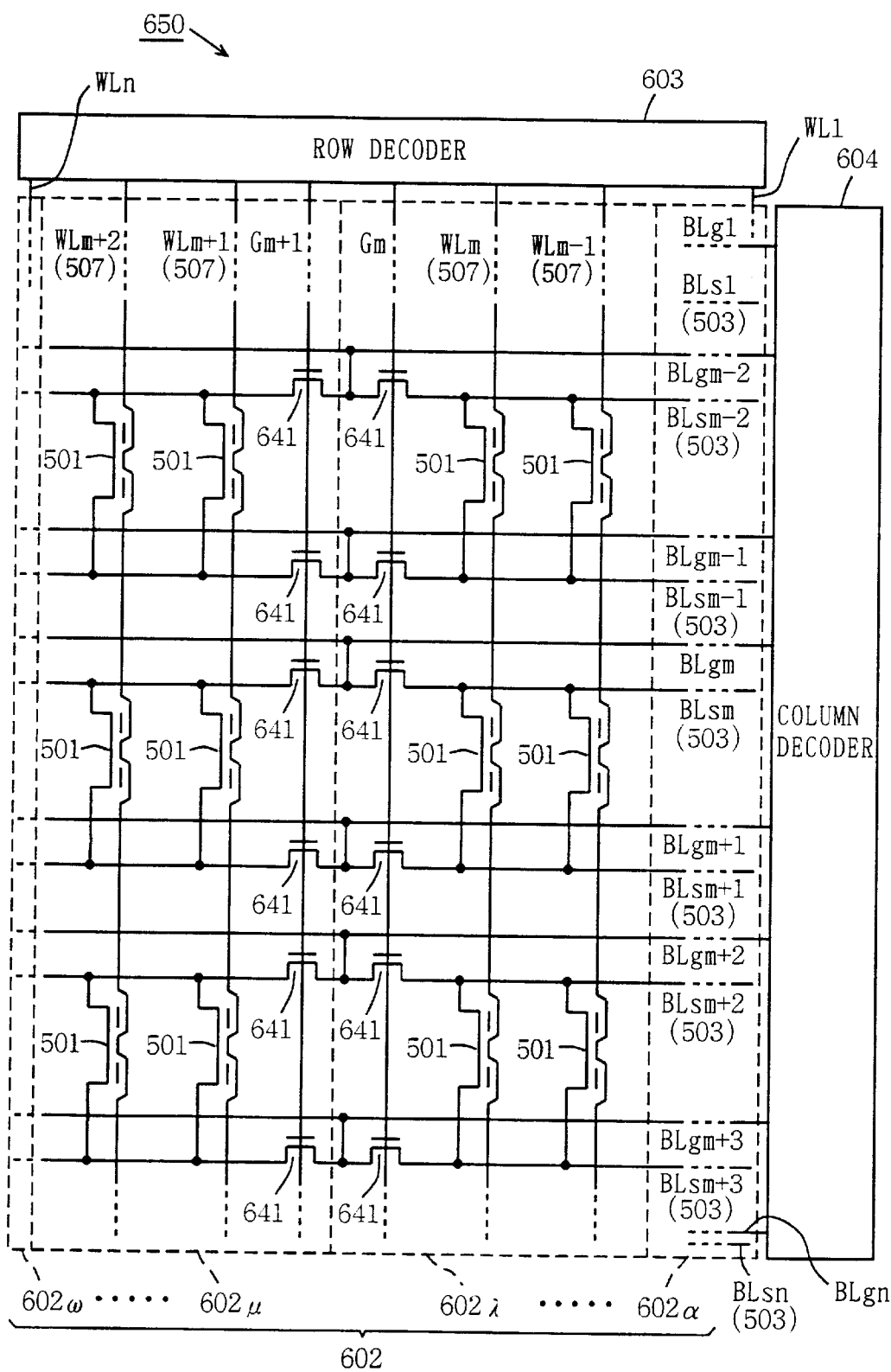
FIG. 68 is a partially fragmented circuit diagram of a nonvolatile semiconductor memory according to a tenth embodiment of the present invention.

The seventh and ninth embodiments are combined with each other to form a flash EEPROM 650 according to a tenth embodiment. FIG. 68 shows a part of the structure of the flash EEPROM 650. In this case, the speed for the read operation can be further increased due to multiplier action of the seventh and ninth embodiments.

Figure 69:
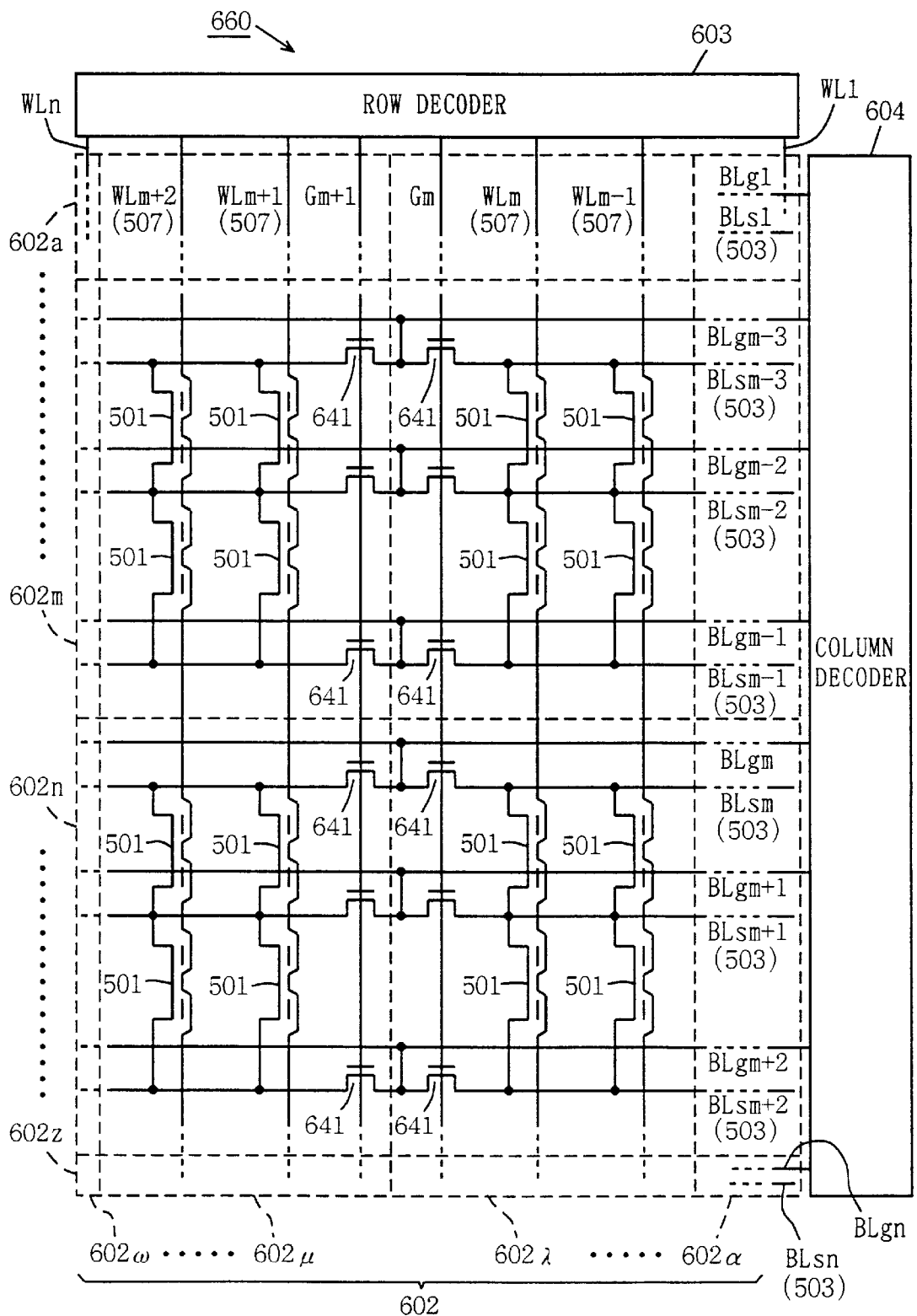
FIG. 69 is a partially fragmented circuit diagram of a nonvolatile semiconductor memory according to an eleventh embodiment of the present invention.
Figure 70:
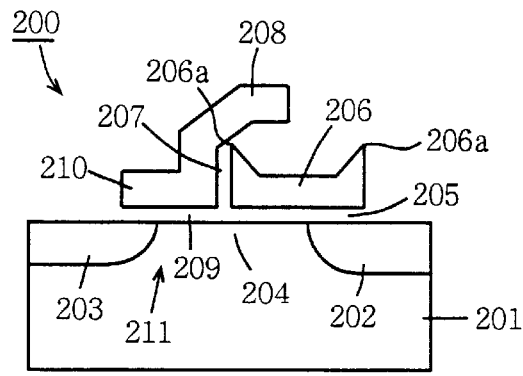
FIG. 70 is a sectional view of a conventional split gate memory cell.

The eighth and ninth embodiments are combined with each other to form a flash EEPROM 660 according to an eleventh embodiment. FIG. 69 shows a part of the structure of the flash EEPROM 660. In this case, the speed for the read operation can be further increased due to multiplier action of the eighth and ninth embodiments. Local short bit lines BLsm−2, BLsm+1, . . . shared by pairs of memory cells 501 are connected to global bit lines, shown by dotted lines in FIG. 69, through MOS transistors.

The isolation films 508 and 510 are replaced with other isolation films mainly composed of at least one of silicon oxide, silicon oxinitride and silicon nitride. The isolation films may be formed by at least one of thermal oxidation, thermal nitriding, thermal oxinitriding and CVD. Alternatively, the isolation films may be prepared by stacking a plurality of isolation films of different materials.

The material for the gate electrodes 505 to 507 is replaced with a conductive material, such as amorphous silicon, single-crystalline silicon, any metal including a high melting point metal, metal silicide or the like, other than doped polysilicon.

The p-type single-crystalline silicon substrate 502 is replaced with a p-type well.

The p-type single-crystalline silicon substrate 502 is replaced with an n-type single-crystalline silicon substrate or an n-type well, and p-type impurity ions of boron, indium or the like are injected for forming the source/drain regions 503.

The material for the global bit lines BLg1 to BLgn is replaced with a conductive material, such as doped polysilicon, metal silicide or the like, other than a metal.

The multivalued storage technique is employed for storing data of at least three values in each of the floating gate electrodes 505 and 506 of each memory cell 501.

A verify write system is employed for the write operation in each embodiment.

The control gate electrode 507 of the third embodiment is provided with a wide part located on the channel region 504 and narrow parts located on the floating gate electrodes 505 and 506 and the source/drain regions 503. According to this structure, the electrostatic capacitance between the control gate electrode 507 and the source/drain regions 503 can be further reduced for further improving the write and read characteristics.

In the fifth embodiment, the width of the control gate electrode 507 is rendered smaller than that of the floating gate electrodes 505 and 506.

In each of the seventh to eleventh embodiments, each memory cell may have a structure obtained by combining the third and fifth embodiments, the fourth and fifth embodiments or the fifth and sixth embodiments with each other.

Additional technical ideas graspable from the aforementioned embodiments are now described.

(A) A semiconductor memory including insulator films formed on floating gate electrodes by LOCOS in relation to the semiconductor memory according to the present invention.

(B) A method of fabricating a semiconductor memory including a step of forming an insulator film on a first conductor film by LOCOS in relation to the method of fabricating a semiconductor memory according to the present invention.

According to the above items (A) and (B), projections can be formed on upper portions of the floating gate electrodes.

In this specification, the members forming the inventive structure are defined as follows:

The semiconductor substrate is not restricted to the single-crystalline silicon semiconductor substrate but includes a well, a single-crystalline silicon film, a polycrystalline silicon film, an amorphous silicon film, a compound semiconductor substrate or a compound semiconductor film.

The conductor film is not restricted to the doped polysilicon film but includes any conductive material film such as an amorphous silicon film, a single-crystalline silicon film, a metal film containing a high melting point metal or a metal silicide film.

The electrostatic capacitance between the floating gate electrodes and the substrate includes that between the floating gate electrodes and the source/drain regions and/or the channel region formed on the substrate.

The quantity of charges stored in the second floating gate electrode, which is so set that a cell current of a necessary value flows when writing data in the first floating gate electrode in the write operation, includes zero charges.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A transistor, comprising:
    two cells having floating gate electrodes, respectively, and sharing a single control gate electrode serving also as a selection gate electrode; and
    an interconnection layer arranged above said floating gate electrodes through an interlayer isolation film,
    said control gate electrode being connected to said interconnection layer.

2. The transistor in accordance with claim 1, wherein said floating gate electrode of each cell is opposed to said control gate electrode at one surface through an insulator film.

3. The transistor in accordance with claim 1, wherein said floating gate electrode of each cell has a projection on a side opposed to said control gate electrode.

4. The transistor in accordance with claim 1, wherein said two cells further include a common channel region and two impurity regions provided through said channel region,
    said two floating gate electrodes are arranged on said channel region at a prescribed space through a first insulator film,
    said control gate electrode extends from above said channel region located between said two floating gate electrodes to above said floating gate electrodes through a second insulator film respectively, and
    said interconnection layer is arranged above said two impurity regions and said two floating gate electrodes through said interlayer isolation film.

5. The transistor in accordance with claim 1, wherein charges are injected into one of said two floating gate electrodes from said channel region by hot carriers in a write operation, and charges are extracted from said two floating gate electrodes to said control gate electrode by a tunnel current in an erase operation.

6. A semiconductor memory, comprising:
    a plurality of word lines extending in a first direction;
    a plurality of bit lines extending in a second direction intersecting with said first direction; and
    a plurality of transistors connected between each pair of said bit lines and arranged along each word line,
    wherein each transistor includes:
        a channel region,
        two impurity regions provided through said channel region for partially forming corresponding bit lines respectively, two floating gate electrodes arranged on said channel region at a prescribed space through a first insulator film, and a single control gate electrode extending from above said channel region located between said two floating gate electrodes to above said two floating gate electrodes, respectively, through a second insulator film, and each word line is arranged above said impurity regions and said floating gate electrodes of a plurality of corresponding transistors arranged along said first direction through an interlayer isolation film and connected to said control gates of said plurality of corresponding transistors.

7. The semiconductor memory in accordance with claim 6, wherein said two floating gate electrodes of each transistor have projections at least on sides closer to said control gate electrode.

8. The semiconductor memory in accordance with claim 6, wherein each transistor shares one of said two impurity regions with another transistor adjacent thereto on one side in said first direction and further shares the other one of said two impurity regions with still another transistor adjacent thereto on another side in said first direction.

9. The semiconductor memory in accordance with claim 6, further comprising:

a selection circuit for selecting one or more of said plurality of transistors, and a potential set circuit for setting the potentials of said plurality of bit lines and said plurality of word lines so that charges are injected into one of said floating gate electrodes from said channel region of any said transistor selected by said selection circuit by hot carriers in a write operation while setting the potentials of said plurality of bit lines and said plurality of word lines so that charges are extracted from one or both of said floating gate electrodes to said control gate electrode of any said transistor selected by said selection circuit by a tunnel current in an erase operation.

10. A transistor comprising:

a floating gate electrode;

a control gate electrode serving also as a selection gate electrode; and an interconnection layer arranged above said floating gate electrode through an interlayer isolation film, said control gate electrode being connected to said interconnection layer, said floating gate electrode having a first side surface which faces said control gate electrode with an insulator film interposed therebetween, and second, third and fourth side surfaces which do not face said control gate electrode.

11. The transistor in accordance with claim 10, wherein said floating gate electrode has a projection on said first side surface.

12. The transistor in accordance with claim 10, further comprising:

a channel region, and first and second impurity regions provided through said channel region, wherein said floating gate electrode is arranged on a side of said channel region closer to said first impurity region with a first insulator film interposed therebetween, said control gate electrode extending from above a side of said channel region closer to said second impurity region to above said floating gate electrode with a second insulator film interposed therebetween, and said interconnection layer being arranged above said floating gate electrode with said interlayer isolation film interposed therebetween.

13. A semiconductor memory comprising:

a plurality of bit lines extending in a first direction;

a plurality of word lines extending in a second direction intersecting with said first direction; and a plurality of transistors provided at intersection points between said plurality of bit lines and said plurality of word lines, wherein each transistor includes:

a channel region, first and second impurity regions provided through said channel region, a floating gate electrode arranged on a side of said channel region closer to said first impurity region with a first insulator film interposed therebetween, and a control gate electrode extending from above a side of said channel region closer to said second impurity region to above said floating gate electrode with a second insulator film interposed therebetween, and each word line being arranged above said floating gate electrodes of a plurality of corresponding transistors arranged along said second direction with an interlayer isolation film interposed therebetween and connected to said control gate electrodes of said plurality of corresponding transistors, said floating gate electrode of each transistor having a first side surface which faces said control gate electrode with an insulator film interposed therebetween, and second, third and fourth side surfaces which do not face said control gate electrode.

14. The semiconductor memory in accordance with claim 13, wherein each bit line is connected to said second impurity regions of a plurality of corresponding transistors arranged along said first direction.

15. The semiconductor memory in accordance with claim 14, wherein said first side surface of said floating gate electrode of each transistor is a side surface closer to said first impurity region.

16. The semiconductor memory in accordance with claim 13, wherein each transistor shares said first impurity region with another transistor adjacent thereto on one side in said first direction and further shares said second impurity region with still another transistor adjacent thereto on another side in said first direction.

17. The semiconductor memory in accordance with claim 13, wherein said floating gate electrode of each transistor has a projection on said first side.

18. The semiconductor memory in accordance with claim 13, further comprising:

a selection circuit for selecting one or more of said plurality of transistors, and a potential set circuit for setting the potentials of said plurality of bit lines and said plurality of word lines so that charges are injected into said floating gate electrode from said channel region of any transistor selected by said selection circuit by hot carriers in a write operation while setting the potentials of said plurality of bit lines and said plurality of word lines so that charges are extracted from said floating gate electrode to said control gate electrode of any transistor selected by said selection circuit by a tunnel current in an erase operation.

* * * * *